United States Patent
Nakano et al.

(10) Patent No.: US 12,486,452 B2
(45) Date of Patent: Dec. 2, 2025

(54) ORGANIC ELECTROLUMINESCENT ELEMENT AND ELECTRONIC DEVICE

(71) Applicant: IDEMITSU KOSAN CO., LTD., Tokyo (JP)

(72) Inventors: Hiromi Nakano, Sodegaura (JP); Hisato Matsumoto, Sodegaura (JP); Takushi Shiomi, Sodegaura (JP); Toshinari Ogiwara, Sodegaura (JP); Keiji Okinaka, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 1044 days.

(21) Appl. No.: 17/614,092

(22) PCT Filed: May 25, 2020

(86) PCT No.: PCT/JP2020/020572
§ 371 (c)(1),
(2) Date: Nov. 24, 2021

(87) PCT Pub. No.: WO2020/241580
PCT Pub. Date: Dec. 3, 2020

(65) Prior Publication Data
US 2022/0231227 A1    Jul. 21, 2022

(30) Foreign Application Priority Data
May 27, 2019 (JP) ................. 2019-098828

(51) Int. Cl.
C09K 11/06 (2006.01)
H10K 85/60 (2023.01)
(Continued)

(52) U.S. Cl.
CPC .............. *C09K 11/06* (2013.01); *H10K 85/60* (2023.02); *H10K 85/615* (2023.02);
(Continued)

(58) Field of Classification Search
None
See application file for complete search history.

(56) References Cited

U.S. PATENT DOCUMENTS 8,476,823 B2 * 7/2013 Kuma ............... C09B 57/00
313/506
11,637,245 B2 * 4/2023 Duan ............... H10K 85/6572
428/690
(Continued)

FOREIGN PATENT DOCUMENTS

| CN | 105103326 A | 11/2015 |
| CN | 106848074 A | 6/2017 |

(Continued)

OTHER PUBLICATIONS

International Search Report mailed on Aug. 25, 2020 in PCT/JP2020/020572 filed on May 25, 2020, 3 pages.
(Continued)

*Primary Examiner* — Robert S Loewe
(74) *Attorney, Agent, or Firm* — Oblon, McClelland, Maier & Neustadt, L.L.P.

(57) ABSTRACT

An organic EL device includes an emitting layer, a first layer adjacent to an anode-side of the emitting layer, and a second layer adjacent to a cathode-side thereof. The emitting layer contains first to third compounds. The first and second layers contain compounds of Formulae (1) and (2), respectively. The first and second compounds exhibits fluorescence and delayed fluorescence, respectively. Singlet energies $S_1$ of the first to third compounds satisfy $S_1(M3)>S_1(M2)>S_1(M1)$. In Formula (1), $Ra_1$-$Ra_5$, $Rb_1$-$Rb_5$ and $Rc_1$-$Rc_5$ are each a substituent, etc. In Formula (2), $X_1$-$X_3$ are each nitrogen atom, etc, $Ar_1$-$Ar_2$ are each a group of Formula (2A) or aryl group, etc, A is a group of Formula (2A) in which HAr is of Formula (2B), a is 1 to 5, $L_1$ is a linking group, etc. In Formula (2B), $X_{11}$-$X_{18}$ are each nitrogen atom, etc, and $Y_1$ is oxygen, sulfur or nitrogen atom, etc,

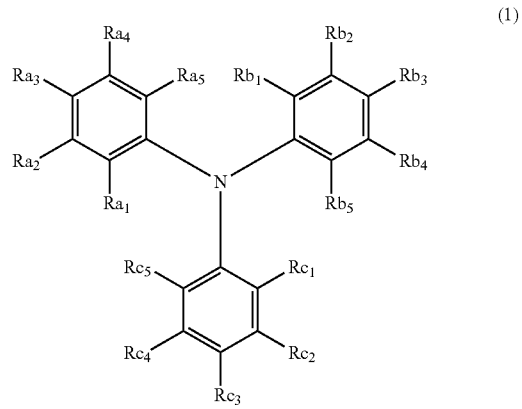

(1)

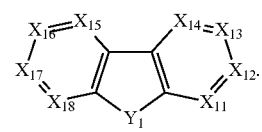

(2)

(2A)

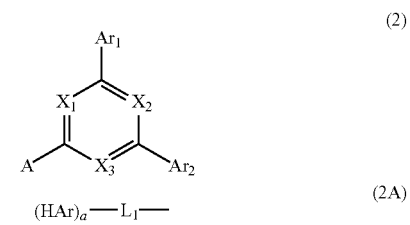

(2B)

31 Claims, 4 Drawing Sheets

(51) Int. Cl.
    *H10K 50/11*      (2023.01)
    *H10K 50/13*      (2023.01)
    *H10K 50/18*      (2023.01)
    *H10K 85/30*      (2023.01)
    *H10K 101/10*     (2023.01)
    *H10K 101/20*     (2023.01)

(52) U.S. Cl.
    CPC ......... H10K 85/633 (2023.02); H10K 85/636 (2023.02); H10K 85/654 (2023.02); H10K 85/657 (2023.02); H10K 85/6572 (2023.02); H10K 85/6574 (2023.02); *C09K 2211/1018* (2013.01); *H10K 50/11* (2023.02); *H10K 50/13* (2023.02); *H10K 50/181* (2023.02); *H10K 85/322* (2023.02); *H10K 85/626* (2023.02); *H10K 2101/10* (2023.02); *H10K 2101/20* (2023.02)

(56) References Cited

U.S. PATENT DOCUMENTS

| | | | |
|---|---|---|---|
| 2004/0191563 A1 | 9/2004 | Iwakuma et al. | |
| 2010/0295445 A1* | 11/2010 | Kuma | H10K 50/11 313/504 |
| 2014/0175419 A1 | 6/2014 | Nakano et al. | |
| 2014/0183486 A1 | 7/2014 | Nakano et al. | |
| 2015/0115225 A1 | 4/2015 | Kawamura et al. | |
| 2015/0179940 A1 | 6/2015 | Mujica-Fernaud et al. | |
| 2015/0287931 A1 | 10/2015 | Kato et al. | |
| 2016/0172601 A1* | 6/2016 | Kawamura | C07D 209/82 257/40 |
| 2016/0190469 A1* | 6/2016 | Ogiwara | C09K 11/06 257/40 |
| 2016/0197286 A1 | 7/2016 | Kawamura et al. | |
| 2016/0197287 A1 | 7/2016 | Kawamura et al. | |
| 2017/0141321 A1 | 5/2017 | Pyo et al. | |
| 2017/0155048 A1* | 6/2017 | Kim | H10K 85/633 |
| 2018/0051204 A1* | 2/2018 | Ogiwara | H10K 85/322 |
| 2018/0053901 A1* | 2/2018 | Yoshida | C09K 11/06 |
| 2019/0019971 A1* | 1/2019 | Xie | H10K 50/121 |
| 2019/0288221 A1* | 9/2019 | Yoshizaki | H10K 85/322 |
| 2020/0203621 A1* | 6/2020 | Kim | C07D 401/14 |
| 2020/0203652 A1* | 6/2020 | Duan | H10K 85/631 |
| 2021/0151683 A1 | 5/2021 | Sakaino et al. | |
| 2021/0253546 A1* | 8/2021 | Ito | H10K 85/615 |

FOREIGN PATENT DOCUMENTS

| | | |
|---|---|---|
| CN | 109411634 A | 3/2019 |
| CN | 109790086 A | 5/2019 |
| JP | 2014-216576 A | 11/2014 |
| JP | 2015-106659 A | 6/2015 |
| JP | 2015-530364 A | 10/2015 |
| JP | 2020-102603 A | 7/2020 |
| KR | 10-2017-0056717 A | 5/2017 |
| WO | WO 2012/153780 A1 | 11/2012 |
| WO | WO 2013/038650 A1 | 3/2013 |
| WO | WO 2013/180241 A1 | 12/2013 |
| WO | WO 2014/002873 A1 | 1/2014 |
| WO | WO 2014/092083 A1 | 6/2014 |
| WO | WO 2014/104346 A1 | 7/2014 |
| WO | WO 2016/056559 A1 | 4/2016 |
| WO | WO 2019/013063 A1 | 1/2019 |

OTHER PUBLICATIONS

Adachi, Ed., "Yuki Hando-tai no Debaisu Bussei (Device Physics of Organic Semiconductors)," Kodansha, Apr. 1, 2012, pp. 261-268, 19 total pages (with English translation).

Uoyama et al., "Highly efficient organic light-emitting diodes from delayed fluorescence", Nature, vol. 492, Dec. 13, 2012, pp. 234-238, 7 total pages.

International Preliminary Report on Patentability and Written Opinion Issued Nov. 16, 2021 in PCT/JP2020/020572 (submitting English translation only), 6 pages.

Chinese Combined Office Action and Search Report issued Oct. 26, 2024 in Chinese Patent Application No. 202080037261.4, 14 pages, (with translation of category of cited documents in the attached foreign language search report).

* cited by examiner

ORGANIC ELECTROLUMINESCENT ELEMENT AND ELECTRONIC DEVICE

TECHNICAL FIELD

The present invention relates to an organic electroluminescence device and an electronic device.

BACKGROUND ART

When a voltage is applied to an organic electroluminescence device (hereinafter, occasionally referred to as an organic EL device), holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

A fluorescent organic EL device using light emission from singlet excitons has been applied to a full-color display such as a mobile phone and a television set, but an internal quantum efficiency is said to be at a limit of 25%. Accordingly, studies has been made to improve a performance of the organic EL device.

For instance, it is expected to further efficiently emit the organic EL device using triplet excitons in addition to singlet excitons. In view of the above, a highly efficient fluorescent organic EL device using thermally activated delayed fluorescence (hereinafter, sometimes simply referred to as "delayed fluorescence") has been proposed and studied.

For instance, a TADF (Thermally Activated Delayed Fluorescence) mechanism has been studied. This TADF mechanism uses such a phenomenon in which inverse intersystem crossing from triplet excitons to singlet excitons thermally occurs when a material having a small energy difference (ΔST) between singlet energy level and triplet energy level is used. Thermally activated delayed fluorescence is explained in "Yuki Hando-tai no Debaisu Bussei (Device Physics of Organic Semiconductors)" (edited by ADACHI, Chihaya, published by Kodansha, issued on Apr. 1, 2012, on pages 261-268).

Patent Literatures 1 and 2 each disclose an organic EL device including a hole transporting layer, an emitting layer containing a TADF compound, and an electron transporting layer. The hole transporting layer described in Patent Literatures 1 and 2 contains an amine compound. The electron transporting layer described in Patent Literatures 1 and 2 contains a compound in which a heteroaryl group is bonded directly or with a linking group to an azine ring having an aryl group.

CITATION LIST

Patent Literature(s)

Patent Literature 1: International Publication No. WO2019/013063
Patent Literature 2: International Publication No. WO2016/056559

SUMMARY OF THE INVENTION

Problems to be Solved by the Invention

An organic EL device using a TADF mechanism is required to emit light at a lower voltage or a higher efficiency in order to further improve performance.

An object of the invention is to provide an organic electroluminescence device configured to emit light at a lower voltage or a higher efficiency or at a lower voltage and a higher efficiency, and an electronic device including the organic electroluminescence device.

Means for Solving the Problem(s)

According to an aspect of the invention, an organic electroluminescence device includes:
an anode;
a cathode;
an emitting layer provided between the anode and the cathode;
a first layer provided between the anode and the emitting layer and adjacent to the emitting layer; and
a second layer provided between the cathode and the emitting layer and adjacent to the emitting layer, in which
the emitting layer contains a first compound, a second compound, and a third compound,
the first layer contains a compound represented by a formula (1) below,
the second layer contains a compound represented by a formula (2) below,
the first compound is a fluorescent compound,
the second compound is a delayed fluorescent compound, and
a singlet energy $S_1(M1)$ of the first compound, a singlet energy $S_1(M2)$ of the second compound, and a singlet energy $S_1(M3)$ of the third compound satisfy a relationship of a numerical formula (Numerical Formula 1) below, $$S_1(M3) > S_1(M2) > S_1(M1). \quad \text{(Numerical Formula 1)}$$

[Formula 1]

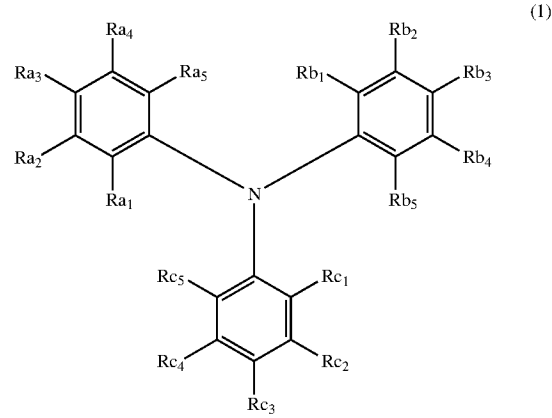

(1)

In the formula (1):
$Ra_1$ to $Ra_5$, $Rb_1$ to $Rb_5$, and $Rc_3$ to $Rc_5$ are each independently a hydrogen atom or a substituent; $Ra_1$ to $Ra_5$, $Rb_1$ to $Rb_5$, and $Rc_3$ to $Rc_5$ as the substituent are each independently a halogen atom, a cyano group, a substituted or unsubstituted aryl group having 6 to 30 ring carbon atoms, or a substituted or unsubstituted heteroaryl group having 5 to 30 ring atoms;

$Rc_1$ is a hydrogen atom or a substituent, or is bonded to $Rc_2$ to form a ring; $Rc_1$ serving as the substituent is a substituted or unsubstituted aryl group having 6 to 12 ring carbon atoms;

$Rc_2$ is a hydrogen atom or a substituent, or a pair of $Rc_1$ and $Rc_2$ are mutually bonded to form a ring;

when a pair of $Rc_1$ and $Rc_2$ are mutually bonded to form a ring, the ring at least includes a five-membered ring, the five-membered ring including at least one of a carbon atom, an oxygen atom, a sulfur atom, or a nitrogen atom; $Rc_1$ and $Rc_2$ are not hydrogen atoms at the same time; and $Rc_2$ serving as the substituent is a substituted or unsubstituted aryl group having 6 to 30 ring carbon atoms, a substituted or unsubstituted heteroaryl group having 5 to 30 ring atoms, a substituted or unsubstituted aryloxy group having 6 to 30 ring carbon atoms, a substituted or unsubstituted arylthio group having 6 to 30 ring carbon atoms, or a substituted or unsubstituted amino group.

[Formula 2]

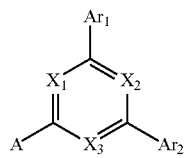

(2)

In the formula (2):

$X_1$ to $X_3$ are each independently a nitrogen atom or $CR_1$, at least one of $X_1$ to $X_3$ is a nitrogen atom;

$R_1$ is a hydrogen atom or a substituent;

$R_1$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

$Ar_1$ and $Ar_2$ are each independently represented by a formula (2A) below, or a substituted or unsubstituted aryl group having 6 to 30 ring carbon atoms, or a substituted or unsubstituted heteroaryl group having 5 to 30 ring atoms; and A is represented by the formula (2A) below.

[Formula 3]

$$(HAr)_a—L_1—$$

(2A)

In the formula (2A):

HAr is represented by a formula (2B) below;

a is 1, 2, 3, 4 or 5;

when a is 1, $L_1$ is a single bond or a divalent linking group;

when a is 2, 3, 4 or 5, $L_1$ is a trivalent to hexavalent linking group;

a plurality of HAr are the same or different;

the linking group is a group derived from a substituted or unsubstituted aryl group having 6 to 30 ring carbon atoms, a group derived from a substituted or unsubstituted heteroaryl group having 5 to 30 ring atoms, a group derived from a group formed by mutually bonding two groups selected from the group consisting of a substituted or unsubstituted aryl group having 6 to 30 ring carbon atoms and a substituted or unsubstituted heteroaryl group having 5 to 30 ring atoms, or a group derived from a group formed by mutually bonding three groups selected from the group consisting of a substituted or unsubstituted aryl group having 6 to 30 ring carbon atoms and a substituted or unsubstituted heteroaryl group having 5 to 30 ring atoms; and the mutually bonded groups are the same or different.

[Formula 4]

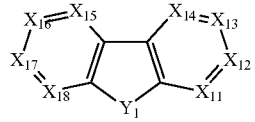

(2B)

In the formula (2B):

$X_{11}$ to $X_{18}$ are each independently a nitrogen atom, $CR_{13}$, or a carbon atom bonded to $L_1$;

a plurality of $R_{13}$ are the same or different;

$Y_1$ is an oxygen atom, a sulfur atom, $NR_{18}$, $SiR_{11}R_{12}$, $CR_{14}R_{15}$, a nitrogen atom bonded to $L_1$, a silicon atom bonded to each of $R_{16}$ and $L_1$, or a carbon atom bonded to each of $R_{17}$ and $L_1$;

among carbon atoms in $X_{11}$ to $X_{18}$, $R_{11}$ to $R_{12}$, and $R_{14}$ to $R_{15}$ as well as a nitrogen atom, a silicon atom, and carbon atoms in $Y_1$, one atom is bonded to $L_1$;

$R_{11}$ and $R_{12}$ are the same or different; $R_{14}$ and $R_{15}$ are the same or different;

$R_{18}$ and $R_{11}$ to $R_{17}$ are each independently a hydrogen atom or a substituent, or at least one pair of a pair of adjacent ones of $R_{13}$, a pair of $R_{11}$ and $R_{12}$, or a pair of $R_{14}$ and $R_{15}$ are bonded to each other to form a ring; and $R_{18}$ and $R_{11}$ to $R_{17}$ serving as the substituent are each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms.

According to another aspect of the invention, an electronic device including the organic electroluminescence device according to the above aspect of the invention is provided.

Still another aspect of the invention can provide an organic EL device configured to emit light at a lower voltage or a higher efficiency or at a lower voltage and a higher efficiency, and an electronic device including the organic EL device.

BRIEF DESCRIPTION OF DRAWING(S)

FIG. 1 schematically shows an exemplary arrangement of an organic EL device according to a first exemplary embodiment.

FIG. 2 schematically shows a device that measures transient PL.

DESCRIPTION OF EMBODIMENT(S)

First Exemplary Embodiment

Arrangement(s) of an organic EL device according to a first exemplary embodiment of the invention will be described below.

The organic EL device includes an anode, a cathode, and an organic layer between the anode and the cathode. This organic layer includes a plurality of layers formed of an organic compound(s). The organic layer may further contain an inorganic compound. At least one of the layers forming the organic layer is an emitting layer.

In the first exemplary embodiment, the organic layer includes the emitting layer provided between the anode and the cathode, a first layer provided between the anode and the emitting layer and adjacent to the emitting layer, and a second layer provided between the cathode and the emitting layer and adjacent to the emitting layer.

The emitting layer contains a first compound, a second compound, and a third compound. The first compound is a fluorescent compound and the second compound is a delayed fluorescent compound.

The first layer contains a compound represented by a formula (1). The first layer is not particularly limited, but is at least one layer selected from the group consisting of a hole injecting layer, hole transporting layer, and electron blocking layer. The first layer is preferably the electron blocking layer.

The second layer contains a compound represented by a formula (2). The second layer is not particularly limited, but is at least one layer selected from the group consisting of an electron injecting layer, electron transporting layer, and hole blocking layer. The second layer is preferably the hole blocking layer.

Figure 1:
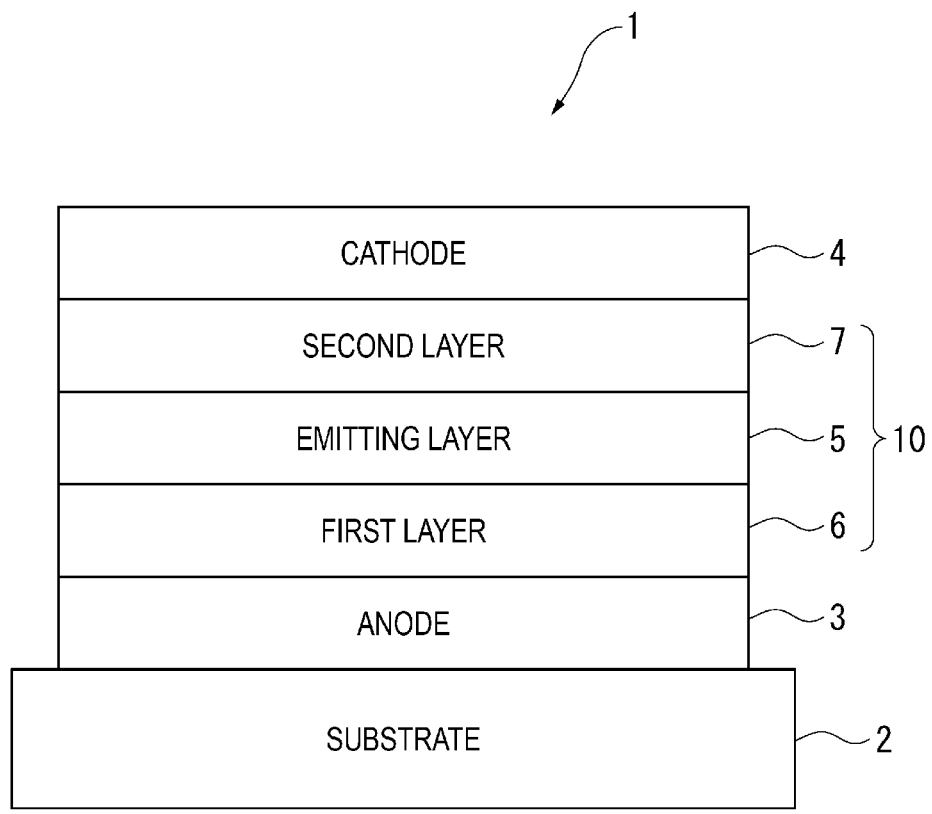

Specifically, the organic layer of the organic EL device in the exemplary embodiment preferably has a layer arrangement below.

electron blocking layer/emitting layer/hole blocking layer
hole injecting layer/electron blocking layer/emitting layer/hole blocking layer
hole transporting layer/electron blocking layer/emitting layer/hole blocking layer
hole injecting layer/hole transporting layer/electron blocking layer/emitting layer/hole blocking layer
hole blocking layer/emitting layer/hole blocking layer/electron injecting layer
hole blocking layer/emitting layer/hole blocking layer/electron transporting layer/electron injecting layer
hole injecting layer/electron blocking layer/emitting layer/hole blocking layer/electron injecting layer
hole injecting layer/electron blocking layer/emitting layer/hole blocking layer/electron transporting layer
hole injecting layer/electron blocking layer/emitting layer/hole blocking layer/electron transporting layer/electron injecting layer
hole transporting layer/electron blocking layer/emitting layer/hole blocking layer/electron injecting layer
hole transporting layer/electron blocking layer/emitting layer/hole blocking layer/electron transporting layer
hole transporting layer/electron blocking layer/emitting layer/hole blocking layer/electron transporting layer/electron injecting layer
hole injecting layer/hole transporting layer/electron blocking layer/emitting layer/hole blocking layer/electron injecting layer
hole injecting layer/hole transporting layer/electron blocking layer/emitting layer/hole blocking layer/electron transporting layer
hole injecting layer/hole transporting layer/electron blocking layer/emitting layer/hole blocking layer/electron transporting layer/electron injecting layer FIG. 1 schematically shows an exemplary arrangement of the organic EL device of the exemplary embodiment.

An organic EL device 1 includes a light-transmissive substrate 2, an anode 3, a cathode 4, and an organic layer 10 provided between the anode 3 and the cathode 4. The organic layer 10 includes a first layer 6, an emitting layer 5, and a second layer 7, which are sequentially laminated on the anode 3. The first layer 6 is adjacent to a side of the emitting layer 5 close to the anode 3. The second layer 7 is adjacent to a side of the emitting layer 5 close to the cathode 4.

The emitting layer 5 may contain a metal complex.

It is preferable that the emitting layer 5 does not contain a phosphorescent material (dopant material).

It is preferable that the emitting layer 5 does not contain a heavy-metal complex and a phosphorescent rare-earth metal complex. Examples of the heavy-metal complex herein include iridium complex, osmium complex, and platinum complex.

It is also preferable that the emitting layer 5 does not contain a metal complex.

The first compound is preferably a dopant material (occasionally referred to as a guest material, emitter or luminescent material).

The second compound is preferably a host material (occasionally referred to as a matrix material).

It is preferable that the third compound is a host material. Occasionally, one of the second compound and the third compound is referred to as a first host material and the other thereof is referred to as a second host material. The third compound may be a delayed fluorescent compound and a compound that does not exhibit delayed fluorescence.

A typical organic EL device including the emitting layer containing three compounds of a fluorescent compound, a TADF compound, and the third compound has been known. In order to manufacture an organic EL device configured to emit light at a lower voltage or higher efficiency than a typical organic EL device, it is necessary to improve hole injectability to the emitting layer. In addition, it is also necessary to trap holes, which have been injected into the emitting layer, in the emitting layer for a longer time and generate excitons efficiently. However, a known combination of the emitting layer and neighboring layers (e.g., an electron blocking layer and a hole blocking layer) makes it insufficient to improve hole injectability into the emitting layer and generate excitons efficiently in the emitting layer.

Inventors have found that in an organic EL device including the emitting layer containing three compounds, the organic EL device configured to emit light at a lower voltage or a higher efficiency or at a lower voltage and a higher efficiency is achievable by providing the first layer to the side of the emitting layer close to the anode, the first layer containing a compound represented by a formula (1), and providing the second layer to the side of the emitting layer close to the cathode, the second layer containing a compound represented by a formula (2).

An arrangement of the organic EL device according to the first exemplary embodiment will be described below.

First Layer

The first layer 6 contains the compound represented by the formula (1).

[Formula 5]

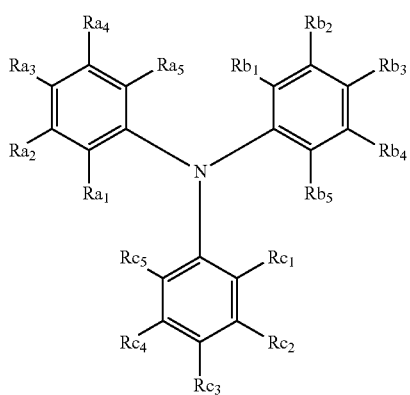

(1)

In the formula (1):

$Ra_1$ to $Ra_5$, $Rb_1$ to $Rb_5$, and $Rc_3$ to $Rc_5$ are each independently a hydrogen atom or a substituent; $Ra_1$ to $Ra_5$, $Rb_1$ to $Rb_5$, and $Rc_3$ to $Rc_5$ as the substituent are each independently a halogen atom, a cyano group, a substituted or unsubstituted aryl group having 6 to 30 ring carbon atoms, or a substituted or unsubstituted heteroaryl group having 5 to 30 ring atoms;

$Rc_1$ is a hydrogen atom or a substituent, or is bonded to $Rc_2$ to form a ring; $Rc_1$ serving as the substituent is a substituted or unsubstituted aryl group having 6 to 12 ring carbon atoms;

$Rc_2$ is a hydrogen atom or a substituent, or a pair of $Rc_1$ and $Rc_2$ are mutually bonded to form a ring;

when a pair of $Rc_1$ and $Rc_2$ are mutually bonded to form a ring, the ring at least includes a five-membered ring, the five-membered ring including at least one of a carbon atom, an oxygen atom, a sulfur atom, or a nitrogen atom; $Rc_1$ and $Rc_2$ are not hydrogen atoms at the same time; and $Rc_2$ serving as the substituent is a substituted or unsubstituted aryl group having 6 to 30 ring carbon atoms, a substituted or unsubstituted heteroaryl group having 5 to 30 ring atoms, a substituted or unsubstituted aryloxy group having 6 to 30 ring carbon atoms, a substituted or unsubstituted arylthio group having 6 to 30 ring carbon atoms, or a substituted or unsubstituted amino group.

Preferably, in the formula (1): when at least one of $Ra_1$ to $Ra_5$ is an unsubstituted dibenzofuranyl group, none of $Rb_1$ to $Rb_5$ and $Rc_2$ to $Rc_5$ are an unsubstituted dibenzofuranyl group; when at least one of $Rb_1$ to $Rb_5$ is an unsubstituted dibenzofuranyl group, none of $Ra_1$ to $Ra_5$ and $Rc_2$ to $Rc_5$ are an unsubstituted dibenzofuranyl group; and when at least one of $Rc_2$ to $Rc_5$ is an unsubstituted dibenzofuranyl group, none of $Ra_1$ to $Ra_5$ and $Rb_1$ to $Rb_5$ are an unsubstituted dibenzofuranyl group.

More preferably, in the formula (1): when at least one of $Ra_1$ to $Ra_5$ is a substituted or unsubstituted dibenzofuranyl group, none of $Rb_1$ to $Rb_5$ and $Rc_2$ to $Rc_5$ are a substituted or unsubstituted dibenzofuranyl group; when at least one of $Rb_1$ to $Rb_5$ is a substituted or unsubstituted dibenzofuranyl group, none of $Ra_1$ to $Ra_5$ and $Rc_2$ to $Rc_5$ are a substituted or unsubstituted dibenzofuranyl group; and when at least one of $Rc_2$ to $Rc_5$ is a substituted or unsubstituted dibenzofuranyl group, none of $Ra_1$ to $Ra_5$ and $Rb_1$ to $Rb_5$ are a substituted or unsubstituted dibenzofuranyl group.

In the formula (1), it is preferable that a pair of $Rc_1$ and $Rc_2$ are bonded to each other to form a ring.

In the formula (1), it is also preferable that $Rc_1$ is a hydrogen atom or a substituent and $Rc_2$ is a hydrogen atom or a substituent. It should be noted that $Rc_1$ and $Rc_2$ are not hydrogen atoms at the same time.

Here, significance that a pair of $Rc_1$ and $Rc_2$ are bonded to each other to form a ring and that at least one of $Rc_1$ or $Rc_2$ is a specific substituent will be described using a formula (1A) below.

The formula (1A) is a partial structure of the compound represented by the formula (1).

[Formula 6]

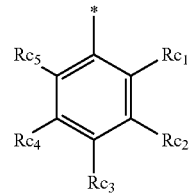

(1A)

In the formula (1A), $Rc_1$ represents the same as $Rc_1$ in the formula (1), $Rc_2$ represents the same as $Rc_2$ in the formula (1), $Rc_3$ to $Rc_5$ each independently represent the same as $Rc_3$ to $Rc_5$ in the formula (1), and * represents a bonding position to a nitrogen atom in the compound represented by the formula (1).

In the formula (1A), that a pair of $Rc_1$ and $Rc_2$ are bonded to each other to form a ring means that $Rc_1$ and $Rc_2$ form, for instance, a ring $Z_{11A}$ represented by a formula (11A) below.

[Formula 7]

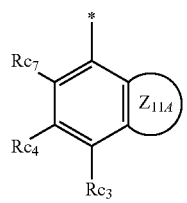

(11A)

In the formula (1A), when $Rc_2$ and $Rc_3$ form a ring $Z_{11B}$ represented by a formula (11B) below and when $Rc_3$ and $Rc_4$ form a ring $Z_{11}$ represented by a formula (11C) below, the formulae (11B) and (11C) do not satisfy the formula (1A).

[Formula 8]

(11B)

(11C)

In the compound represented by the formula (1), $Rc_1$ and $Rc_2$ that are at positions close to a nitrogen atom in the formula (1) are bonded to each other to form the ring $Z_{11A}$, or at least one of $Rc_1$ or $Rc_2$ has a specific substituent. Therefore, the compound represented by the formula (1) has a bulkier structure at the surroundings of the nitrogen atom than, for instance, a compound having the ring $Z_{11B}$ formed by mutually bonding $Rc_2$ and $Rc_3$, a compound having the ring $Z_{11C}$ formed by mutually bonding $Rc_3$ and $Rc_4$, and a compound in which $Rc_3$ has a substituent. Based on this, the compound represented by the formula (1) is considered to have a narrow orbital of HOMO (Highest Occupied Molecular Orbital) and a deep ionization potential Ip (large absolute value).

Accordingly, it is considered that since the first layer adjacent to a side of the emitting layer 5 close to the anode 3 contains the compound represented by the formula (1) in the organic EL device 1 of the exemplary embodiment, injectability of holes into the emitting layer and an efficiency of generation of excitons in the emitting layer are improved, resulting in improvement in at least one of driving at a low voltage or light emission at a high efficiency.

It is preferable that the partial structure represented by the formula (1A) in the formula (1) is a group represented by one of formulae (1A-1) to (1A-10) below.

[Formula 9]

(1A-1)

[Formula 10]

(1A-2)

(1A-3)

(1A-4)

(1A-5)

(1A-6)

(1A-7)

(1A-8)

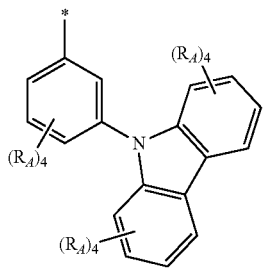
(1A-9)

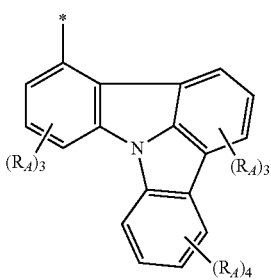
(1A-10)

In the formulae (1A-1) to (1A-10):
$R_A$ is a hydrogen atom or a substituent;
$R_A$ as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

when a plurality of $R_A$ are present, the plurality of $R_A$ are the same or different; and

* represents a bonding position to a nitrogen atom in the compound represented by the formula (1).

The group represented by the formula (1A) is preferably the group represented by one of the formulae (1A-1) to (1A-5) and (1A-10), more preferably the group represented by the formula (1A-1) or (1A-4).

The group represented by the formula (1A) is also preferably the group represented by one of the formulae (1A-6) to (1A-9), more preferably the group represented by the formula (1A-9).

The group represented by the formula (1A) is more preferably the group represented by the formula (1A-1), (1A-4) or (1A-9).

In the formulae (1A-1) to (1A-10), $R_A$ is preferably a hydrogen atom.

In the formula (1), it is preferable that $Ra_1$ to $Ra_5$ and $Rb_1$ to $Rb_5$ are each independently a hydrogen atom or a substituted or unsubstituted aryl group having 6 to 30 ring carbon atoms.

In the formula (1), it is also preferable that $Ra_1$ to $Ra_5$ are each independently a hydrogen atom or a substituted or unsubstituted aryl group having 6 to 30 ring carbon atoms and $Rb_1$ to $Rb_5$ are each independently a hydrogen atom or a substituted or unsubstituted heteroaryl group having 5 to 30 ring atoms.

In the formula (1), it is also preferable that $Ra_1$ to $Ra_5$ are each independently a hydrogen atom or a substituted or unsubstituted aryl group having 6 to 30 ring carbon atoms and substituted by a heteroaryl group having a 5 to 30 ring atoms, and $Rb_1$ to $Rb_5$ are each independently a hydrogen atom or a substituted or unsubstituted heteroaryl group having 5 to 30 ring atoms.

In the formula (1), it is also preferable that $Ra_1$ to $Ra_5$ and $Rb_1$ to $Rb_5$ are each independently a hydrogen atom or a substituted or unsubstituted heteroaryl group having 5 to 30 ring atoms.

In the formula (1), it is preferable that one of $Ra_1$ to $Ra_5$ is a substituent and $Ra_1$ to $Ra_5$ not being the substituent are hydrogen atoms, one of $Rb_1$ to $Rb_5$ is a substituent and $Rb_1$ to $Rb_5$ not being the substituent are hydrogen atoms, and $Rc_3$ to $Rc_5$ are hydrogen atoms.

In the formula (1), it is preferable that $Ra_1$ to $Ra_5$, $Rb_1$ to $Rb_5$, and $Rc_3$ to $RC_5$ as the substituent are each independently a halogen atom, cyano group, unsubstituted aryl group having 6 to 30 ring carbon atoms, or unsubstituted heteroaryl group having 5 to 30 ring atoms.

In the formula (1), it is preferable that one of $Ra_1$ to $Ra_5$ is a substituent and $Ra_1$ to $Ra_5$ not being the substituent are hydrogen atoms, one of $Rb_1$ to $Rb_5$ is a substituent and $Rb_1$ to $Rb_5$ not being the substituent are hydrogen atoms, $Rc_3$ to $RC_5$ are hydrogen atoms, $Ra_1$ to $Ra_5$ and $Rb_1$ to $Rb_5$ as the substituent are each independently a halogen atom, cyano group, unsubstituted aryl group having 6 to 30 ring carbon atoms, or unsubstituted heteroaryl group having 5 to 30 ring atoms.

In the formula (1), it is preferable that at least one of $Ra_1$ to $Ra_5$ is each independently a group represented by one of formulae (11B-1) to (11B-10) and at least one of $Rb_1$ to $Rb_5$ is each independently a group represented by one of formulae (1B-1) to (1B-10).

[Formula 11]

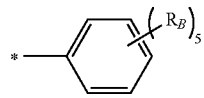
(1B-1)

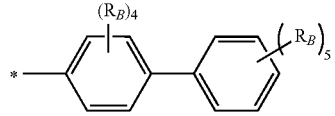
(1B-2)

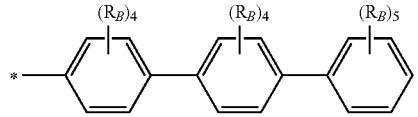
(1B-3)

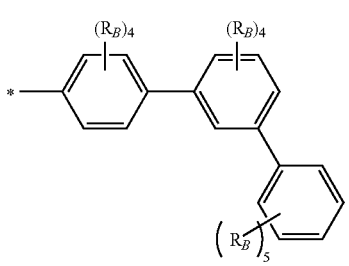
(1B-4)

(1B-5)

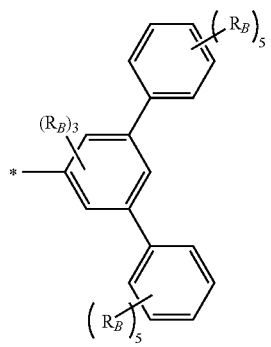

(1B-6)

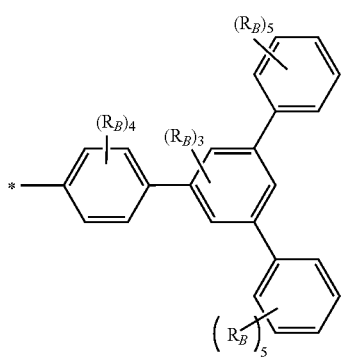

[Formula 12]

(1B-7)

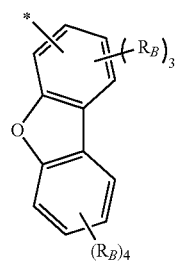

(1B-8)

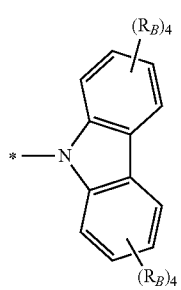

(1B-9)

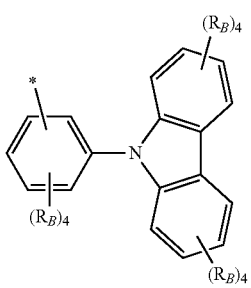

(1B-10)

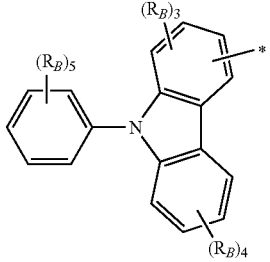

In the formulae (1B-1) to (1B-10):

$R_B$ is a hydrogen atom or a substituent;

$R_B$ as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

when a plurality of $R_B$ are present, the plurality of $R_B$ are the same or different; and

* each represents a bonding position to a benzene ring bonded to $Ra_1$ to $Ra_5$ or a bonding position to a benzene ring bonded to $Rb_1$ to $Rb_5$ in the compound represented by the formula (1).

In the formulae (1B-1) to (1B-10), $R_B$ is preferably a hydrogen atom.

The compound represented by the formula (1) is preferably a compound represented by a formula (1X), a formula (1Y) or a formula (1Z).

[Formula 13]

(1X)

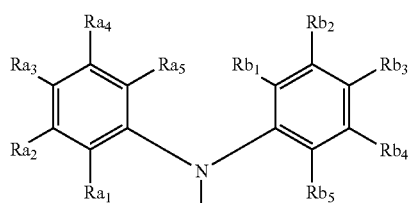

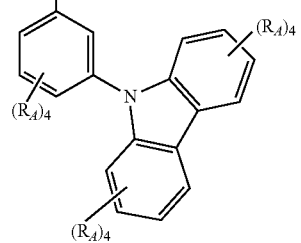

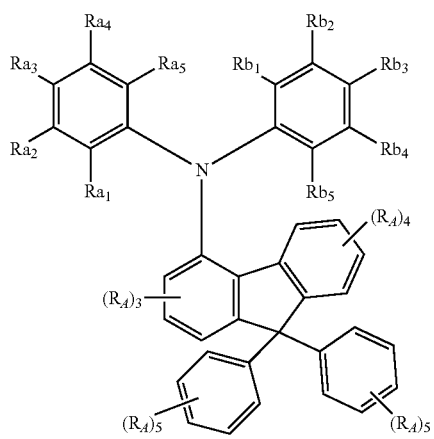

(1Y)

[Formula 14]

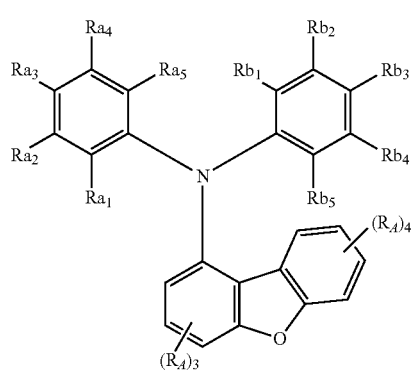

(1Z)

In the formulae (1X), (1Y) and (1Z), at least one of $Ra_1$ to $Ra_5$ is each independently a group represented by one of the formulae (1B-1) to (1B-10), at least one of $Rb_1$ to $Rb_5$ is each independently a group represented by one of the formulae (1B-1) to (1B-10), and $R_A$ represents the same as $R_A$ in the formulae (1A-1) to (1A-10).

In the formulae (1X), (1Y) and (1Z), it is preferable that one of $Ra_1$ to $Ra_5$ is a group represented by one of the formulae (1B-1) to (1B-10) and one of $Rb_1$ to $Rb_5$ is a group represented by one of the formulae (1B-1) to (1B-10).

In the formulae (1X), (1Y) and (1Z), $R_A$ is preferably a hydrogen atom.

In the formulae (1X), (1Y) and (1Z), $R_B$ is preferably a hydrogen atom.

An ionization potential Ip of the compound represented by the formula (1) is preferably 5.78 eV or more, more preferably 5.80 eV or more, further preferably 5.85 eV or more, in order to improve injectability of holes into the emitting layer and generate excitons efficiently in the emitting layer.

The measurement method of the ionization potential Ip of the compound represented by the formula (1) is as described in later-described Examples.

Specific examples of the compound represented by the formula (1) are shown below. It should be noted that the compound represented by the formula (1) in the invention is not limited to the specific examples.

[Formula 15]

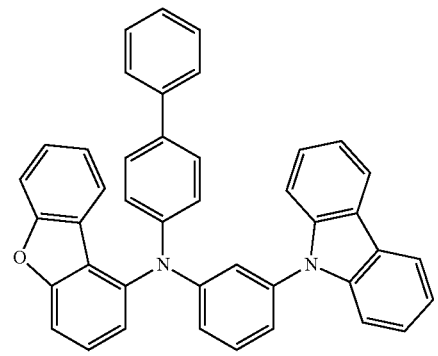

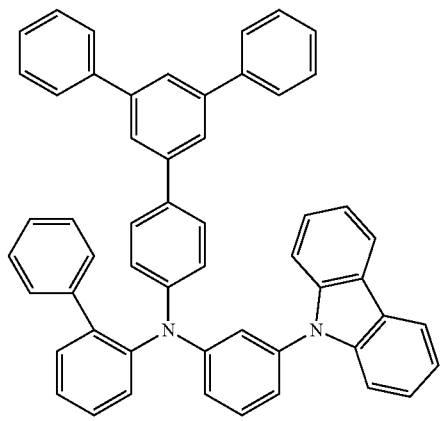

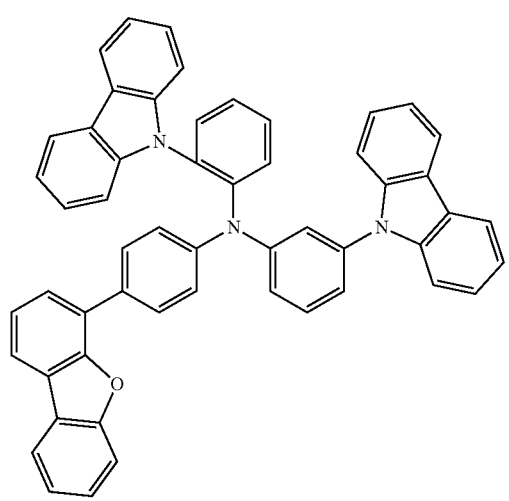

[Formula 16]
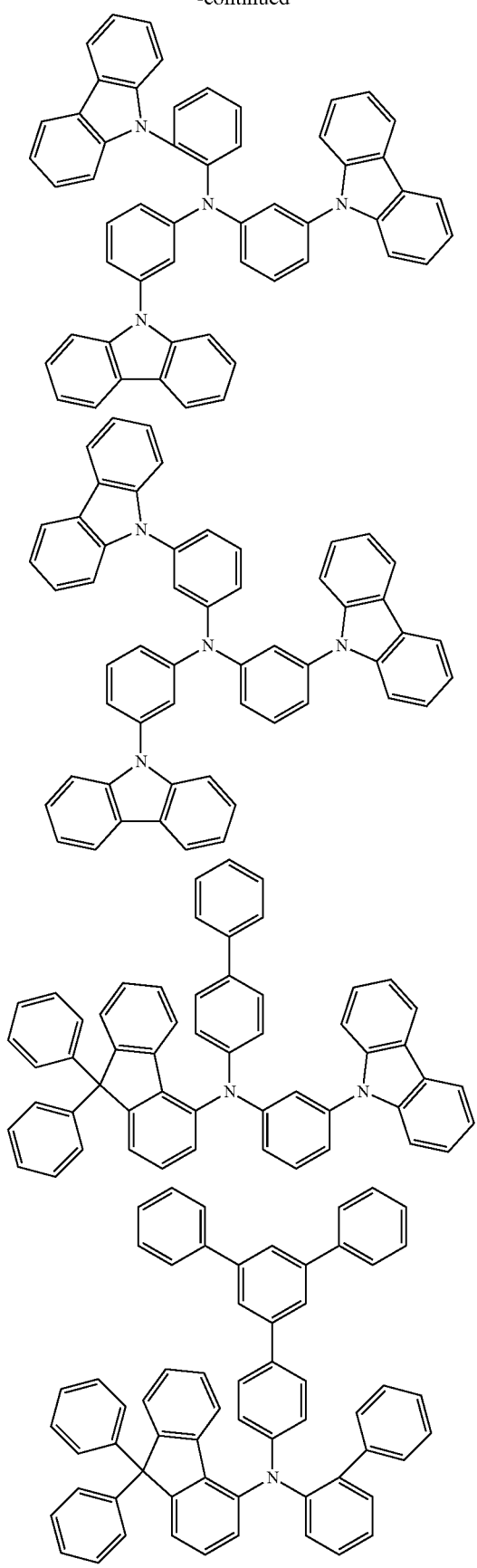
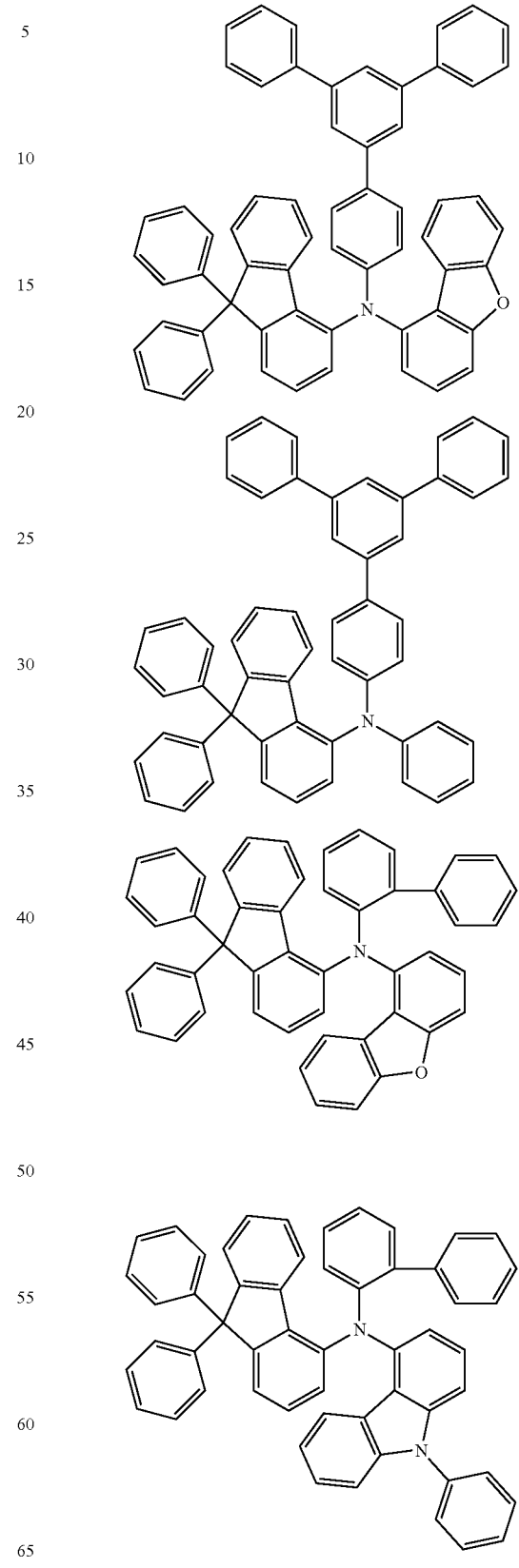

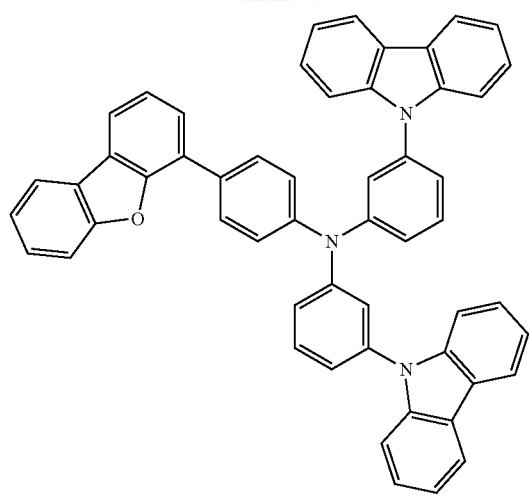
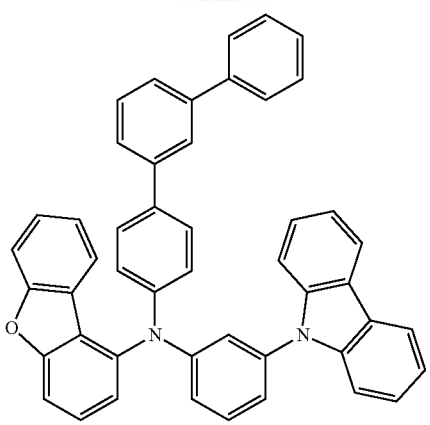
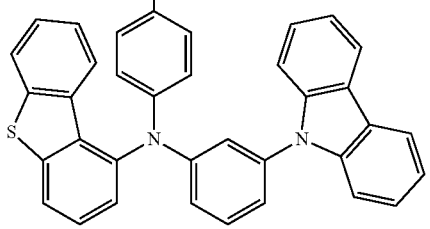
[Formula 17]
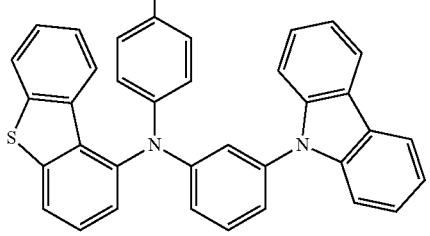
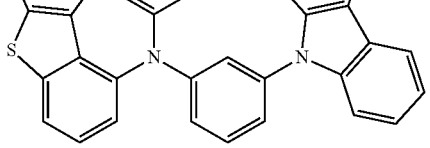

-continued
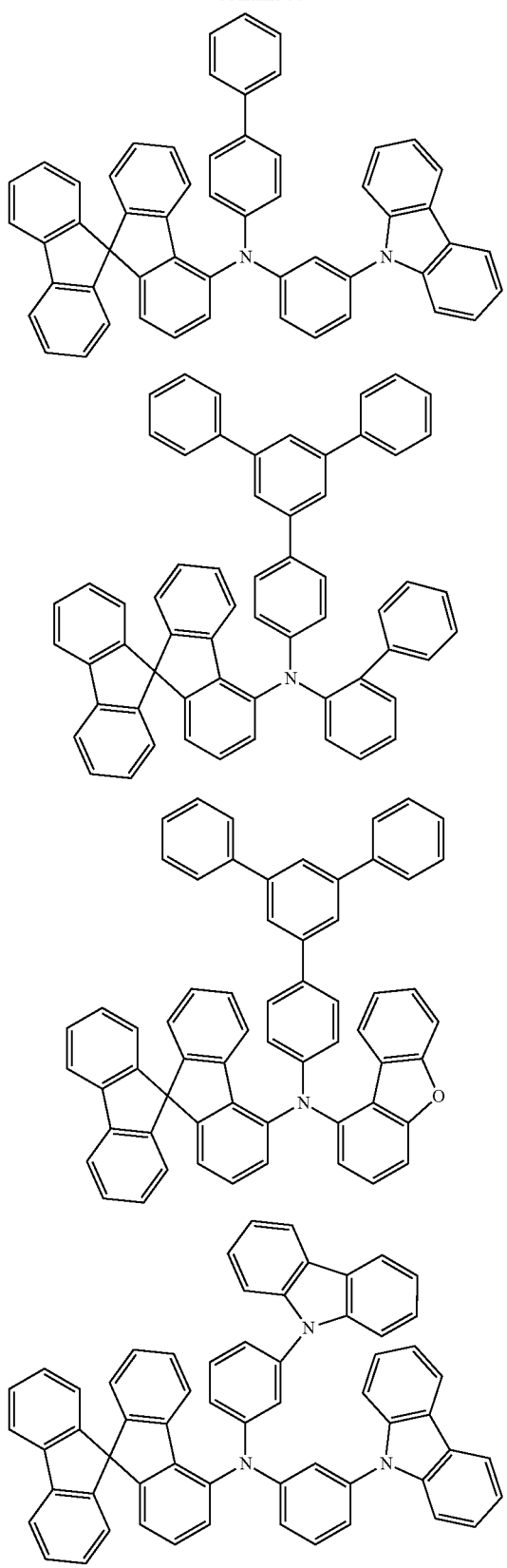
-continued
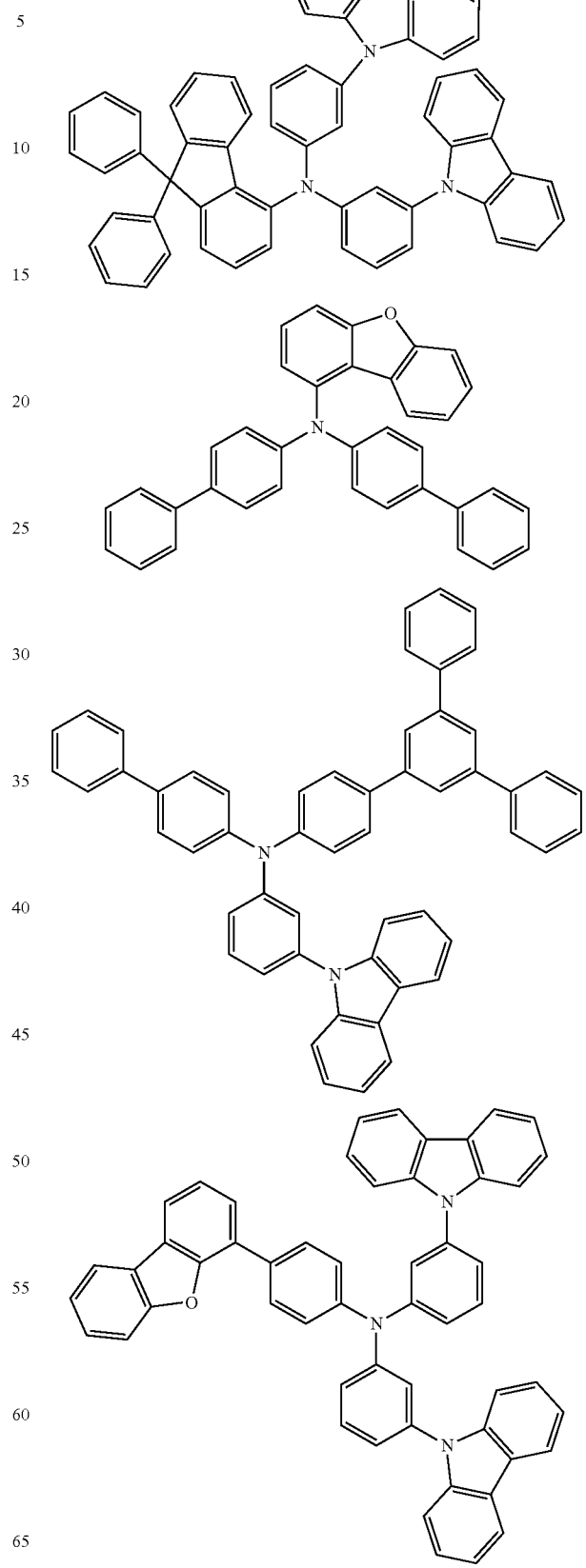

-continued
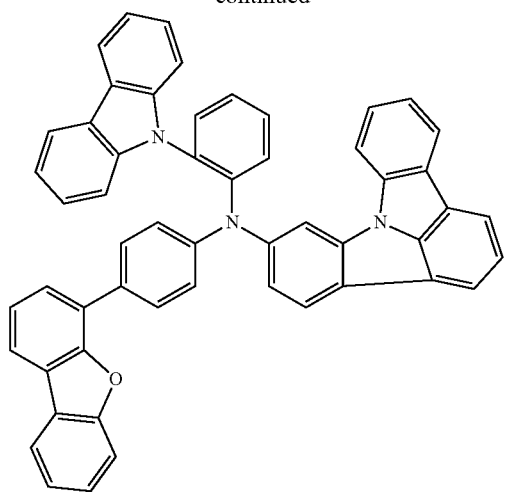
[Formula 18]
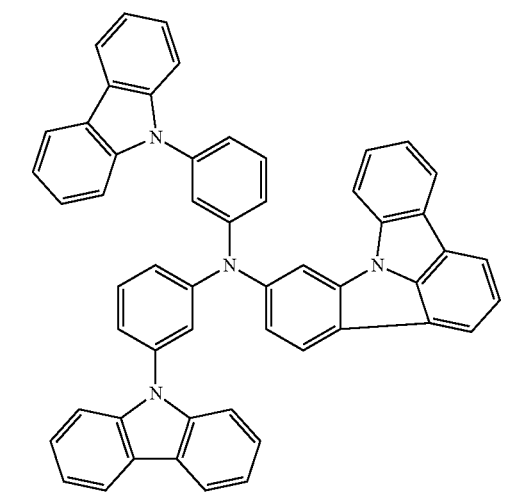
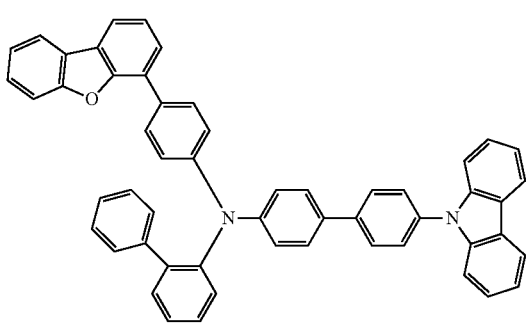
-continued
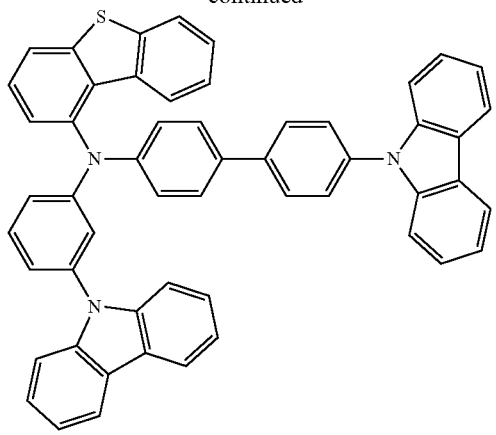
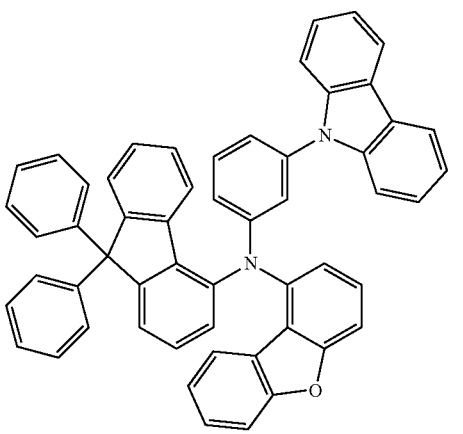
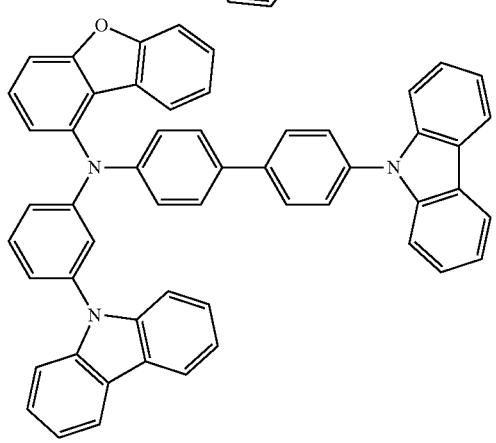
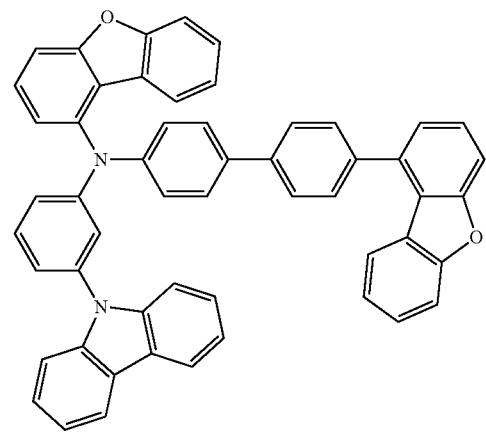

25
-continued
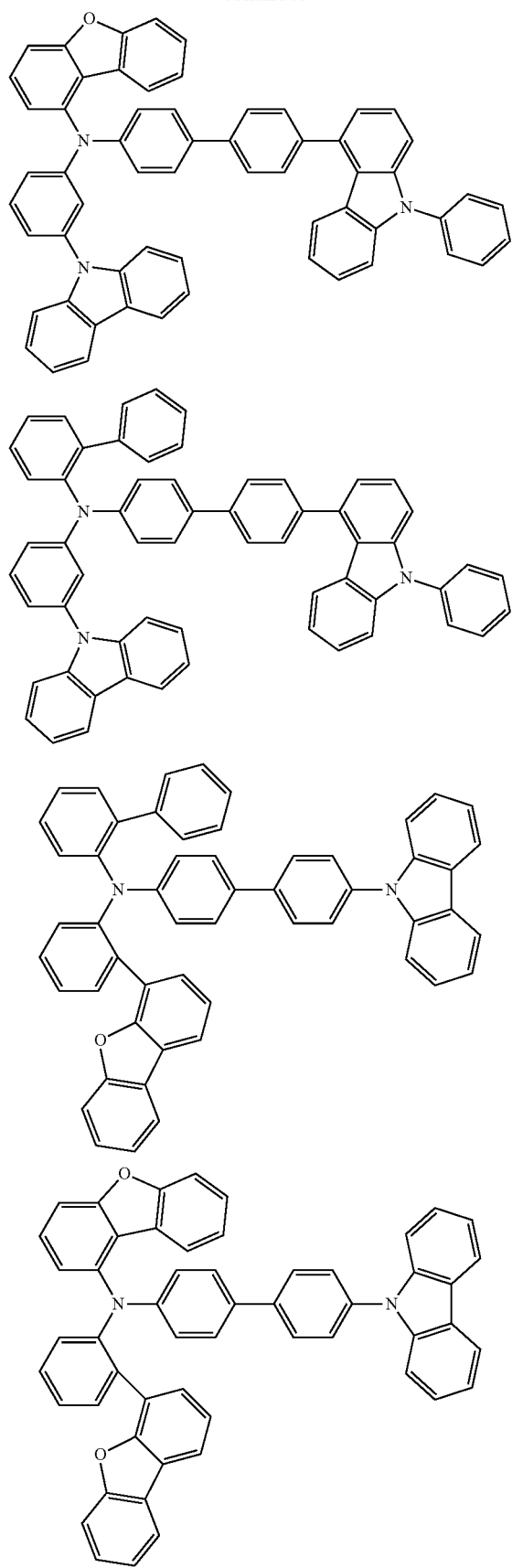
26
-continued
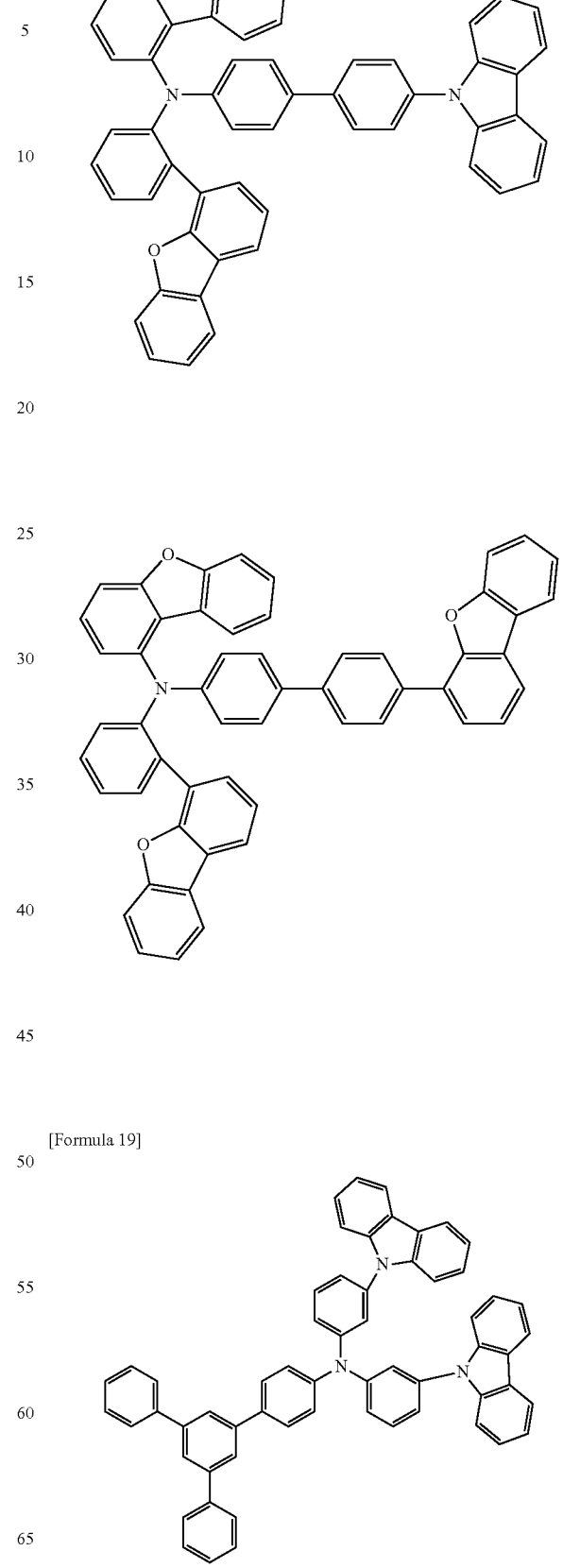
[Formula 19]

[Formula 20]
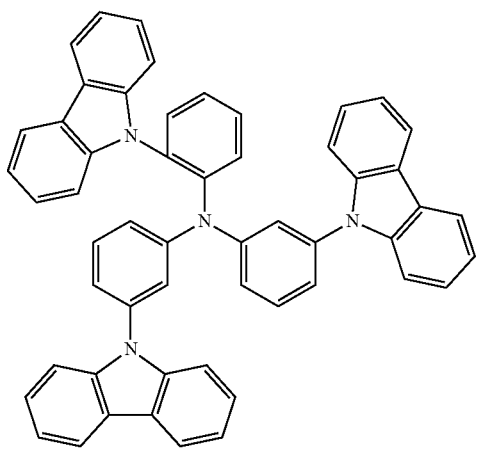
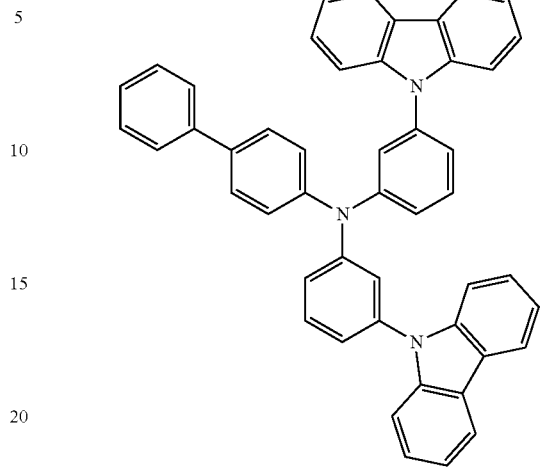
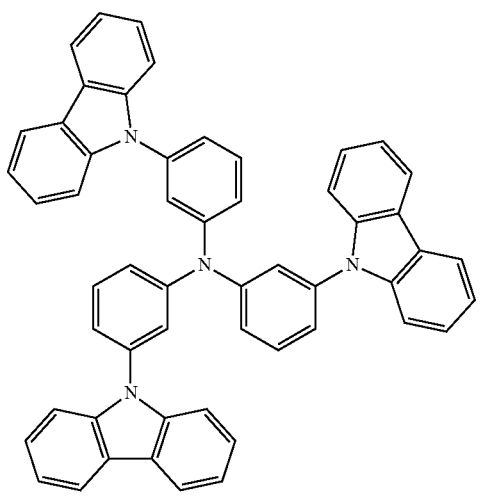
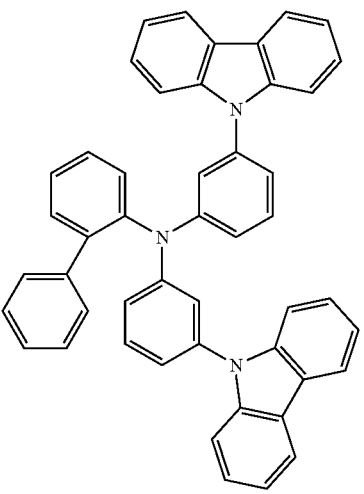
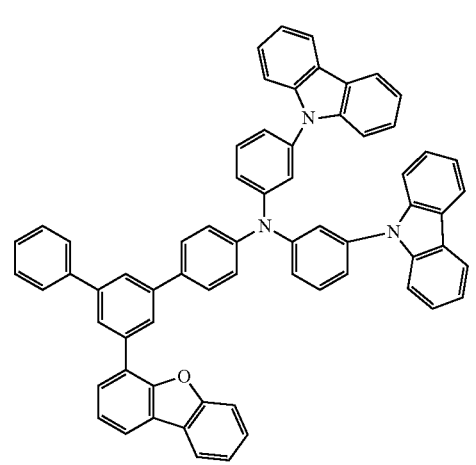
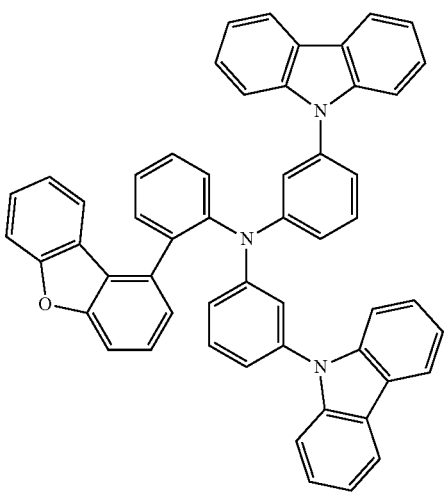

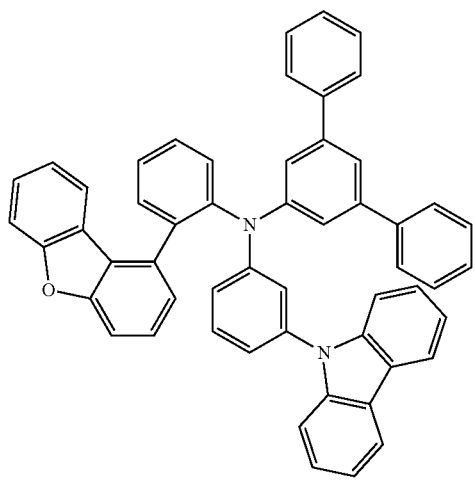

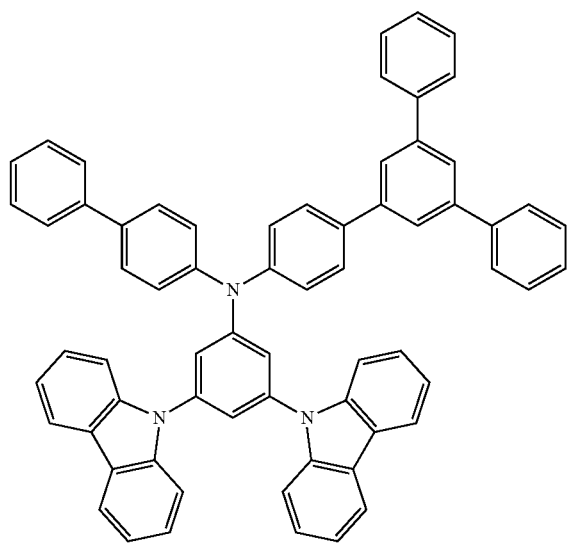

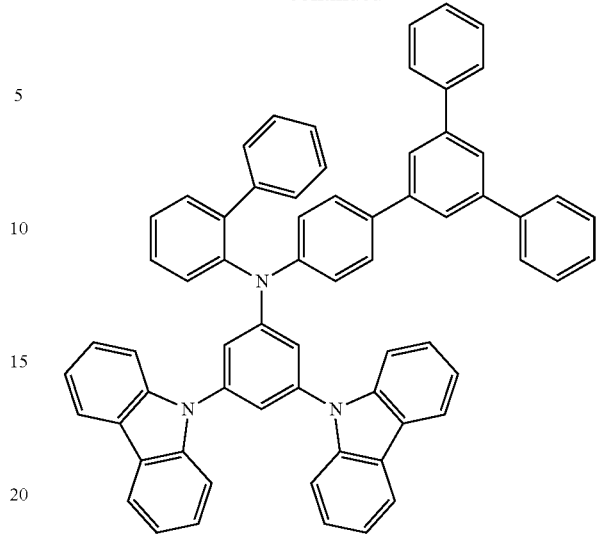

Measurement Method of Compound Represented by Formula (1)

The compound represented by the formula (1) can be manufactured by a known method.

Second Layer

THE second layer 7 contains a compound represented by a formula (2) below.

[Formula 21]

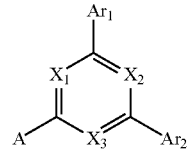

(2)

In the formula (2):

$X_1$ to $X_3$ are each independently a nitrogen atom or $CR_1$, at least one of $X_1$ to $X_3$ is a nitrogen atom;

$R_1$ is a hydrogen atom or a substituent;

$R_1$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

$Ar_1$ and $Ar_2$ are each independently represented by a formula (2A) below, or a substituted or unsubstituted aryl group having 6 to 30 ring carbon atoms, or a substituted or unsubstituted heteroaryl group having 5 to 30 ring atoms; and A is represented by the formula (2A) below.

[Formula 22]

(2A)

In the formula (2A):
HAr is represented by a formula (2B) below;
a is 1, 2, 3, 4 or 5;
when a is 1, $L_1$ is a single bond or a divalent linking group;
when a is 2, 3, 4 or 5, $L_1$ is a trivalent to hexavalent linking group;
a plurality of HAr are the same or different;
the linking group is a group derived from a substituted or unsubstituted aryl group having 6 to 30 ring carbon atoms, a group derived from a substituted or unsubstituted heteroaryl group having 5 to 30 ring atoms, a group derived from a group formed by mutually bonding two groups selected from the group consisting of a substituted or unsubstituted aryl group having 6 to 30 ring carbon atoms and a substituted or unsubstituted heteroaryl group having 5 to 30 ring atoms, or a group derived from a group formed by mutually bonding three groups selected from the group consisting of a substituted or unsubstituted aryl group having 6 to 30 ring carbon atoms and a substituted or unsubstituted heteroaryl group having 5 to 30 ring atoms; and
the mutually bonded groups are the same or different.

[Formula 23]

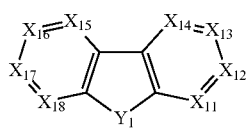
(2B)

In the formula (2B):
$X_{11}$ to $X_{18}$ are each independently a nitrogen atom, $CR_{13}$, or a carbon atom bonded to $L_1$;
a plurality of $R_{13}$ are the same or different;
$Y_1$ is an oxygen atom, a sulfur atom, $NR_{18}$, $SiR_{11}R_{12}$, $CR_{14}R_{15}$, a nitrogen atom bonded to $L_1$, a silicon atom bonded to each of $R_{16}$ and $L_1$, or a carbon atom bonded to each of $R_{17}$ and $L_1$;
among carbon atoms in $X_{11}$ to $X_{18}$, $R_{11}$ to $R_{12}$, and $R_{14}$ to $R_{15}$ as well as a nitrogen atom, a silicon atom, and carbon atoms in $Y_1$, one atom is bonded to $L_1$;
$R_{11}$ and $R_{12}$ are the same or different; $R_{14}$ and $R_{15}$ are the same or different;
$R_{18}$ and $R_{11}$ to $R_{17}$ are each independently a hydrogen atom or a substituent, or at least one pair of a pair of adjacent ones of $R_{13}$, a pair of $R_{11}$ and $R_{12}$, or a pair of $R_{14}$ and $R_{15}$ are bonded to each other to form a ring; and
$R_{18}$ and $R_{11}$ to $R_{17}$ serving as the substituent are each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms.

When $Y_1$ is a silicon atom bonded to both $R_{16}$ and $L_1$, the formula (2B) is represented by a formula (2B-1). In the formula (2B-1), $X_{11}$ to $X_{18}$ represent the same as $X_{11}$ to $X_{18}$ in the formula (2B).

When $Y_1$ is a carbon atom bonded to both $R_{17}$ and $L_1$, the formula (3B) is represented by a formula (2B-2). In the formula (2B-2), $X_{11}$ to $X_{18}$ represent the same as $X_{11}$ to $X_{18}$ in the formula (2B).

[Formula 24]

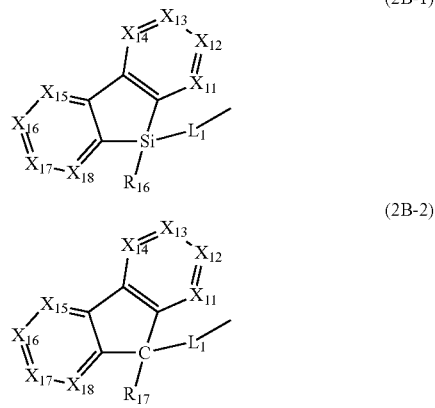

(2B-1)

(2B-2)

In the formula (2B), it is also preferable that $L_1$ serving as the linking group is a divalent to hexavalent residue derived from a substituted or unsubstituted aryl group having 6 to 30 ring carbon atoms.

In the formula (2A), a is preferably 1, 2, or 3, more preferably 1 or 2.

When a is 1, $L_1$ is a divalent linking group, whereby the formula (2A) is represented by a formula (2A-1).

When a is 2, 3, 4 or 5, $L_1$ is a trivalent to hexavalent linking group. When a is 2, $L_1$ is a trivalent linking group, whereby the formula (2A) is represented by a formula (2A-2). At this time, HAr are the same or different.

[Formula 25]

(2A-1)

(2A-2)

In the formulae (2A-1) to (2A-2): $L_1$ is a divalent or trivalent linking group. This linking group is a group derived from a substituted or unsubstituted aryl group having 6 to 30 ring carbon atoms, a group derived from a substituted or unsubstituted heteroaryl group having 5 to 30 ring atoms, a group derived from a group formed by mutually bonding two groups selected from the group consisting of a substituted or unsubstituted aryl group having 6 to 30 ring carbon atoms and a substituted or unsubstituted heteroaryl group having 5 to 30 ring atoms, or a group derived from a group formed by mutually bonding three groups selected from the group consisting of a substituted or unsubstituted aryl group having 6 to 30 ring carbon atoms and a substituted or unsubstituted heteroaryl group having 5 to 30 ring atoms.

The group formed by bonding two or three of the above groups as $L_1$ in the above formulae (2A), (2A-1) and (2A-2) means a group formed by bonding two or three divalent or trivalent residues through a single bond, the two or three divalent or trivalent residues being derived from the aryl group having 6 to 30 ring carbon atoms and the heteroaryl group having 5 to 30 ring atoms. The mutually bonded groups in the linking group are the same or different.

In the formulae (2A), (2A-1) and (2A-2), it is preferable that $L_1$ serving as the linking group is a substituted or unsubstituted aryl group having 6 to 30 ring carbon atoms or a substituted or unsubstituted heteroaryl group having 5 to 30 ring atoms.

In the formulae (2A), (2A-1) and (2A-2), it is also preferable that $L_1$ serving as the linking group is a divalent or trivalent residue derived from benzene, biphenyl, terphenyl, naphthalene, and phenanthrene.

In the formula (2A), it is also preferable that a is 1 or 2 and $L_1$ is a divalent or trivalent linking group.

In the formula (2A), it is also preferable that a is 1 and $L_1$ is the linking group, in which $L_1$ as the linking group is a divalent residue derived from a substituted or unsubstituted aryl group having 6 to 30 ring carbon atoms or a divalent residue derived from a substituted or unsubstituted heteroaryl group having 5 to 30 ring atoms.

In the formula (2A), it is also preferable that a is 2 and $L_1$ is the linking group, in which $L_1$ serving as the linking group is a trivalent residue derived from a substituted or unsubstituted aryl group having 6 to 30 ring carbon atoms or a trivalent residue derived from a substituted or unsubstituted heteroaryl group having 5 to 30 ring atoms.

In the formula (2A), $L_1$ is also preferably a single bond.

In the formula (2B), it is also preferable that $X_{13}$ or $X_{16}$ is a carbon atom bonded to $L_1$.

In the formula (2B), $Y_1$ is preferably $NR_{18}$, an oxygen atom, a sulfur atom, $CR_{14}R_{15}$, or a nitrogen atom bonded to $L_1$.

In the formula (2B), $Y_1$ is also preferably $CR_{14}R_{15}$.

When $Y_1$ is $CR_{14}R_{15}$, it is preferable that one of $X_{11}$ to $X_{18}$ is a carbon atom bonded to $L_1$ and the rest of $X_{11}$ to $X_1$ are a nitrogen atom or $CR_{13}$.

In the formula (2B), it is also preferable that $Y_1$ is $NR_{18}$ or a nitrogen atom bonded to $L_1$. When $Y_1$ is $NR_{18}$, it is preferable that one of $X_{11}$ to $X_{18}$ is a carbon atom bonded to $L_1$ and the rest of $X_{11}$ to $X_{18}$ are each a nitrogen atom or $CR_{13}$. When $Y_1$ is a nitrogen atom bonded to $L_1$, it is preferable that $X_{11}$ to $X_{18}$ are each independently a nitrogen atom or $CR_{13}$.

In the formula (2B), $Y_1$ is preferably an oxygen atom or a sulfur atom, more preferably an oxygen atom.

In the formula (2B), it is also preferable that $Y_1$ is an oxygen atom or a sulfur atom, one of $X_{11}$ to $X_{18}$ is a carbon atom bonded to $L_1$ and the rest of $X_{11}$ to $X_1$ are each $CR_{13}$.

In the formula (2B), it is more preferable that $Y_1$ is an oxygen atom, $X_{11}$ and $X_{18}$ are $CR_{13}$, one of $X_{12}$ to $X_{17}$ is a carbon atom bonded to $L_1$, and the rest of $X_{12}$ to $X_{17}$ are $CR_{13}$.

In the formula (2), it is preferable that two or three of $X_1$ to $X_3$ are nitrogen atoms.

When two of $X_1$ to $X_3$ are nitrogen atoms, it is preferable that $X_1$ and $X_2$ are nitrogen atoms and $X_3$ is $CR_1$.

In the formula (2), it is more preferable that $X_1$ and $X_2$ are each a nitrogen atom and $X_3$ is $CR_1$, in which $R_1$ is a hydrogen atom. In this case, the third compound is represented by a formula (21) below.

[Formula 26]

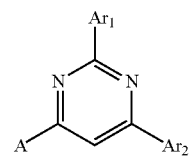

(21)

In the formula (21), A, $Ar_1$, and $Ar_2$ represent the same as A, $Ar_1$, and $Ar_2$ in the formula (2).

Specific examples of the compound represented by the formula (2) are shown below. It should be noted that the compound represented by the formula (2) in the invention is not limited to the specific examples.

[Formula 27]

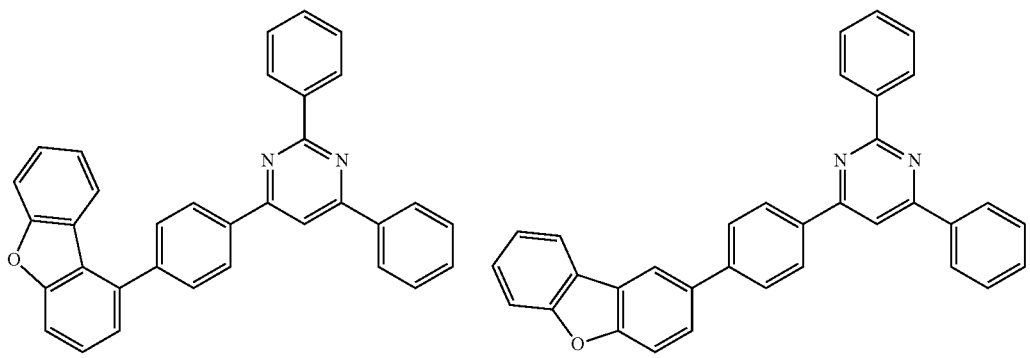

-continued
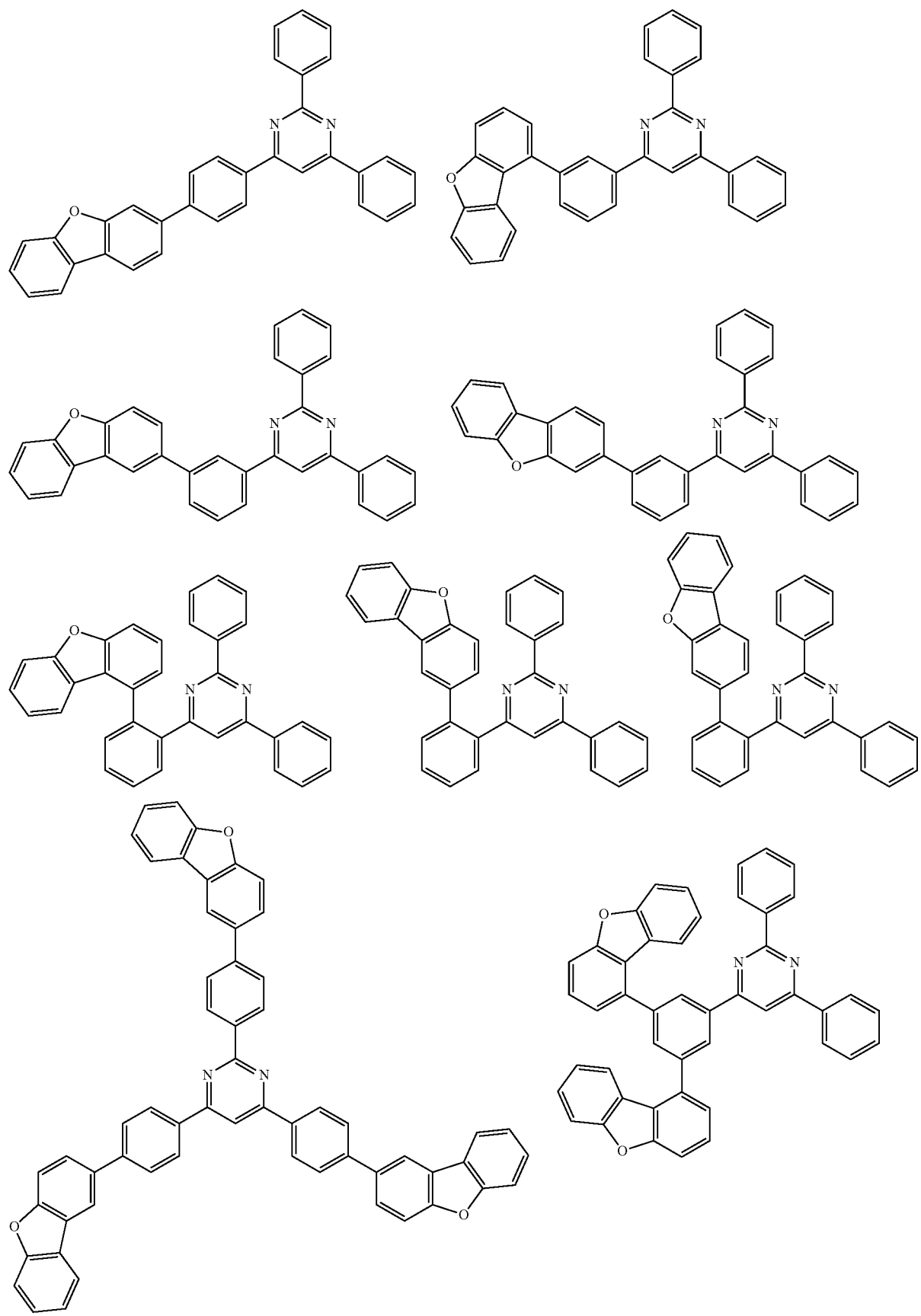

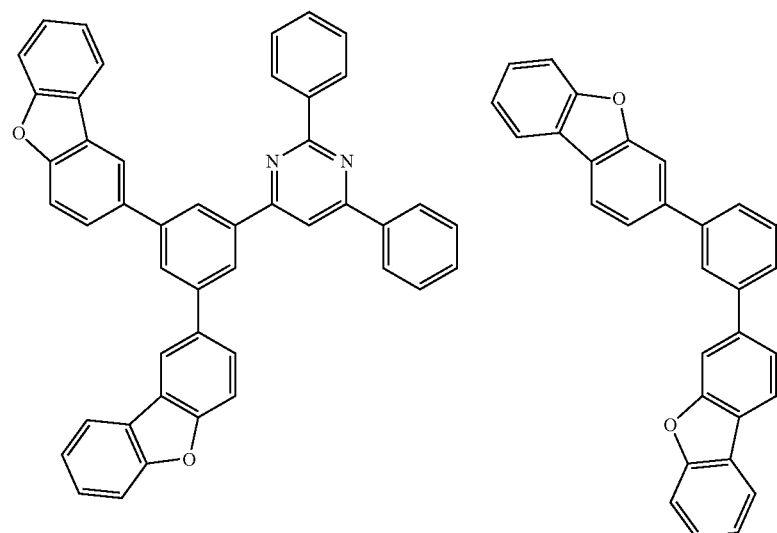
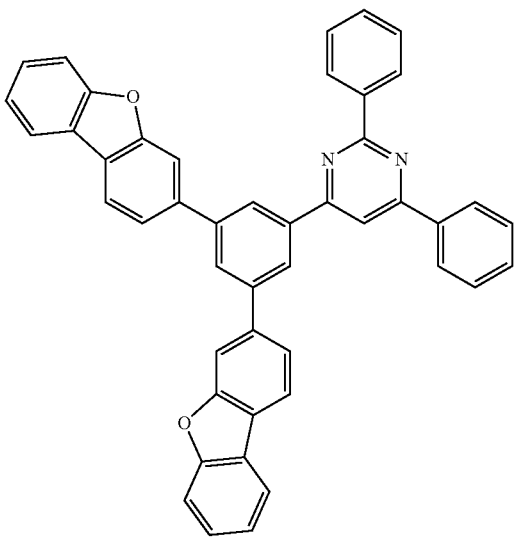
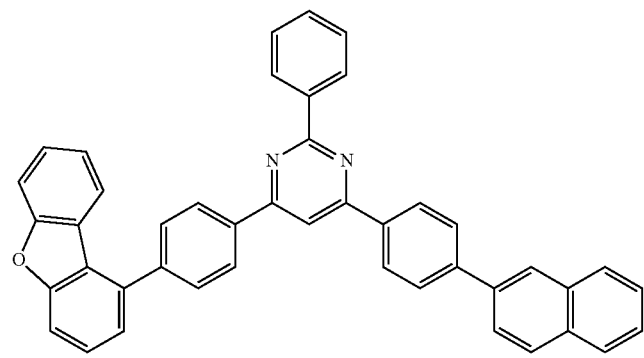
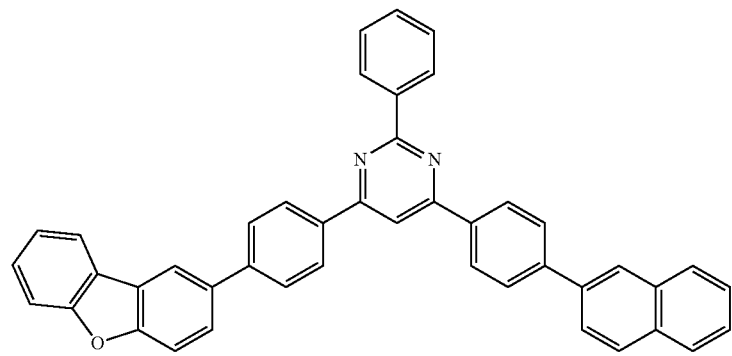
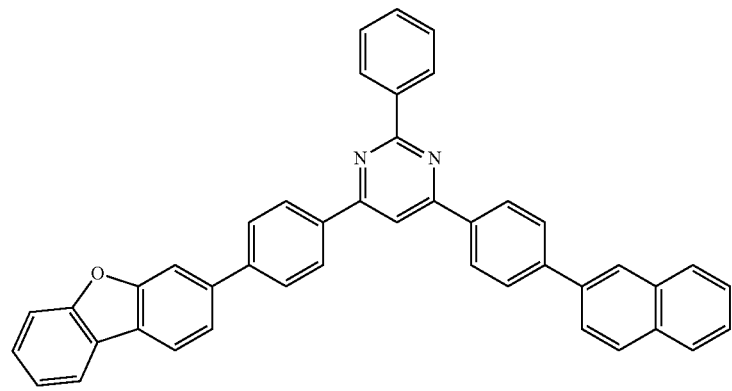

-continued
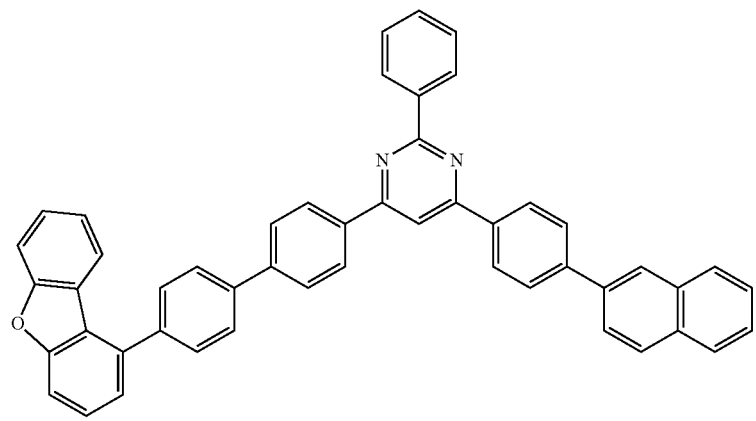
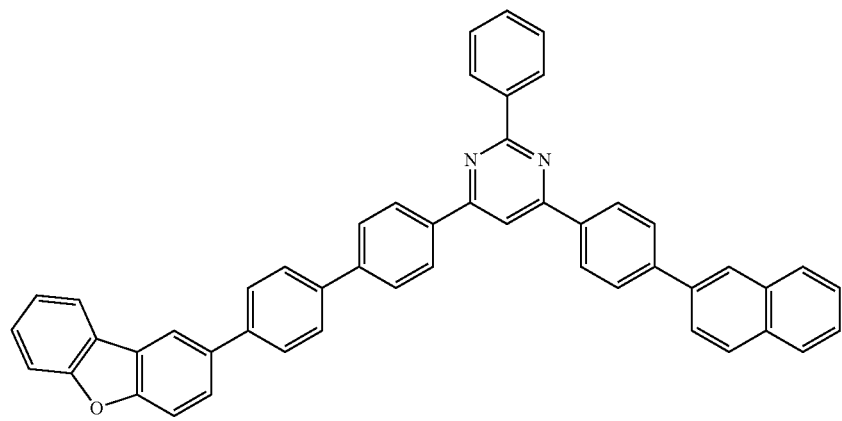
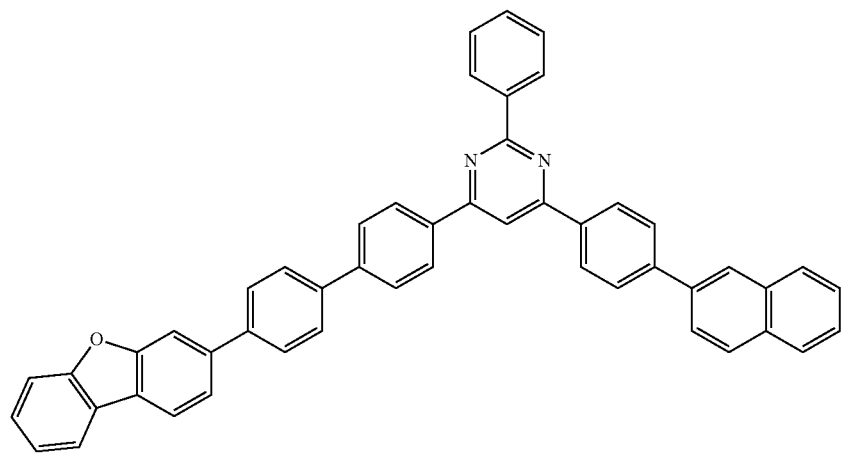
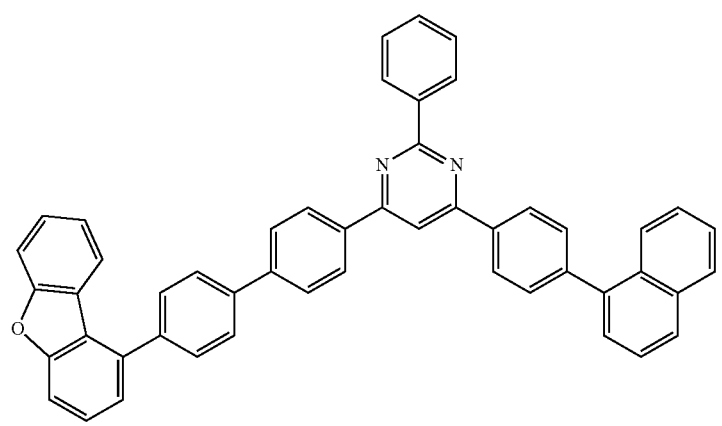

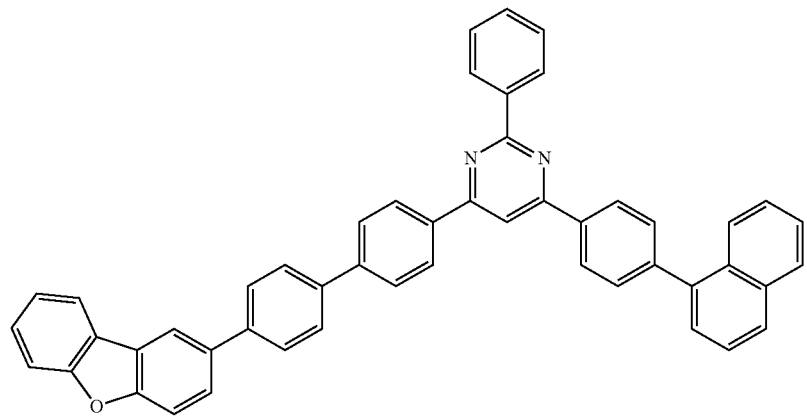
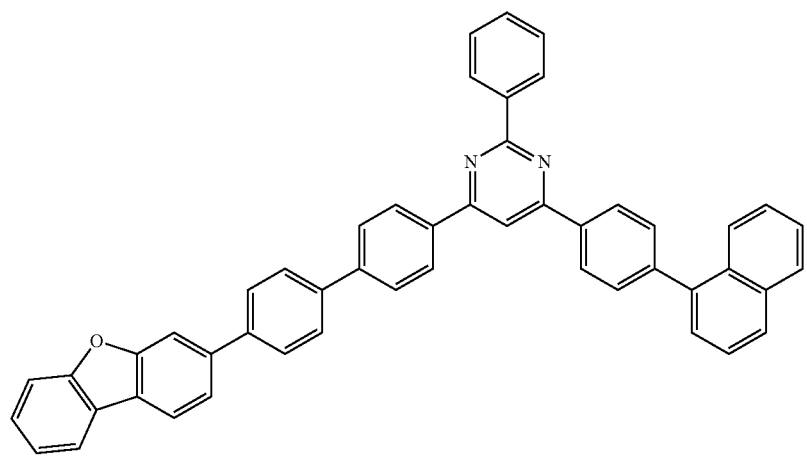
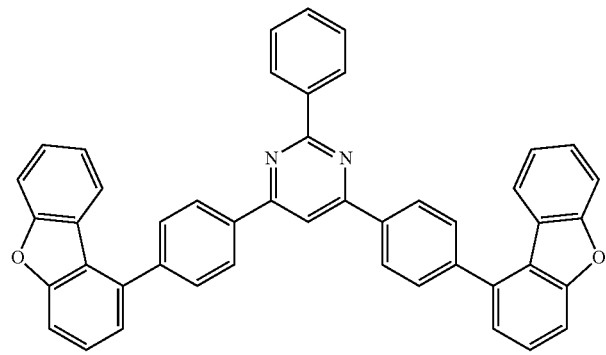
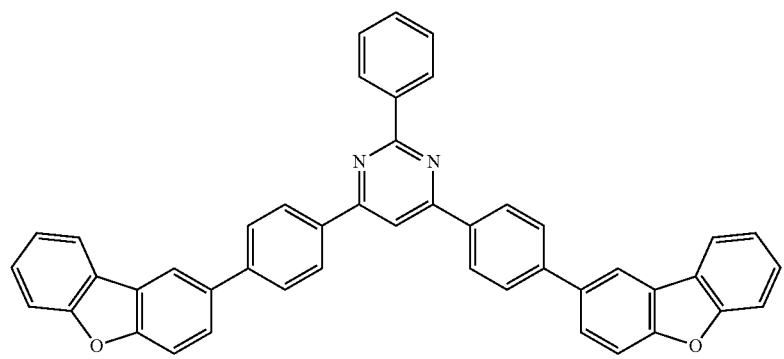

-continued
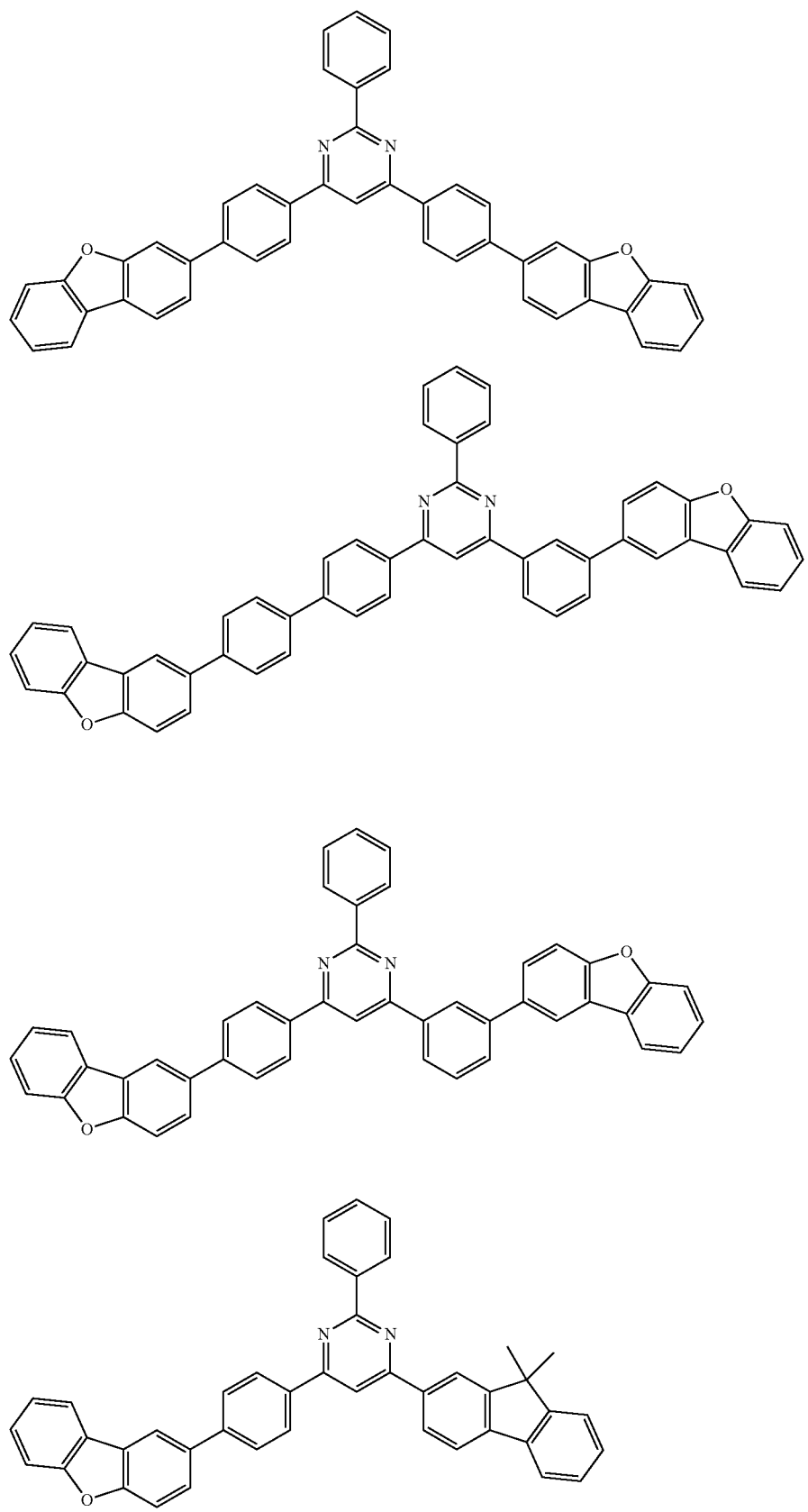

[Formula 28]
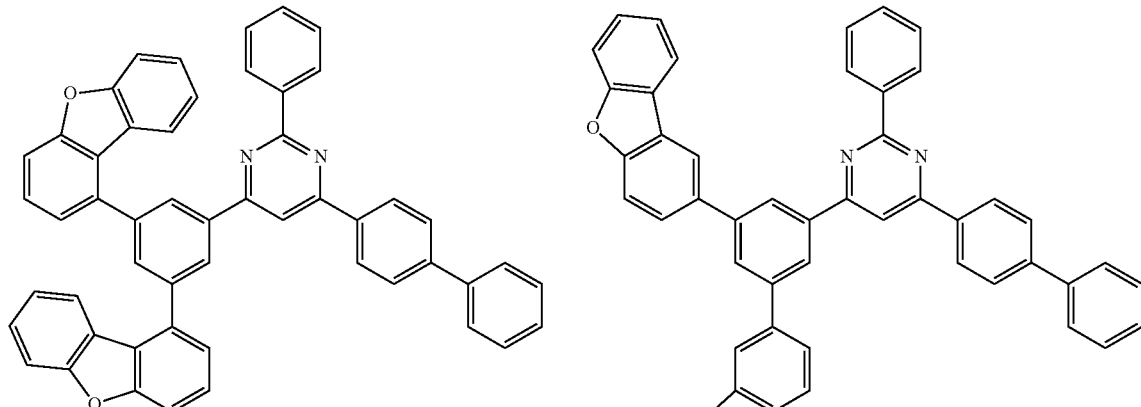
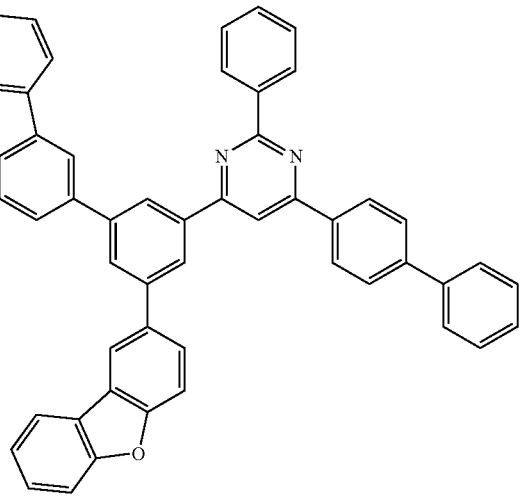
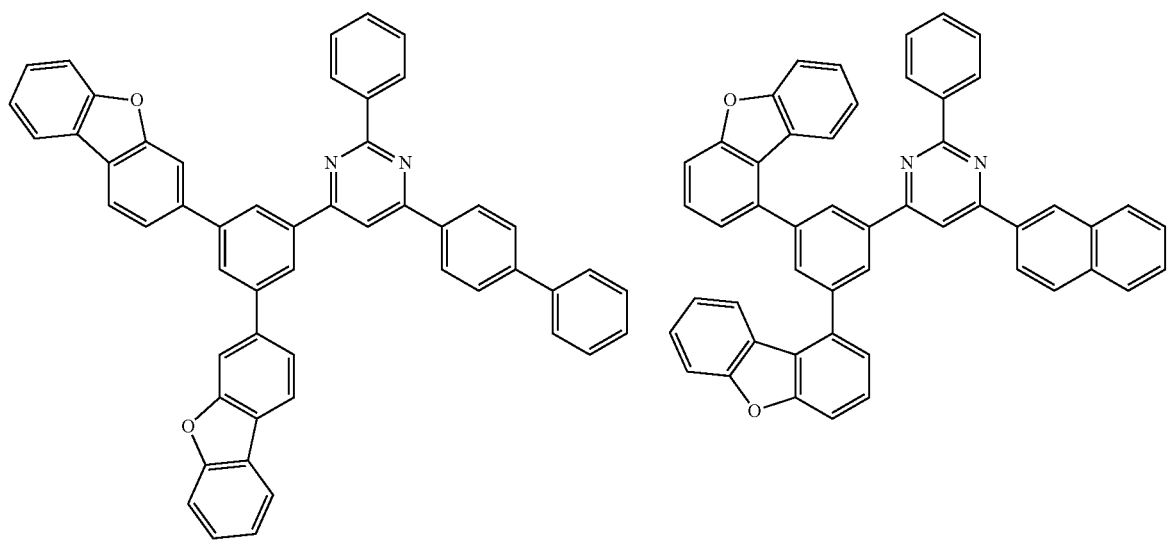
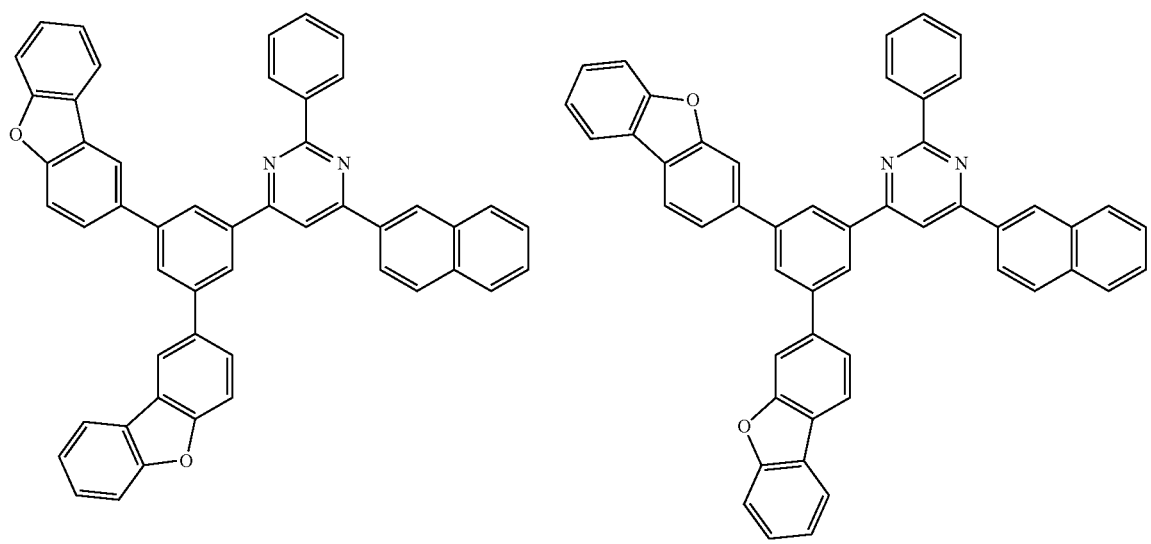

[Formula 29]
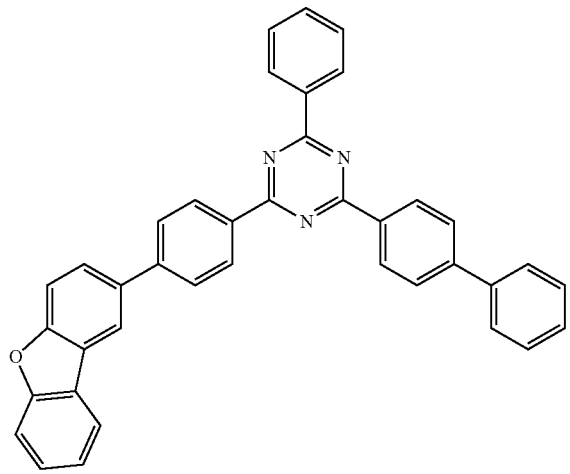
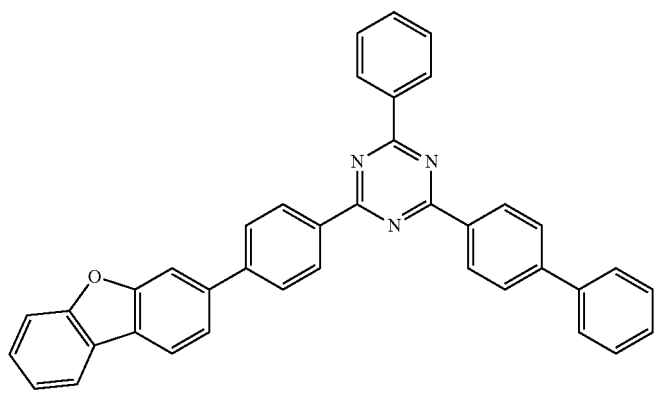
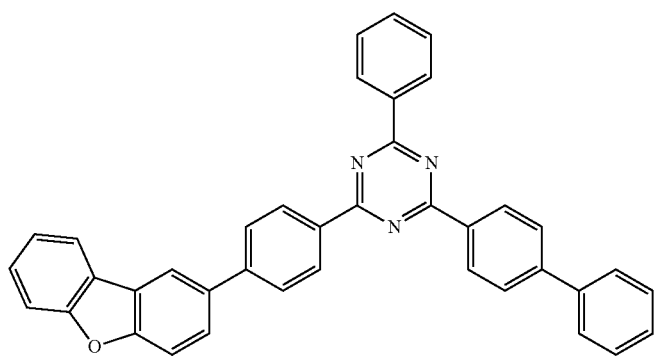

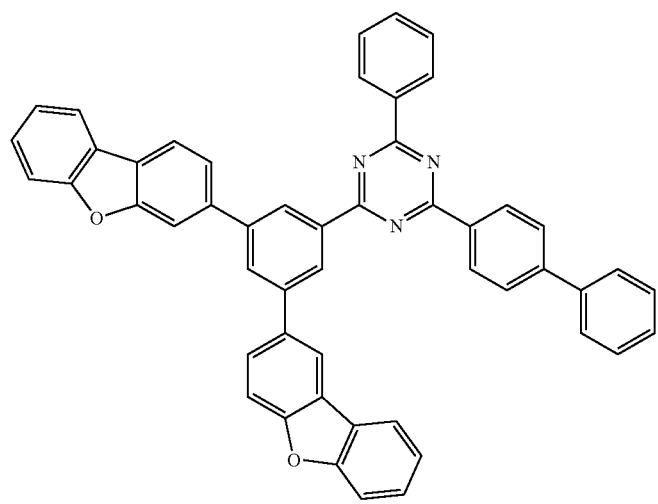
[Formula 30]
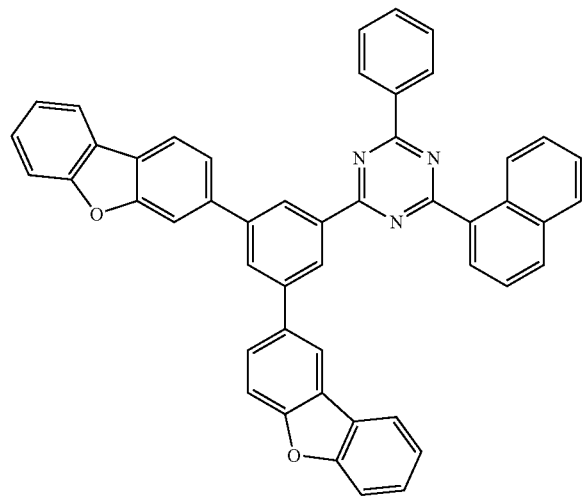
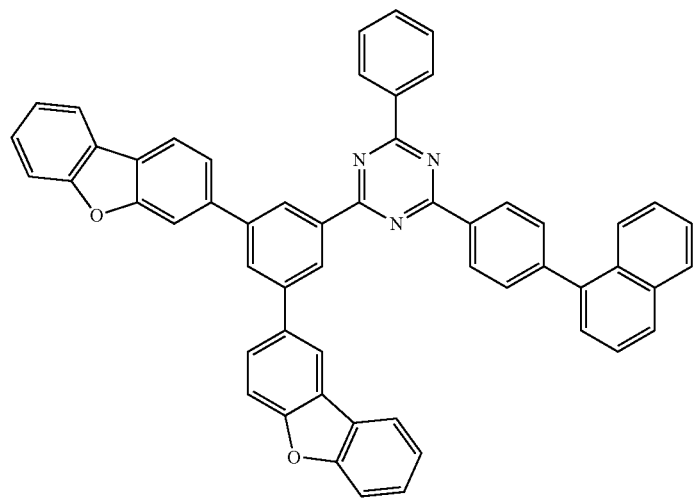

-continued
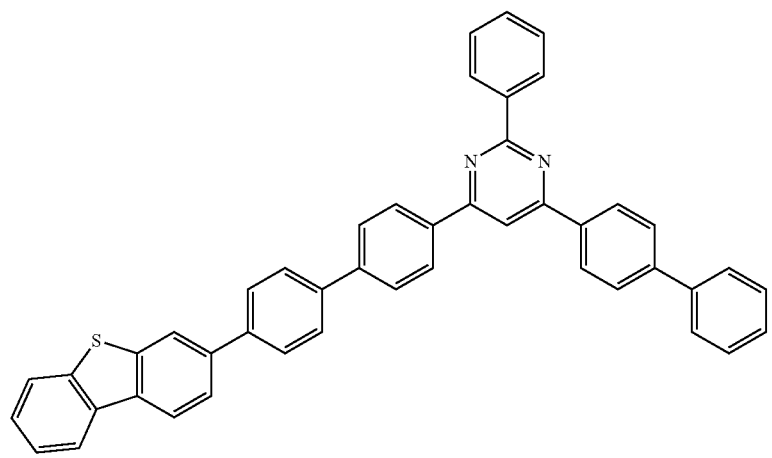
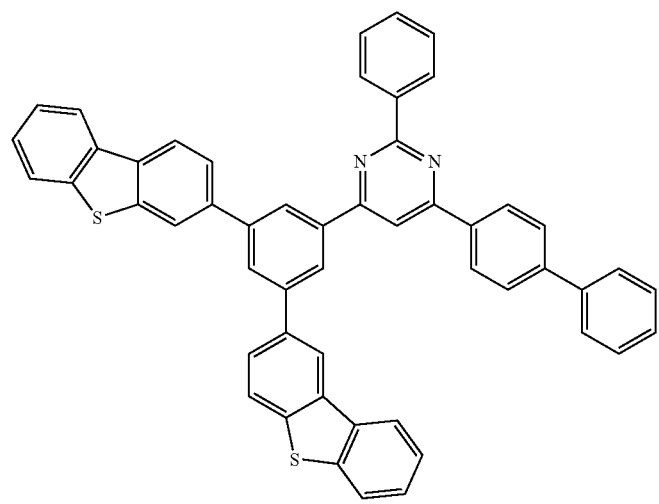
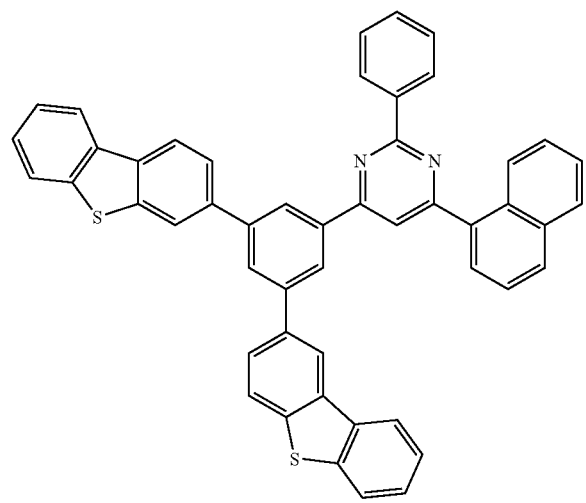

[Formula 31]
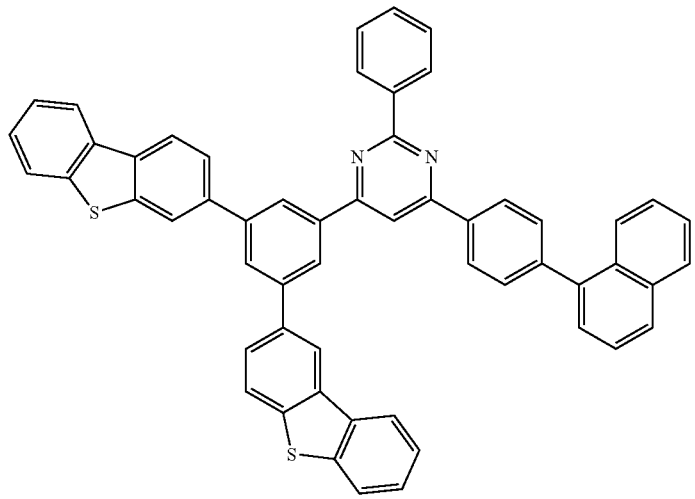
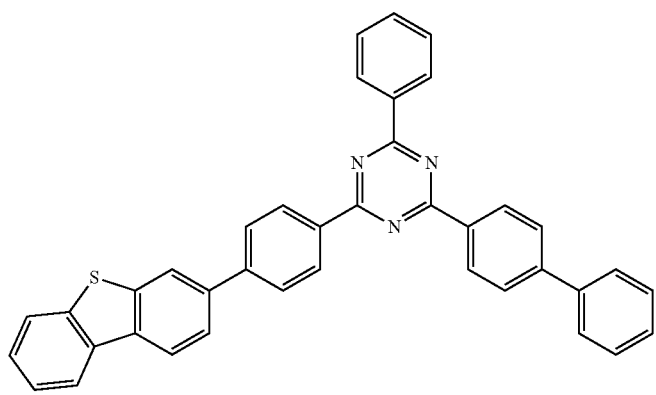
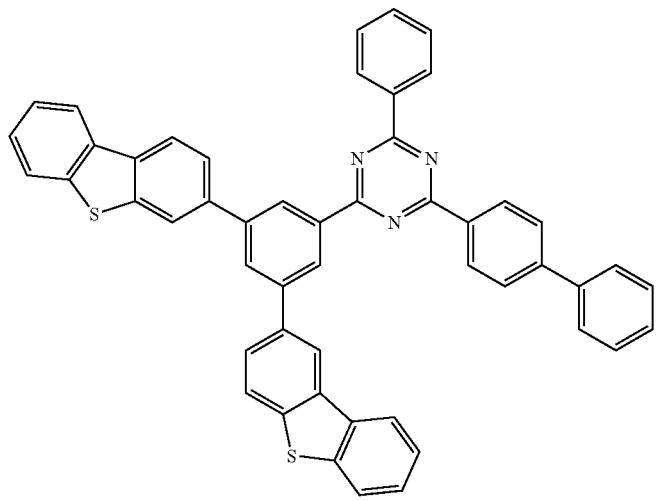

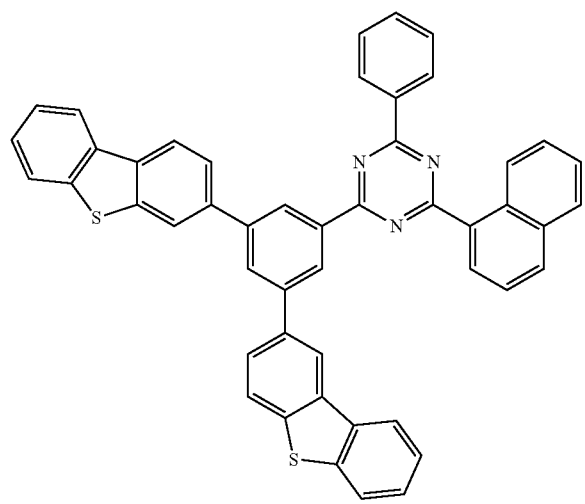
[Formula 32]
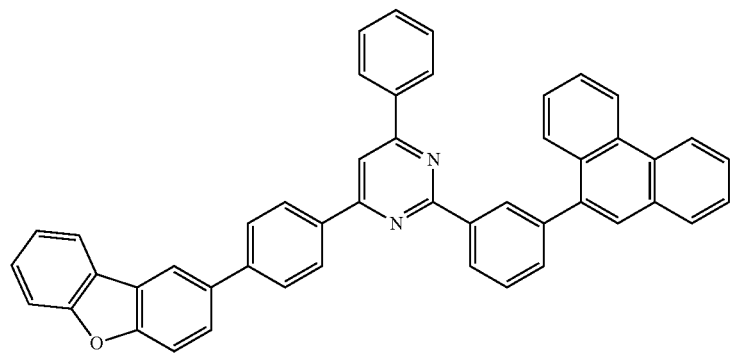
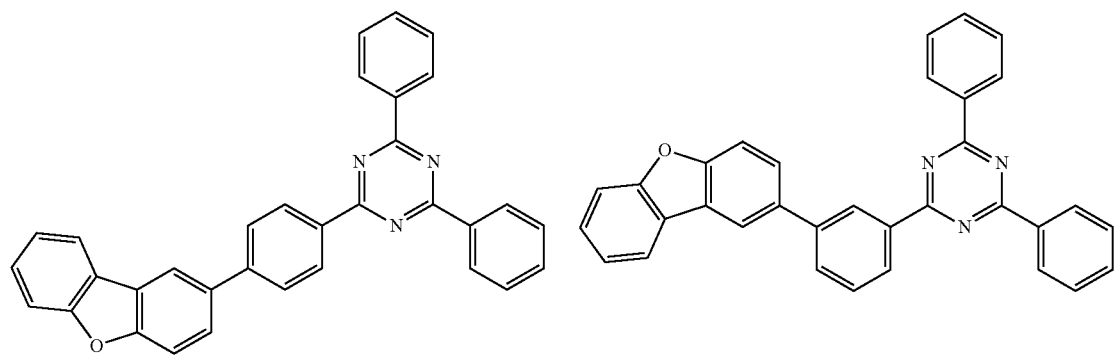

-continued
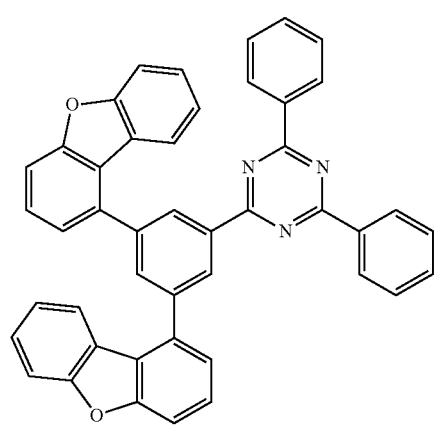
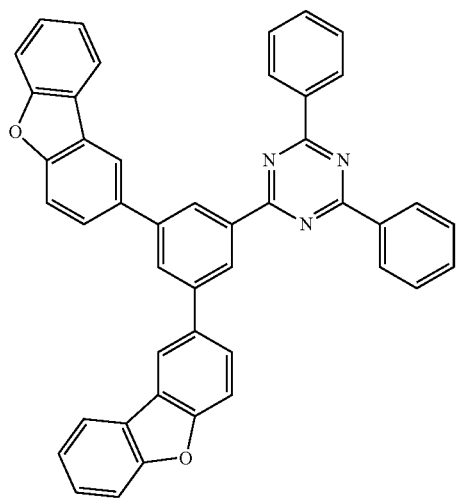
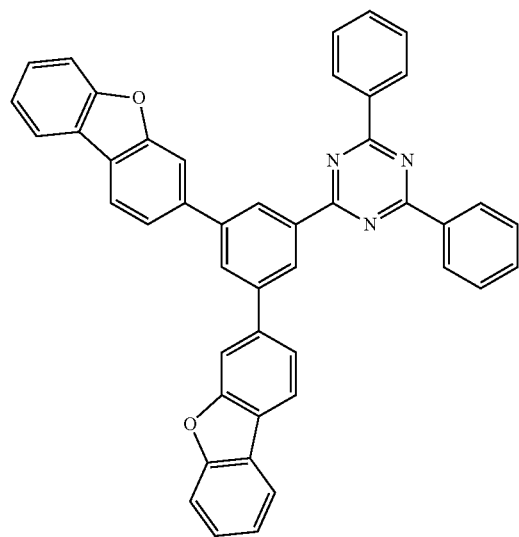
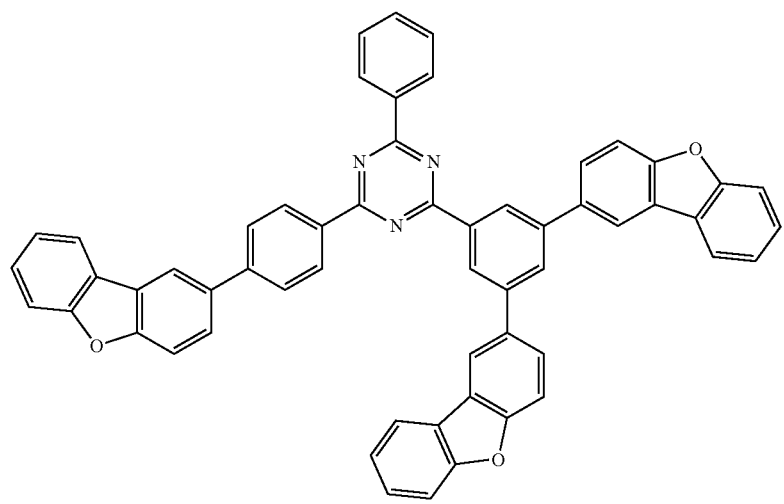

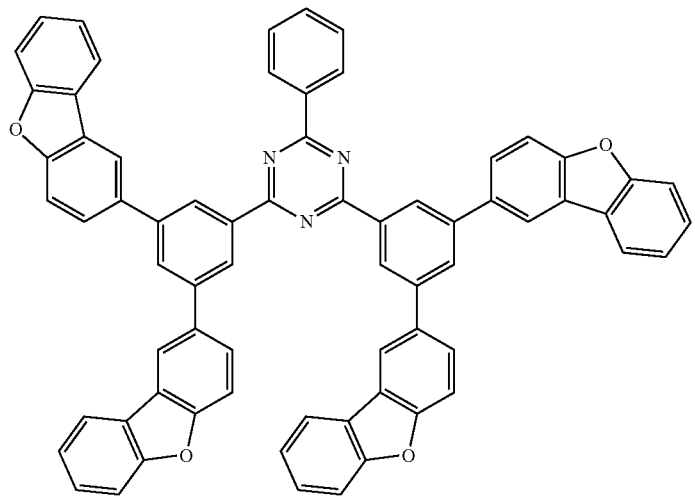
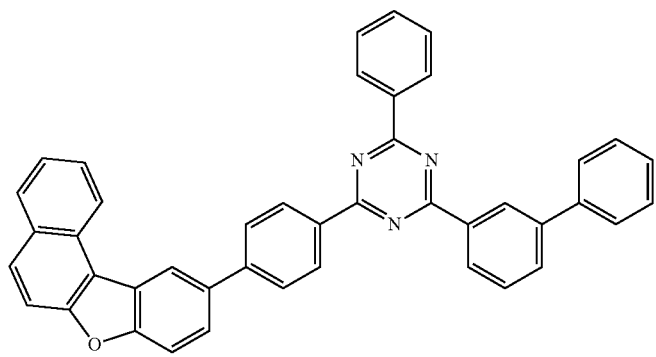
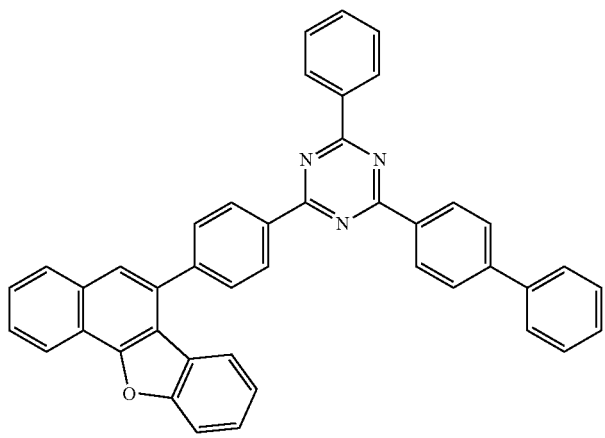
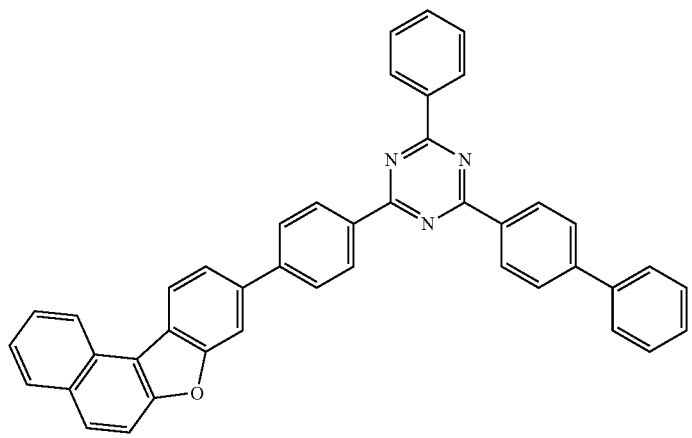

-continued
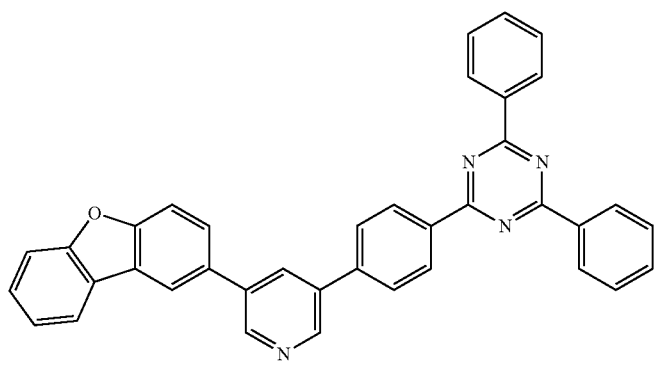
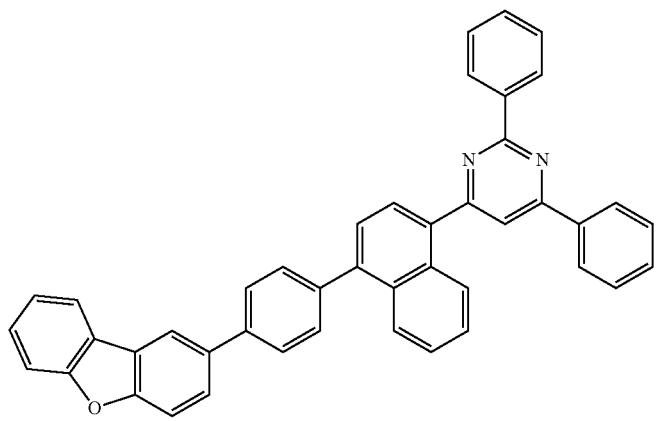
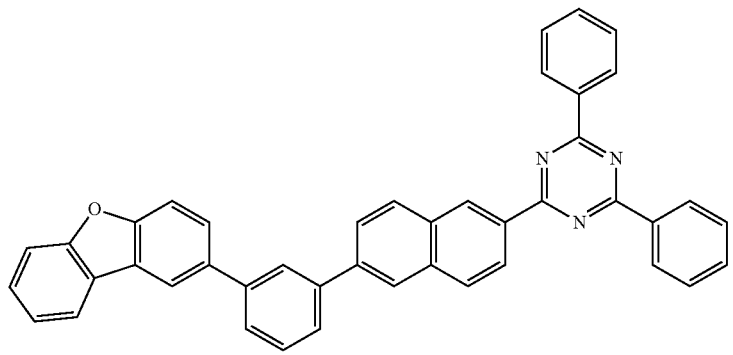
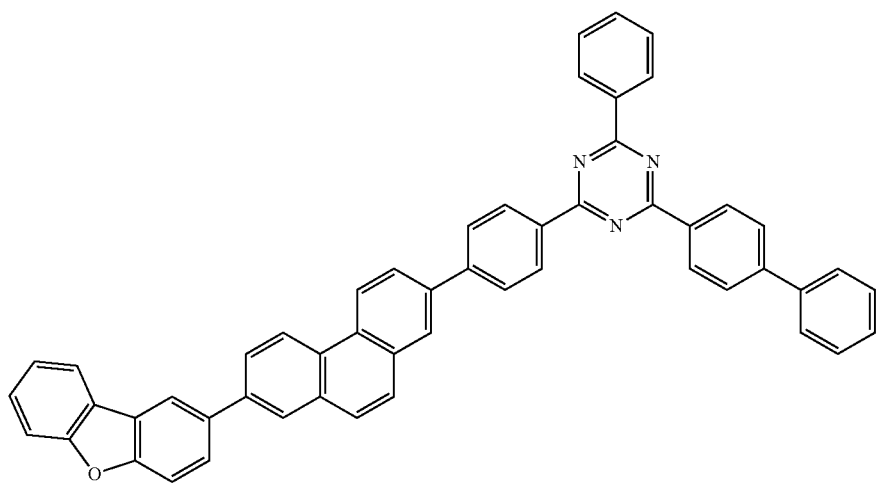

-continued
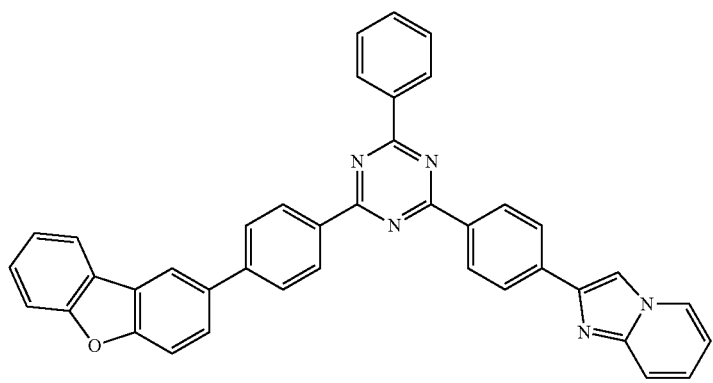
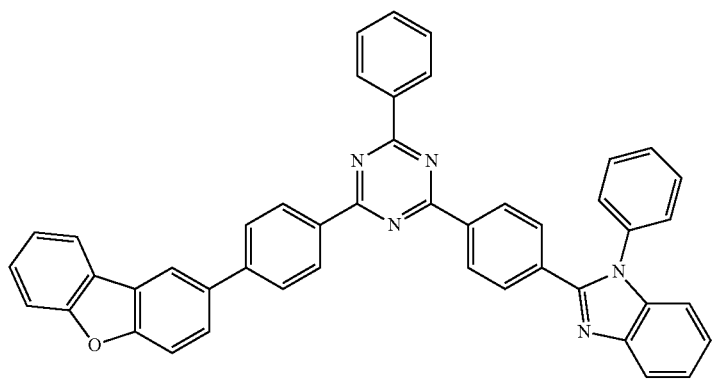
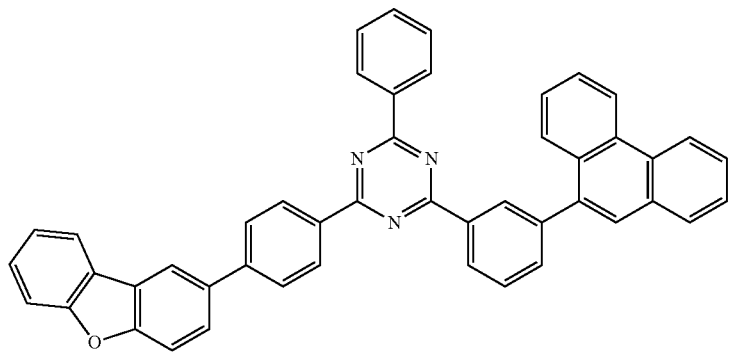
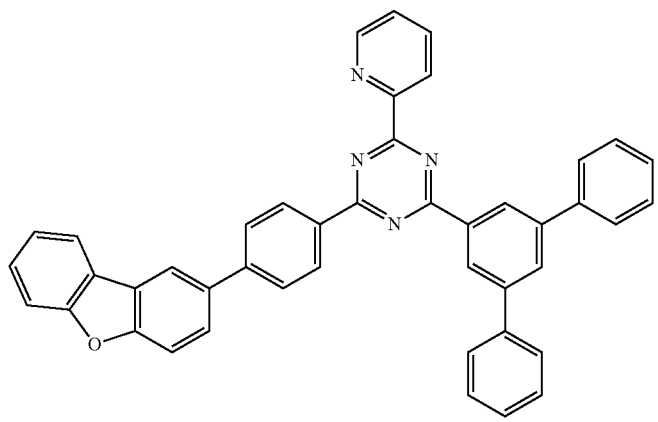

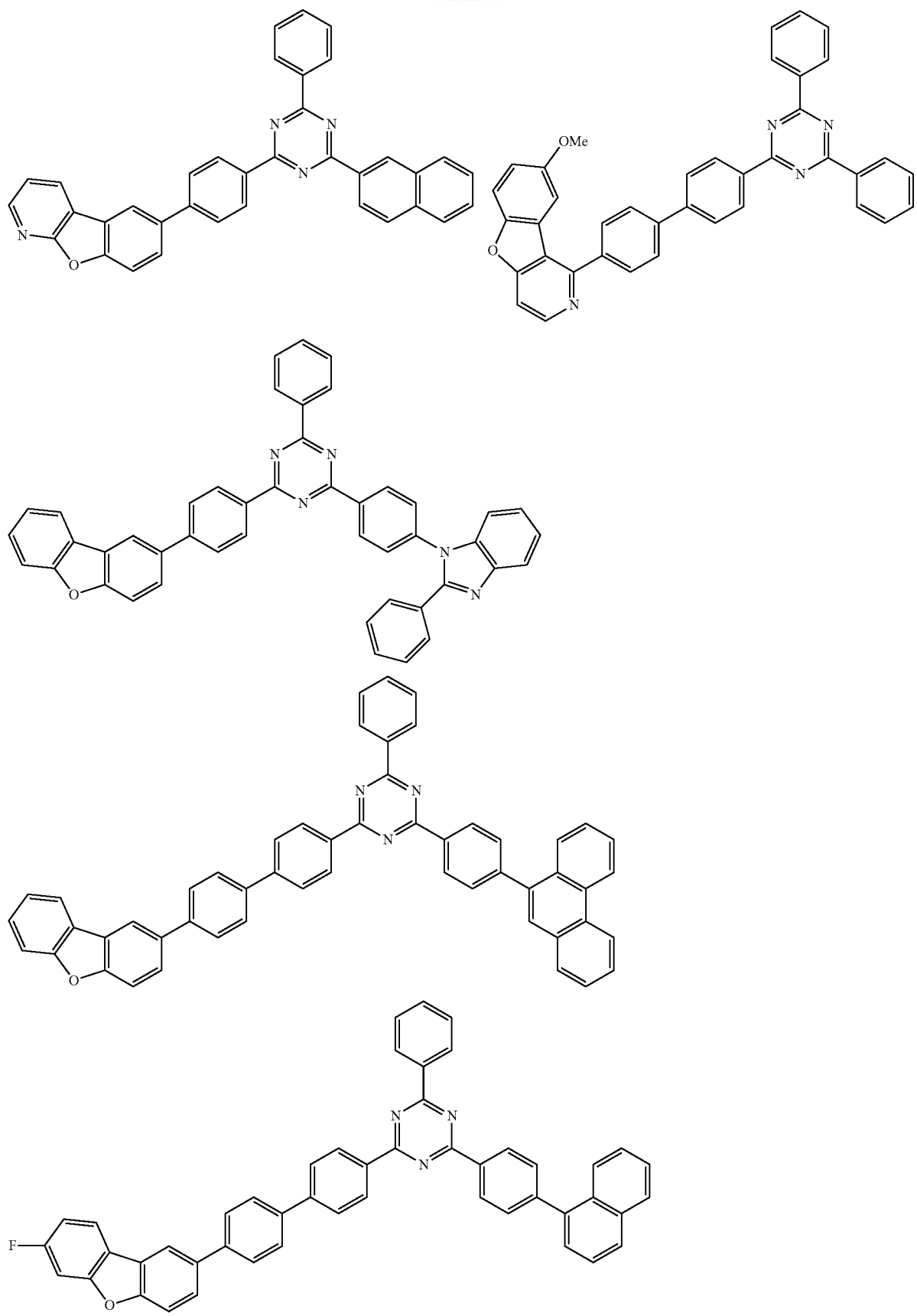

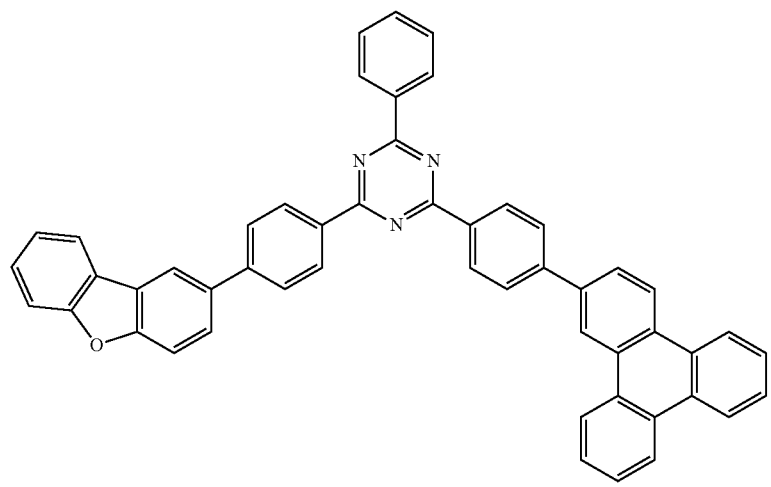
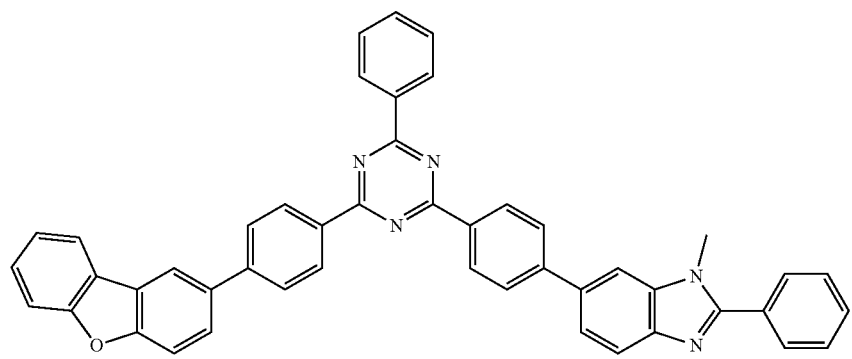
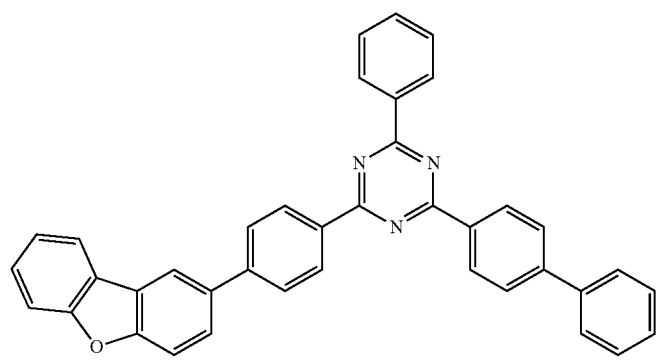
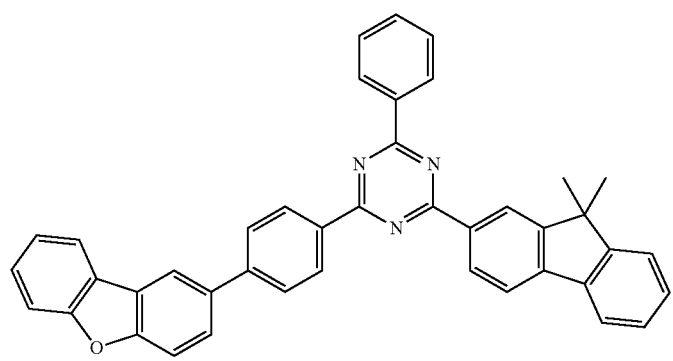

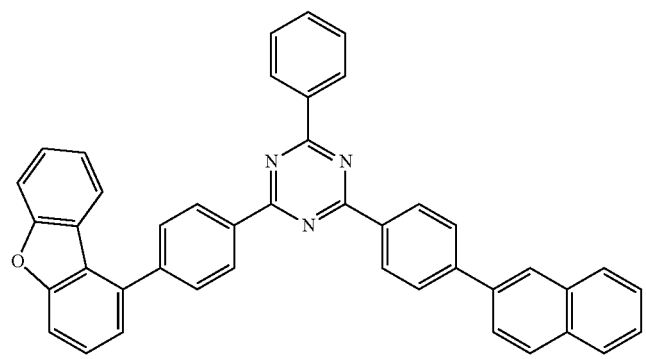
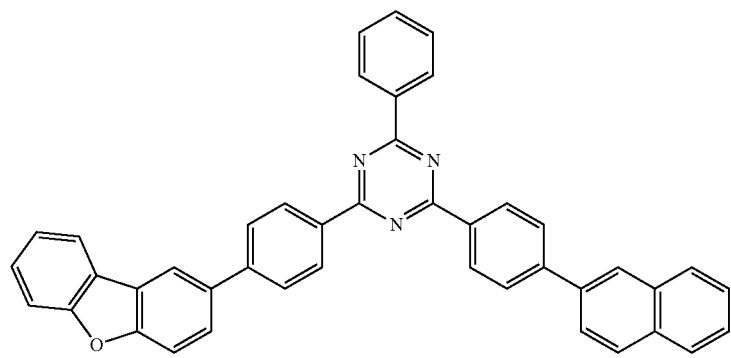
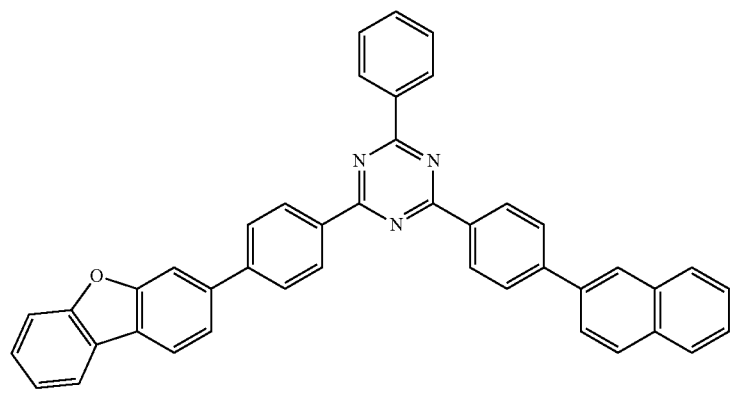
[Formula 33]
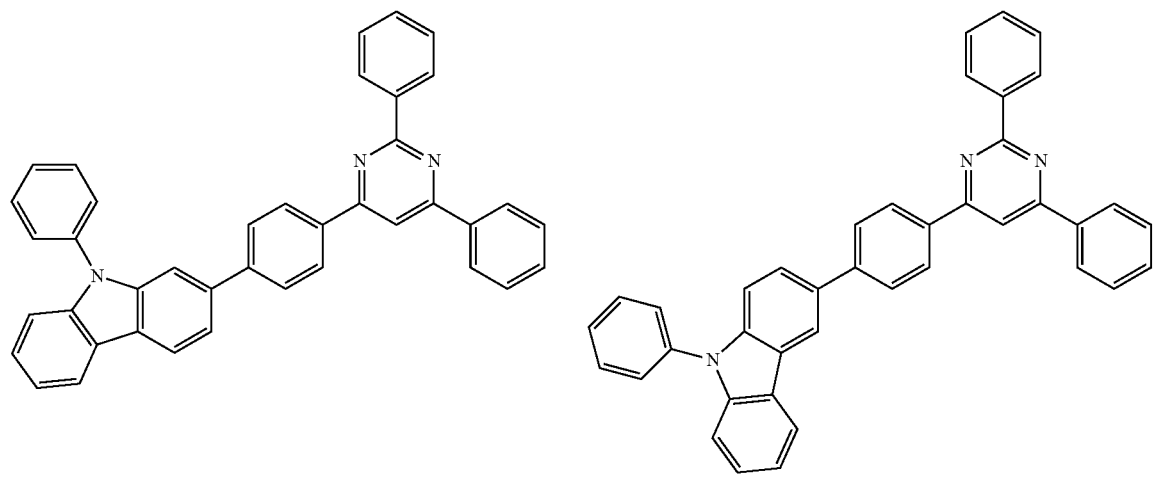

-continued
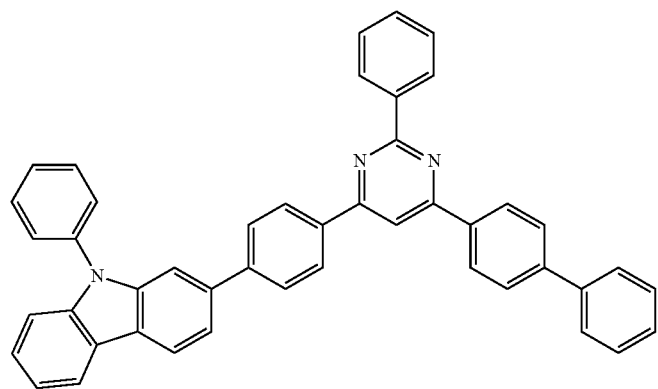
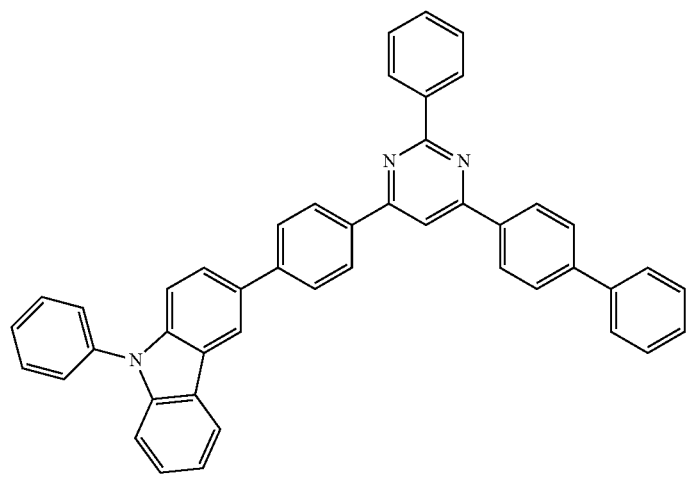
[Formula 34]
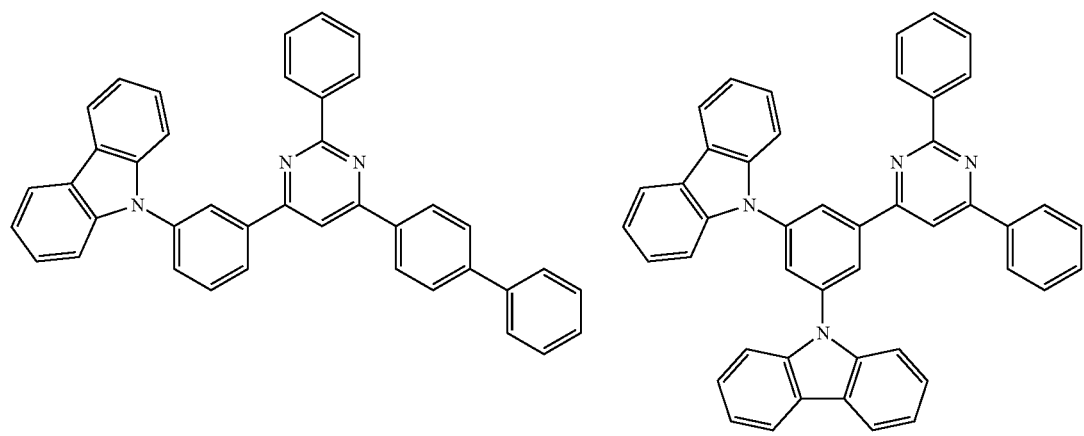

-continued
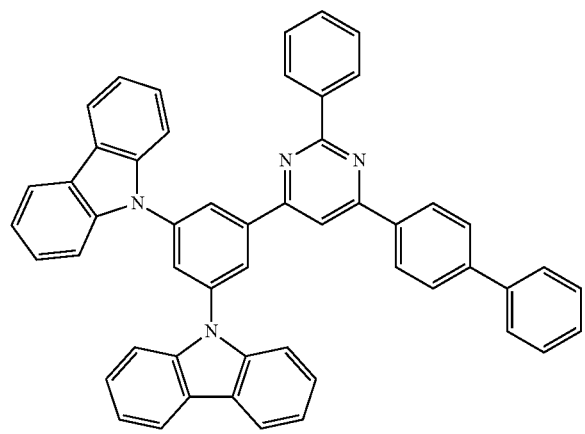
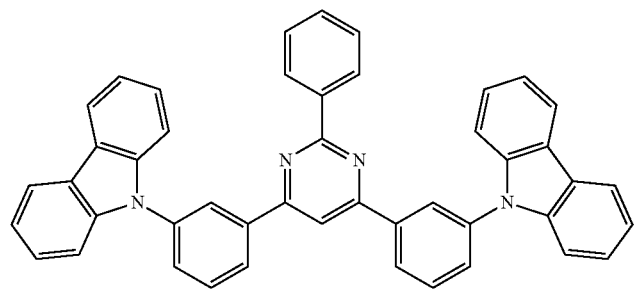
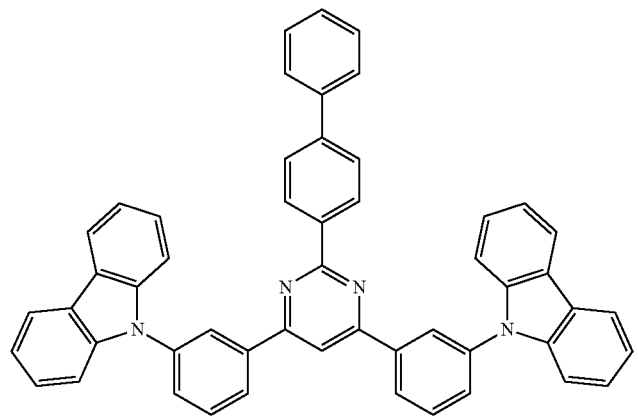
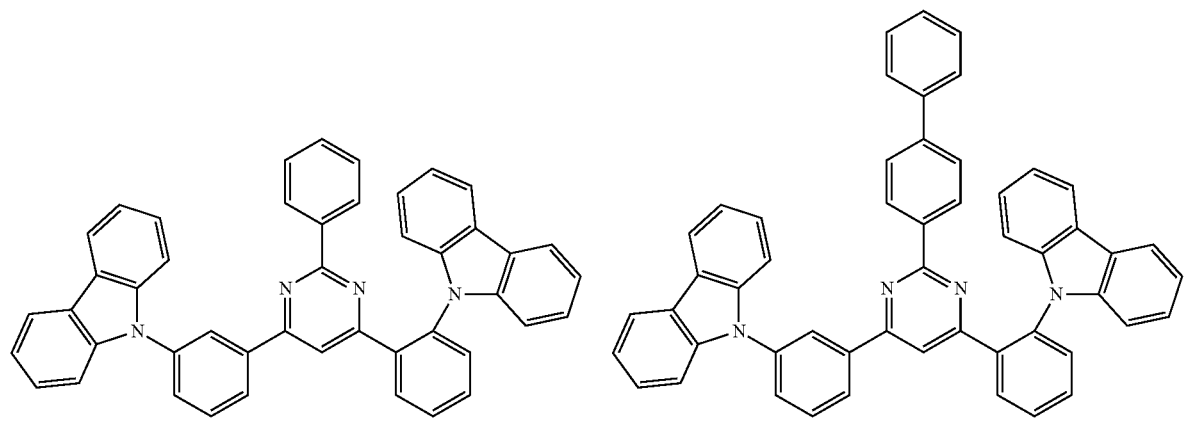

75 76
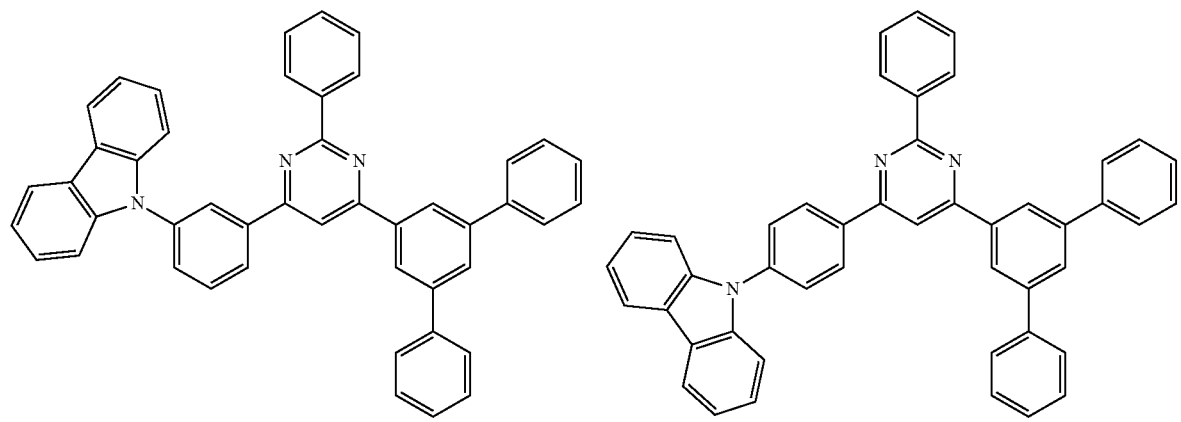
[Formula 35]
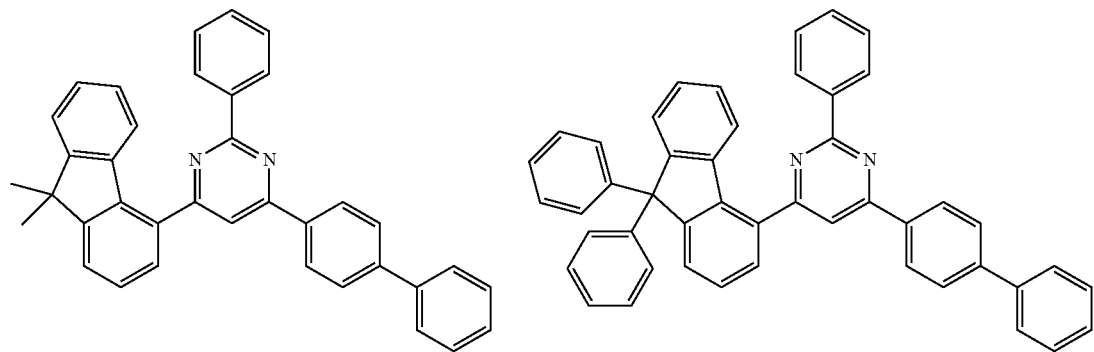
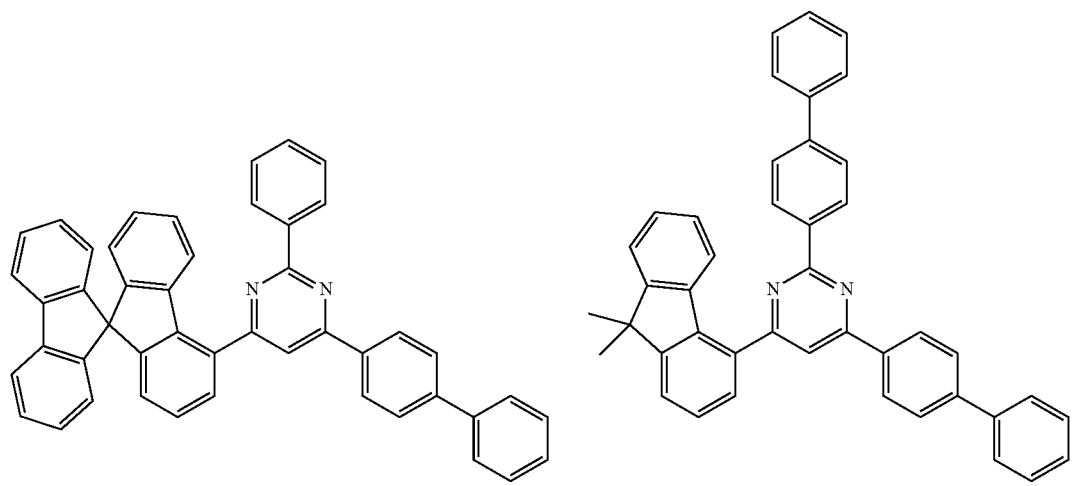

77
78
-continued
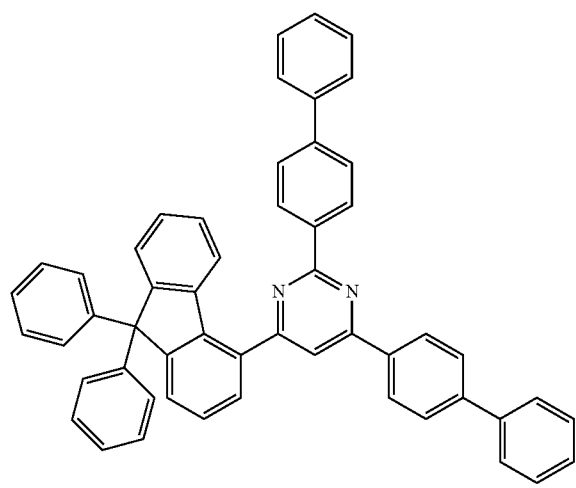
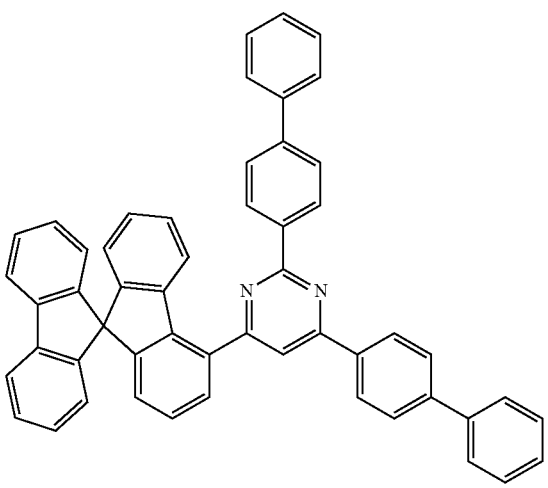
[Formula 36]
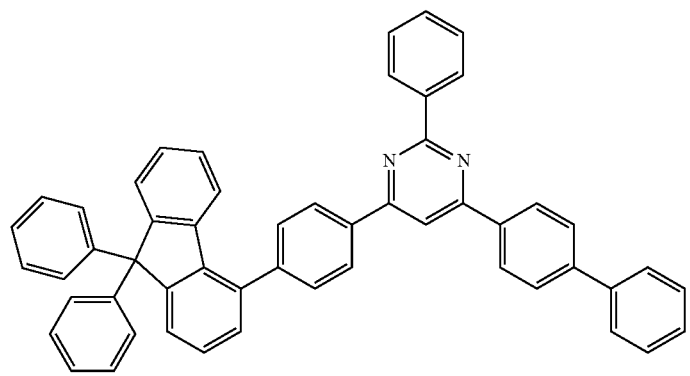
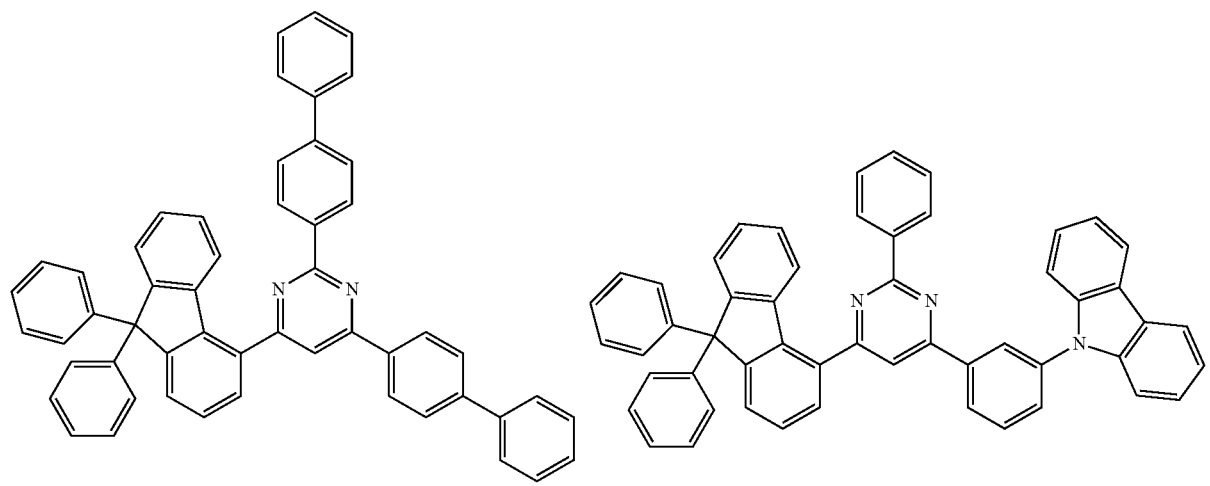

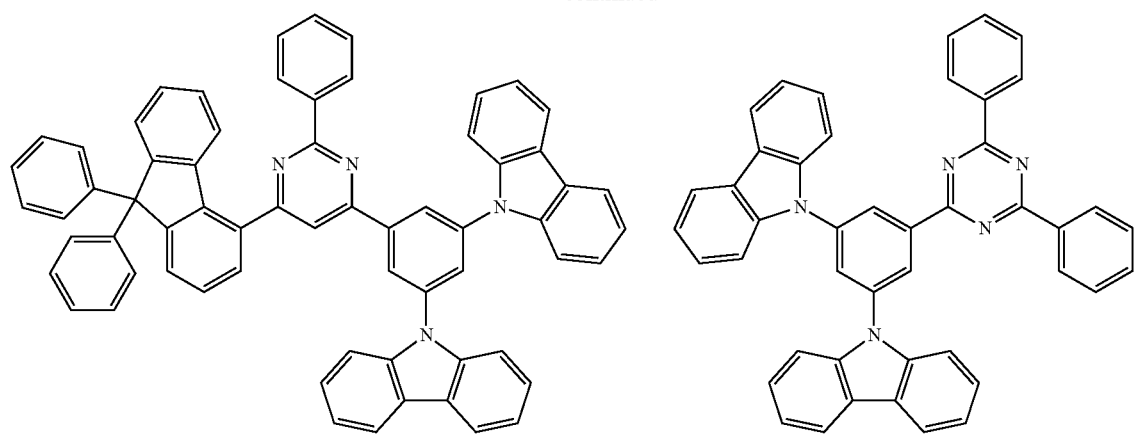
[Formula 37]
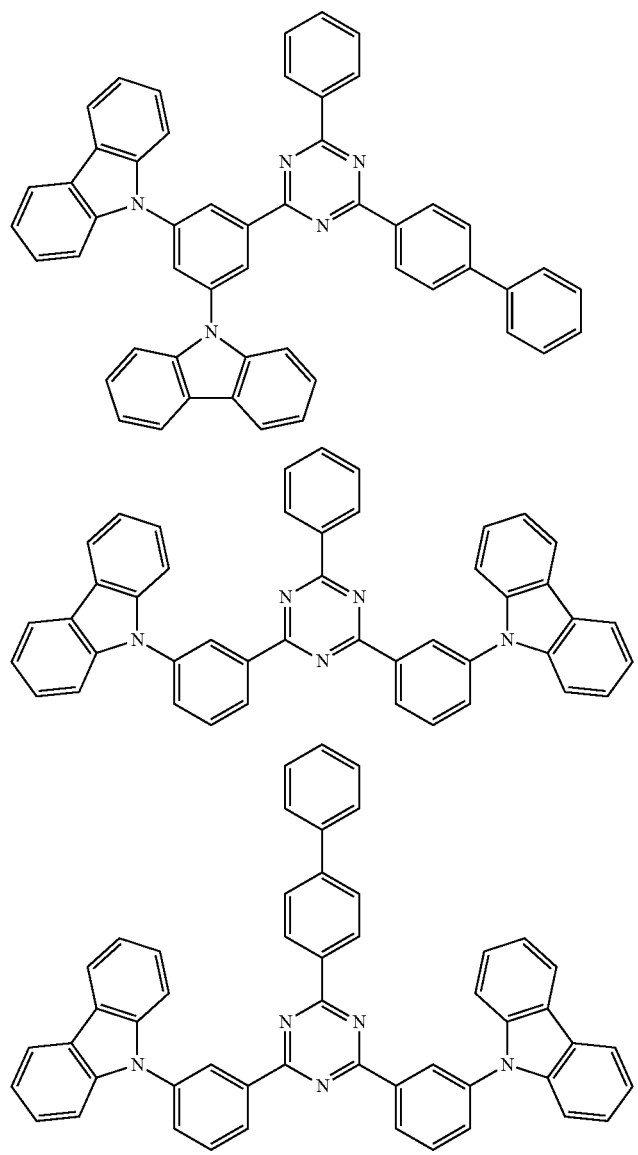

-continued

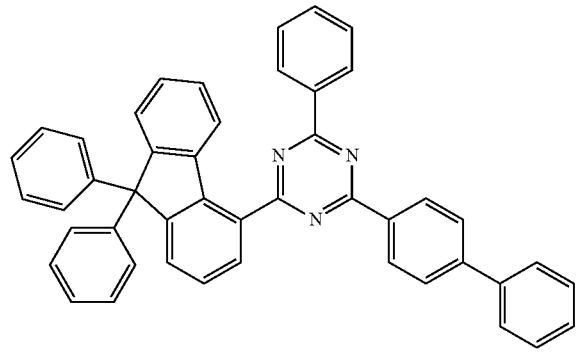

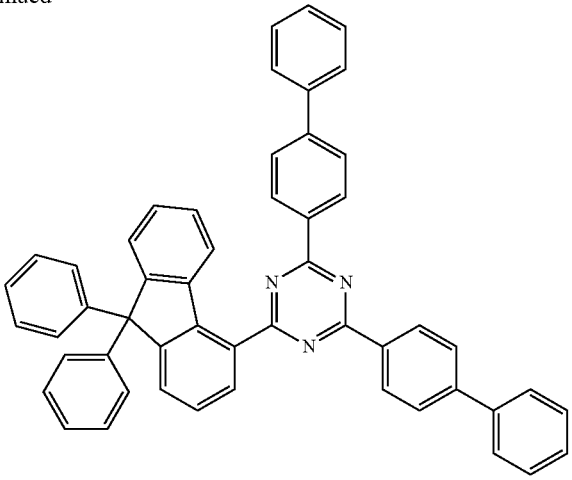

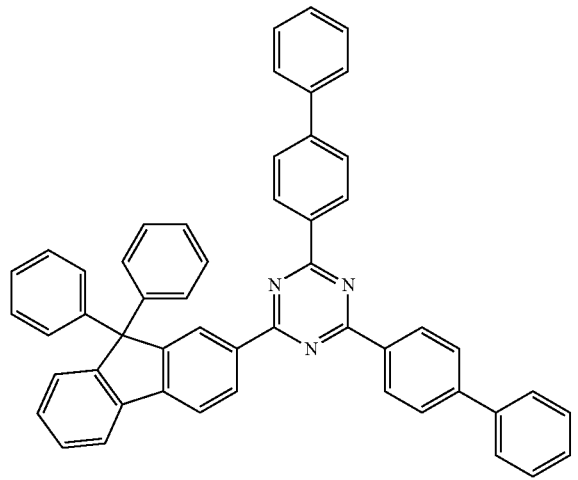

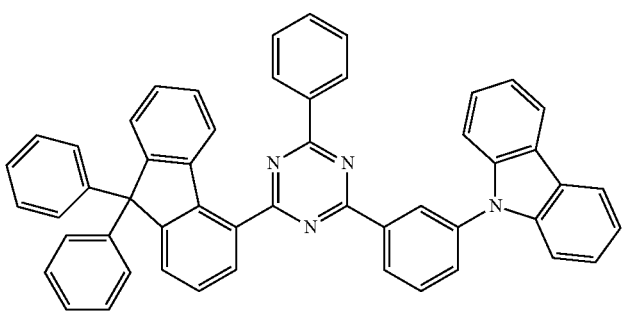

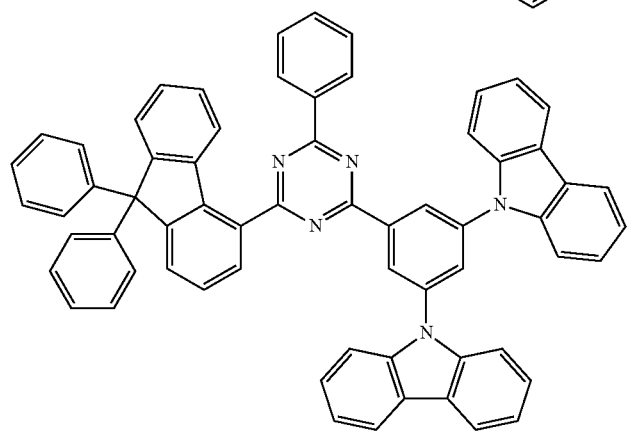

Measurement Method of Compound Represented by Formula (2)

The compound represented by the formula (2) can be manufactured by a known method.

Emitting Layer

The emitting layer 5 contains the first compound, the second compound, and the third compound.

First Compound

The first compound is a fluorescent compound. The first compound may be a delayed fluorescent compound and a compound that does not exhibit delayed fluorescence.

A fluorescent material is usable as the first compound according to the exemplary embodiment. Specific examples of the fluorescent material include a bisarylaminonaphthalene derivative, aryl-substituted naphthalene derivative, bisarylaminoanthracene derivative, aryl-substituted anthracene derivative, bisarylaminopyrene derivative, aryl-substituted pyrene derivative, bisarylamino chrysene derivative, aryl-substituted chrysene derivative, bisarylaminofluoranthene derivative, aryl-substituted fluoranthene derivative, indenoperylene derivative, acenaphthofluoranthene derivative, pyromethene boron complex compound, compound having a pyromethene skeleton, metal complex of the compound having a pyrromethene skeleton, diketopyrrolopyrrole derivative, perylene derivative, and naphthacene derivative.

The first compound is preferably compounds represented by later-described formulae (20), (30), (40), (50), (1) and (60).

Compound Represented by Formula (20)

The first compound in the exemplary embodiment is preferably a compound represented by the formula (20) below.

[Formula 38]

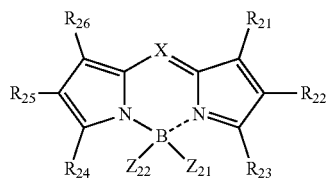

(20)

In the formula (20):

X is a nitrogen atom, or a carbon atom bonded to Y;

Y is a hydrogen atom or a substituent;

$R_{21}$ to $R_{26}$ are each independently a hydrogen atom or a substituent, or at least one of a pair of $R_{21}$ and $R_{22}$, a pair of $R_{22}$ and $R_{23}$, a pair of $R_{24}$ and $R_{25}$, or a pair of $R_{25}$ and $R_{26}$ are mutually bonded to form a ring;

Y and $R_{21}$ to $R_{26}$ serving as the substituents are each independently selected from the group consisting of a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, a substituted or unsubstituted alkylthio group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted aralkyl group having 7 to 30 carbon atoms, a substituted or unsubstituted heteroaryl group having 5 to 30 ring atoms, a halogen atom, a carboxy group, a substituted or unsubstituted ester group, a substituted or unsubstituted carbamoyl group, a substituted or unsubstituted amino group, a nitro group, a cyano group, a substituted or unsubstituted silyl group, and a substituted or unsubstituted siloxanyl group;

$Z_{21}$ and $Z_{22}$ are each independently a substituent, or are mutually bonded to form a ring; and $Z_{21}$ and $Z_{22}$ serving as the substituents are each independently selected from the group consisting of a halogen atom, a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

In the formula (20), when a pair of $R_{25}$ and $R_{26}$ are bonded to each other to form a ring, the first compound is represented by a formula (21) below.

[Formula 39]

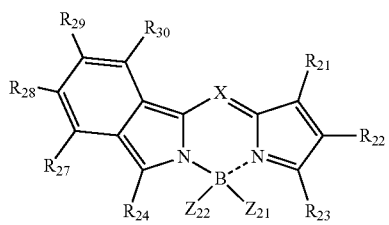

(21)

In the formula (21): X, Y, $R_{21}$ to $R_{24}$, $Z_{21}$, and $Z_{22}$ each represent the same as X, Y, $R_{21}$ to $R_{24}$, $Z_{21}$, and $Z_{22}$ in the formula (20); $R_{27}$ to $R_{30}$ are each independently a hydrogen atom or a substituent; and when $R_{27}$ to $R_{30}$ are each a substituent, the substituent represents the same as the examples of the substituent usable as $R_{21}$ to $R_{24}$.

In the formula (20), when $Z_{21}$ and $Z_{22}$ are bonded to each other to form a ring, the first compound is represented by, for instance, a formula (20A) or a formula (20B) below. It should be noted that a structure of the first compound is not limited to structures as follows.

[Formula 40]

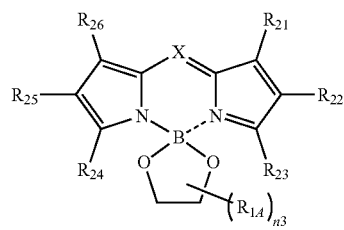

(20A)

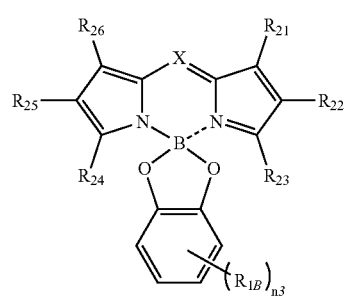

(20B)

In the formula (20A): X, Y, $R_{21}$ to $R_{26}$ each represent the same as X, Y, $R_{21}$ to $R_{26}$ in the formula (20); $R_{1A}$ is each independently a hydrogen atom or a substituent; when $R_{1A}$ is a substituent, the substituent represents the same as the examples of the substituent usable as $R_{21}$ to $R_{26}$; and n3 is 4.

In the formula (20B): X, Y, $R_{21}$ to $R_{26}$ each represent the same as X, Y, $R_{21}$ to $R_{26}$ in the formula (20); $R_{1B}$ A is each independently a hydrogen atom or a substituent; when $R_{1B}$ is a substituent, the substituent represents the same as the examples of the substituent usable as $R_{21}$ to $R_{26}$; and n4 is 4.

At least one of $Z_{21}$ or $Z_{22}$ (preferably $Z_{21}$ and $Z_{22}$) is preferably a group selected from the group consisting of a substituted or unsubstituted alkyl group having 1 to 30 carbon atoms, a substituted or unsubstituted alkyl halide group having 1 to 30 carbon atoms, a substituted or unsubstituted aryl group having 6 to 30 ring carbon atoms, a substituted or unsubstituted alkoxy group having 1 to 30 carbon atoms, a substituted or unsubstituted alkoxy halide group having 1 to 30 carbon atoms, and a substituted or unsubstituted aryloxy group having 6 to 30 ring carbon atoms.

At least one of $Z_{21}$ or $Z_{22}$ is more preferably a group selected from the group consisting of an alkoxy group having 1 to 30 carbon atoms and substituted by a fluorine atom, an aryloxy group having 6 to 30 ring carbon atoms and substituted by a fluorine atom, and an aryloxy group having 6 to 30 ring carbon atoms and substituted by a fluoro alkyl group having 1 to 30 carbon atoms.

At least one of $Z_{21}$ or $Z_{22}$ is further preferably an alkoxy group having 1 to 30 carbon atoms and substituted by a fluorine atom. $Z_{21}$ and $Z_{22}$ are each still further preferably an alkoxy group having 1 to 30 carbon atoms and substituted by a fluorine atom.

It is also preferable that $Z_{21}$ and $Z_{22}$ are the same.

It is also preferable that at least one of $Z_{21}$ or $Z_{22}$ is a fluorine atom, and more preferable that $Z_{21}$ and $Z_{22}$ are fluorine atoms.

It is also preferable that at least one of $Z_{21}$ or $Z_{22}$ is a group represented by a formula (20a) below.

[Formula 41]

(20a)

In the formula (20a): A is a substituted or unsubstituted alkyl group having 1 to 6 carbon atoms, a substituted or unsubstituted alkyl halide group having 1 to 6 carbon atoms, or a substituted or unsubstituted aryl group having 6 to 12 ring carbon atoms; $L_2$ is a substituted or unsubstituted alkylene group having 1 to 6 carbon atoms or a substituted or unsubstituted arylene group having 6 to 12 ring carbon atoms; m is 0, 1, 2, 3, 4, 5, 6, or 7; and when m is 2, 3, 4, 5, 6, or 7, a plurality of $L_2$ are mutually the same or different. m is preferably 0, 1, or 2. When m is 0, A is directly bonded to O (an oxygen atom).

In the formula (20), when $Z_{21}$ and $Z_{22}$ are each the group represented by the formula (20a), the first compound is a compound represented by a formula (22).

The first compound is also preferably a compound represented by a formula (22) below.

[Formula 42]

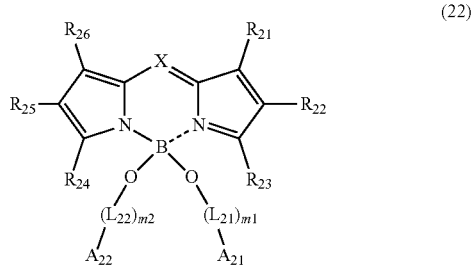

(22)

In the formula (22), X, Y when X is a carbon atom bonded to Y, and $R_{21}$ to $R_{26}$ represent the same as X, Y, $R_{21}$ to $R_{26}$ in the formula (20). $A_{21}$ and $A_{22}$ represent the same as A in the formula (20a) and may be mutually the same or different. $L_{21}$ and $L_{22}$ represent the same as $L_2$ in the formula (20a) and may be mutually the same or different. m1 and m2 are each independently 0, 1, 2, 3, 4, 5, 6, or 7, preferably 0, 1, or 2. When m1 is 2, 3, 4, 5, 6, or 7, a plurality of $L_{21}$ are mutually the same or different. When m2 is 2, 3, 4, 5, 6, or 7, a plurality of $L_{22}$ are mutually the same or different. When m1 is 0, $A_{21}$ is directly bonded to O (an oxygen atom). When m2 is 0, $A_{22}$ is directly bonded to O (an oxygen atom).

At least one of A or $L_2$ in the formula (20a) is preferably substituted by a halogen atom, more preferably substituted by a fluorine atom.

A in the formula (20a) is more preferably a perfluoroalkyl group having 1 to 6 carbon atoms or a perfluoroaryl group having 6 to 12 ring carbon atoms, further preferably perfluoroalkyl group having 1 to 6 carbon atoms.

$L_2$ in the formula (20a) is more preferably a perfluoroalkylene group having 1 to 6 carbon atoms or a perfluoroarylene group having 6 to 12 ring carbon atoms, further preferably perfluoroalkylene group having 1 to 6 carbon atoms.

Specifically, the first compound is also preferably a compound represented by a formula (22a) below.

[Formula 43]

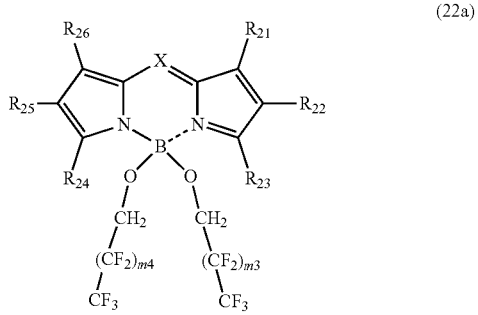

(22a)

In the formula (22a):
X represents X in the formula (20). When X is a carbon atom bonded to Y, Y represents the same as Y in the formula (20);
$R_{21}$ to $R_{26}$ each independently represent the same as $R_{21}$ to $R_{26}$ in the formula (20);
m3 is in a range from 0 to 4;
m4 is in a range from 0 to 4; and
m3 and m4 are mutually the same or different.
In the formulae (20), (21), (22), and (22a):
X is a carbon atom bonded to Y;
Y is a hydrogen atom or a substituent;
Y serving as the substituent is preferably a substituent selected from the group consisting of a substituted or unsubstituted alkyl group having 1 to 30 carbon atoms, a substituted or unsubstituted alkyl halide group having 1 to 30 carbon atoms, and a substituted or unsubstituted aryl group having 6 to 30 ring carbon atoms, more preferably a substituted or unsubstituted aryl group having 6 to 30 ring carbon atoms.
In the formulae (20), (21), (22), and (22a):
it is more preferable that X is a carbon atom bonded to Y;
Y is a hydrogen atom or a substituent;
Y serving as the substituent is a substituted or unsubstituted aryl group having 6 to 30 ring carbon atoms;

when Y as the substituent is an aryl group having 6 to 30 ring carbon atoms and having a substituent, the substituent is a substituted or unsubstituted alkyl group having 1 to 30 carbon atoms, a substituted or unsubstituted alkyl halide group having 1 to 30 carbon atoms, a substituted or unsubstituted alkoxy group having 1 to 30 carbon atoms, a substituted or unsubstituted alkoxy halide group having 1 to 30 carbon atoms, or an aryl group having 6 to 30 ring carbon atoms and substituted by an alkyl group having 1 to 30 carbon atoms.

In the first compound, although $Z_{21}$ and $Z_{22}$ may be bonded to each other to form a ring, it is preferable that $Z_{21}$ and $Z_{22}$ are not bonded to form no ring.

In the formulae (20), (22), and (22a), at least one of $R_{21}$, $R_{23}$, $R_{24}$, or $R_{26}$ is preferably a substituted or unsubstituted alkyl group having 1 to 30 carbon atoms or a substituted or unsubstituted alkyl halide group having 1 to 30 carbon atoms. In the formulae (20), (22), and (22a), $R_{21}$, $R_{23}$, $R_{24}$, and $R_{26}$ are more preferably a substituted or unsubstituted alkyl group having 1 to 30 carbon atoms or a substituted or unsubstituted alkyl halide group having 1 to 30 carbon atoms. In this case, $R_{22}$ and $R_{25}$ are preferably hydrogen atoms.

In the formulae (20), (22), and (22a), at least one of $R_{21}$, $R_{23}$, $R_{24}$, or $R_{26}$ is preferably a substituted or unsubstituted aryl group having 6 to 30 ring carbon atoms.

In the formulae (20), (22), and (22a), $R_{21}$, $R_{23}$, $R_{24}$, and $R_{26}$ are more preferably a substituted or unsubstituted aryl group having 6 to 30 ring carbon atoms. In this case, $R_{22}$ and $R_{25}$ are preferably hydrogen atoms.

In the formulae (20), (22), and (22a), it is more preferable that $R_{21}$, $R_{23}$, $R_{24}$, and $R_{26}$ are each independently a substituted or unsubstituted alkyl group having 1 to 30 carbon atoms (preferably 1 to 6 carbon atoms), a substituted or unsubstituted alkyl halide group having 1 to 30 carbon atoms (preferably 1 to 6 carbon atoms), or an aryl group having 6 to 30 ring carbon atoms (preferably 6 to 12 ring carbon atoms) substituted by an alkyl group having 1 to 30 carbon atoms, and $R_{22}$ and $R_{25}$ are hydrogen atoms.

In the formula (21), at least one of $R_{21}$, $R_{23}$, or $R_{24}$ is preferably a substituted or unsubstituted alkyl group having 1 to 30 carbon atoms or a substituted or unsubstituted alkyl halide group having 1 to 30 carbon atoms.

In the formula (21), $R_{21}$, $R_{23}$, and $R_{24}$ are more preferably a substituted or unsubstituted alkyl group having 1 to 30 carbon atoms or a substituted or unsubstituted alkyl halide group having 1 to 30 carbon atoms. In this case, $R_{22}$ is preferably a hydrogen atom.

In the formula (21), at least one of $R_{21}$, $R_{23}$, or $R_{24}$ is preferably a substituted or unsubstituted aryl group having 6 to 30 ring carbon atoms.

In the formula (21), $R_{21}$, $R_{23}$, and $R_{24}$ are more preferably a substituted or unsubstituted aryl group having 6 to 30 ring carbon atoms. In this case, $R_{22}$ is preferably a hydrogen atom.

In the formula (21), it is more preferable that $R_{21}$, $R_{23}$, and $R_{24}$ are each independently a substituted or unsubstituted alkyl group having 1 to 30 carbon atoms (preferably 1 to 6 carbon atoms), a substituted or unsubstituted alkyl halide group having 1 to 30 carbon atoms (preferably 1 to 6 carbon atoms), or an aryl group having 6 to 30 ring carbon atoms (preferably 6 to 12 ring carbon atoms) substituted by an alkyl group having 1 to 30 carbon atoms, and $R_{22}$ is a hydrogen atom.

In the first compound, examples of an alkoxy group substituted by an fluorine atom include 2,2,2-trifluoroethoxy group, 2,2-difluoroethoxy group, 2,2,3,3,3-pentafluoro-1-propoxy group, 2,2,3,3-tetrafluoro-1-propoxy group, 1,1,1,3,3,3-hexafluoro-2-propoxy group, 2,2,3,3,4,4,4-heptafluoro-1-butyloxy group, 2,2,3,3,4,4-hexafluoro-1-butyloxy group, nonafluoro tertiary butyloxy group, 2,2,3,3,4,4,5,5,5-nonafluoropentanoxy group, 2,2,3,3,4,4,5,5,6,6,6-undecafluorohexanoxy group, 2,3-bis(trifluoromethyl)-2,3-butanedioxy group, 1,1,2,2-tetra(trifluoromethyl)ethylene glycoxy group, 4,4,5,5,6,6,6-heptafluorohexane-1,2-dioxy group, and 4,5,5,6,6,7,7,8,8,9,9,9-tridecafluorononane-1,2-dioxy group.

In the first compound, examples of an aryloxy group substituted by an fluorine atom or an aryloxy group substituted by a fluoroalkyl group include pentafluoro phenoxy group, 3,4,5-trifluorophenoxy group, 4-trifluoromethylphenoxy group, 3,5-bistrifluoromethylphenoxy group, 3-fluoro-4-trifluoromethylphenoxy group, 2,3,5,6-tetrafluoro-4-trifluoromethylphenoxy group, 4-fluorocatecholato group, 4-trifluoromethylcatecholato group, and 3,5-bistrifluoromethylcatecholato group.

When the first compound is a fluorescent compound, the first compound preferably emits light whose main peak wavelength is in a range from 400 nm to 700 nm.

Herein, the main peak wavelength means a peak wavelength of a fluorescence spectrum exhibiting a maximum luminous intensity among fluorescence spectra measured in a toluene solution in which a measurement target compound is dissolved at a concentration ranging from $10^{-6}$ mol/l to $10^{-5}$ mol/l. A spectrophotofluorometer (F-7000 manufactured by Hitachi High-Tech Science Corporation) is used as a measurement device.

The first compound preferably emits red light or green light.

Herein, the red light emission refers to light emission whose main peak wavelength of fluorescence spectrum is in a range from 600 nm to 660 nm.

When the first compound is a red fluorescent compound, the main peak wavelength of the first compound is preferably in a range from 600 nm to 660 nm, more preferably in a range from 600 nm to 640 nm, further preferably in a range from 610 nm to 630 nm.

Herein, the green light emission refers to light emission whose main peak wavelength of fluorescence spectrum is in a range from 500 nm to 560 nm.

When the first compound is a green fluorescent compound, the main peak wavelength of the first compound is preferably in a range from 500 nm to 560 nm, more preferably in a range from 500 nm to 540 nm, further preferably in a range from 510 nm to 530 nm.

Herein, the blue light emission refers to a light emission in which a main peak wavelength of fluorescence spectrum is in a range from 430 nm to 480 nm.

When the first compound is a blue fluorescent compound, the main peak wavelength of the first compound is preferably in a range from 430 nm to 480 nm, more preferably in a range from 445 nm to 480 nm.

Specific examples of the compound represented by the formula (20) are shown below. It should be noted that the compound represented by the formula (20) in the invention is not limited to the specific examples.

A coordinate bond between a boron atom and a nitrogen atom in a pyrromethene skeleton is shown by various means such as a solid line, a broken line, an arrow, and omission. Herein, the coordinate bond is shown by a solid line or a broken line, or the description of the coordinate bond is omitted.

[Formula 44]
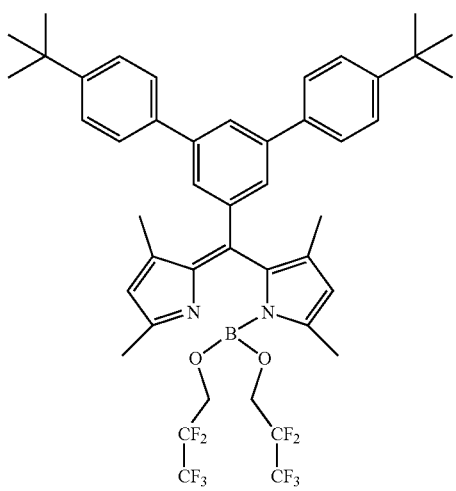
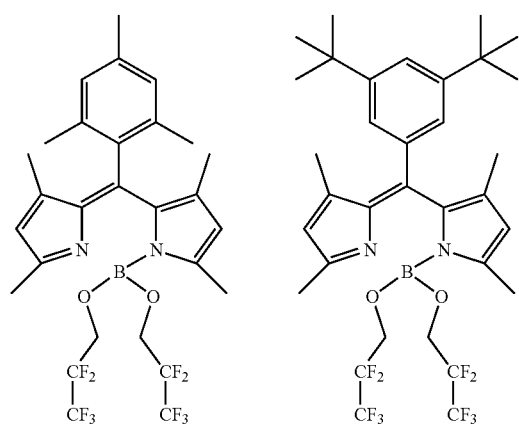
[Formula 45]
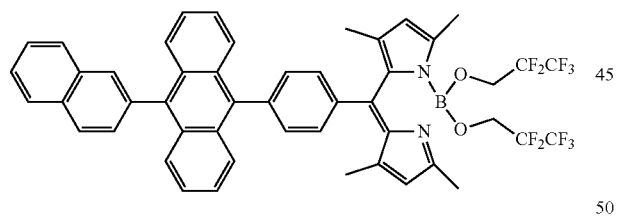
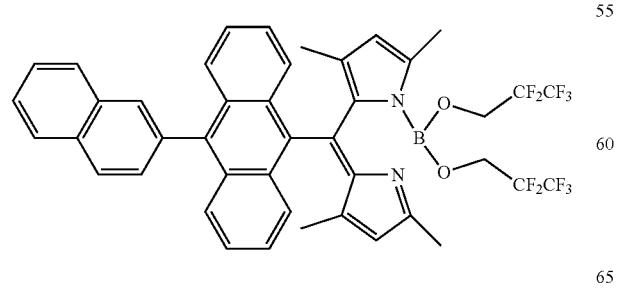
[Formula 46]
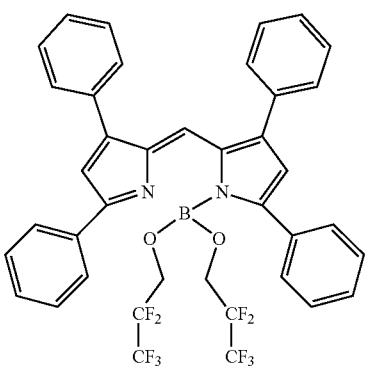
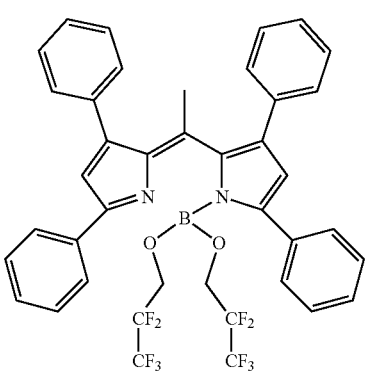
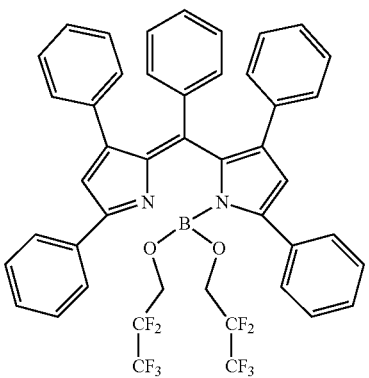
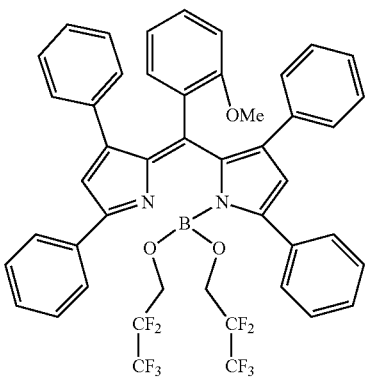

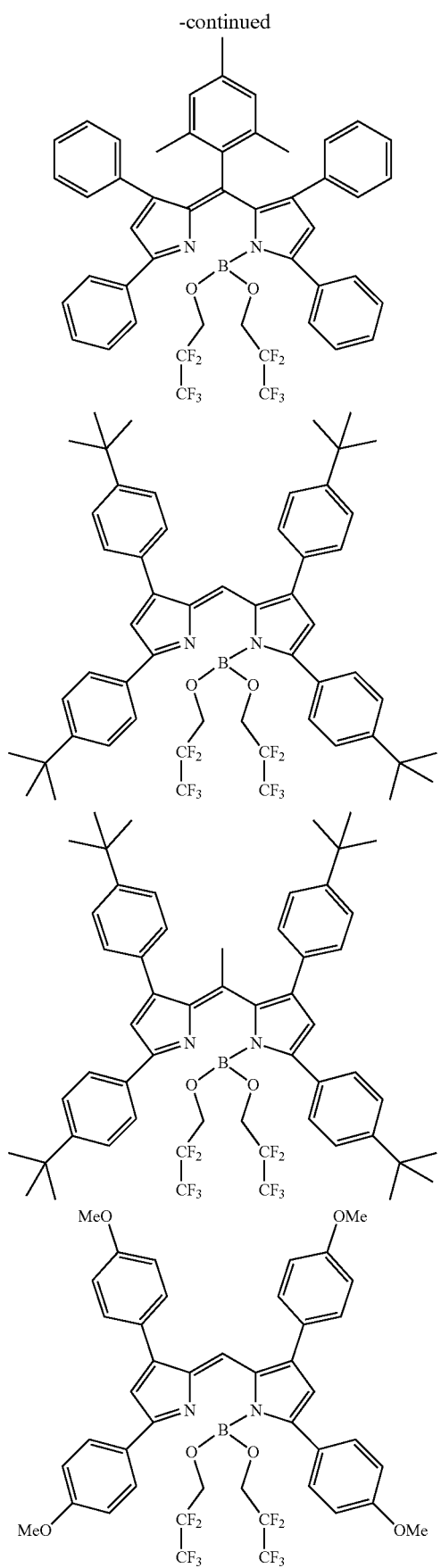
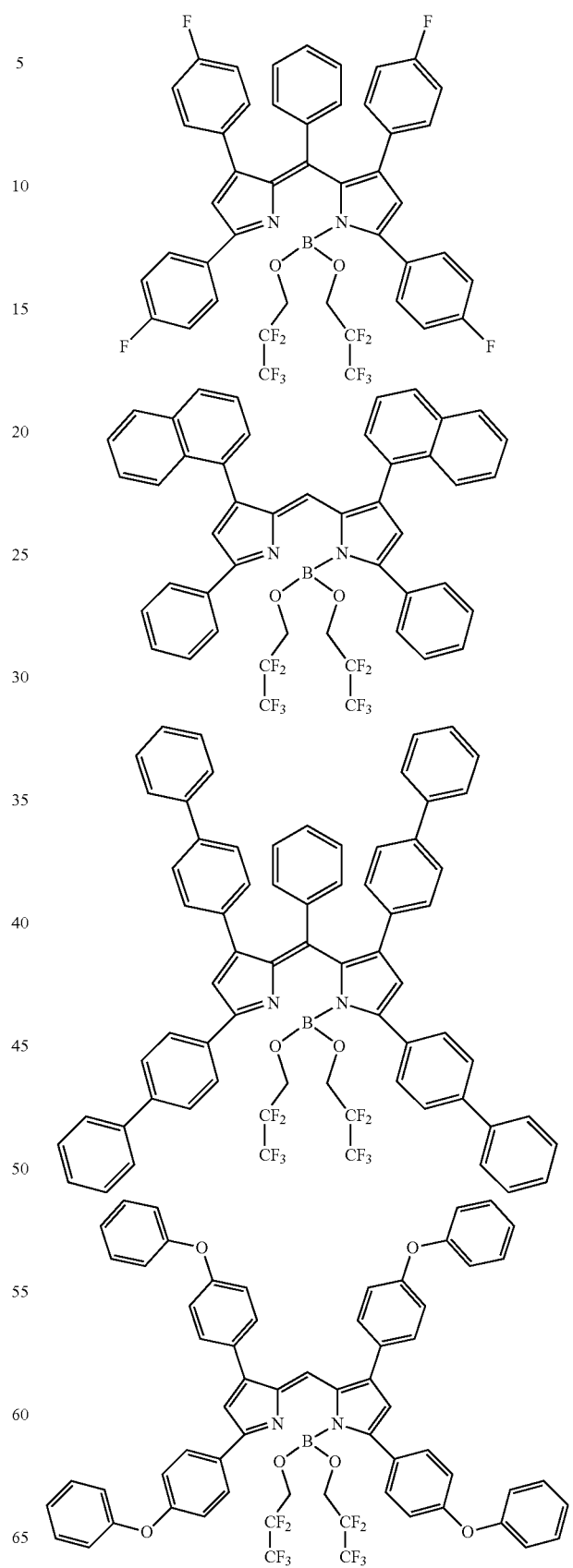

93
-continued
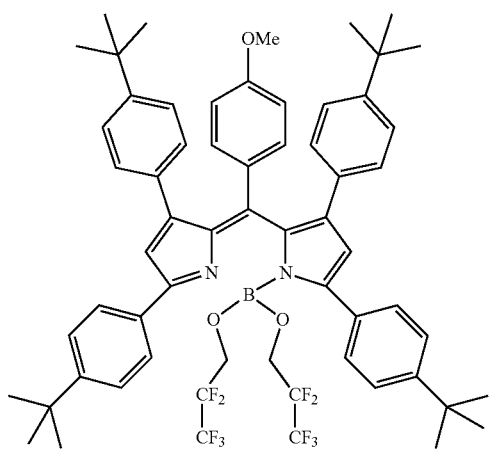
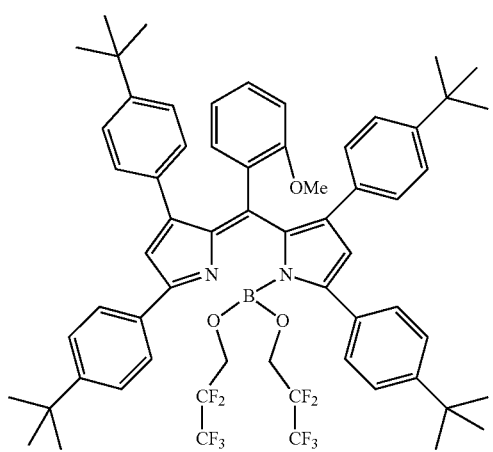
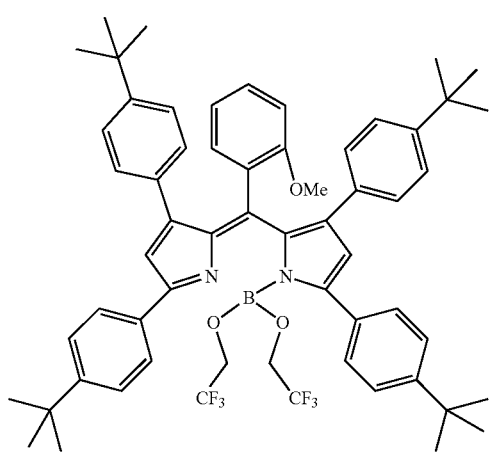
94
-continued
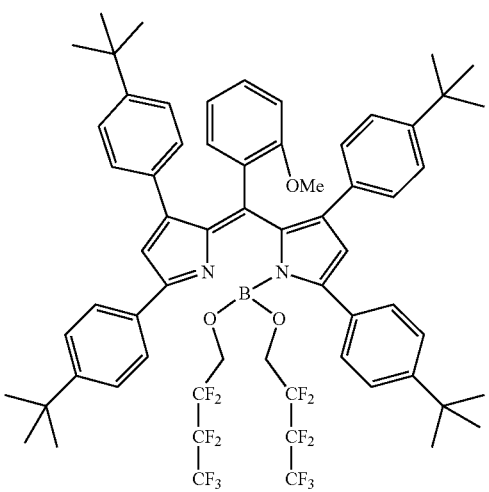
[Formula 48]
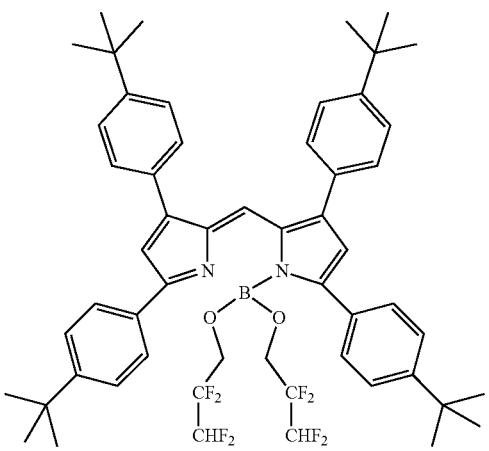
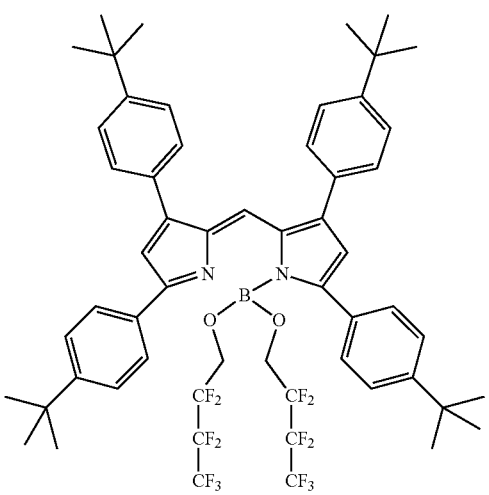

95
-continued
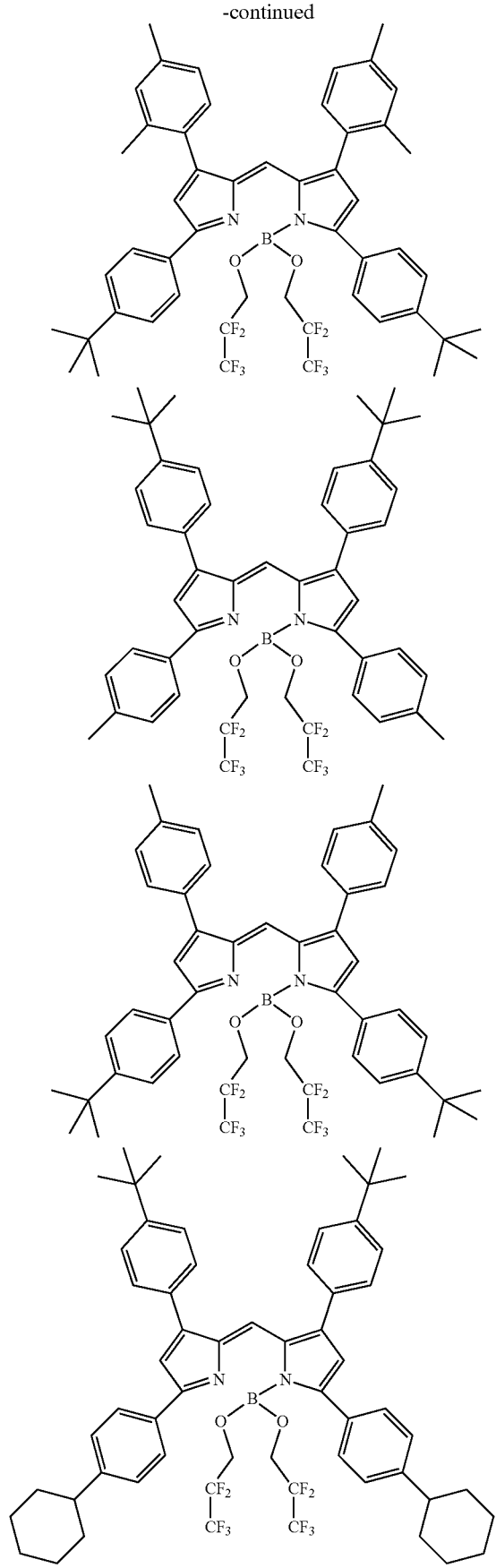
96
-continued
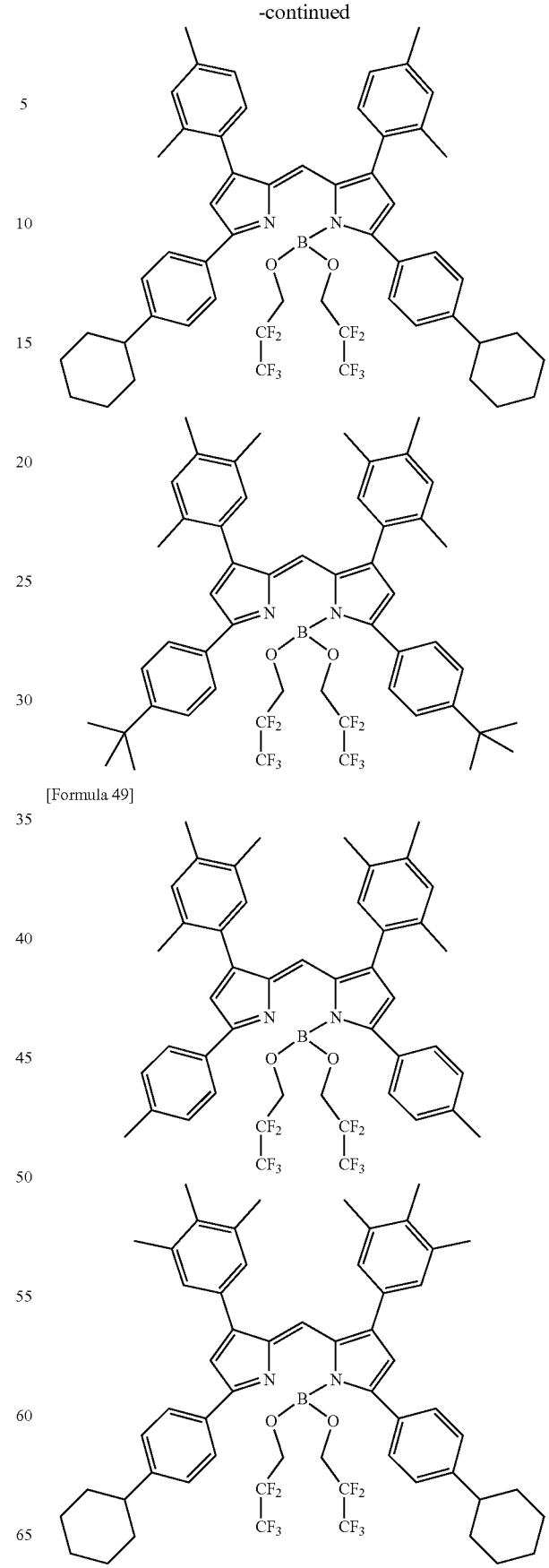
[Formula 49]

97
-continued
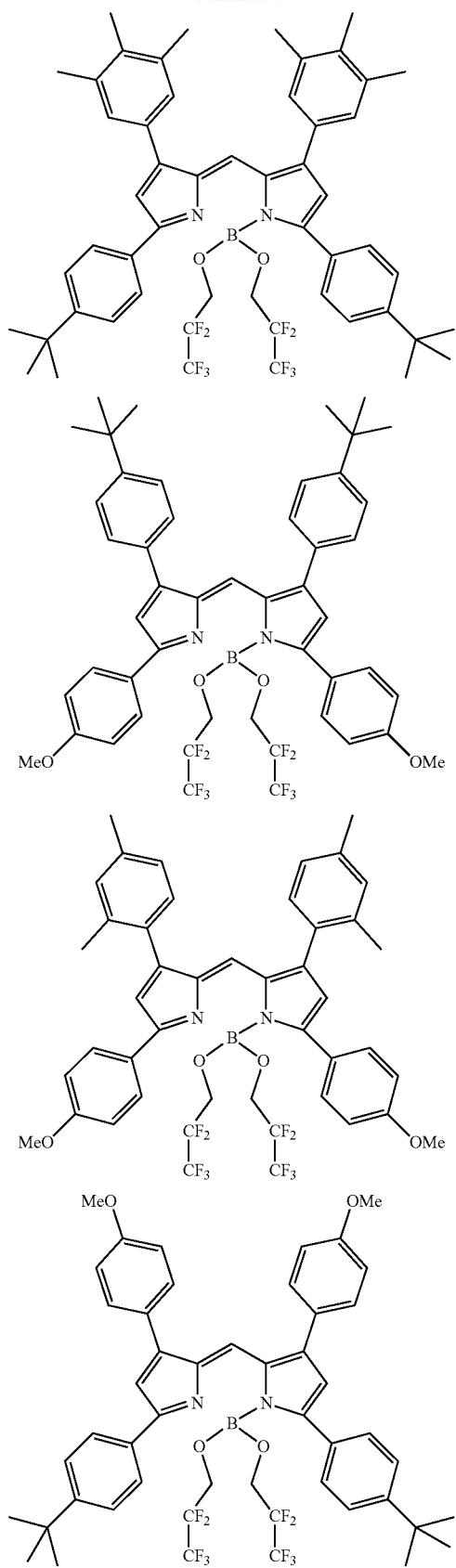
98
-continued
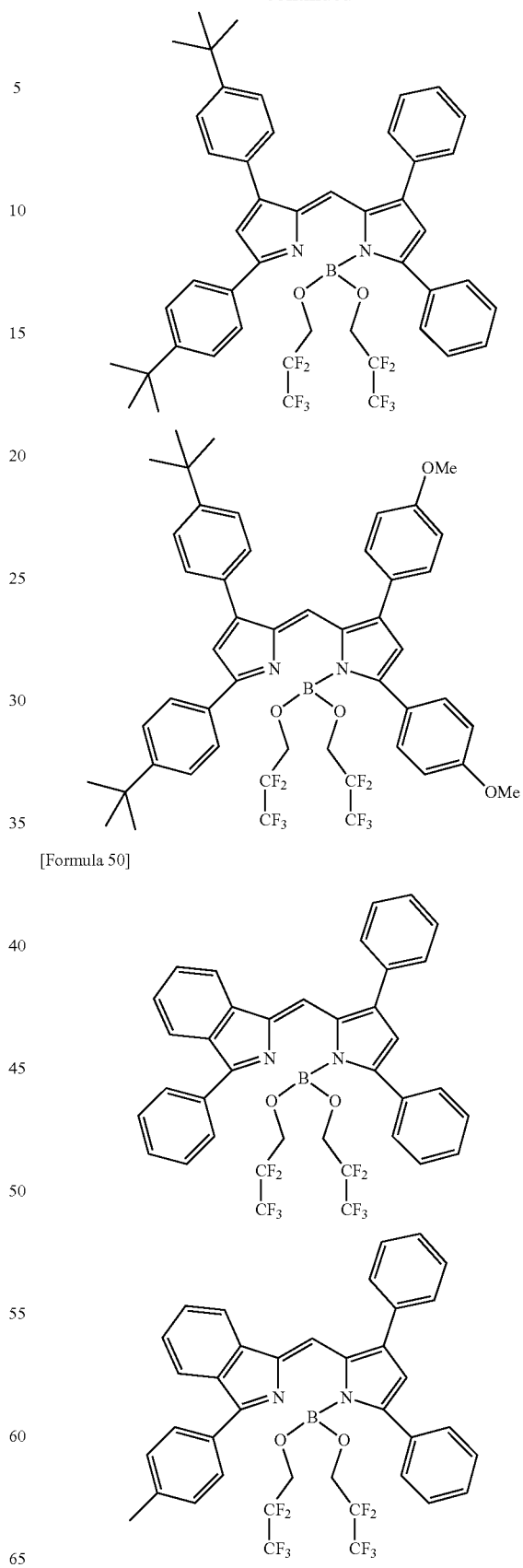
[Formula 50]

99
-continued
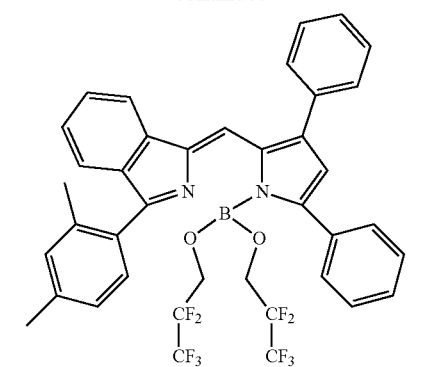
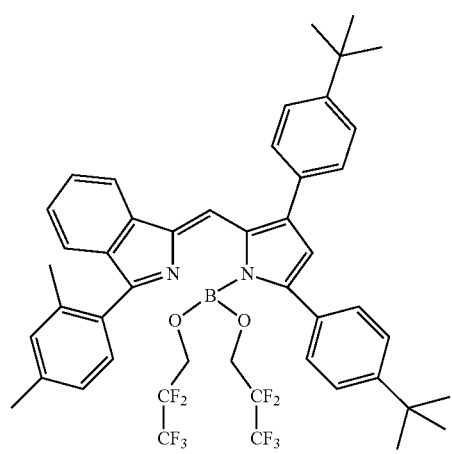 [SMILES: Cc1ccc(C2=N/C(=C\c3c(-c4ccc(C(C)(C)C)cc4)cc(-c4ccc(C(C)(C)C)cc4)n3B(OCC(F)(F)C(F)(F)F)OCC(F)(F)C(F)(F)F)c3ccccc32)c(C)c1]
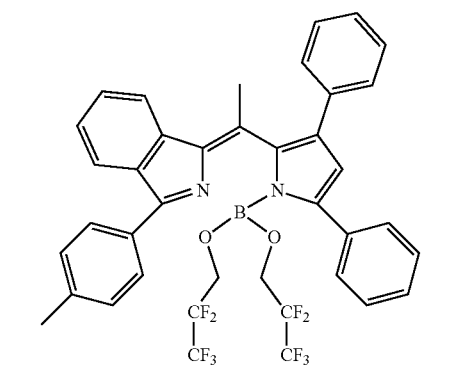
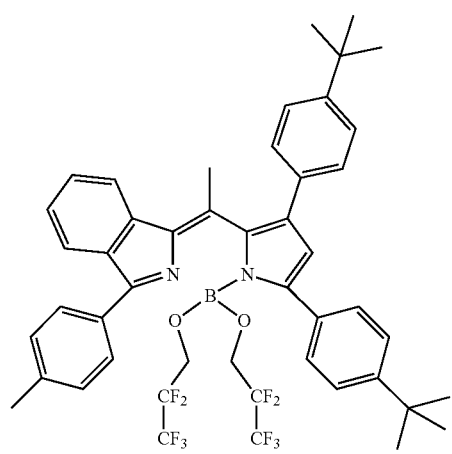
100
-continued
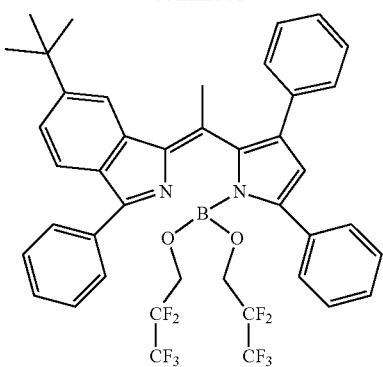
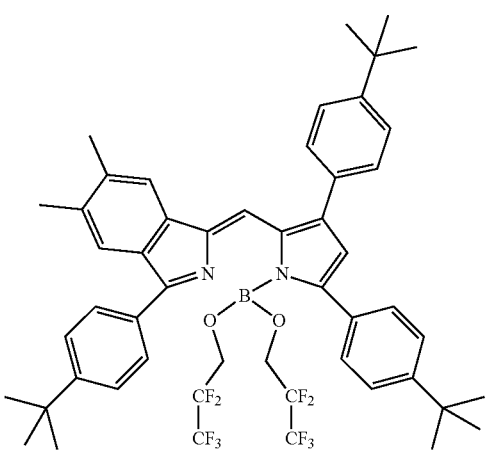 [SMILES: Cc1cc2c(cc1C)/C(=C/c1c(-c3ccc(C(C)(C)C)cc3)cc(-c3ccc(C(C)(C)C)cc3)n1B(OCC(F)(F)C(F)(F)F)OCC(F)(F)C(F)(F)F)N=C2c1ccc(C(C)(C)C)cc1]
[Formula 51]
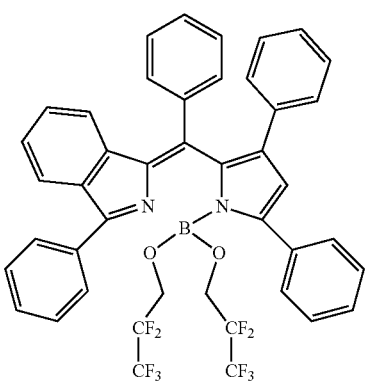
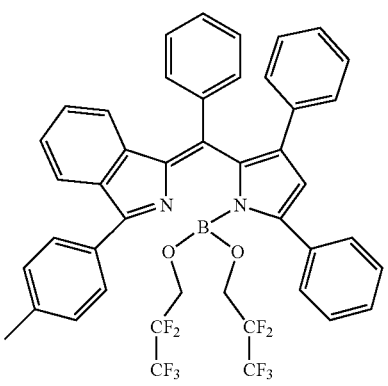

101
-continued
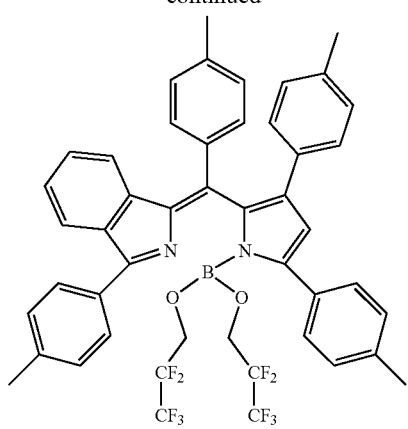
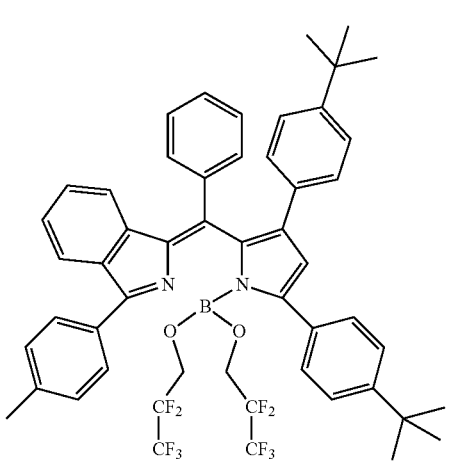 [SMILES: Cc1ccc(C2=N/C(=C(/c3ccccc3)c3c(-c4ccc(C(C)(C)C)cc4)cc(-c4ccc(C(C)(C)C)cc4)n3B(OCC(F)(F)C(F)(F)F)OCC(F)(F)C(F)(F)F)c3ccccc32)cc1]
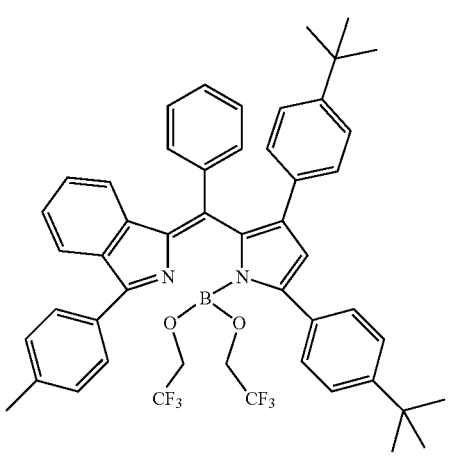
102
-continued
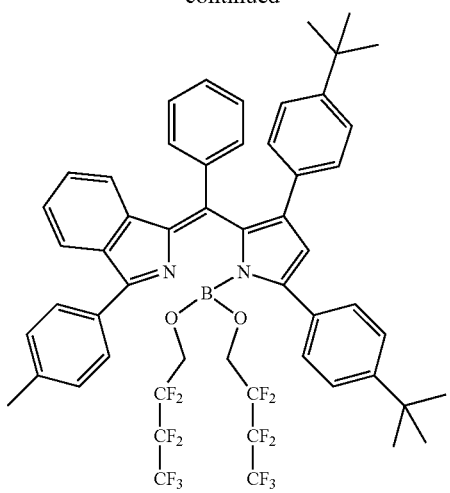
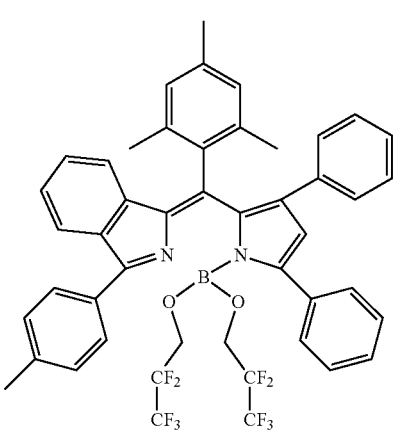
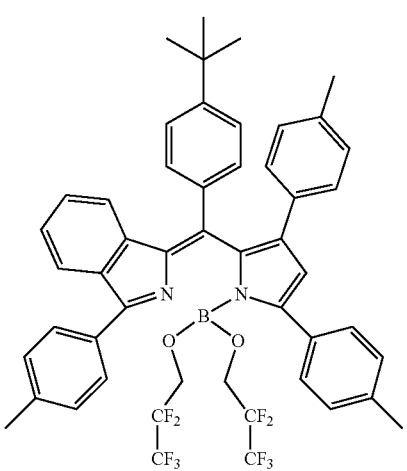

-continued
[Formula 52]
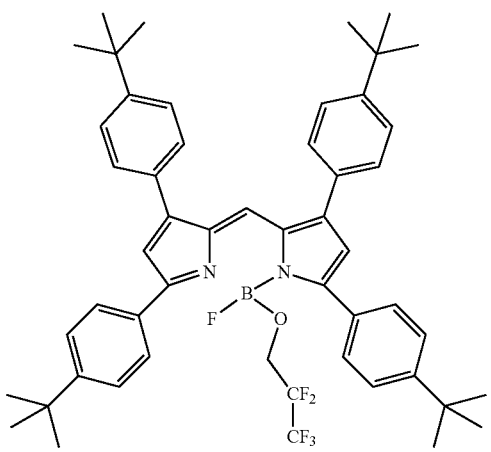
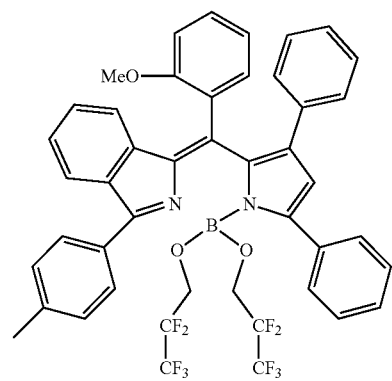
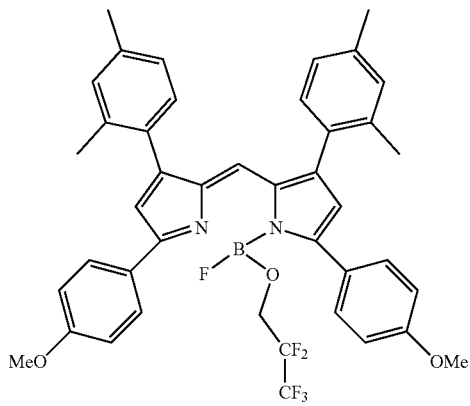
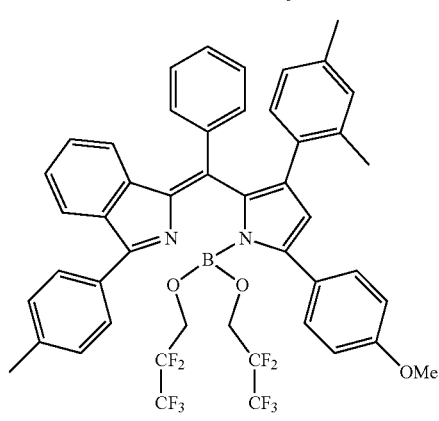
-continued
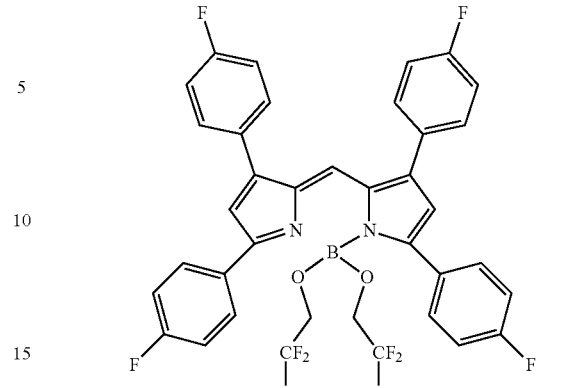
[Formula 53]
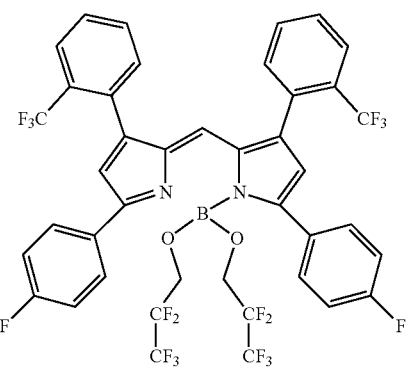
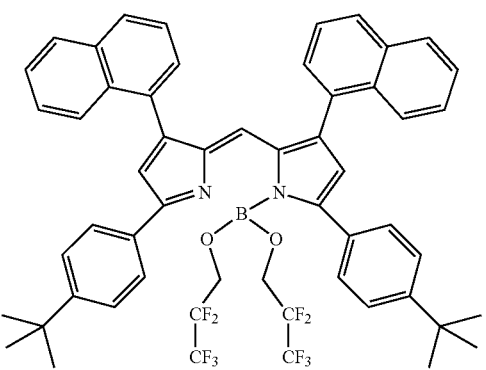
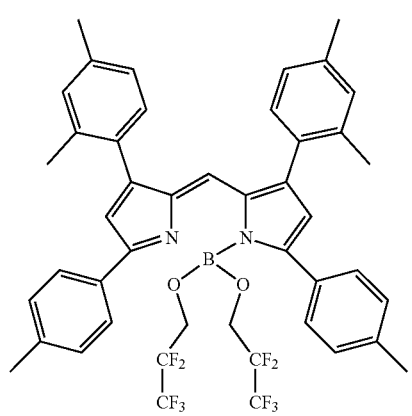

-continued
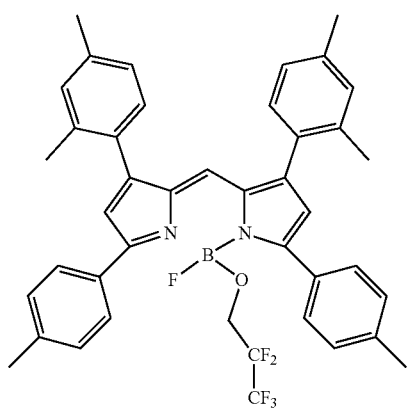
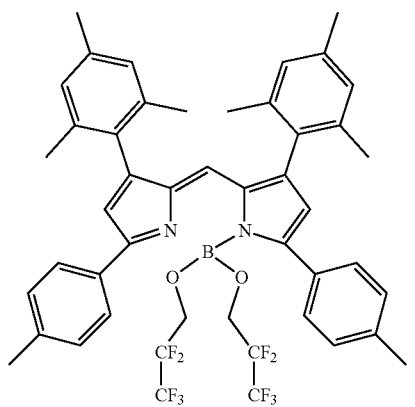
[Formula 54]
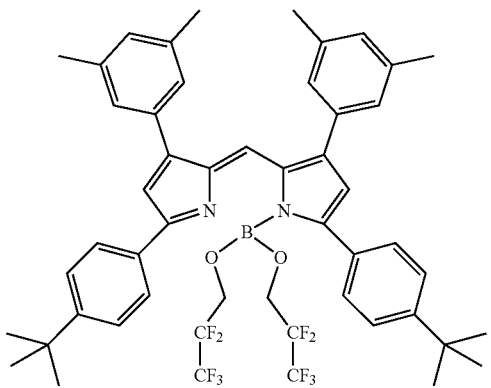
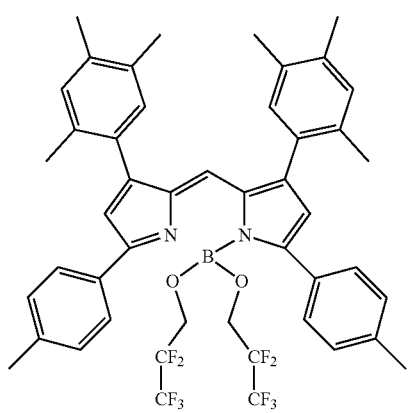
-continued
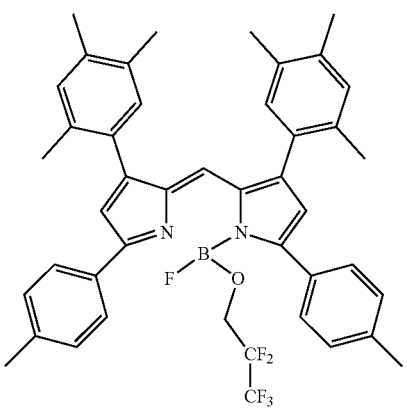
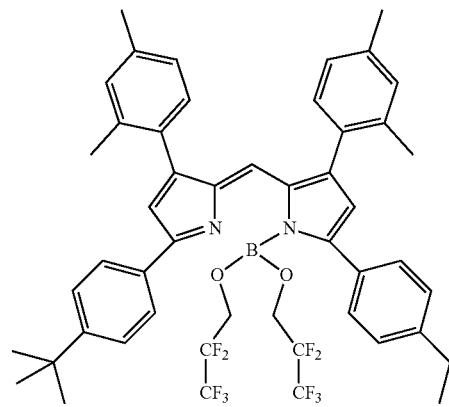
[Formula 55]
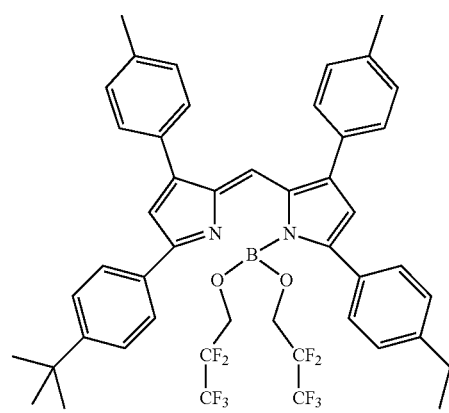
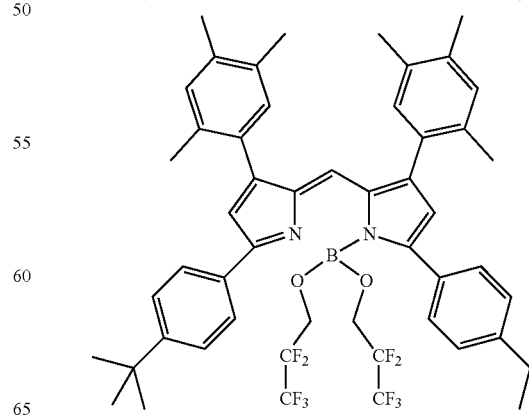

107
-continued
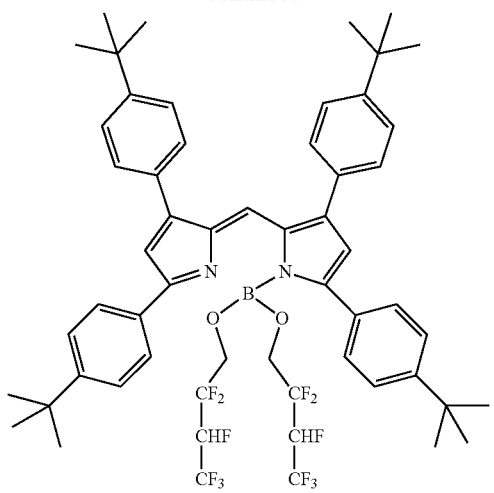
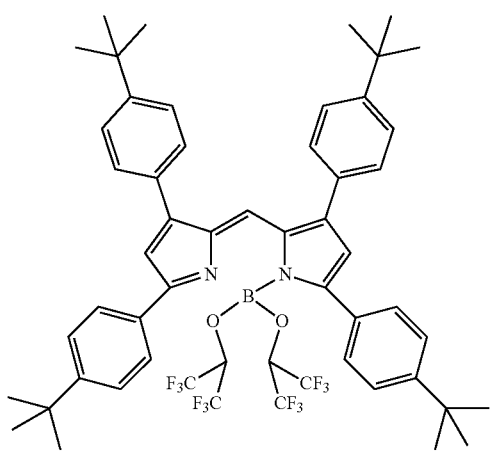
108
-continued
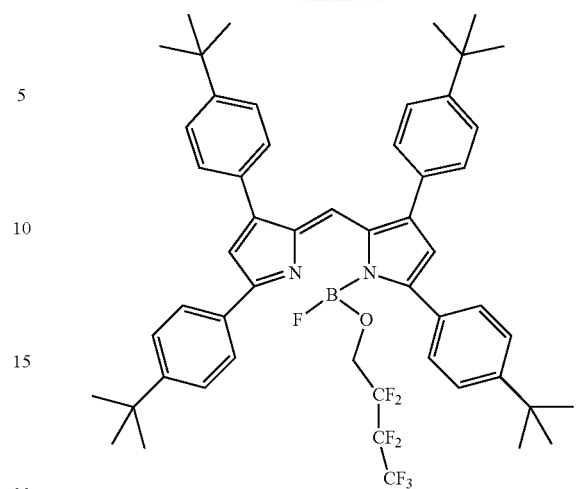
[Formula 56]
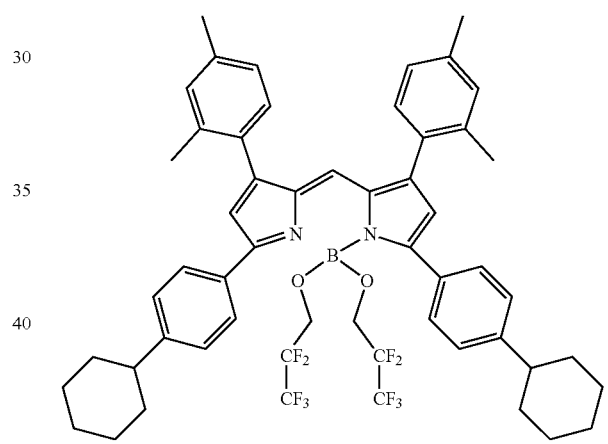
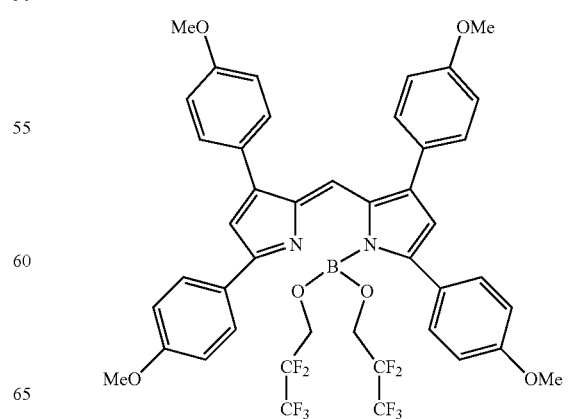

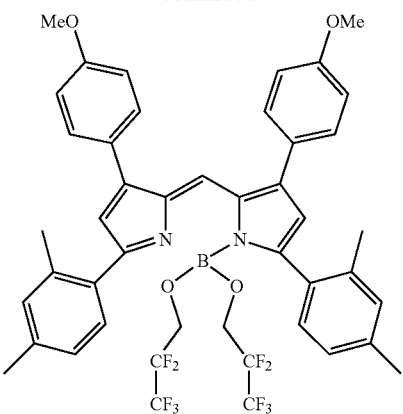
[Formula 57]
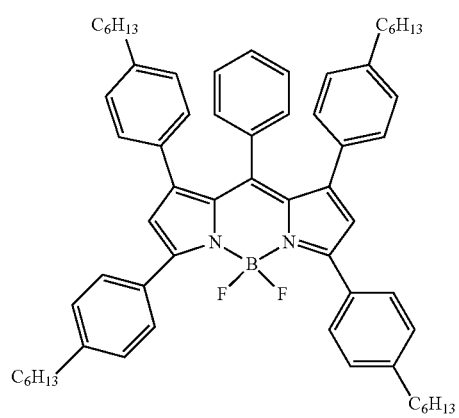
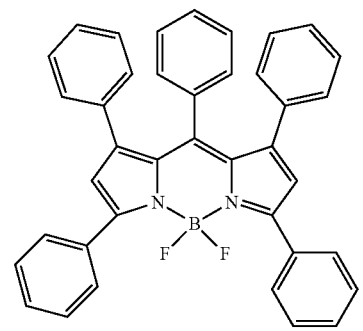
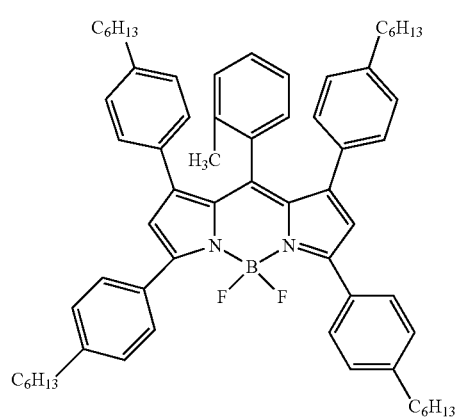
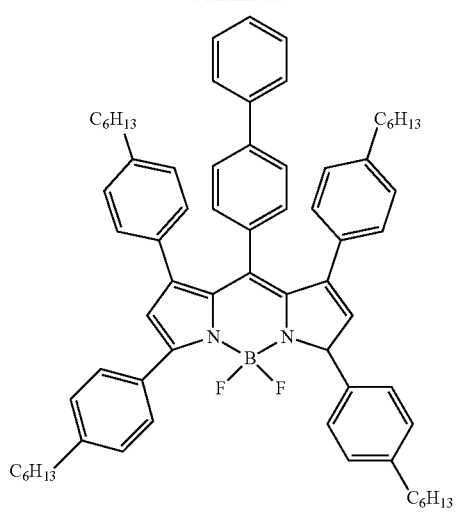
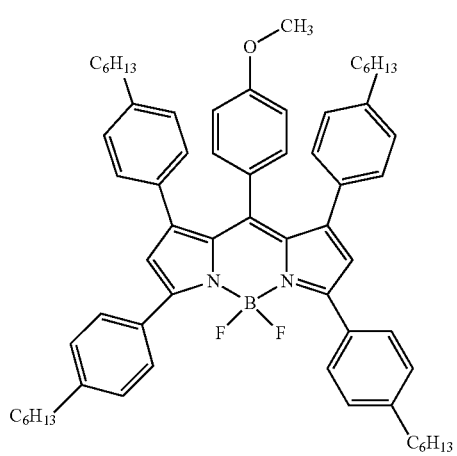
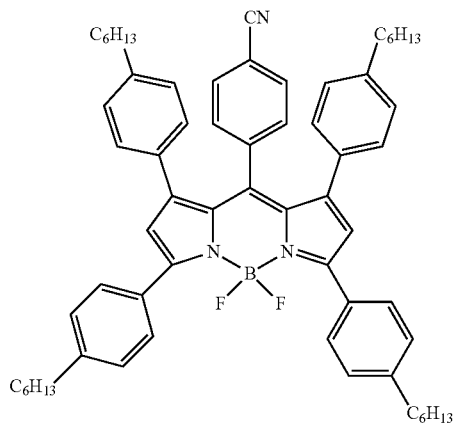

111
-continued
[Formula 58]
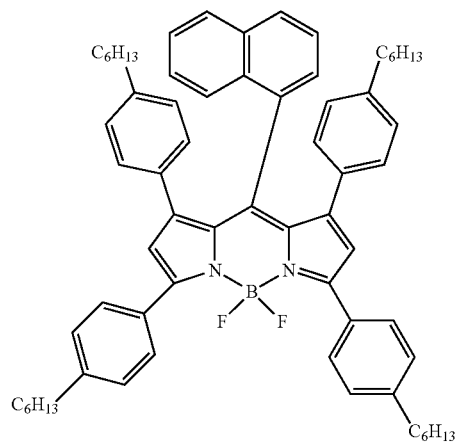
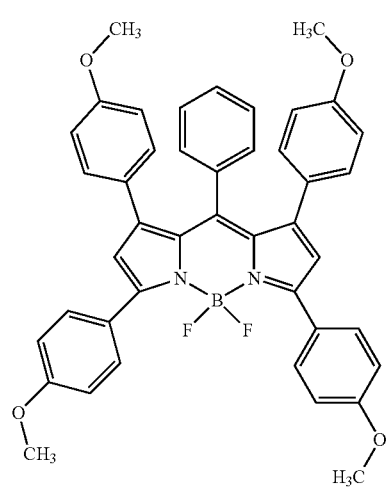
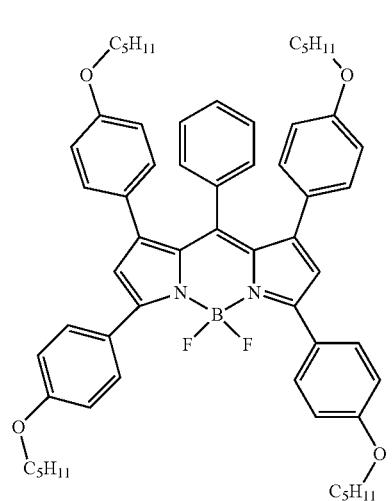
112
-continued
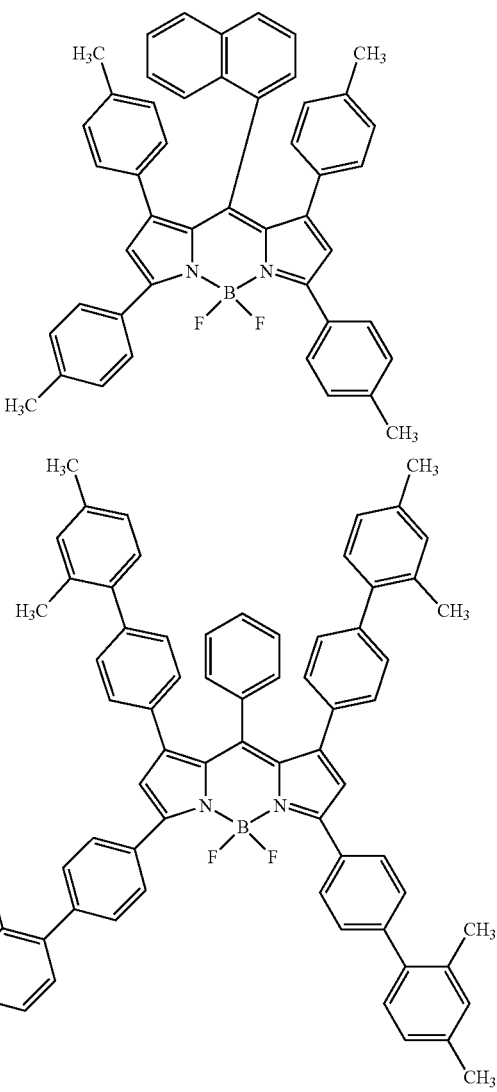
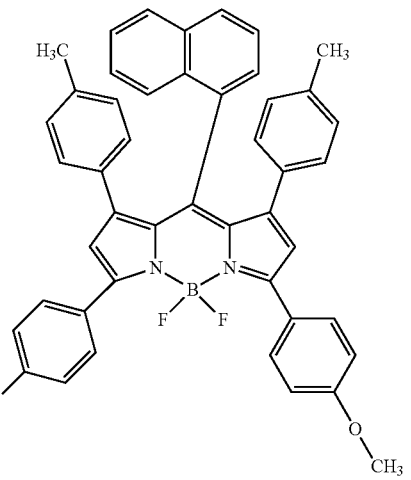

[Formula 59]
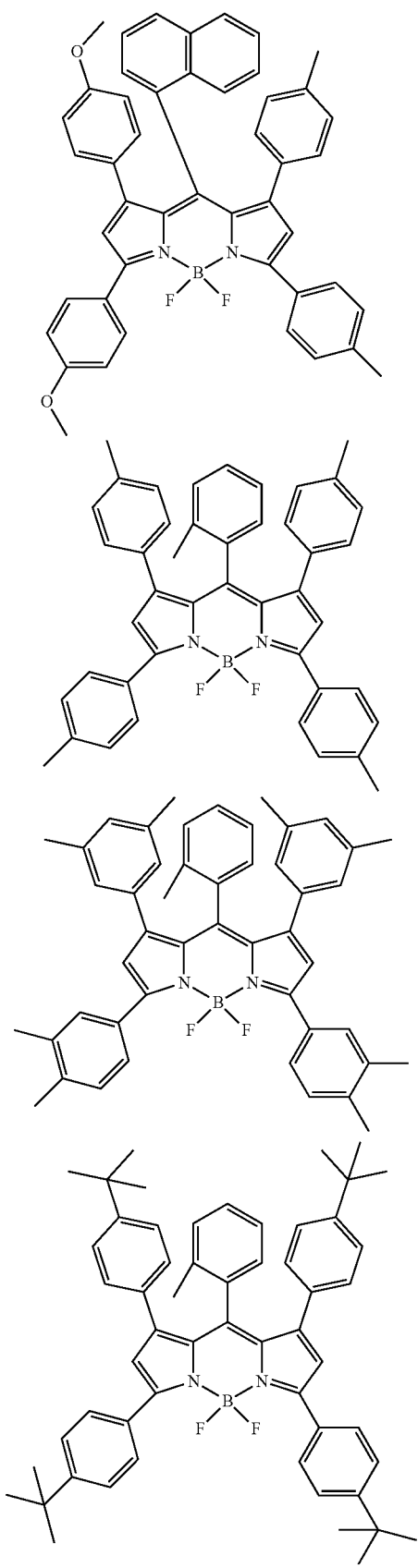
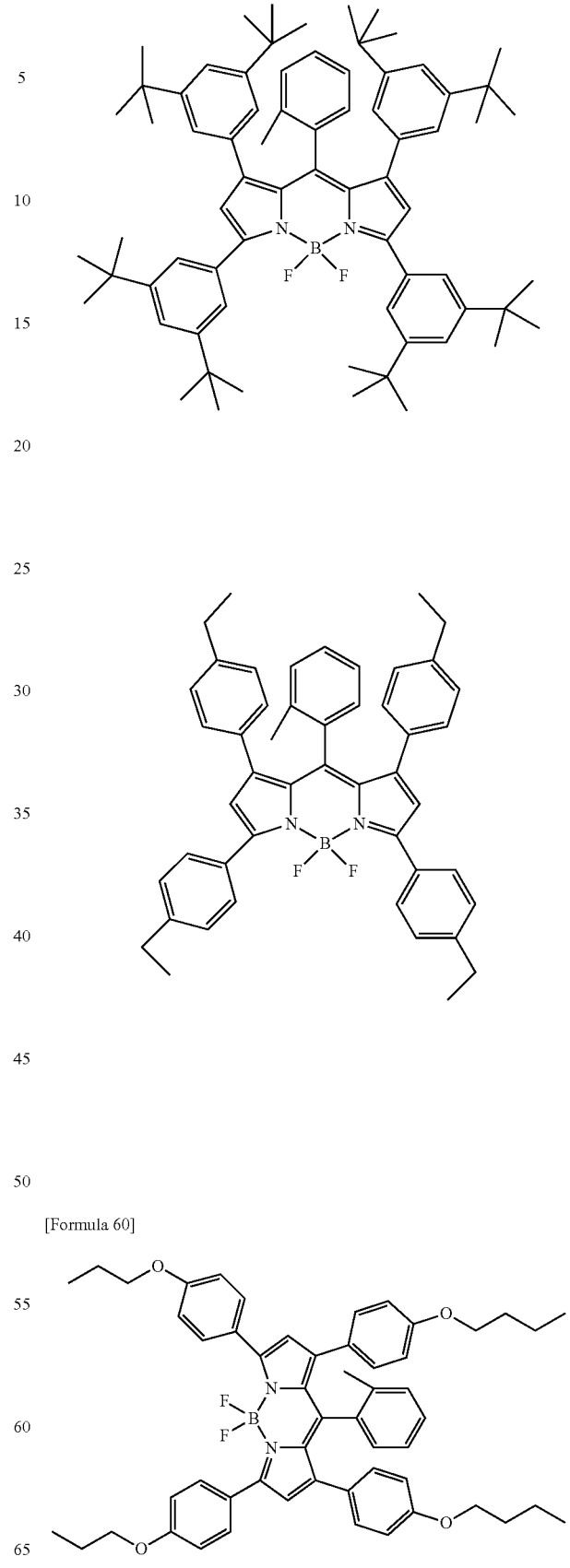
[Formula 60]

115
-continued
[Formula 61]
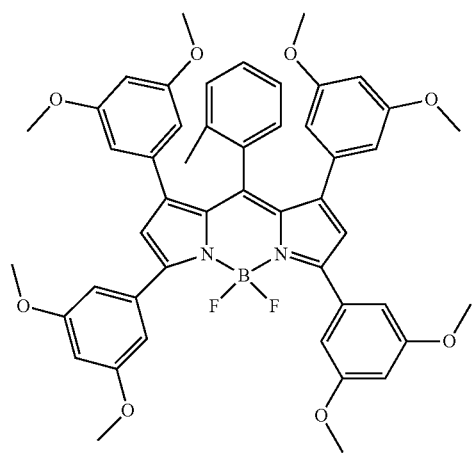
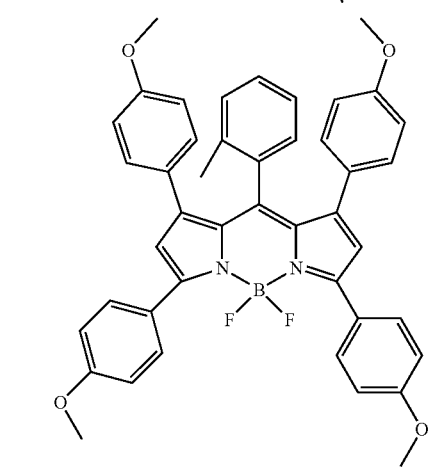
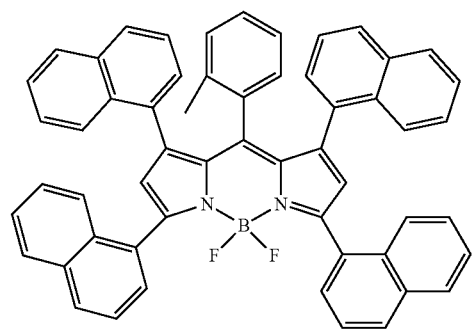
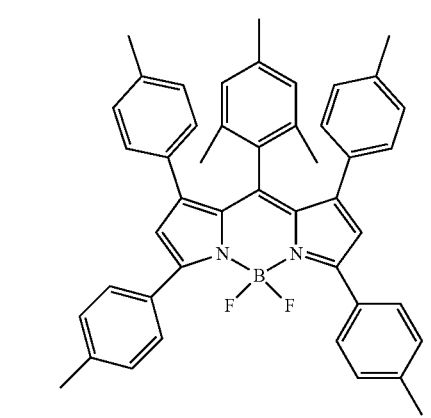
116
-continued
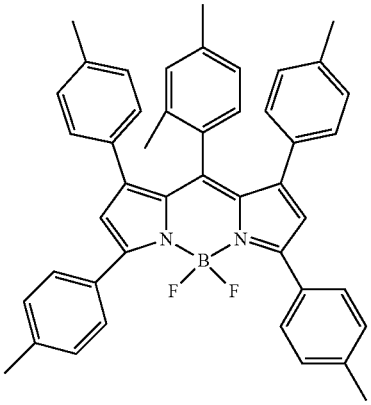
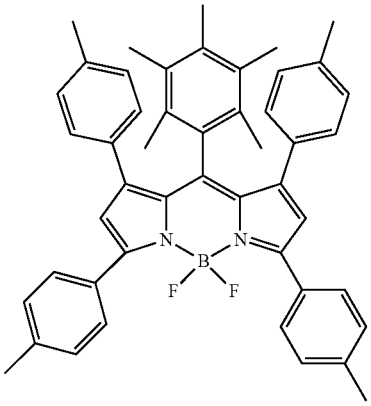
[Formula 62]
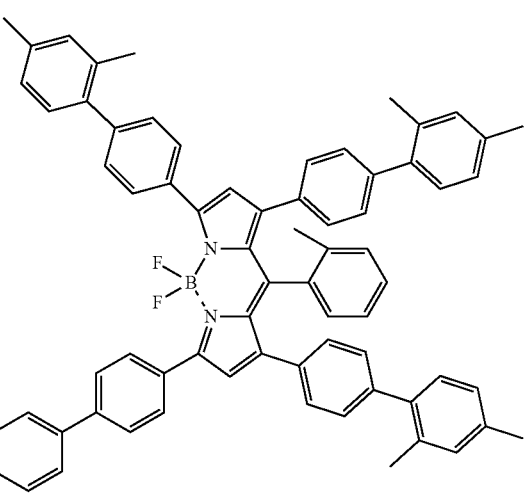

[Formula 63]
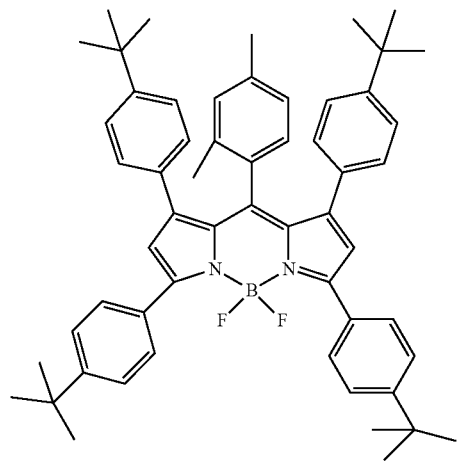
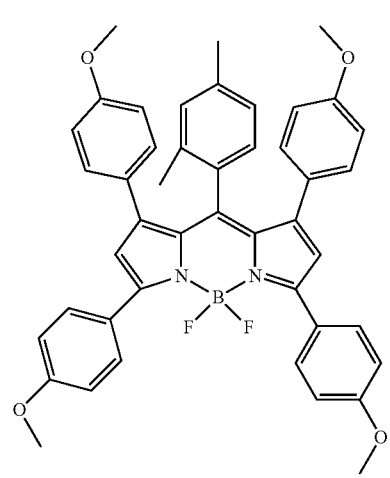
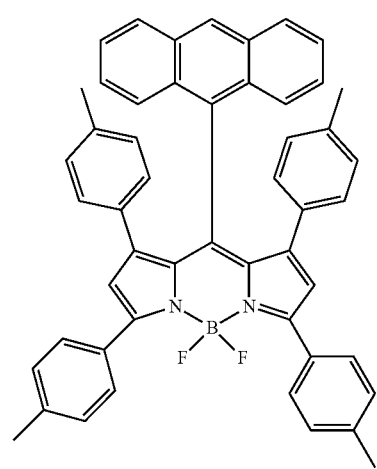
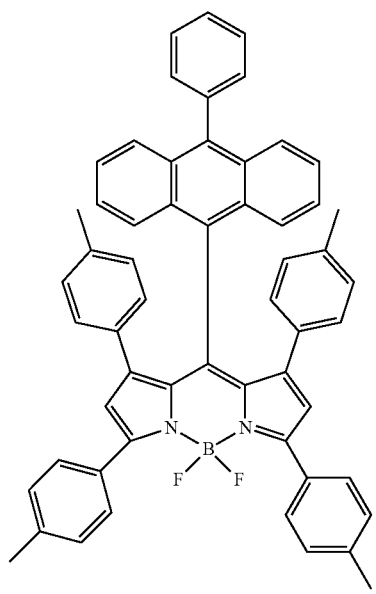
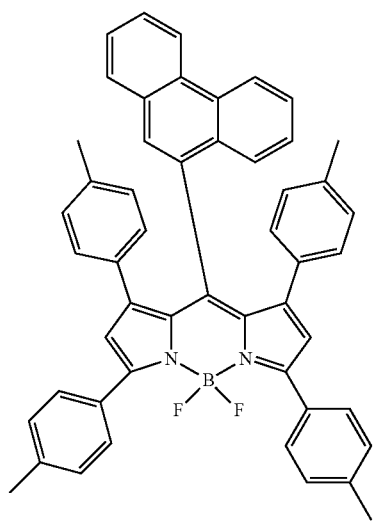
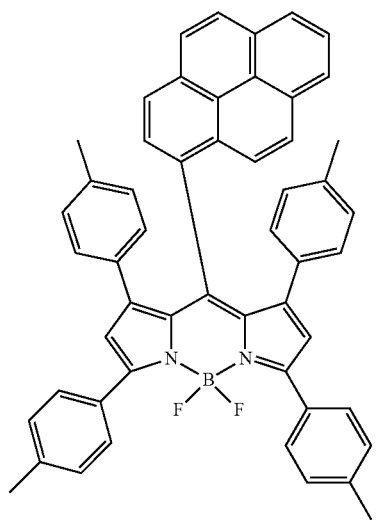

[Formula 64]
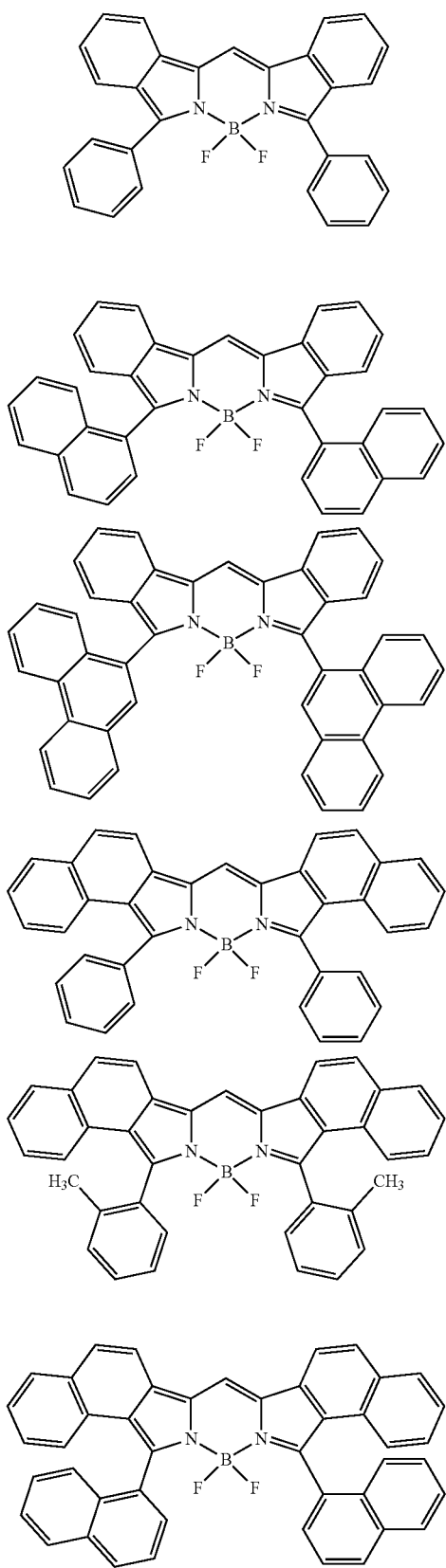
[Formula 65]
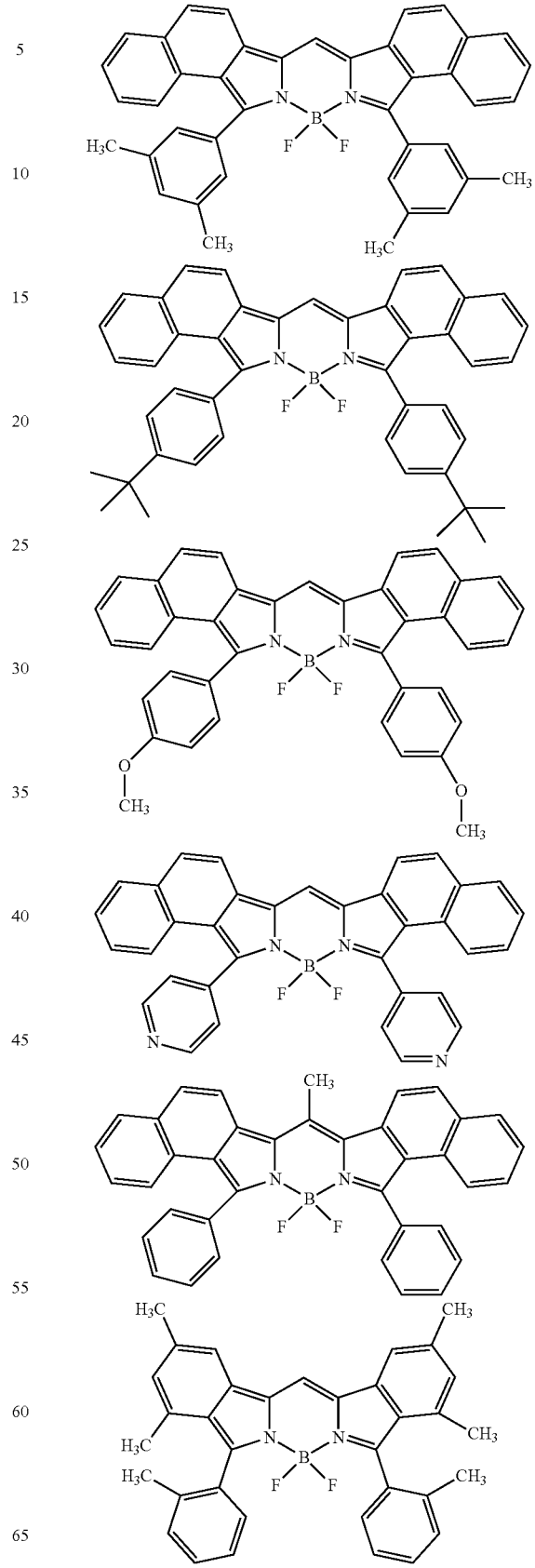

121
-continued
[Formula 66]
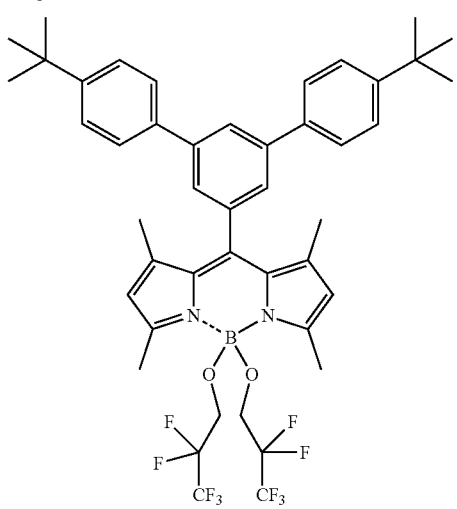
122
-continued
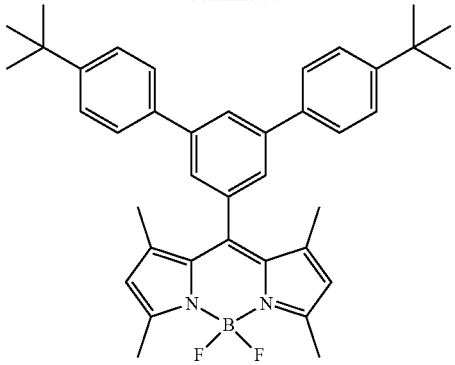
Compound Represented by Formula (30)
The first compound in the exemplary embodiment is also preferably a compound (aromatic compound) represented by a formula (30) below.
[Formula 67]
(30)
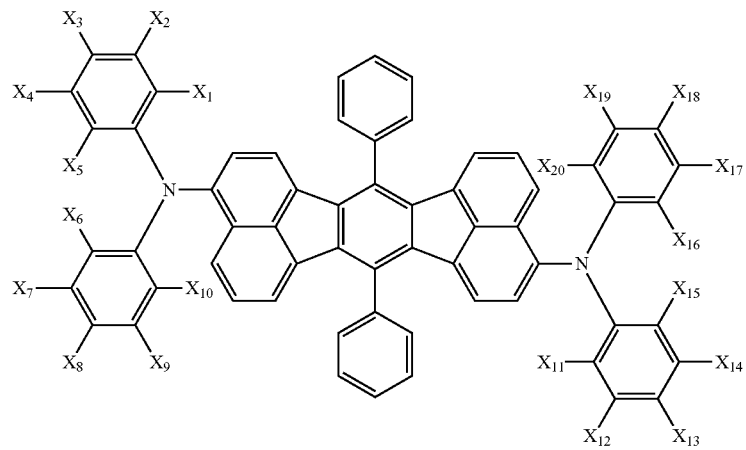
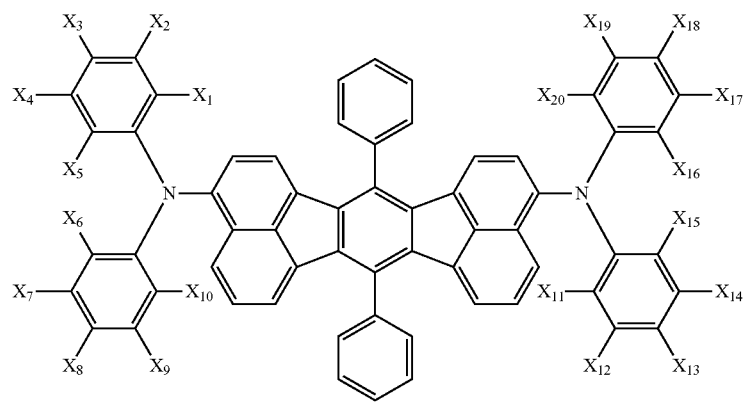

The formula (30) satisfies one of (1) to (4).
(1) At least four of $X_1$ to $X_{20}$ are each independently a linear or branched alkoxy group having 1 to 6 carbon atoms and the rest of $X_1$ to $X_{20}$ are each a hydrogen atom.
(2) At least one of $X_1$ to $X_{20}$ is a linear or branched alkyl group having 1 to 6 carbon atoms, at least one of $X_1$ to $X_{20}$ is a linear or branched alkoxy group having 1 to 6 carbon atoms, and a total of the alkyl group and the alkoxy group is four or more. The rest of $X_1$ to $X_{20}$ are each a hydrogen atom.
(3) At least six of $X_1$ to $X_{20}$ are each independently a linear or branched alkyl group having 1 to 6 carbon atoms and the rest of $X_1$ to $X_{20}$ are each a hydrogen atom.
(4) At least four of $X_1$ to $X_{20}$ are each independently a linear or branched alkyl group having 1 to 6 carbon atoms, two of which has 3 to 6 carbon atoms. The rest of $X_1$ to $X_{20}$ are each a hydrogen atom.

Specific examples of the compound represented by the formula (30) are shown below. It should be noted that the compound represented by the formula (30) in the invention is not limited to the specific examples.

[Formula 68]

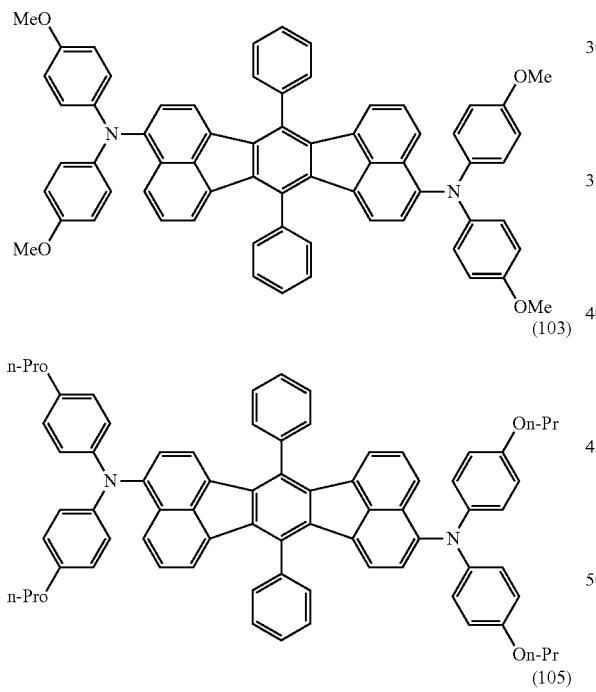

[Formula 69]

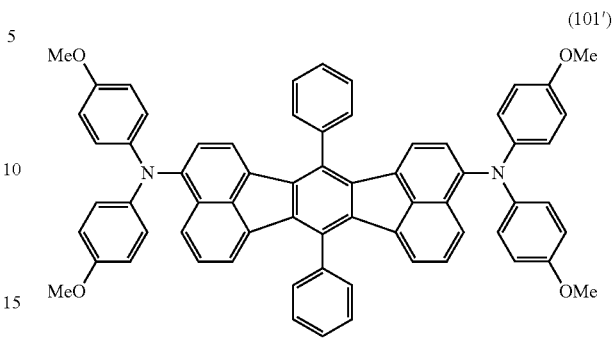

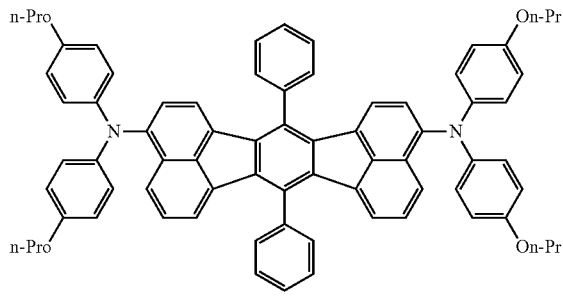

[Formula 70]

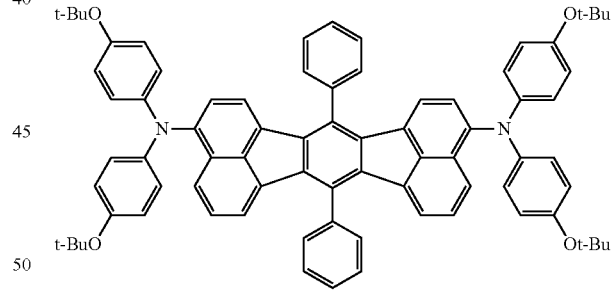

(503)

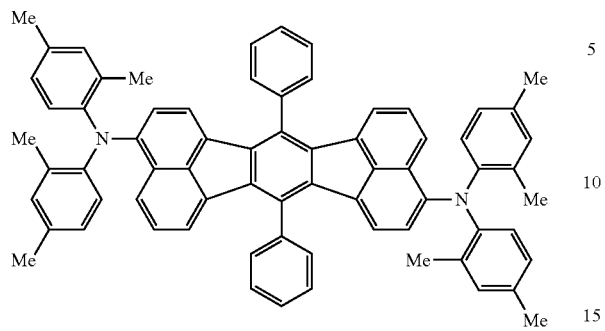

(505)

[Formula 71]

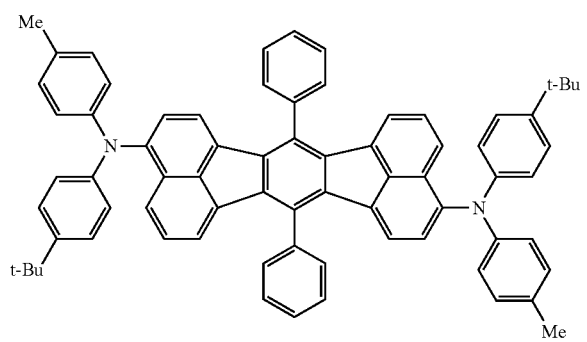

(601')

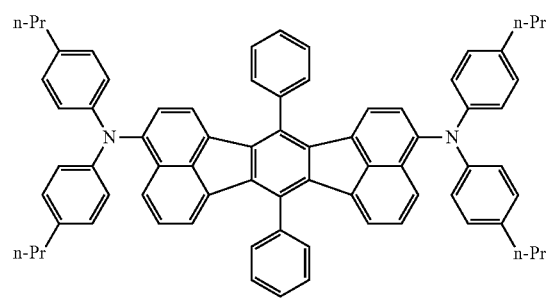

(603')

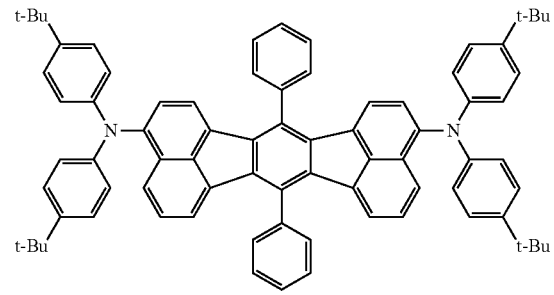

(605')

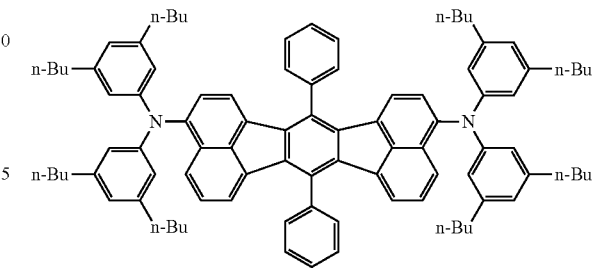

Compound Represented by Formula (40)

The first compound in the exemplary embodiment is preferably a compound represented by a formula (40) below.

[Formula 72]

(40)

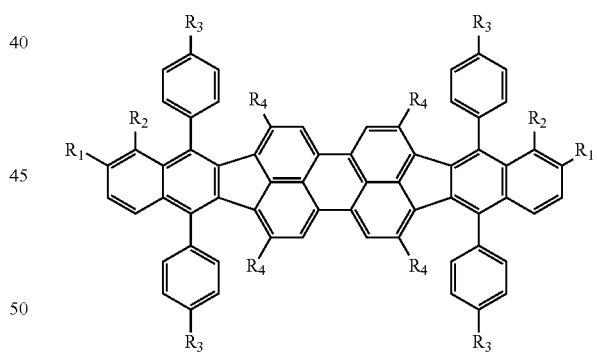

In the formula (40): $R_1$ to $R_4$ are each independently a hydrogen atom or a substituent; and $R_1$ to $R_4$ serving as the substituent are each independently selected from the group consisting of a halogen atom, a substituted or unsubstituted alkyl group having 1 to 30 carbon atoms, a substituted or unsubstituted alkoxy group having 1 to 30 carbon atoms, a substituted or unsubstituted aryl group having 6 to 30 ring carbon atoms, and a group derived from a substituted or unsubstituted heteroaryl group having 5 to 30 ring atoms.

Specific examples of the compound represented by the formula (40) are shown below. It should be noted that the compound represented by the formula (40) in the invention is not limited to the specific examples.

[Formula 73]
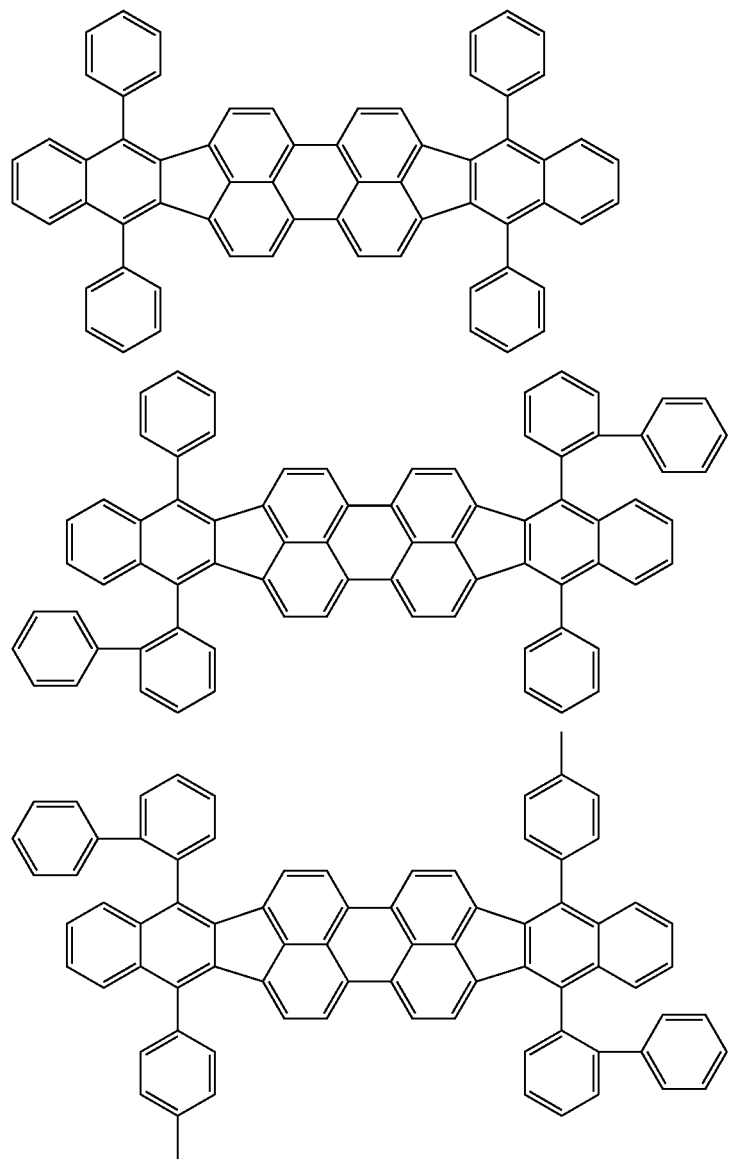
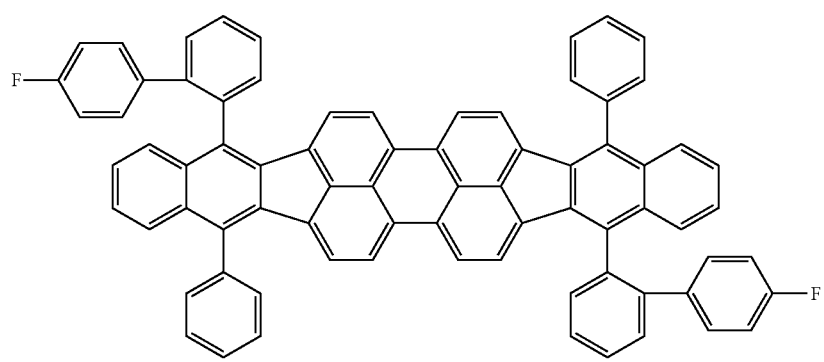

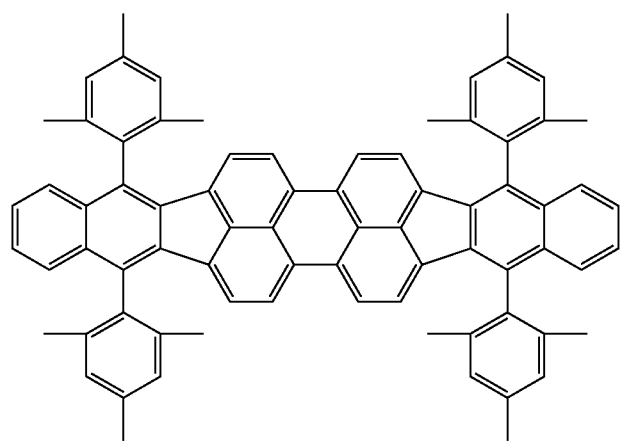
[Formula 74]
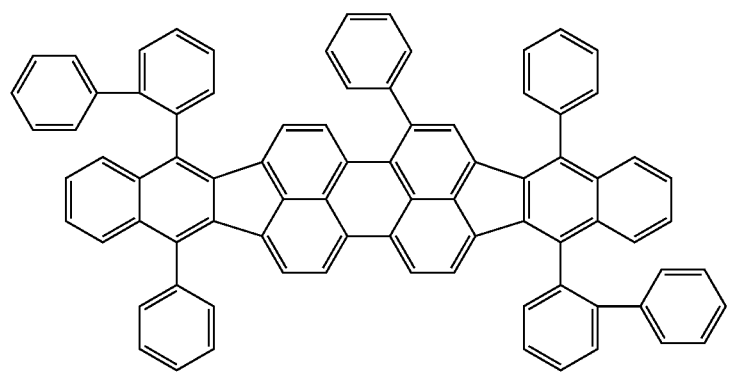
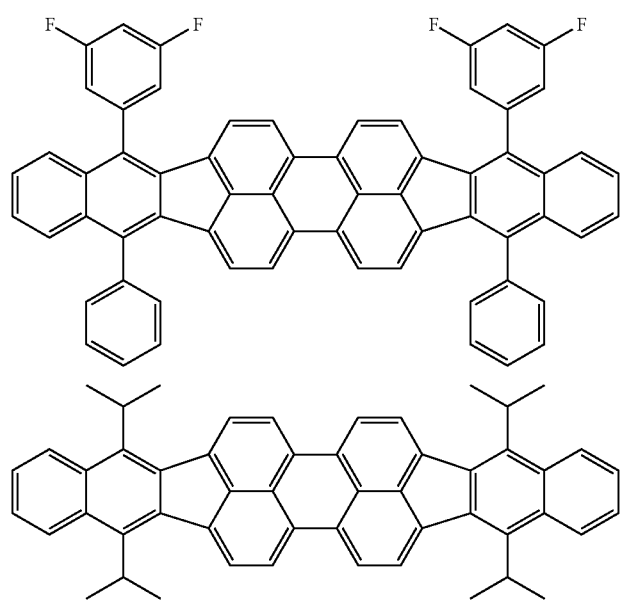

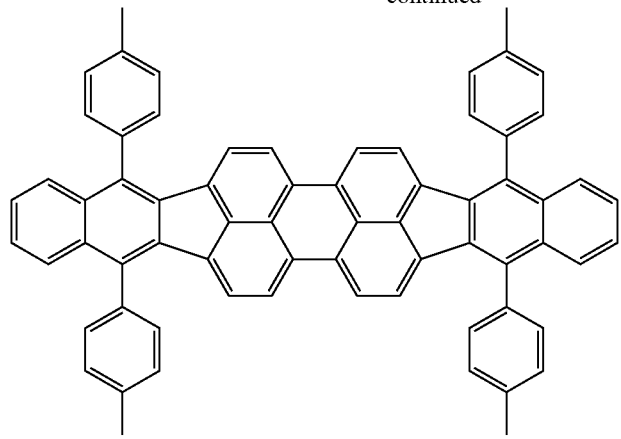

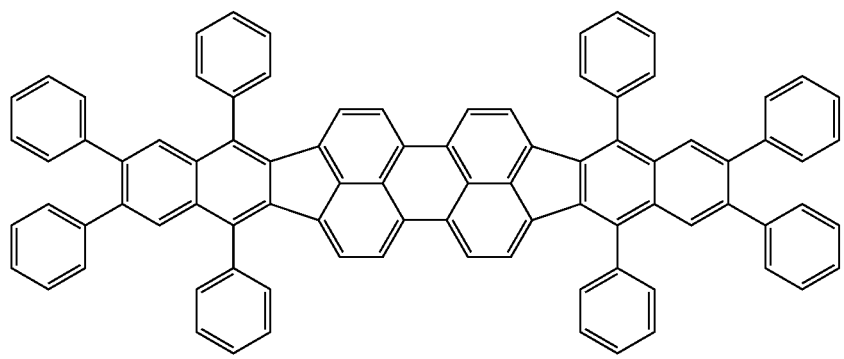

Compound Represented by Formula (50)

The first compound in the exemplary embodiment is also preferably a compound (aromatic amine derivative) represented by a formula (50) below.

[Formula 75]

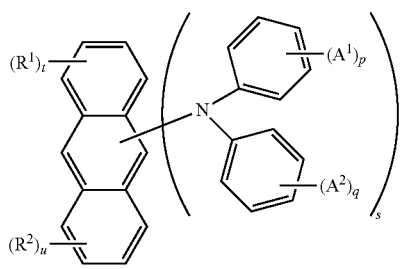

In the formula (50): $A^1$ to $A^2$ each independently represent a hydrogen atom, a substituted or unsubstituted alkyl group having 1 to 10 carbon atoms, a substituted or unsubstituted aryl group having 6 to 50 ring carbon atoms, a substituted or unsubstituted cycloalkyl group having 3 to 20 ring carbon atoms, a substituted or unsubstituted alkoxy group having 1 to 10 carbon atoms, a substituted or unsubstituted aryloxy group having 6 to 50 ring carbon atoms, a substituted or unsubstituted arylamino group having 6 to 50 ring carbon atoms, a substituted or unsubstituted alkylamino having 1 to 10 carbon atoms, or a halogen atom; p and q are each an integer from 1 to 5; and s is an integer from 1 to 9. When p and q are each 2 or more, a plurality of $A^1$ and a plurality of $A^2$ may be mutually the same or different. The plurality of $A^1$ may be connected to each other to form a saturated or unsaturated ring. The plurality of $A^2$ may be connected to each other to form a saturated or unsaturated ring. It should be noted that $A^1$ and $A^2$ are not hydrogen atoms at the same time.

$R^1$ represents a substituted or unsubstituted secondary or tertiary alkyl group having 3 to 10 carbon atoms. t is an integer from 1 to 9. When t is 2 or more, a plurality of $R^1$ may be mutually the same or different. $R^2$ represents a hydrogen atom, a substituted or unsubstituted alkyl group having 1 to 10 carbon atoms, a substituted or unsubstituted aryl group having 6 to 50 ring carbon atoms, a substituted or unsubstituted cycloalkyl group having 3 to 20 ring carbon atoms, a substituted or unsubstituted alkoxy group having 1 to 10 carbon atoms, a substituted or unsubstituted aryloxy group having 6 to 50 ring carbon atoms, a substituted or unsubstituted arylamino group having 6 to 50 ring carbon atoms, a substituted or unsubstituted alkylamino having 1 to 10 carbon atoms, or a halogen atom; and u is an integer from 0 to 8. When u is 2 or more, a plurality of $R^2$ may be mutually the same or different.

s+t+u is an integer from 2 to 10.

The compound represented by the formula (50) is more preferably a compound represented by a formula (51) below.

[Formula 76]

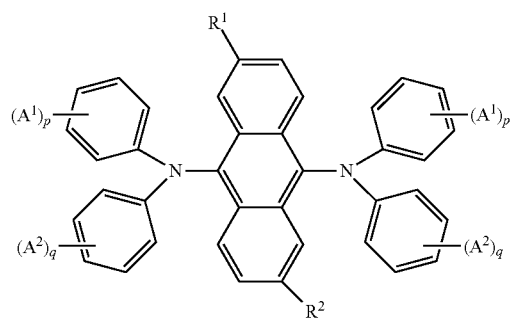

(51)

In the formula (51), $A^1$, $A^2$, p, q, $R^1$ and $R^2$ each independently represent the same as $A^1$, $A^2$, p, q, $R^1$ and $R^2$ in the formula (50).

Specific examples of the compound represented by the formula (50) are shown below. It should be noted that the compound represented by the formula (50) in the invention is not limited to the specific examples.

[Formula 77]

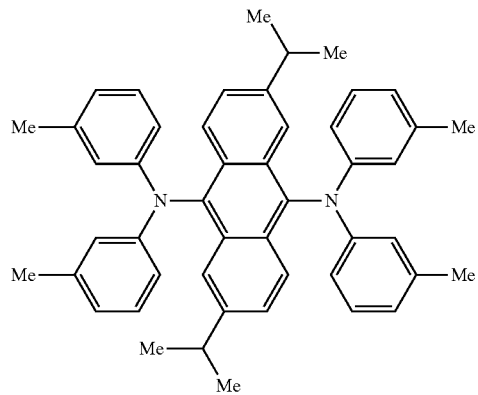

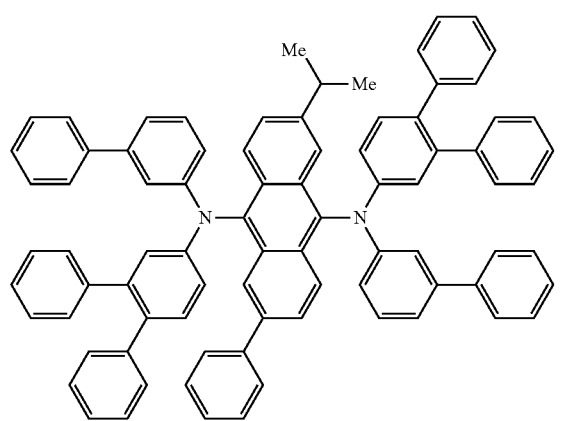

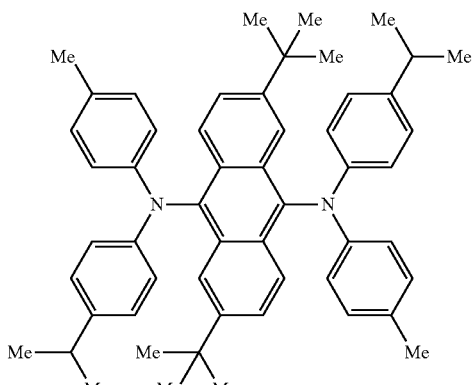

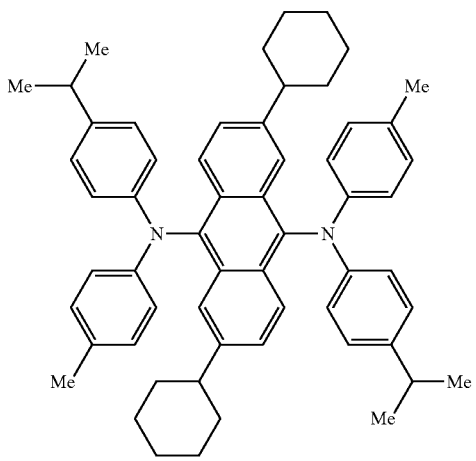

[Formula 78]

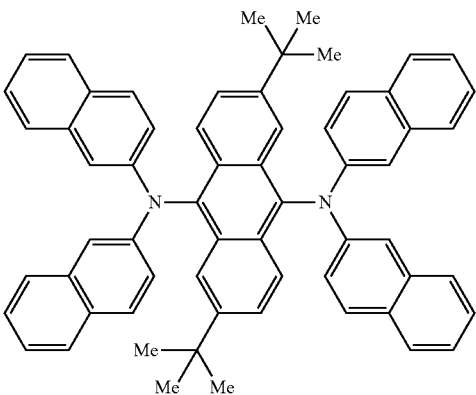

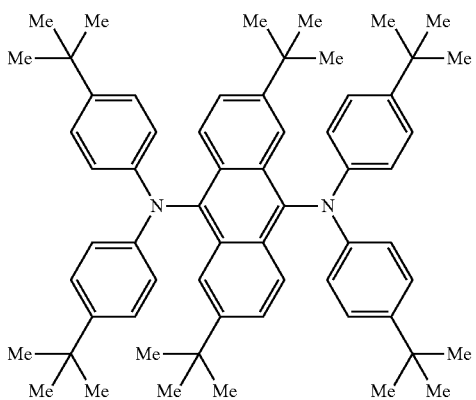

-continued

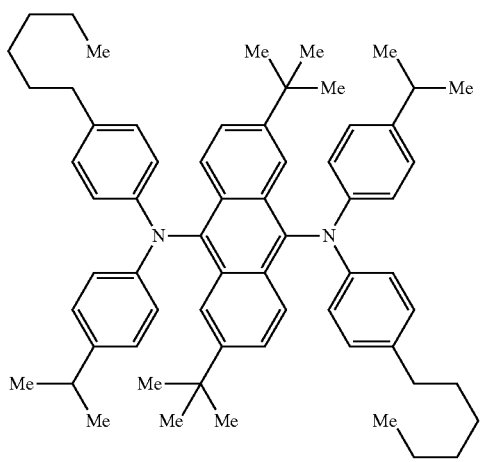

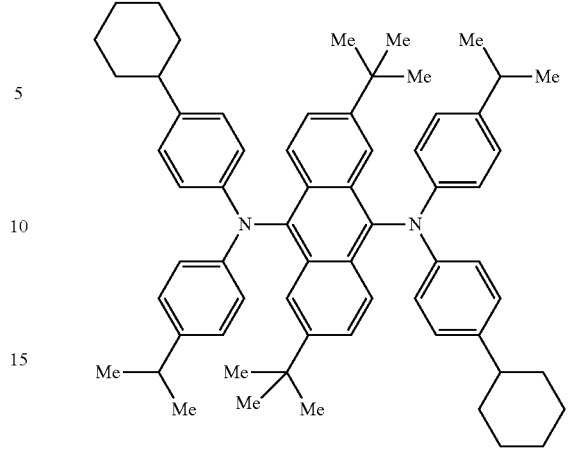

[Formula 79]

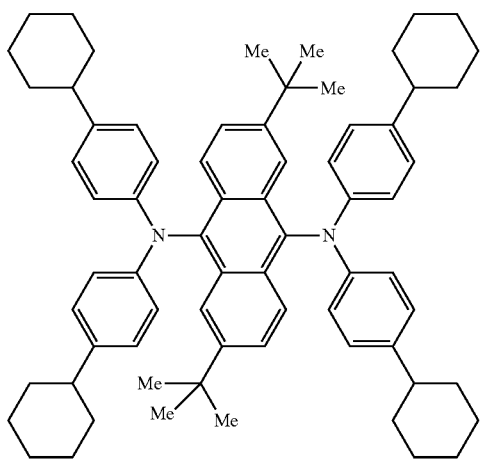

Compound Represented by Formula (1)

The first compound in the exemplary embodiment is also preferably a compound (aromatic amine derivative) represented by a formula (1) below.

[Formula 80]

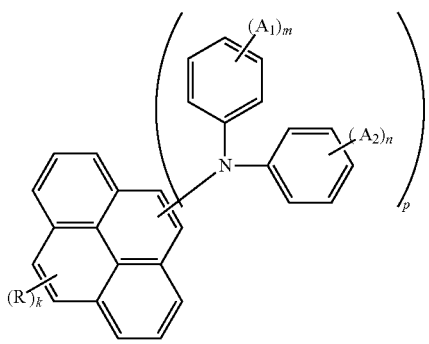

In the formula (1), R represents a hydrogen atom, a substituted or unsubstituted alkyl group having 1 to 50 carbon atoms, a substituted or unsubstituted aryl group having 6 to 50 carbon atoms, a substituted or unsubstituted aralkyl group having 7 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aryloxy group having 6 to 50 carbon atoms, a substituted or unsubstituted arylamino group having 6 to 50 carbon atoms, a substituted or unsubstituted alkylamino having 1 to 20 carbon atoms, a cyano group, or a halogen atom. k is an integer from 1 to 9. When k is 2 or more, a plurality of R may be mutually the same or different.

$A^1$ and $A^2$ each independently represent a hydrogen atom, a substituted or unsubstituted alkyl group having 1 to 50 carbon atoms, a substituted or unsubstituted aryl group having 6 to 50 carbon atoms, a substituted or unsubstituted aralkyl group having 7 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aryloxy group having 6 to 50 carbon atoms, a substituted or unsubstituted arylamino group having 6 to 50 carbon atoms, a substituted or unsubstituted alkylamino having 1 to 20 carbon atoms, a cyano group, or a halogen atom. m and n are each an integer from 0 to 5. When m is 2 or more, a plurality of $A^1$ may be mutually the same or different and may be connected to each other to form a saturated or unsaturated ring. When n is 2 or more, a plurality of $A^2$ may be mutually the same or different and may be connected to each other to form a saturated or unsaturated ring.

At least one of $A^1$ or $A^2$ has one group of a substituted or unsubstituted alkyl group having 2 or more carbon atoms, a substituted or unsubstituted aralkyl group having 7 or more carbon atoms, a substituted or unsubstituted cycloalkyl group having 3 or more carbon atoms, a substituted or unsubstituted alkoxy group having 2 or more carbon atoms, and a substituted or unsubstituted alkylamino group having 2 or more carbon atoms.

p is an integer from 1 to 9. When p is 2 or more, a plurality of groups shown inside parentheses ( )$_p$ may be mutually the same or different. k+p is an integer of 10 or less.

The compound represented by the formula (1) is more preferably a compound represented by a formula (II) below.

[Formula 81]

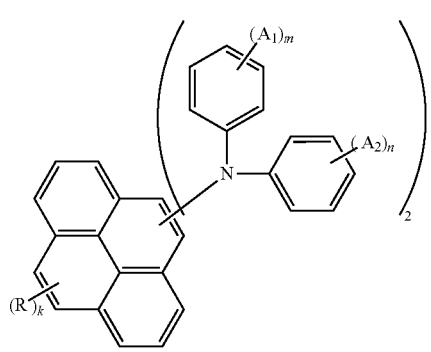

(II)

In the formula (II), R represents a hydrogen atom, a substituted or unsubstituted alkyl group having 1 to 50 carbon atoms, a substituted or unsubstituted aryl group having 6 to 50 carbon atoms, a substituted or unsubstituted aralkyl group having 7 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aryloxy group having 6 to 50 carbon atoms, a substituted or unsubstituted arylamino group having 6 to 50 carbon atoms, a substituted or unsubstituted alkylamino having 1 to 20 carbon atoms, a cyano group, or a halogen atom. k is an integer from 1 to 9. When k is 2 or more, a plurality of R may be mutually the same or different.

$A^1$ and $A^2$ each independently represent a hydrogen atom, a substituted or unsubstituted alkyl group having 1 to 50 carbon atoms, a substituted or unsubstituted aryl group having 6 to 50 carbon atoms, a substituted or unsubstituted aralkyl group having 7 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aryloxy group having 6 to 50 carbon atoms, a substituted or unsubstituted arylamino group having 6 to 50 carbon atoms, a substituted or unsubstituted alkylamino having 1 to 20 carbon atoms, a cyano group, or a halogen atom. m and n are each an integer from 0 to 5. When m is 2 or more, a plurality of $A^1$ may be mutually the same or different and may be connected to each other to form a saturated or unsaturated ring. When n is 2 or more, a plurality of $A^2$ may be mutually the same or different and may be connected to each other to form a saturated or unsaturated ring.

At least one of $A^1$ or $A^2$ has one group of a substituted or unsubstituted alkyl group having 2 or more carbon atoms, a substituted or unsubstituted aralkyl group having 7 or more carbon atoms, a substituted or unsubstituted cycloalkyl group having 3 or more carbon atoms, a substituted or unsubstituted alkoxy group having 2 or more carbon atoms, and a substituted or unsubstituted alkylamino group having 2 or more carbon atoms.

A plurality of groups shown inside parentheses ( )$_2$ may be mutually the same or different.

Specific examples of the compound represented by the formula (1) are shown below. It should be noted that the compound represented by the formula (1) in the invention is not limited to the specific examples.

[Formula 82]

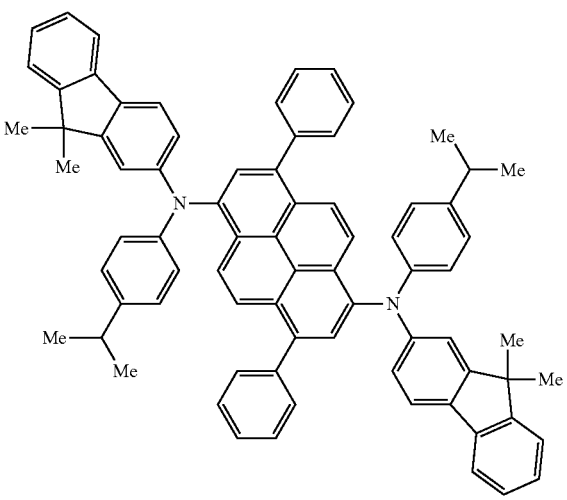

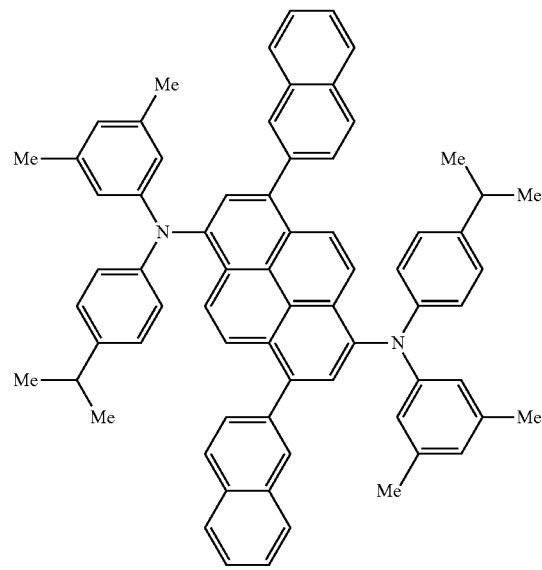

-continued
[Formula 83]
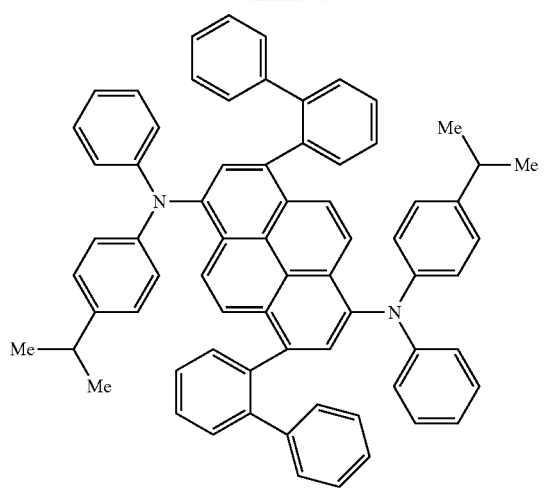
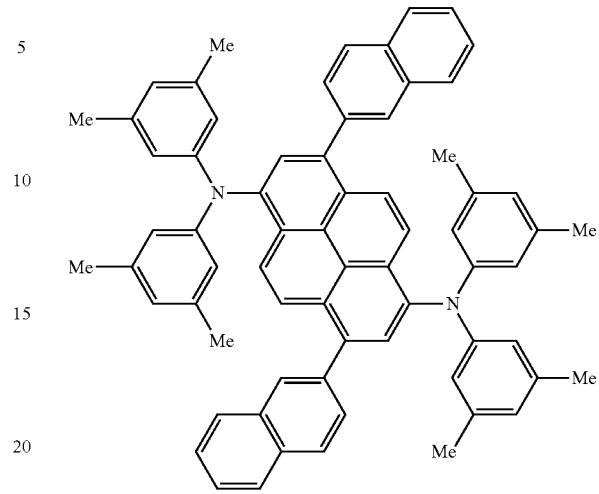
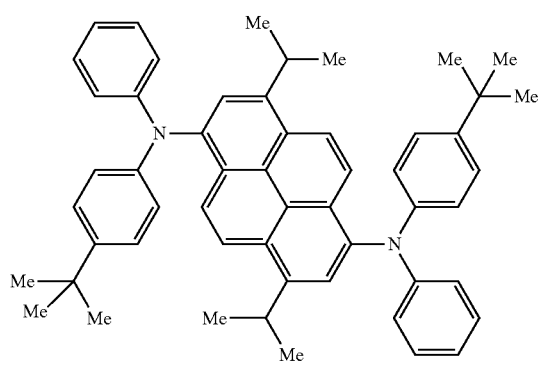
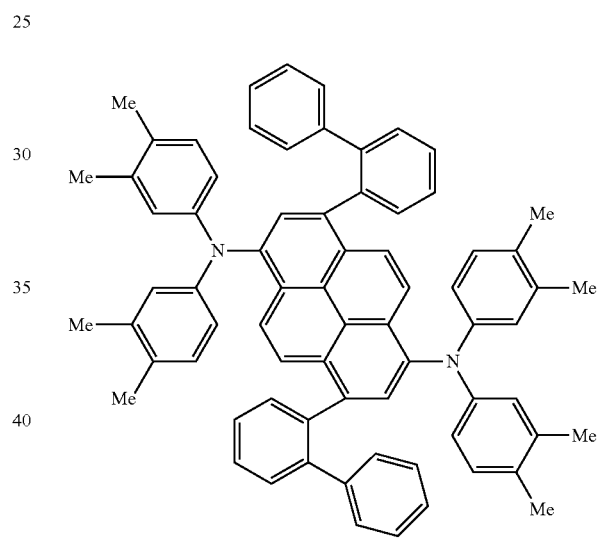
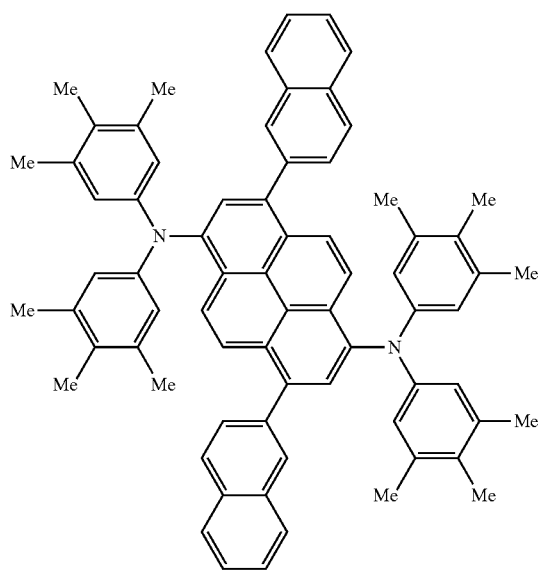
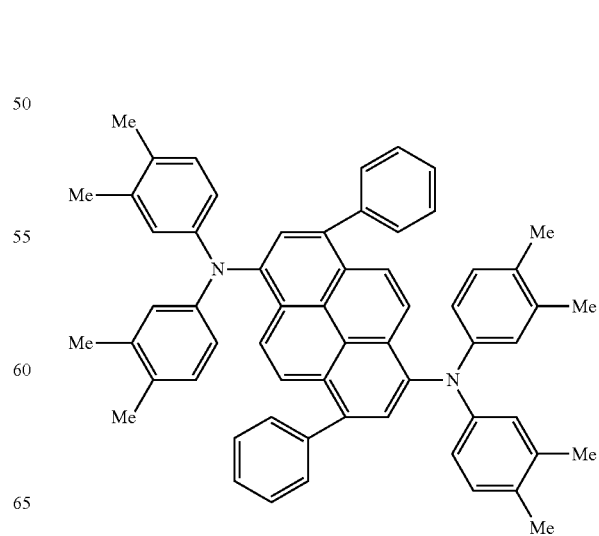

-continued

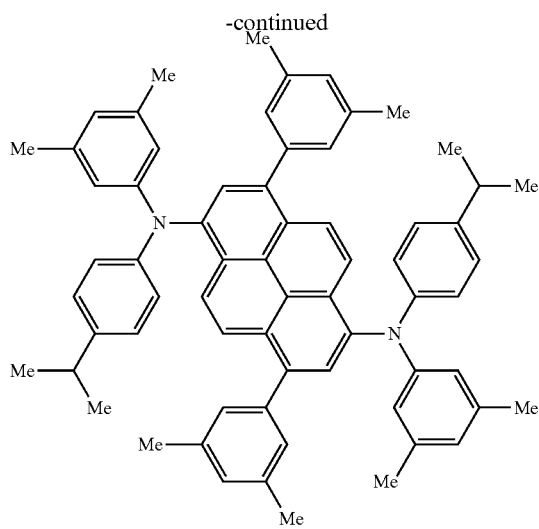

Compound Represented by Formula (60)
The first compound in the exemplary embodiment is also preferably a compound represented by a formula (60) below.

[Formula 84]

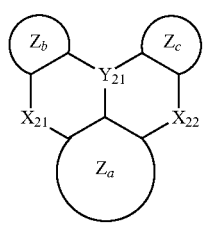

(60)

In the formula (60):
Za ring, Zb ring and Zc ring are each independently a cyclic structure selected from the group consisting of a substituted or unsubstituted aryl ring having 6 to 30 ring carbon atoms, and a substituted or unsubstituted heteroaryl ring having 5 to 30 ring atoms;
$X_{21}$ and $X_{22}$ are each independently an oxygen atom, NRa (a nitrogen atom having a substituent Ra), or a sulfur atom;
when $X_{21}$ is NRa, Ra is bonded to Za ring or Zb ring to form a ring or is not bonded to form no ring;
when $X_{22}$ is NRa, Ra is bonded to Za ring or Zc ring to form a ring or is not bonded to form no ring;
Ra is each independently a group selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 30 carbon atoms, $Y_2$ is any one of a boron atom, a phosphorus atom, SiRb (a silicon atom having a substituent Rb), P=O, and P=S; and
Rb is each independently a group selected from the group consisting of a substituted or unsubstituted aryl group having 6 to 30 ring carbon atoms, a substituted or unsubstituted heteroaryl group having 5 to 30 ring atoms, and a substituted or unsubstituted alkyl group having 1 to 30 carbon atoms.
Specific examples of the compound represented by the formula (60) are shown below. It should be noted that the compound represented by the formula (60) in the invention is not limited to the specific examples.

[Formula 85]

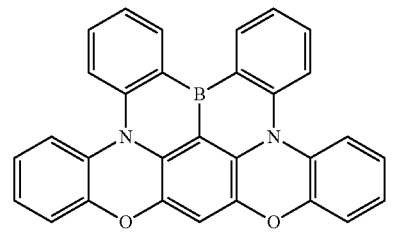

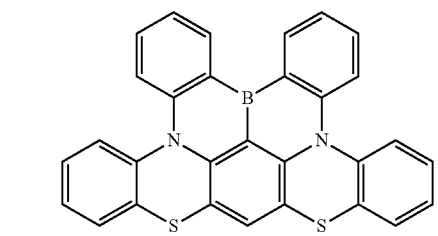

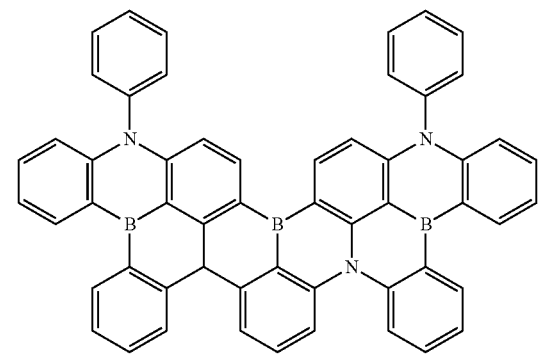

[Formula 86]

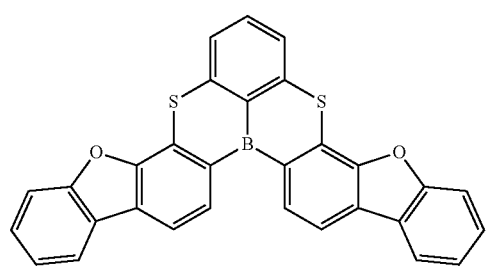

-continued

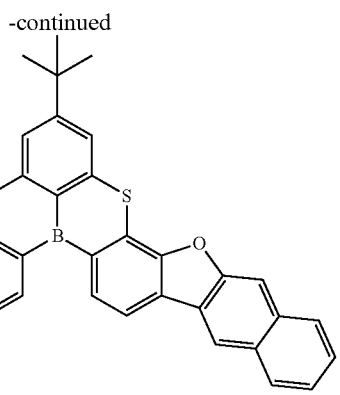

Method of Preparing First Compound

The first compound can be prepared by any known method.

Second Compound

The second compound is a delayed fluorescent compound.

The second compound is not a phosphorescent metal complex. The second compound is preferably not a metal complex.

Delayed Fluorescence

Delayed fluorescence is explained in "Yuki Hando-tai no Debaisu Bussei (Device Physics of Organic Semiconductors)" (edited by ADACHI, Chihaya, published by Kodansha, on pages 261-268). This document describes that, if an energy difference $\Delta E_{13}$ of a fluorescent material between a singlet state and a triplet state is reducible, a reverse energy transfer from the triplet state to the singlet state, which usually occurs at a low transition probability, would occur at a high efficiency to express thermally activated delayed fluorescence (TADF). Further, a mechanism of generating delayed fluorescence is explained in FIG. 10.38 in the document. The first compound of the exemplary embodiment is preferably a compound exhibiting thermally activated delayed fluorescence generated by such a mechanism.

In general, emission of delayed fluorescence can be confirmed by measuring the transient PL (Photo Luminescence).

The behavior of delayed fluorescence can also be analyzed based on the decay curve obtained from the transient PL measurement. The transient PL measurement is a method of irradiating a sample with a pulse laser to excite the sample, and measuring the decay behavior (transient characteristics) of PL emission after the irradiation is stopped. PL emission in TADF materials is classified into a light emission component from a singlet exciton generated by the first PL excitation and a light emission component from a singlet exciton generated via a triplet exciton. The lifetime of the singlet exciton generated by the first PL excitation is on the order of nanoseconds and is very short. Therefore, light emission from the singlet exciton rapidly attenuates after irradiation with the pulse laser.

On the other hand, the delayed fluorescence is gradually attenuated due to light emission from a singlet exciton generated via a triplet exciton having a long lifetime. As described above, there is a large temporal difference between the light emission from the singlet exciton generated by the first PL excitation and the light emission from the singlet exciton generated via the triplet exciton. Therefore, the luminous intensity derived from delayed fluorescence can be determined.

Figure 2:
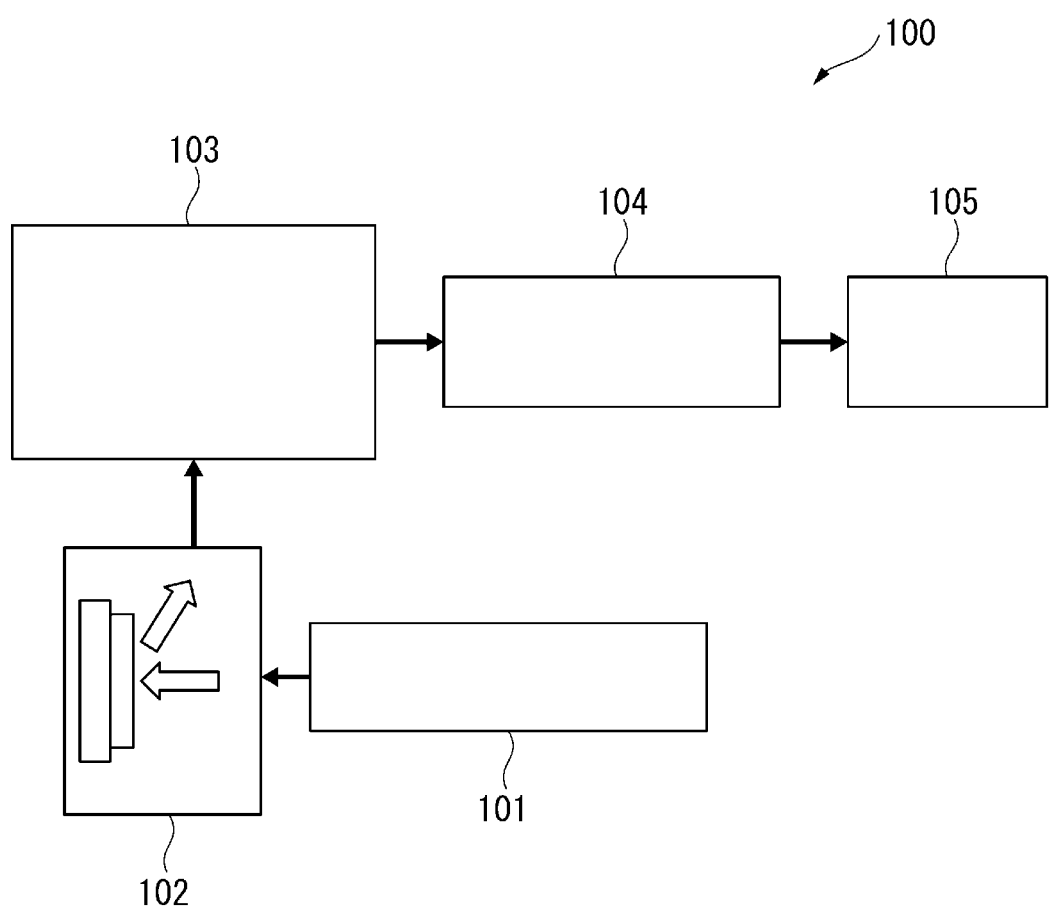

FIG. 2 shows a schematic diagram of an exemplary device for measuring the transient PL. An example of a method of measuring a transient PL using FIG. 2 and an example of behavior analysis of delayed fluorescence will be described.

A transient PL measuring device 100 in FIG. 2 includes: a pulse laser 101 capable of radiating a light having a predetermined wavelength; a sample chamber 102 configured to house a measurement sample; a spectrometer 103 configured to divide a light radiated from the measurement sample; a streak camera 104 configured to provide a two-dimensional image; and a personal computer 105 configured to import and analyze the two-dimensional image. A device for measuring the transient PL is not limited to the device described in the exemplary embodiment.

The sample housed in the sample chamber 102 is obtained by forming a thin film, in which a matrix material is doped with a doping material at a concentration of 12 mass %, on the quartz substrate.

The thin film sample housed in the sample chamber 102 is irradiated with the pulse laser from the pulse laser 101 to excite the doping material. Emission is extracted in a direction of 90 degrees with respect to a radiation direction of the excited light. The extracted emission is divided by the spectrometer 103 to form a two-dimensional image in the streak camera 104. As a result, the two-dimensional image is obtainable in which the ordinate axis represents a time, the abscissa axis represents a wavelength, and a bright spot represents a luminous intensity. When this two-dimensional image is taken out at a predetermined time axis, an emission spectrum in which the ordinate axis represents the luminous intensity and the abscissa axis represents the wavelength is obtainable. Moreover, when this two-dimensional image is taken out at the wavelength axis, a decay curve (transient PL) in which the ordinate axis represents a logarithm of the luminous intensity and the abscissa axis represents the time is obtainable.

For instance, a thin film sample A was prepared as described above from a reference compound H1 as the matrix material and a reference compound D1 as the doping material and was measured in terms of the transient PL.

[Formula 87]

Reference Compound H1

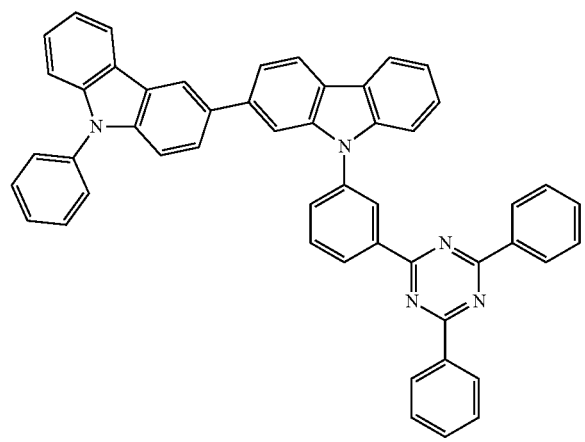

Reference Compound D1

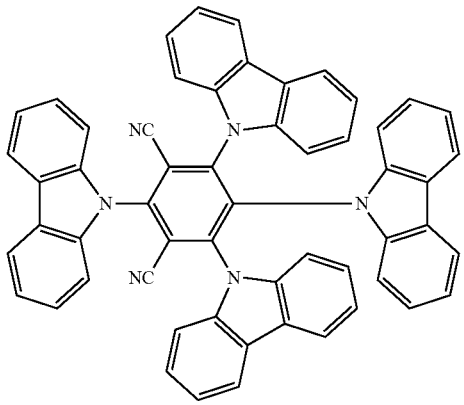

Herein, the decay curve was analyzed using the above-described thin film sample A and a thin film sample B. The thin film sample B was manufactured in the same manner as described above from a reference compound H2 as the matrix material and the reference compound D1 as the doping material.

Figure 3:
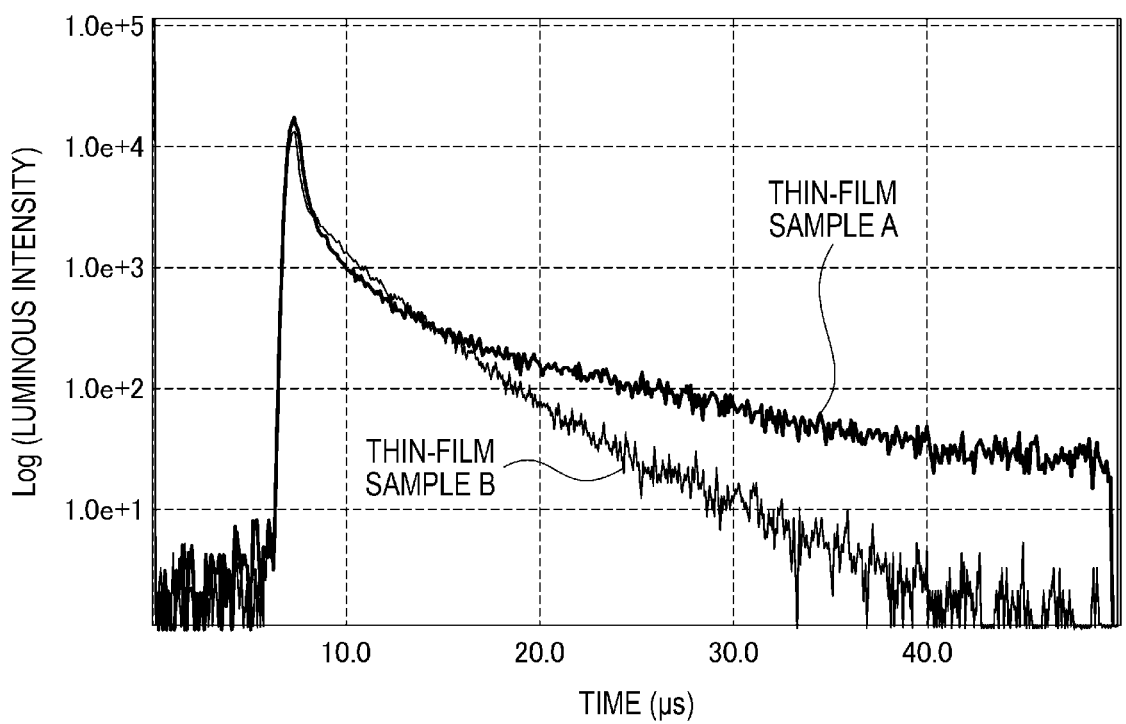
FIG. 3 shows an example of a decay curve of the transient PL.

FIG. 3 shows a decay curve obtained from the measured transitional PL of the thin film sample A and the thin film sample B.

[Formula 88]

Reference Compound H2

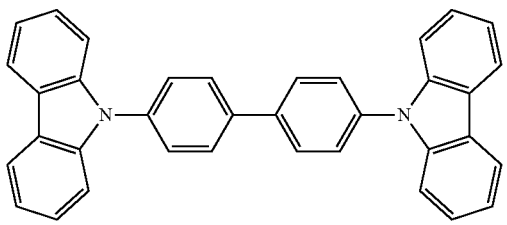

As described above, an emission decay curve in which the ordinate axis represents the luminous intensity and the abscissa axis represents the time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

Specifically, Prompt emission and Delay emission are present as emission from the delayed fluorescent material. Prompt emission is observed promptly when the excited state is achieved by exciting the compound of the exemplary embodiment with a pulse beam (i.e., a beam emitted from a pulse laser) having a wavelength absorbable by the delayed fluorescent material. Delay emission is observed not promptly when the excited state is achieved but after the excited state is achieved.

An amount of Prompt emission, an amount of Delay emission and a ratio between the amounts thereof can be obtained according to the method as described in "Nature 492, 234-238, 2012" (Reference Document 1). The amount of Prompt emission and the amount of Delay emission may be calculated using a device different from one described in Reference Document 1 or one shown in FIG. 2.

Herein, a sample manufactured by a method shown below is used for measuring delayed fluorescence of the first compound. For instance, the first compound is dissolved in toluene to prepare a dilute solution with an absorbance of 0.05 or less at the excitation wavelength to eliminate the contribution of self-absorption. In order to prevent quenching due to oxygen, the sample solution is frozen and degassed and then sealed in a cell with a lid under an argon atmosphere to obtain an oxygen-free sample solution saturated with argon.

The fluorescence spectrum of the sample solution is measured with a spectrofluorometer FP-8600 (manufactured by JASCO Corporation), and the fluorescence spectrum of a 9,10-diphenylanthracene ethanol solution is measured under the same conditions. Using the fluorescence area intensities of both spectra, the total fluorescence quantum yield is calculated by an equation (1) in Morris et al. J. Phys. Chem. 80 (1976) 969.

An amount of Prompt emission, an amount of Delay emission and a ratio between the amounts thereof can be obtained according to the method as described in "Nature 492, 234-238, 2012" (Reference Document 1). The amount of Prompt emission and the amount of Delay emission may be calculated using a device different from one described in Reference Document 1 or one shown in FIG. 2.

In the exemplary embodiment, provided that an amount of Prompt emission of a measurement target compound (first compound) is denoted by XP and an amount of Delay emission thereof is denoted by XD, a value of XD/XP is preferably 0.05 or more.

The amounts of Prompt emission and Delay emission and a ratio of the amounts thereof in compounds other than the first compound herein are measured in the same manner as those of the first compound.

In the exemplary embodiment, the second compound is exemplified by a compound represented by a formula (2) below.

[Formula 89]

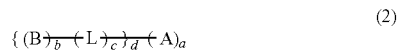

$$\{(B)_b\text{-}(L)_c\}_d\text{-}(A)_a \qquad (2)$$

In the formula (2): A is an acceptor (electron accepting) partial structure having a partial structure selected from formulae (a-1) to (a-7) below, a plurality of A being mutually the same or different when a plurality of A are present, the plurality of A being optionally mutually bonded to form a saturated or unsaturated ring;

B is a donor (electron donating) moiety having a partial structure selected from formulae (b-1) to (b-6) below, a plurality of B being mutually the same or different when a plurality of B are present, the plurality of B being optionally mutually bonded to form a saturated or unsaturated ring; a, b, and d are each independently 1, 2, 3, 4, or 5;

c is 0, 1, 2, 3, 4 or 5;

when c is 0, A and B are bonded via a single bond or a spiro bond;

when c is 1, 2, 3, 4 or 5, L is a linking group selected from the group consisting of a substituted or unsubstituted aromatic hydrocarbon group having 6 to 30 ring carbon atoms, and a substituted or unsubstituted heterocyclic group having 5 to 30 ring atoms; and when a plurality of L are present, the plurality of L are mutually the same or different and are optionally mutually bonded to form a saturated or unsaturated ring.

[Formula 90]

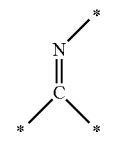 (a-1)

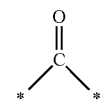 (a-2)

 (a-3)

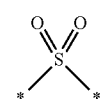 (a-4)

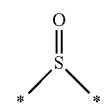 (a-5)

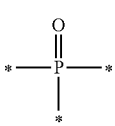 (a-6)

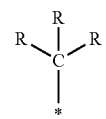 (a-7)

[Formula 91]

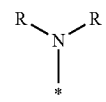 (b-1)

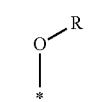 (b-2)

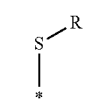 (b-3)

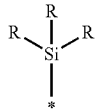 (b-4)

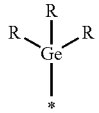 (b-5)

(b-6)

In the formulae (b-1) to (b-6): R each independently represent a hydrogen atom or a substituent, the substituent for R being selected from the group consisting of a substituted or unsubstituted aromatic hydrocarbon group having 6 to 30 ring carbon atoms, a substituted or unsubstituted heterocyclic group having 5 to 30 ring atoms, and a substituted or unsubstituted alkyl group having 1 to 30 carbon atoms; and when a plurality of R are present, the plurality of R are mutually the same or different and are optionally mutually bonded to form a saturated or unsaturated ring.

Examples of the bonding form of the compound represented by the formula (2) are shown in Table 1 below.

TABLE 1

| No. | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B<A,A |
| (1D) | 1 | 2 | 0 | 1 | B—B—A, B,B>A |
| (1E) | 2 | 1 | 1 | 1 | B—L—A—A, B—L<A,A |
| (1F) | 1 | 2 | 1 | 1 | B—B—L—A, B,B>L—A |
| (1G) | 1 | 1 | 2 | 1 | B—L—L—A |
| (1H) | 1 | 1 | 1 | 2 | B—L>A,A; B—L—B—L—A |

In the exemplary embodiment, the second compound preferably has a partial structure represented by a formula (200) below and a partial structure represented by a formula (2Y) below in one molecule.

[Formula 92]

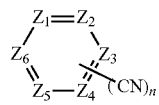
(200)

In the formula (200), CN is a cyano group, and n is an integer of 1 or more, n being preferably an integer in a range from 1 to 5, more preferably 2 or 4.

$Z_1$ to $Z_6$ are each independently a nitrogen atom, a carbon atom bonded to CN, or a carbon atom bonded to another atom in the molecule of the second compound. For instance, when $Z_1$ is a carbon atom bonded to CN, at least one of remaining five atoms (i.e. $Z_2$ to $Z_6$) is a carbon atom bonded to another atom in the molecule of the second compound. The another atom may be an atom forming a partial structure represented by the formula (2Y) below or an atom of a substituent or a linking group for bonding the partial structure.

The second compound of the exemplary embodiment may have a partial structure in a form of a six-membered ring formed by $Z_1$ to $Z_6$, or, alternatively, have a partial structure in a form of a fused ring formed by fusing a further ring to the six-membered ring.

[Formula 93]

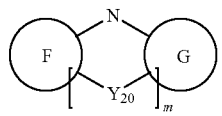
(2Y)

In the formula (2Y): F and G each independently represent a cyclic structure; m is 0 or 1; and when m is 1, $Y_{20}$ represents a single bond, an oxygen atom, a sulfur atom, a selenium atom, a carbon atom, a silicon atom, or a germanium atom.

When m is 0 in the formula (2Y), the formula (2Y) is represented by a formula (20Y) below.

[Formula 94]

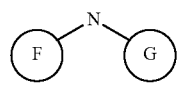
(20Y)

The cyclic structures F and G in the formula (20Y) represent the same as the cyclic structures F and G in the formula (2Y).

When m is 1 in the formula (2Y), the formula (2Y) is represented by any one of formulae (22) to (28) below.

[Formula 95]

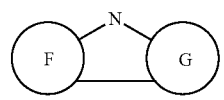
(22)

-continued

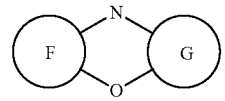
(23)

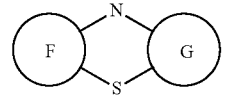
(24)

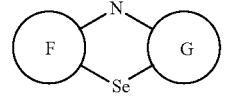
(25)

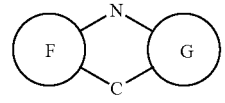
(26)

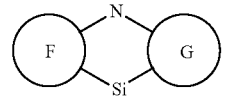
(27)

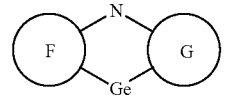
(28)

The cyclic structures F and G in the formulae (22) to (28) represent the same as the cyclic structures F and G in the formula (2Y).

In the exemplary embodiment, the cyclic structures F and G are each preferably a five-membered ring or a six-membered ring, the five-membered or six-membered ring preferably being an unsaturated ring, more preferably an unsaturated six-membered ring.

In the exemplary embodiment, the second compound is preferably a compound represented by a formula (20) below.

[Formula 96]

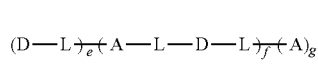
(20)

In the formula (20): A is represented by the formula (200), where CN represents a cyano group, n is an integer of 1 or more, $Z_1$ to $Z_6$ each independently represent a nitrogen atom, a carbon atom bonded to CN, a carbon atom bonded to R, a carbon atom bonded to L, or a carbon atom bonded to D, at least one of $Z_1$ to $Z_6$ being the carbon atom bonded to CN and at least one of $Z_1$ to $Z_6$ being the carbon atom bonded to L or D; and R is each independently a hydrogen atom or a substituent, the substituent for R being selected from the group consisting of a halogen atom, a substituted or unsubstituted aryl group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms.

In the formula (20), D is represented by the formula (2Y), where the cyclic structures F and G are unsubstituted or substituted, m is 0 or 1, and, when m is 1, $Y_{20}$ represents a single bond, an oxygen atom, a sulfur atom, a selenium atom, a carbonyl group, $CR_{21}R_{22}$, $SiR_{23}R_{24}$ or $GeR_{25}R_{26}$, $R_{21}$ to $R_{26}$ representing the same group for R. When m is 1 in the formula (2Y), the formula (2Y) is represented by any one of the formulae (22) to (25) and formulae (21Y) to (24Y) below.

[Formula 97]

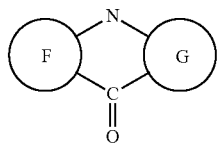

(21Y)

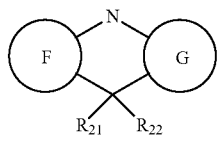

(22Y)

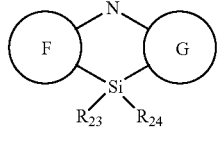

(23Y)

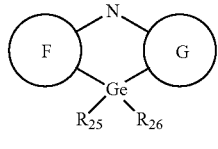

(24Y)

In the formula (20): (i) when L is present between A and D, L is a single bond, a substituted or unsubstituted aromatic hydrocarbon group having 6 to 14 ring carbon atoms, a substituted or unsubstituted aromatic heterocyclic group having 5 to 14 ring atoms, $CR_{81}R_{82}$, $NR_{83}$, O, S, $SiR_{84}R_{85}$, $CR_{86}R_{87}$—$CR_{88}R_{89}$, $CR_{90}$=$CR_{91}$, a substituted or unsubstituted alicyclic hydrocarbon group, or a substituted or unsubstituted aliphatic heterocyclic group; and $R_{81}$ to $R_{91}$ each independently represent the same as R.

In the formula (20): (ii) when L is at a terminal end of a molecule of the second compound, L represents the same as R.

In the formula (20): f is an integer of 1 or more; e and g are each independently an integer of 0 or more; a plurality of A are optionally mutually the same or different; a plurality of D are optionally mutually the same or different; and a plurality of L are optionally mutually the same or different.

The formula (20) is represented by, for instance, formulae (201) to (220) below.

TABLE 2

| Formula No. | e, f, q in Formula (20) | Formula |
|---|---|---|
| (207) | e = 1, f = 1, g = 1 | D—L—A—L—D—L—A |
| (208) | e = 1, f = 1, g = 1 | D—A—D—A |
| (209) | e = 1, f = 2, g = 0 | D—L—A—L—D—L—A—L—D |
| (210) | e = 1, f = 2, g = 0 | D—A—D—A—D |
| (211) | e = 0, f = 2, g = 1 | A—L—D—L—A—L—D—L—A |
| (212) | e = 0, f = 2, g = 1 | A—D—A—D—A |

TABLE 3

| Formula No. | e, f, q in Formula (20) | Formula |
|---|---|---|
| (207) | e = 1, f = 1, g = 1 | D—L—A—L—D—L—A |
| (208) | e = 1, f = 1, g = 1 | D—A—D—A |
| (209) | e = 1, f = 2, g = 0 | D—L—A—L—D—L—A—L—D |
| (210) | e = 1, f = 2, g = 0 | D—A—D—A—D |
| (211) | e = 0, f = 2, g = 1 | A—L—D—L—A—L—D—L—A |
| (212) | e = 0, f = 2, g = 1 | A—D—A—D—A |

TABLE 4

| Formula No. | e, f, g in Formula (20) | Formula |
|---|---|---|
| (213) | e = 2, f = 1, g = 0 | D—L—A—L—D<br>        \|<br>        L<br>        \|<br>        D |
| (214) | e = 2, f = 1, g = 0 | D—A—D<br>    \|<br>    D |
| (215) | e = 3, f = 1, g = 0 | D<br>\|<br>L<br>\|<br>D—L—A—L—D<br>        \|<br>        L<br>        \|<br>        D |
| (216) | e = 3, f = 1, g = 0 | D<br>\|<br>D—A—D<br>    \|<br>    D |

TABLE 5

| Formula No. | e, f, g in Formula (20) | Formula |
|---|---|---|
| (217) | e = 0, f = 1, g = 2 | A—L—D—L—A<br>        \|<br>        L<br>        \|<br>        A |
| (218) | e = 0, f = 1, g = 2 | A—D—A<br>    \|<br>    A |

TABLE 5-continued

| Formula No. | e, f, g in Formula (20) | Formula |
|---|---|---|
| (219) | e = 0, f = 1, g = 3 | 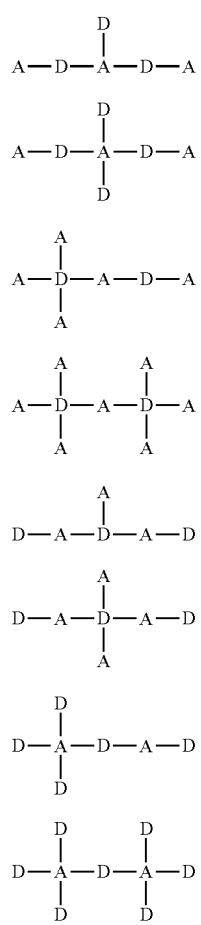 |
| (220) | e = 0, f = 1, g = 3 | |

Further, in the repeating unit in parentheses suffixed by a repeating number f in the formula (20), D may be bonded to A via L, or A may be bonded to D via L. For instance, the repeating unit may be branched as shown in formulae (221) to (228) below.

[Formula 98]

(221)
(222)
(223)
(224)
(225)
(226)
(227)
(228)

The second compound in the exemplary embodiment is not limited to the compounds represented by the formulae (201) to (228). It should be noted that omission of L in the formulae (201) to (228) means that L is a single bond between A and D or L is a hydrogen atom at a terminal end of the molecule of the second compound.

In order to keep ΔST of the molecule at a small level, it is preferable that L is not a fused aromatic ring in terms of molecule design. However, a fused aromatic ring may be used as long as thermally activated delayed fluorescence can be obtained. Further, since the molecule has to be designed so that A and D are accurately disposed in a single molecule, the second compound of the exemplary embodiment is preferably a low molecular material. Accordingly, it is preferable that the molecular weight of the second compound of the exemplary embodiment is 5000 or less, more preferably 3000 or less. The second compound in the exemplary embodiment preferably includes the partial structure represented by the formula (200) and the partial structure represented by the formula (2Y).

The organic EL device containing the second compound emits light through a thermally activated delayed fluorescence mechanism.

In the exemplary embodiment, the formula (2Y) is preferably represented by at least one of a formula (2a) or a formula (2x) below.

[Formula 99]

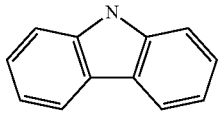
(2a)

[Formula 100]

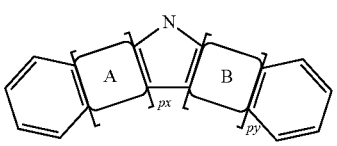
(2x)

In the formula (2x), A and B each independently represent a cyclic structure represented by a formula (2c) below or a cyclic structure represented by a formula (2d) below, the cyclic structures A and B being fused to adjacent cyclic structure(s) at any position(s). px and py are each independently an integer ranging from 0 to 4, px and py representing the number of the cyclic structure A and the number of the cyclic structure B, respectively. When px is an integer ranging from 2 to 4, a plurality of the cyclic structures A may be mutually the same or different. When py is an integer ranging from 2 to 4, a plurality of the cyclic structures B may be mutually the same or different. Accordingly, when, for instance, px is 2, the cyclic structures A may be two cyclic structures each represented by a formula (2c), two cyclic structures each represented by a formula (2d), or a combination of one cyclic structure represented by the formula (2c) and one cyclic structure represented by the formula (2d).

[Formula 101]

(2c)

[Formula 102]

(2d)

In the formula (2d), $Z_7$ represents a carbon atom, a nitrogen atom, a sulfur atom, or an oxygen atom.

When px is 0 and the number of py is c in the formula (2x), the formula (2x) is represented by a formula (2b) below.

[Formula 103]

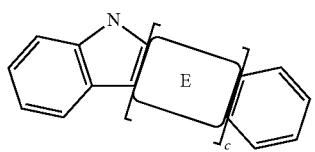
(2b)

In the formula (2b), c is an integer ranging from 1 to 4. When c is an integer ranging from 2 to 4, a plurality of the cyclic structures E may be mutually the same or different. In the formula (2b), E represents the cyclic structure represented by the formula (2c) or the cyclic structure represented by the formula (2d), the cyclic structure E being fused to adjacent cyclic structure(s) at any position(s). Accordingly, when, for instance, c is 2, the two cyclic structures E may be two cyclic structures each represented by the formula (2c), two cyclic structures each represented by the formula (2d), or a combination of one cyclic structure represented by the formula (2c) and one cyclic structure represented by the formula (2d).

The presence of the partial structures represented by the formula (200) and the formula (2Y) in a single molecule allows a design capable of effectively reducing ΔST.

The second compound in the exemplary embodiment preferably includes a partial structure represented by a formula (2e) below in a molecule.

[Formula 104]

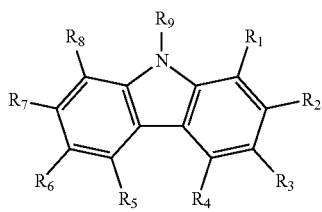
(2e)

$R_1$ to $R_9$ in the formula (2e) each independently represent a hydrogen atom, a substituent, or a single bond to another atom in the molecule of the second compound. The substituent for $R_1$ to $R_9$ is a substituent selected from the group consisting of a halogen atom, a substituted or unsubstituted aryl group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted alkylsilyl group having 3 to 30 carbon atoms, a substituted or unsubstituted arylsilyl group having 6 to 60 ring carbon atoms, a substituted or unsubstituted alkoxy group having 1 to 30 carbon atoms, a substituted or unsubstituted aryloxy group having 6 to 30 ring carbon atoms, a substituted or unsubstituted alkylamino group having 2 to 30 carbon atoms, a substituted or unsubstituted arylamino group having 6 to 60 ring carbon atoms, a substituted or unsubstituted alkylthio group having 1 to 30 carbon atoms, and a substituted or unsubstituted arylthio group having 6 to 30 ring carbon atoms. It should be noted that at least one of $R_1$ to $R_9$ is a single bond to another atom in the molecule of the second compound.

In the formula (2e), at least one pair of the substituents selected from $R_1$ to $R_9$ are optionally bonded to form a cyclic structure. When the cyclic structure is formed, among substituents $R_1$ to $R_9$ bonded to the carbon atoms of the six-membered ring or the nitrogen atom of the five-membered ring in the formula (2e), a pair of substituents selected from $R_1$ to $R_8$ each bonded to adjacent carbon atoms of the six-membered ring and $R_9$ of the five-membered ring form the cyclic structure. Specifically, at least one of pairs of substituents consisting of $R_1$ and $R_2$, $R_2$ and $R_3$, $R_3$ and $R_4$, $R_4$ and $R_5$, $R_5$ and $R_6$, $R_6$ and $R_7$, $R_7$ and $R_8$, $R_8$ and $R_9$, and $R_1$ and $R_9$ forms a mutual bonding to form a cyclic structure.

In the exemplary embodiment, the cyclic structure formed by the bonding of the substituents is preferably a fused ring. For instance, the cyclic structure formable in the formula (2e) is a fused six-membered cyclic structure.

The second compound in the exemplary embodiment preferably includes a partial structure represented by a formula (2y) below in a molecule.

[Formula 105]

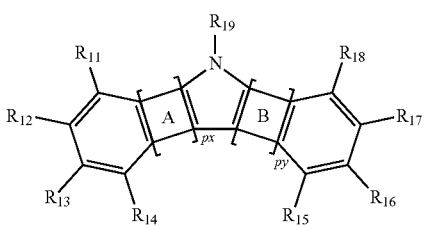
(2y)

In the formula (2y), $R_{11}$ to $R_{19}$ each independently represent the same as $R_1$ to $R_9$ of the formula (2e). It should be noted that at least one of $R_{11}$ to $R_{19}$ is a single bond to another atom in the molecule of the second compound. In the formula (2y), at least one pair of the substituents selected from $R_{11}$ to $R_{19}$ are optionally bonded to form a cyclic structure. In the formula (2y), A and B each independently represent a cyclic structure represented by a formula (2g) below or a cyclic structure represented by a formula (2h) below, the cyclic structures A and B being fused to adjacent cyclic structure(s) at any position(s). px represents the number of the cyclic structure A and is an integer ranging from 0 to 4. When px is an integer ranging from 2 to 4, a plurality of the cyclic structures A may be mutually the same or different. When py is an integer ranging from 2 to 4, a plurality of the cyclic structures B may be mutually the same or different. py represents the number of the cyclic structure B and is an integer ranging from 0 to 4. Accordingly, when, for instance, px is 2, the two cyclic structures A may be two cyclic structures each represented by the formula (2g) below, two cyclic structures each represented by the formula (2h)

below, or a combination of one cyclic structure represented by the formula (2g) and one cyclic structure represented by the formula (2h).

[Formula 106]

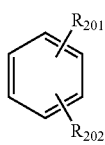

(2g)

[Formula 107]

(2h)

In the formula (2g), $R_{201}$ and $R_{202}$ each independently represent the same as the above $R_1$ to $R_9$, $R_{201}$ and $R_{202}$ being optionally mutually bonded to form a cyclic structure. $R_{201}$ and $R_{202}$ are each bonded to corresponding one of carbon atoms of the six-membered ring of the formula (2g).

In the formula (2h), $Z_5$ represents $CR_{203}R_{204}$, $NR_{205}$, a sulfur atom, or an oxygen atom, $R_{202}$ to $R_{205}$ each independently represent the same as the substituent for $R_1$ to $R_9$.

In the formula (2y), at least one pair of the substituents selected from $R_{11}$ to $R_{19}$ and $R_{201}$ to $R_{205}$ are optionally bonded to form a cyclic structure.

When px is 0 and the number of py is c in the formula (2y), the formula (2y) is represented by a formula (2f) below.

[Formula 108]

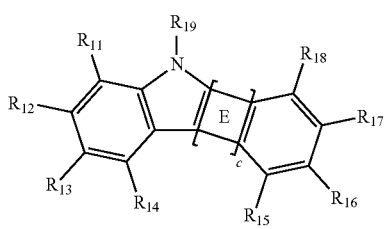

(2f)

In the formula (2f), $R_{11}$ to $R_{19}$ each independently represent the same as $R_1$ to $R_9$ of the formula (2e). It should be noted that at least one of $R_{11}$ to $R_{19}$ is a single bond to another atom in the molecule of the second compound. In the formula (2f), at least one pair of the substituents selected from $R_{11}$ to $R_{19}$ are optionally bonded to form a cyclic structure. In the formula (2f), E represents the cyclic structure represented by the formula (2g) or the cyclic structure represented by the formula (2h), the cyclic structure E being fused to adjacent cyclic structure(s) at any position(s). c represents the number of the cyclic structure E and is an integer ranging from 1 to 4. When c is an integer ranging from 2 to 4, a plurality of the cyclic structures E may be mutually the same or different. Accordingly, when, for instance, c is 2, the two cyclic structures E may be two cyclic structures each represented by the formula (2g) below, two cyclic structures each represented by the formula (2h) below, or a combination of one cyclic structure represented by the formula (2g) and one cyclic structure represented by the formula (2h).

The second compound of the exemplary embodiment is preferably represented by a formula (2A) below.

[Formula 109]

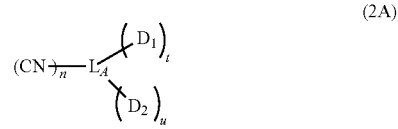

(2A)

In the formula (2A), n is an integer of 1 or more, t is an integer of 1 or more and u is an integer of 0 or more. LA is a substituted or unsubstituted aromatic hydrocarbon ring having 6 to 30 ring carbon atoms, or a substituted or unsubstituted aromatic heterocyclic ring having 6 to 30 ring atoms. CN is a cyano group. $D_1$ and $D_2$ are each independently represented by the formula (2Y), where the cyclic structures F and G are unsubstituted or substituted, m is 0 or 1, and, when m is 1, $Y_{20}$ represents a single bond, an oxygen atom, a sulfur atom, a selenium atom, a carbonyl group, $CR_{21}R_{22}$, $SiR_{23}R_{24}$ or $GeR_{25}R_{26}$, $R_{21}$ to $R_{26}$ being selected from the same group for R. When m is 1 in the formula (2Y), the formula (2Y) is represented by any one of the formulae (22) to (25) and the formulae (21Y) to (24Y). $D_1$ and $D_2$ may be the same or different. When t is 2 or more, a plurality of $D_1$ may be mutually the same or different. When u is 2 or more, a plurality of $D_2$ may be mutually the same or different. In the exemplary embodiment, it is preferable that LA is a substituted or unsubstituted aromatic hydrocarbon ring having 6 to 14 ring carbon atoms. Examples of the aromatic hydrocarbon ring having 6 to 14 ring carbon atoms include benzene, naphthalene, fluorene, and phenanthrene. LA is further preferably an aromatic hydrocarbon ring having 6 to 10 ring carbon atoms.

Examples of the aromatic heterocyclic ring having 6 to 30 ring atoms for LA include pyridine, pyrimidine, pyrazine, quinoline, quinazoline, phenanthroline, benzofuran, and dibenzofuran.

In the exemplary embodiment, $D_1$ or $D_2$ is optionally bonded to a first carbon atom of the aromatic hydrocarbon ring represented by LA in the formula (2A), and CN is optionally bonded to a second carbon atom adjacent to the first carbon atom. For instance, in the second compound according to the exemplary embodiment, D may be bonded to a first carbon atom $C_1$ and a cyano group may be bonded to a second carbon atom $C_2$ adjacent to the first carbon atom $C_1$ as in a partial structure represented by a formula (2B) below. D in the formula (2B) below is the same as the above $D_1$ or $D_2$. Wavy lines in the formula (2B) below each represent a bonding position to another structure or atom.

[Formula 110]

(2B)

$D_1$ or $D_2$ having the structure represented by the formula (2a) or (2b) and a cyano group, which are adjacently bonded to the aromatic hydrocarbon ring represented by LA, reduces the value of ΔST of the compound.

In the exemplary embodiment, t is preferably an integer of 2 or more. When two or more $D_1$ are bonded to the aromatic hydrocarbon ring represented by $L_4$, the structures of the plurality of $D_1$ may be the same or different.

The second compound of the exemplary embodiment is preferably represented by a formula (21) below.

[Formula 111]

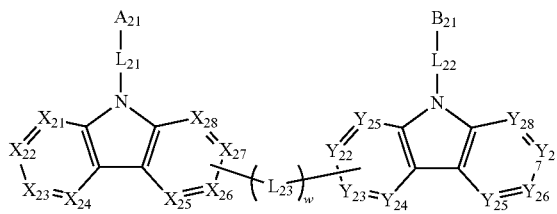

(21)

In the formula (21), $A_{21}$ and $B_{21}$ each independently represent a substituted or unsubstituted aromatic hydrocarbon group having 6 to 30 ring carbon atoms, or a substituted or unsubstituted aromatic heterocyclic group having 5 to 30 ring atoms.

$X_{21}$ to $X_{28}$ and $Y_{21}$ to $Y_{28}$ each independently represent a nitrogen atom, a carbon atom bonded to $R^D$, or a carbon atom bonded to $L_{23}$, where at least one of $X_{25}$ to $X_{28}$ is a carbon atom bonded to $L_{23}$, and at least one of $Y_{21}$ to $Y_{24}$ is a carbon atom bonded to $L_{23}$.

$R^D$ each independently represent a hydrogen atom or a substituent. The substituent for $R^D$ is selected from the group consisting of a halogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms and a substituted or unsubstituted silyl group.

$L_{21}$ and $L_{22}$ are each independently a single bond or a linking group, the linking group for $L_{21}$ and $L_{22}$ being a substituted or unsubstituted aromatic hydrocarbon group having 6 to 30 ring carbon atoms, a substituted or unsubstituted heterocyclic group having 5 to 30 ring atoms, a multiple linking group provided by bonding two to four groups selected from the aromatic hydrocarbon group, a multiple linking group provided by bonding two to four groups selected from the heterocyclic group, or a multiple linking group provided by bonding two to four groups selected from the aromatic hydrocarbon group and the heterocyclic group.

$L_{23}$ is a substituted or unsubstituted monocyclic hydrocarbon group having 6 or less ring carbon atoms, or a substituted or unsubstituted monocyclic heterocyclic group having 6 or less ring atoms.

w represents an integer ranging from 0 to 3. When w is 0, at least one of $X_{25}$ to $X_{28}$ and at least one of $Y_{21}$ to $Y_{24}$ are directly bonded.

It should be noted that the monocyclic hydrocarbon group is not a fused ring but is a group derived from a single hydrocarbon ring (alicyclic hydrocarbon or aromatic hydrocarbon) and the monocyclic heterocyclic group is a group derived from a single heterocycle.

It should be noted that the formula (21) satisfies at least one of conditions (i) and (ii) below.
(i) At least one of $A_{21}$ or $B_{21}$ is a cyano-group-substituted aromatic hydrocarbon group having 6 to 30 ring carbon atoms, or a cyano-group-substituted aromatic heterocyclic group having 6 to 30 ring atoms.
(ii) At least one of $X_{21}$ to $X_{24}$ or $Y_{25}$ to $Y_{28}$ is a carbon atom bonded to $R^D$, and at least one of $R^D$ is a cyano-group-substituted aromatic hydrocarbon group having 6 to 30 ring carbon atoms, or a cyano-group-substituted aromatic heterocyclic group having 6 to 30 ring atoms.

When a plurality of $R^D$ are present, the plurality of $R^D$ may be the same or different.

In the formula (21), when the aromatic hydrocarbon group having 6 to 30 ring carbon atoms or the aromatic heterocyclic group having 6 to 30 ring atoms represented by $A_{21}$ and $B_{21}$ has a substituent, the substituent is preferably one or more group selected from the group consisting of a cyano group, a halogen atom, an alkyl group having 1 to 20 carbon atoms, a cycloalkyl group having 3 to 20 carbon atoms, an alkoxy group having 1 to 20 carbon atoms, a haloalkyl group having 1 to 20 carbon atoms, a haloalkoxy group having 1 to 20 carbon atoms, an alkylsilyl group having 1 to 10 carbon atoms, an aryl group having 6 to 30 ring carbon atoms, an aryloxy group having 6 to 30 ring carbon atoms, an aralkyl group having 6 to 30 carbon atoms, and a heterocyclic group having 5 to 30 ring atoms. When $A_{21}$ and $B_{21}$ have a plurality of substituents, the substituents may be the same or different.

It is preferable that the formula (21) satisfies the above condition (i) and does not satisfy the above condition (ii).

Alternatively, it is preferable that the formula (21) satisfies the above condition (ii) and does not satisfy the above condition (i).

Further alternatively, it is preferable that the formula (21) satisfies the above conditions (i) and (ii).

In the formula (21), at least one of $A_{21}$ or $B_{21}$ is preferably a phenyl group substituted by a cyano group, a naphthyl group substituted by a cyano group, a phenanthryl group substituted by a cyano group, a dibenzofuranyl group substituted by a cyano group, a dibenzothiophenyl group substituted by a cyano group, a biphenyl group substituted by a cyano group, a terphenyl group substituted by a cyano group, a 9,9-diphenylfluorenyl group substituted by a cyano group, a 9,9'-spirobi[9H-fluorene]-2-yl group substituted by a cyano group, a 9,9-dimethylfluorenyl group substituted by a cyano group, or a triphenylenyl group substituted by a cyano group.

In the formula (21), it is preferable that at least one of $X_{21}$ to $X_{24}$ or $Y_{25}$ to $Y_{28}$ is $CR^D$, and at least one of $R^D$ in $X_{21}$ to $X_{24}$ or $Y_{25}$ to $Y_{28}$ is a phenyl group substituted by a cyano group, a naphthyl group substituted by a cyano group, a phenanthryl group substituted by a cyano group, a dibenzofuranyl group substituted by a cyano group, a dibenzothiophenyl group substituted by a cyano group, a biphenyl group substituted by a cyano group, a terphenyl group substituted by a cyano group, a 9,9-diphenylfluorenyl group substituted by a cyano group, a 9,9'-spirobi[9H-fluorene]-2-yl group substituted by a cyano group, a 9,9-dimethylfluorenyl group substituted by a cyano group, or a triphenylenyl group substituted by a cyano group.

In the formula (21), it is preferable that $X_{26}$ and $Y_{23}$ are bonded via $L_{23}$, or directly bonded.

In the formula (21), it is also preferable that $X_{26}$ and $Y_{22}$ are bonded via $L_{23}$, or directly bonded.

In the formula (21), it is also preferable that $X_{27}$ and $Y_{23}$ are bonded via $L_{23}$, or directly bonded.

In the formula (21), w is preferably 0.

Alternatively, in the formula (21), w is preferably 1.

In the formula (21), $L_{21}$ and $L_{22}$ are each preferably a single bond or a substituted or unsubstituted aromatic hydrocarbon group having 6 to 30 ring carbon atoms.
Specific examples of the second compound are shown below. It should be noted that the second compound according to the invention is not limited to these specific examples.
[Formula 112]
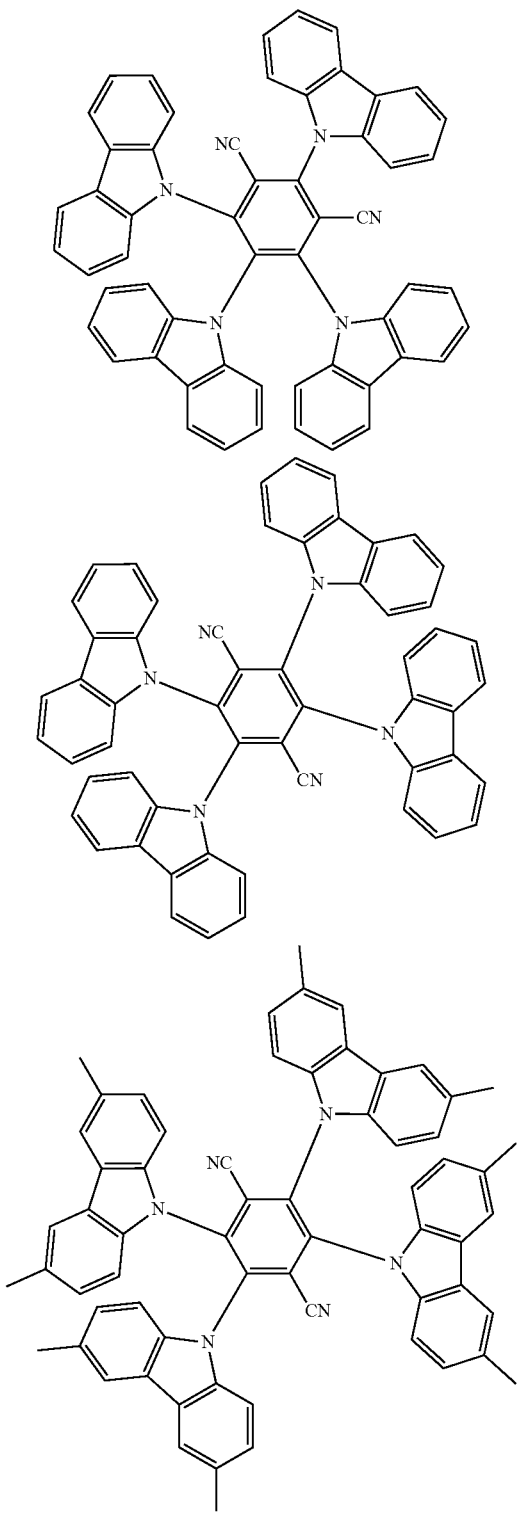
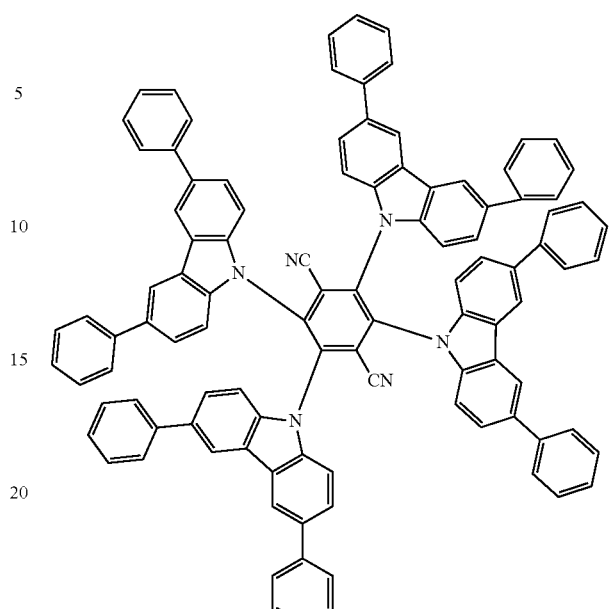
[Formula 113]
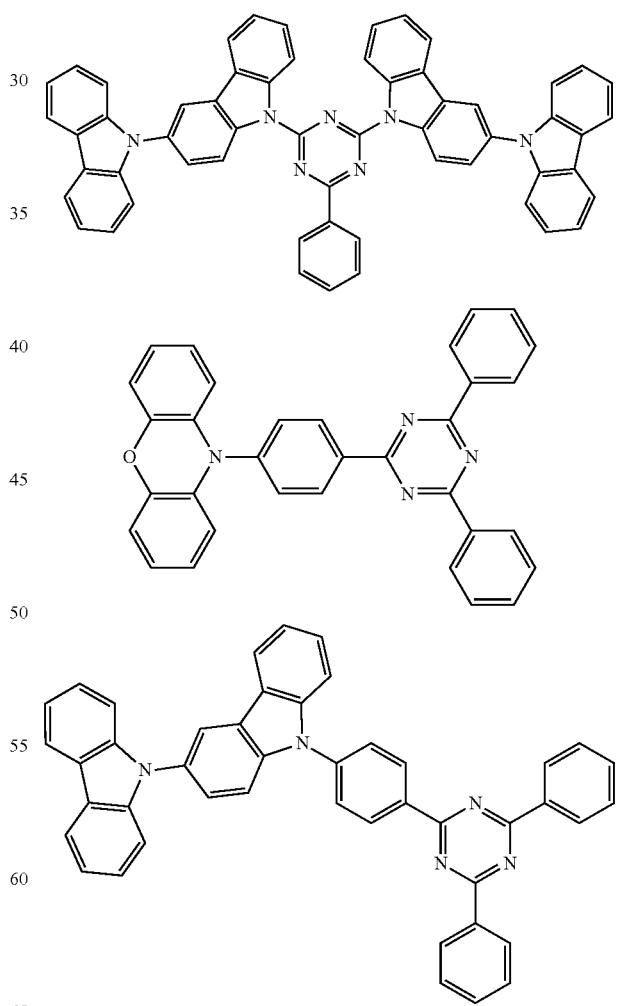

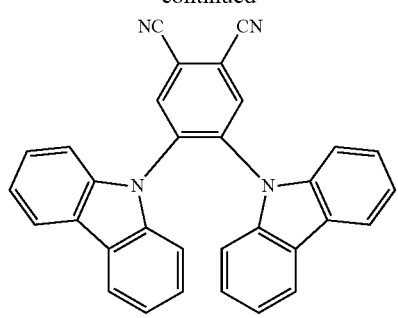
[Formula 114]
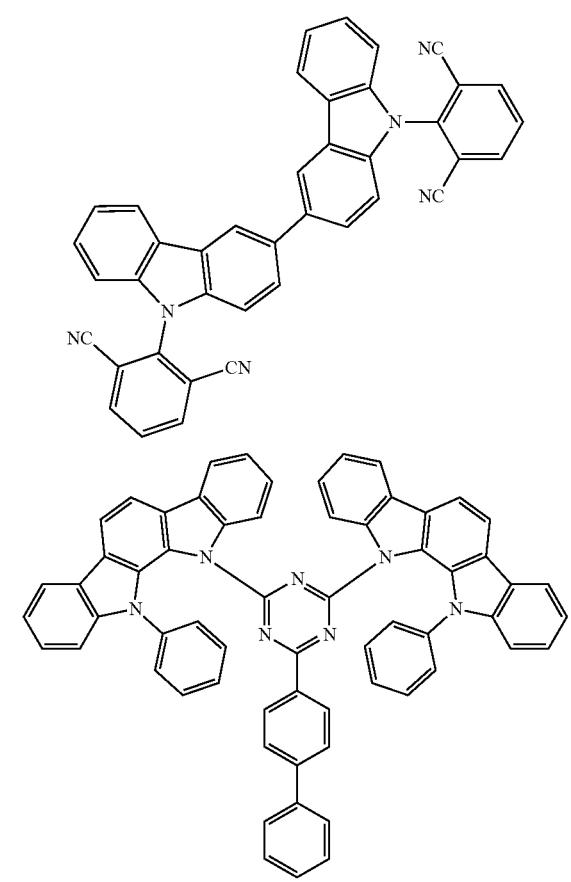
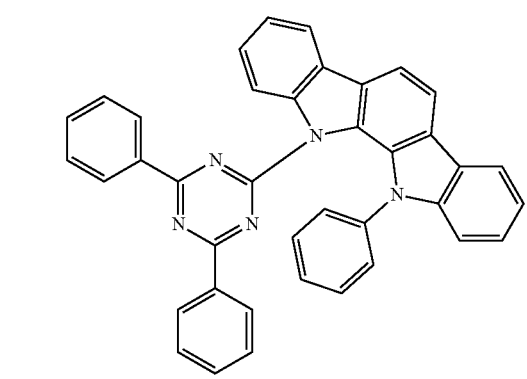
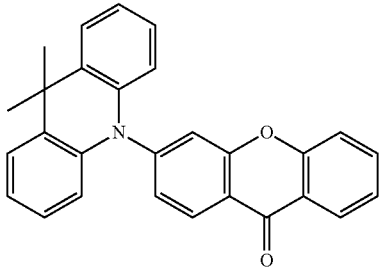
[Formula 115]
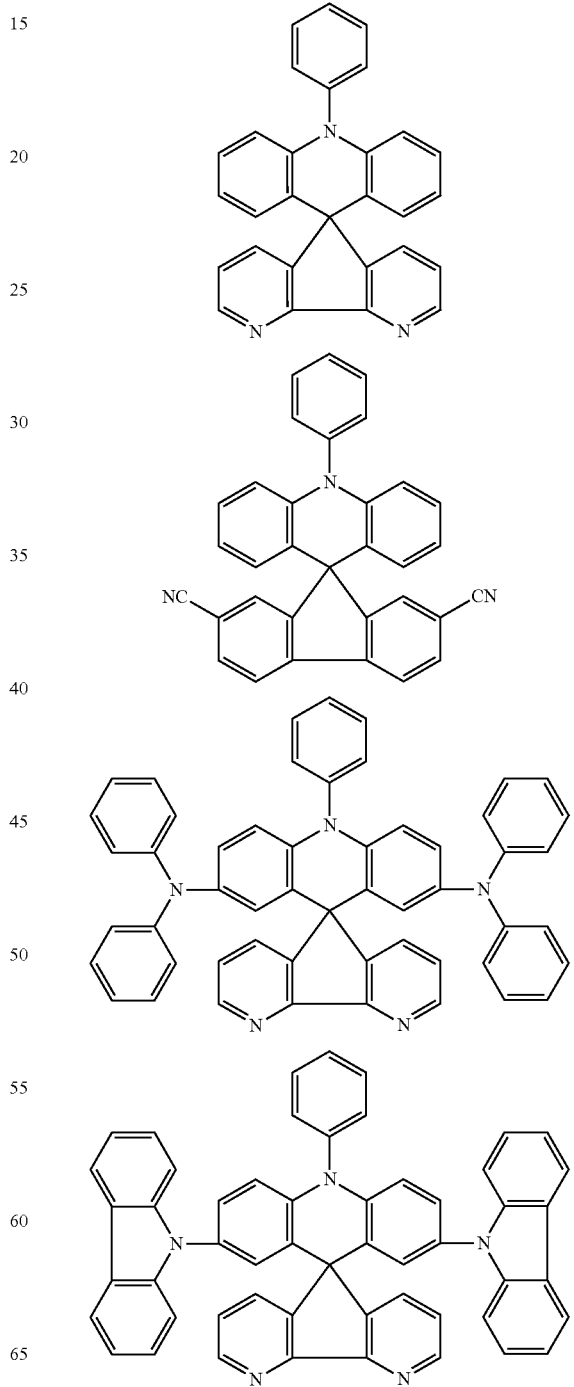

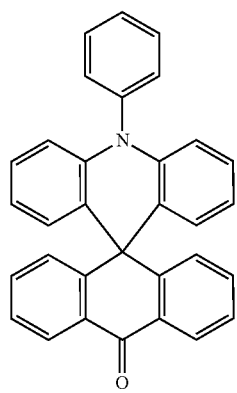
[Formula 116]
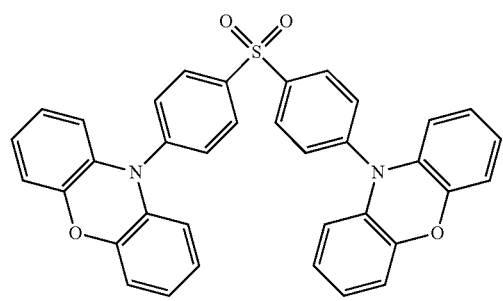
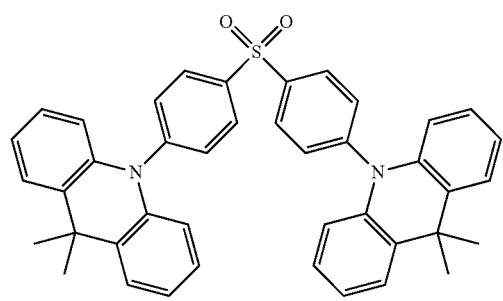
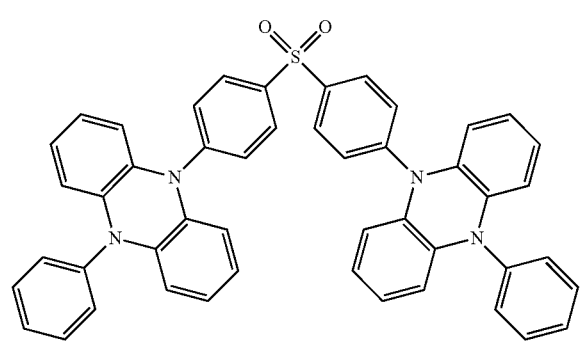
[Formula 117]
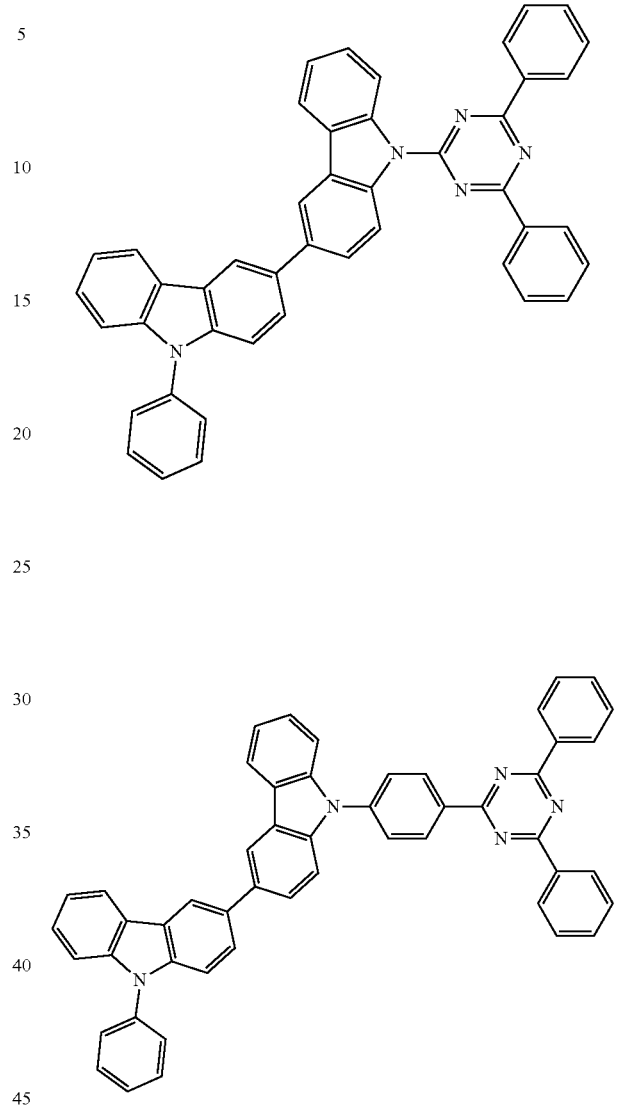
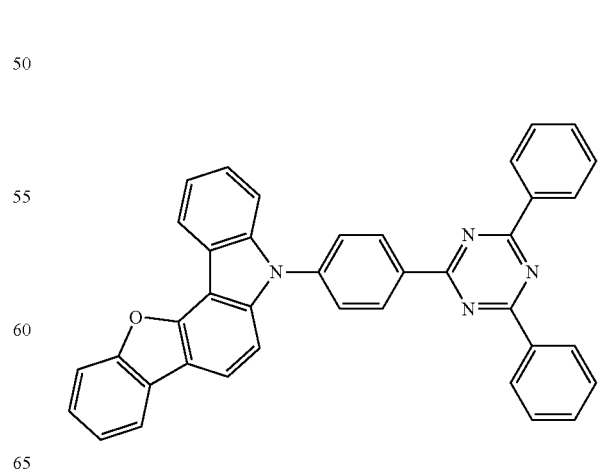

[Formula 118]

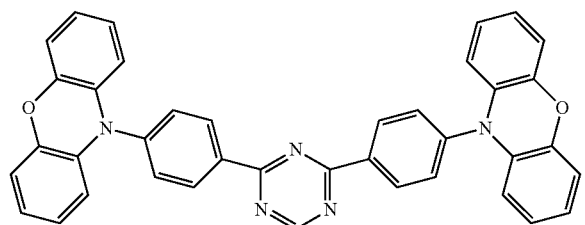

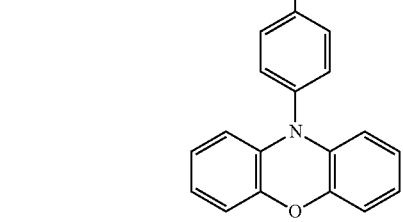

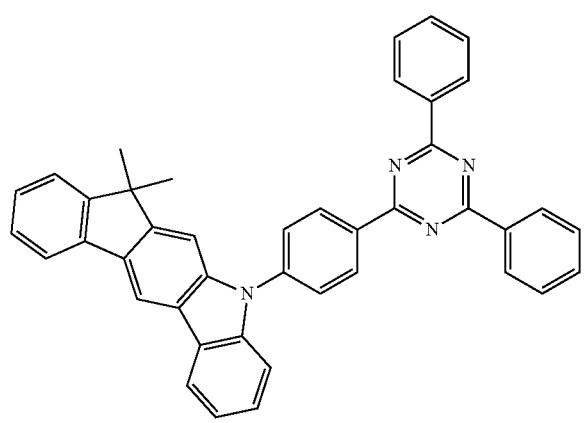

[Formula 119]

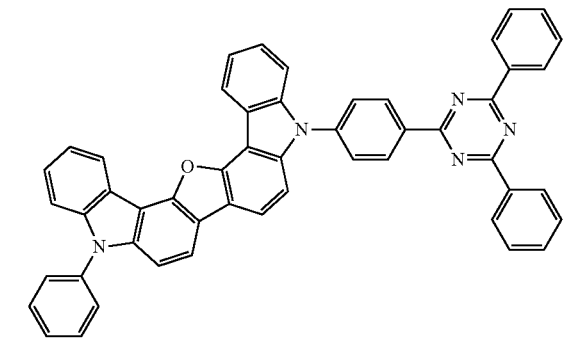

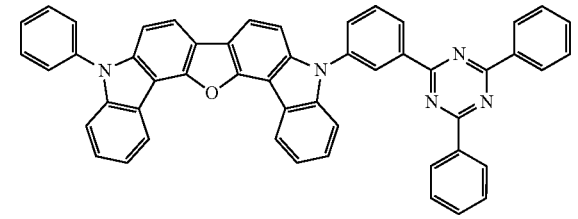

[Formula 120]

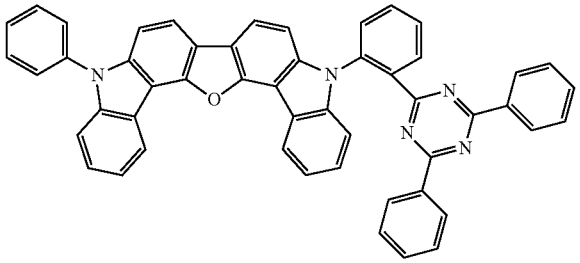

Preparation Method of Second Compound

The second compound can be prepared by methods disclosed in, for instance, International Publication Nos. WO2013/180241, WO2014/092083, WO2014/104346 and the like.

Third Compound

The third compound may be a thermally activated delayed fluorescent compound and a compound that does not exhibit thermally activated delayed fluorescence.

The third compound is not particularly limited, but is preferably a compound other than an amine compound. Although the third compound may be a derivative selected from the group consisting of a carbazole derivative, dibenzofuran derivative, and dibenzothiophene derivative, the third compound is not limited thereto.

It is also preferable that the third compound has at least one of a partial structure represented by a formula (31), a partial structure represented by a formula (32), a partial structure represented by a formula (33A) or a partial structure represented by a formula (34A) in one molecule.

[Formula 121]

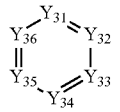

(31)

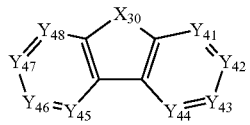

(32)

(33A)

(34A)

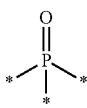

In the formula (31): $Y_{31}$ to $Y_{36}$ each independently represent a nitrogen atom or a carbon atom bonded to another atom in the molecule of the third compound; and at least one of $Y_{31}$ to $Y_{36}$ is a carbon atom bonded to another atom in the molecule of the third compound.

In the formula (32): $Y_{41}$ to $Y_{48}$ each independently represent a nitrogen atom or a carbon atom bonded to another atom in the molecule of the third compound;

At least one of $Y_{41}$ to $Y_{48}$ is a carbon atom bonded to another atom in the molecule of the third compound; and $X_{30}$ represents a nitrogen atom bonded to another atom in the molecule of the third compound, an oxygen atom, or a sulfur atom.

* in the formulae (33A) and (34A) each independently shows a bonding position with another atom or another structure in a molecule of the third compound.

In the formula (32), it is also preferable that at least two of $Y_{41}$ to $Y_{48}$ are carbon atoms bonded to other atoms in the molecule of the third compound to form a cyclic structure including the carbon atoms.

For instance, the partial structure represented by the formula (32) is preferably any one selected from the group consisting of partial structures represented by formulae (321), (322), (323), (324), (325) and (326).

[Formula 122]

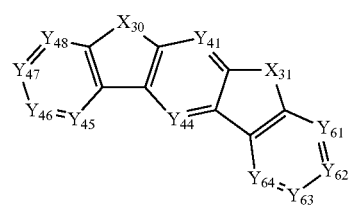

(321)

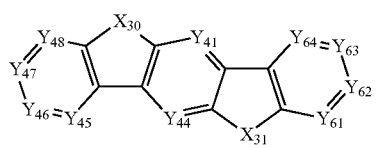

(322)

[Formula 123]

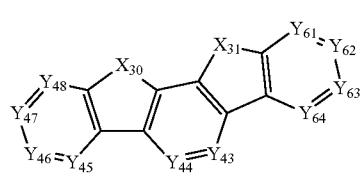

(323)

[Formula 124]

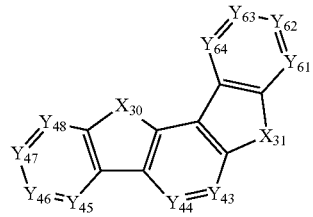

(324)

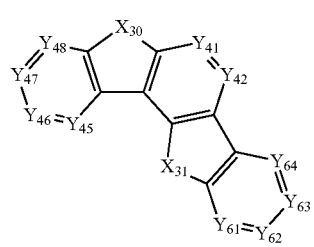

(325)

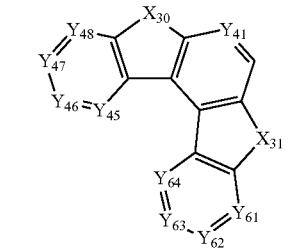

(326)

In the formulae (321) to (326):

$X_{30}$ each independently represents a nitrogen atom bonded to another atom in the molecule of the third compound, an oxygen atom, or a sulfur atom;

$Y_{41}$ to $Y_{48}$ each independently represent a nitrogen atom or a carbon atom bonded to another atom in the molecule of the third compound;

$X_{31}$ each independently represents a nitrogen atom bonded to another atom in the molecule of the third compound, an oxygen atom, a sulfur atom, or a carbon atom bonded to another atom in the molecule of the third compound; and $Y_{61}$ to $Y_{64}$ each independently represent a nitrogen atom or a carbon atom bonded to another atom in the molecule of the third compound.

In the exemplary embodiments, the third compound preferably has the partial structure represented by the formula (323) among those represented by the formulae (323) to (326).

The partial structure represented by the formula (31) is preferably included in the third compound as at least one group selected from the group consisting of a group represented by a formula (33) and a group represented by a formula (34) below.

It is also preferable that the third compound has at least one of the partial structures represented by the formulae (33) and (34). Since bonding positions are situated in meta positions as shown in the partial structures represented by the formulae (33) and (34), an energy gap $T_{77K}(M2)$ at 77 K of the third compound can be kept high.

[Formula 125]

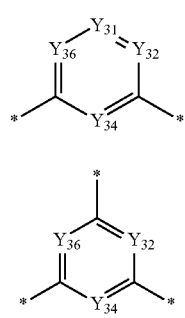

In the formula (33), $Y_{31}$, $Y_{32}$, $Y_{34}$ and $Y_{36}$ are each independently a nitrogen atom or $CR_{31}$.

In the formula (34), $Y_{32}$, $Y_{34}$ and $Y_{36}$ are each independently a nitrogen atom or $CR_{31}$.

In the formulae (33) and (34), $R_{31}$ each independently represents a hydrogen atom or a substituent.

$R_{31}$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

The substituted or unsubstituted aryl group having 6 to 30 ring carbon atoms for $R_{31}$ is preferably a non-fused ring.

The mark * in the formulae (33) and (34) each independently shows a bonding position with another atom or another structure in the molecule of the third compound.

In the formula (33), $Y_{31}$, $Y_{32}$, $Y_{34}$ and $Y_{36}$ are each independently preferably $CR_{31}$, in which a plurality of $R_{31}$ are the same or different.

In the formula (34), $Y_{32}$, $Y_{34}$ and $Y_{36}$ are each independently preferably $CR_{31}$, in which a plurality of $R_{31}$ are the same or different.

The substituted germanium group is preferably represented by —$Ge(R_{301})_3$. $R_{301}$ is each independently a substituent. The substituent $R_{301}$ is preferably a substituted or unsubstituted alkyl group having 1 to 30 carbon atoms or a substituted or unsubstituted aryl group having 6 to 30 ring carbon atoms. A plurality of $R_{301}$ are mutually the same or different.

The partial structure represented by the formula (32) is preferably included in the third compound as at least one group selected from the group consisting of groups represented by formulae (35) to (39) and a group represented by a formula (30a).

[Formula 126]

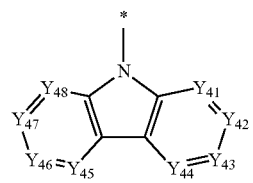

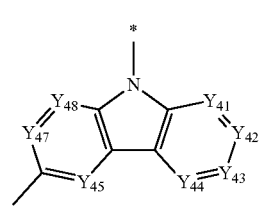

[Formula 127]

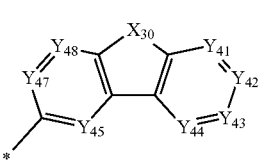

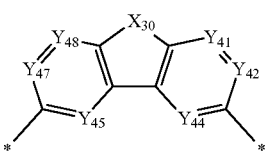

[Formula 128]

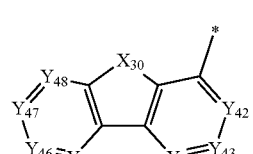

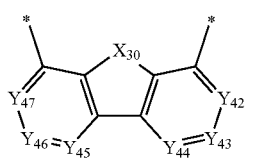

In the formula (35), $Y_{41}$ to $Y_{43}$ are each independently a nitrogen atom or $CR_{32}$.

In the formulae (36) and (37), $Y_{41}$ to $Y_4$, $Y_{47}$ and $Y_4 2$ are each independently a nitrogen atom or $CR_{32}$.

In the formula (38), $Y_{41}$, $Y_{42}$, $Y_{44}$, $Y_{45}$, $Y_{47}$ and $Y_{44}$ are each independently a nitrogen atom or $CR_{32}$.

In the formula (39), $Y_{42}$ to $Y_{48}$ are each independently a nitrogen atom or $CR_{32}$.

In the formula (30a), $Y_{42}$ to $Y_{47}$ are each independently a nitrogen atom or $CR_{32}$.

In the formulae (35) to (39) and (30a), $R_{32}$ each independently represents a hydrogen atom or a substituent.

$R_{32}$ as the substituent is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

A plurality of $R_{32}$ are the same or different.

In the formulae (37) to (39) and (30a), $X_{30}$ is $NR_{33}$, an oxygen atom or a sulfur atom.

$R_{33}$ is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a fluorine atom, a cyano group, a nitro group, and a substituted or unsubstituted carboxy group.

A plurality of $R_{33}$ are the same or different.

The substituted or unsubstituted aryl group having 6 to 30 ring carbon atoms for $R_{33}$ is preferably a non-fused ring.

The mark * in the formulae (35) to (39) and (30a) each independently shows a bonding position with another atom or another structure in the molecule of the third compound.

In the formula (35), $Y_{41}$ to $Y_{48}$ are each independently preferably $CR_{32}$. In the formulae (36) and (37), $Y_{41}$ to $Y_{45}$, $Y_{47}$ and $Y_{43}$ are each independently preferably $CR_{32}$. In the formula (38), $Y_{41}$, $Y_{42}$, $Y_{44}$, $Y_{45}$, $Y_{47}$ and $Y_{43}$ are each independently preferably $CR_{32}$. In the formula (39), $Y_{42}$ to $Y_{43}$ are each independently preferably $CR_{32}$. In the formula (30a), $Y_{42}$ to $Y_{47}$ are each independently preferably $CR_{32}$. A plurality of $R_{32}$ are the same or different.

In the third compound, $X_{30}$ is preferably an oxygen atom or a sulfur atom, more preferably an oxygen atom.

In the third compound, $R_{31}$ and $R_{32}$ each independently represent a hydrogen atom or a substituent. $R_{31}$ and $R_{32}$ as the substituents are preferably each independently a group selected from the group consisting of a fluorine atom, a cyano group, a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms. $R_{31}$ and $R_{32}$ are more preferably a hydrogen atom, a cyano group, a substituted or unsubstituted aryl group having 6 to 30 ring carbon atoms, or a substituted or unsubstituted heteroaryl group having 5 to 30 ring atoms. When $R_{31}$ and $R_{32}$ as the substituents are each a substituted or unsubstituted aryl group having 6 to 30 ring carbon atoms, the aryl group is preferably a non-fused ring.

It is also preferable that the third compound is an aromatic hydrocarbon compound or an aromatic heterocyclic compound. The third compound preferably contains no fused aromatic hydrocarbon ring in a molecule.

Preparation Method of Third Compound

The third compound can be manufactured by methods disclosed in International Publication No. WO2012/153780, International Publication No. WO2013/038650, and the like. Furthermore, the second compound can be manufactured, for instance, by application of known substitution reactions and/or materials depending on a target compound.

Examples of the substituent in the third compound are shown below, but the invention is not limited thereto.

Specific examples of an aryl group (occasionally referred to as an aromatic hydrocarbon group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group, 9,9-dimethylfluorenyl group, benzofluorenyl group, dibenzofluorenyl group, biphenyl group, terphenyl group, quarter phenyl group, fluoranthenyl group, among which a phenyl group, biphenyl group, terphenyl group, quarter phenyl group, naphthyl group, triphenylenyl group, fluorenyl group and the like are preferable.

Specific examples of the aryl group having a substituent include a tolyl group, xylyl group and 9,9-dimethylfluorenyl group.

As is understood from the specific examples, the aryl group includes both fused aryl group and non-fused aryl group.

Preferable examples of the aryl group include a phenyl group, biphenyl group, terphenyl group, quarterphenyl group, naphthyl group, triphenylenyl group and fluorenyl group.

Specific examples of the heteroaryl group (occasionally referred to as a heterocyclic group, heteroaromatic ring group or aromatic heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothienyl group, dibenzothienyl group, azadibenzothienyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothienyl group, carbazolyl group, pyridyl group, pyrimidinyl group, triazinyl group, azadibenzofuranyl group, azadibenzothienyl group and the like are preferable.

The heteroaryl group is preferably a dibenzofuranyl group, dibenzothienyl group, carbazolyl group, pyridyl group, pyrimidinyl group, triazinyl group, azadibenzofuranyl group or azadibenzothienyl group, and more preferably a dibenzofuranyl group, dibenzothienyl group, azadibenzofuranyl group and azadibenzothienyl group.

In the third compound, it is also preferable that the substituted silyl group is selected from the group consisting of a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyldimethylsilyl group.

Specific examples of the substituted or unsubstituted triarylsilyl group include triphenylsilyl group and tritolylsilyl group.

In the third compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

In the third compound, the substituted carboxy group is exemplified by a benzoyloxy group.

Relationship between First Compound, Second Compound and Third Compound in Emitting Layer In the organic EL device 1 of the exemplary embodiment, a singlet energy $S_1(M1)$ of the first compound, a singlet energy $S_1(M2)$ of the second compound, and a singlet energy $S_1(M3)$ of the third compound in the emitting layer 5 satisfy a relationship of a numerical formula (Numerical Formula 1) below.

$$S_1(M3) > S_1(M2) > S_1(M1) \quad \text{(Numerical Formula 1)}$$

An energy gap $T_{77K}(M1)$ at 77K of the first compound, an energy gap $T_{77K}(M2)$ at 77K of the second compound, and an energy gap $T_{77K}(M3)$ at 77K of the third compound in the emitting layer 5 preferably satisfy a relationship of a numerical formula (Numerical Formula 2) below.

$$T_{77K}(M3) > T_{77K}(M2) > T_{77K}(M1) \quad \text{(Numerical Formula 2)}$$

In the exemplary embodiment, a difference $\Delta ST(M2)$ between the singlet energy $S1(M2)$ of the second compound and the energy gap $T_{77K}(M2)$ at 77K of the second compound is preferably less than 0.3 eV, more preferably less than 0.2 eV, further preferably less than 0.1 eV. In other words, $\Delta ST(M2)$ preferably satisfies a relationship of one of numerical formulae (Numerical Formulae 1A to 1C).

$$\Delta ST(M2) = S_1(M2) - T_{77K}(M2) < 0.3 \text{ eV} \quad \text{(Numerical Formula 1A)}$$

$$\Delta ST(M2) = S_1(M2) - T_{77K}(M2) < 0.2 \text{ eV} \quad \text{(Numerical Formula 1B)}$$

$$\Delta ST(M2) = S_1(M2) - T_{77K}(M2) < 0.1 \text{ eV} \quad \text{(Numerical Formula 1C)}$$

In the exemplary embodiment, a difference $\Delta ST(M1)$ between the singlet energy $S_1(M1)$ of the first compound and the energy gap $T_{77K}(M1)$ at 77K of the first compound preferably satisfies a relationship of a numerical formula (Numerical Formula 1 D) below.

$$\Delta ST(M1) = S_1(M1) - T_{77K}(M1) > 0.3 \text{ eV} \quad \text{(Numerical Formula 1D)}$$

In the exemplary embodiment, a difference $\Delta ST(M3)$ between the singlet energy $S_1(M3)$ of the third compound and the energy gap $T_{77K}(M3)$ at 77K of the third compound preferably satisfies a relationship of a numerical formula (Numerical Formula 1E) below.

$$\Delta ST(M3) = S_1(M3) - T_{77K}(M3) > 0.3 \text{ eV} \quad \text{(Numerical Formula 1E)}$$

In the exemplary embodiment, an energy gap $T_{77K}(M3)$ at 77K of the third compound is preferably 2.9 eV or more. With the energy gap $T_{77K}(M3)$ of the third compound, it is believed that the triplet energy of the second compound (delayed fluorescent compound) can be efficiently trapped in the emitting layer.

TADF Mechanism In the organic EL device 1 of the exemplary embodiment, the second compound is preferably a compound having a small $\Delta ST(M2)$, so that inverse intersystem crossing from the triplet energy level of the second compound to the singlet energy level thereof is easily caused by a heat energy given from the outside. An energy state conversion mechanism to perform spin exchange from the triplet state of electrically excited excitons within the organic EL device to the singlet state by inverse intersystem crossing is referred to as the TADF Mechanism.

Figure 4:
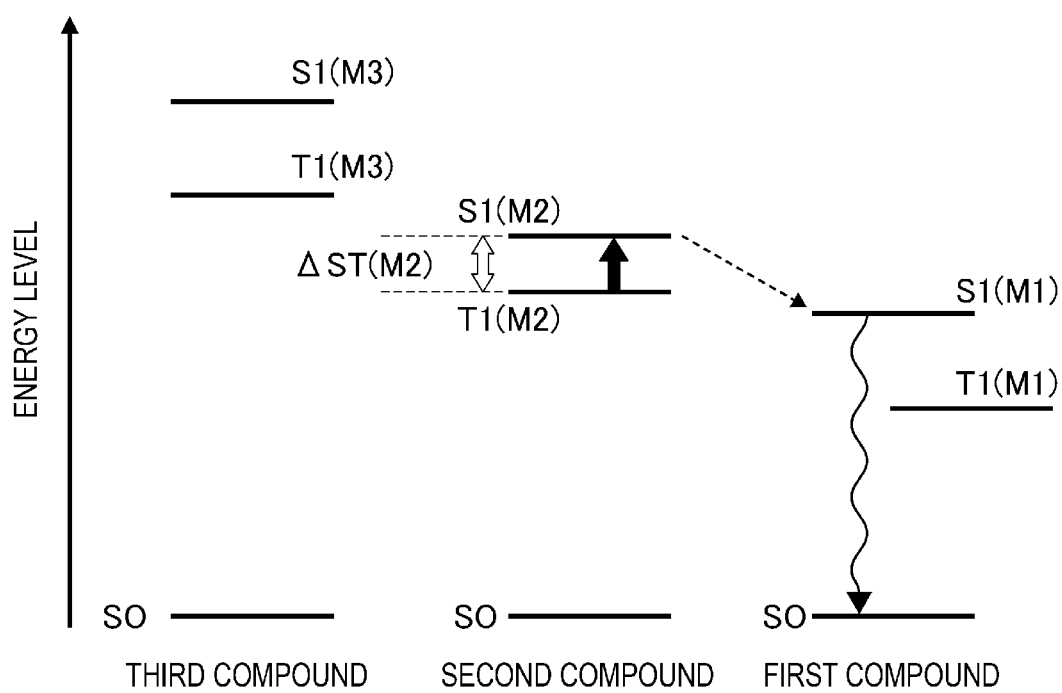
FIG. 4 shows a relationship in energy level and energy transfer between a first compound, a second compound, and a third compound in an emitting layer of an exemplary organic EL device according to the first exemplary embodiment.

FIG. 4 shows an example of a relationship between energy levels of the first compound, the second compound, and the third compound in the emitting layer 5. In FIG. 4, S0 represents a ground state. S1(M1) represents the lowest singlet state of the first compound. T1(M1) represents the lowest triplet state of the first compound. S1 (M2) represents the lowest singlet state of the second compound. T1(M2) represents the lowest triplet state of the second compound. S1(M3) represents the lowest singlet state of the third compound. T1(M3) represents the lowest triplet state of the third compound. A dashed arrow directed from S1 (M2) to S1 (M1) in FIG. 4 represents Forster energy transfer from the lowest singlet state of the second compound to the lowest singlet state of the first compound.

As shown in FIG. 4, when a compound having a small $\Delta ST(M2)$ is used as the second compound, inverse intersystem crossing from the lowest triplet state T1(M2) to the lowest singlet state S1(M2) can be caused by a heat energy. Subsequently, Forster energy transfer from the lowest singlet state S1(M2) of the second compound to the first compound occurs to generate the lowest singlet state S1(M1). Consequently, fluorescence from the lowest singlet state S1(M1) of the first compound can be observed. It is inferred that the internal quantum efficiency can be theoretically raised up to 100% also by using delayed fluorescence by the TADF mechanism.

Relationship between Triplet Energy and Energy Gap at 77K

Here, a relationship between a triplet energy and an energy gap at 77K will be described. In the exemplary embodiment, the energy gap at 77K is different from a typical triplet energy in some aspects.

The triplet energy is measured as follows. First, a solution in which a compound (measurement target) is dissolved in an appropriate solvent is encapsulated in a quartz glass tube to prepare a sample. A phosphorescent spectrum (ordinate axis: phosphorescent luminous intensity, abscissa axis: wavelength) of the sample is measured at a low temperature (77K). A tangent is drawn to the rise of the phosphorescent spectrum close to the short-wavelength region. The triplet energy is calculated by a predetermined conversion equation based on a wavelength value at an intersection of the tangent and the abscissa axis.

Herein, the delayed fluorescent compound used in the exemplary embodiment is preferably a compound having a small $\Delta ST$. When $\Delta ST$ is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. The measurement target compound is dissolved in EPA (diethylether:isopentane:ethanol=5:5:2 in volume ratio) at a concentration of 10 µmol/L, and the obtained solution is encapsulated in a quartz cell to provide a measurement sample. A phosphorescent spectrum (ordinate axis: phosphorescent luminous intensity, abscissa axis: wavelength) of the sample is measured at a low temperature (77K). A tangent is drawn to the rise of the phosphorescent spectrum close to the short-wavelength region. An energy amount is calculated by a conversion equation (F1) below based on a wavelength value $\lambda_{edge}$ [nm] at an intersection of the tangent and the abscissa axis and is defined as an energy gap $T_{77K}$ at 77K.

Conversion Equation (F1): $T_{77K}[\text{eV}] = 1239.85/\lambda_{edge}$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring the singlet energy S1 with use of a solution (occasionally referred to as a solution method) is exemplified by a method below.

A toluene solution of a measurement target compound at a concentration of 10 µmol/L is prepared and put in a quartz cell. An absorption spectrum (ordinate axis: absorption intensity, abscissa axis: wavelength) of the thus-obtained sample is measured at a normal temperature (300K). A tangent was drawn to the fall of the absorption spectrum close to the long-wavelength region, and a wavelength value $\lambda_{edge}$ (nm) at an intersection of the tangent and the abscissa axis is assigned to a conversion equation (F2) below to calculate the singlet energy.

Conversion Equation (F2): $S_1$ [eV] = $1239.85/\lambda_{edge}$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

In the exemplary embodiment, a difference ($S_1-T_{77K}$) between the singlet energy $S_1$ and the energy gap $T_{77K}$ at 77K is defined as ΔST.

When the organic EL device 1 of the exemplary embodiment emits light, it is preferable that a fluorescent compound mainly emits light in the emitting layer 5.

The organic EL device 1 of the exemplary embodiment preferably emits red light or green light.

When the organic EL device 1 of the exemplary embodiment emits green light, a main peak wavelength of the light emitted from the organic EL device 1 is preferably in a range from 500 nm to 560 nm.

When the organic EL device 1 of the exemplary embodiment emits red light, a main peak wavelength of the light emitted from the organic EL device 1 is preferably in a range from 600 nm to 660 nm.

When the organic EL device 1 of the exemplary embodiment emits blue light, a main peak wavelength of the light emitted from the organic EL device 1 is preferably in a range from 430 nm to 480 nm.

A main peak wavelength of the light emitted from the organic EL device 1 is measured as follows.

Voltage is applied on the organic EL device 1 such that a current density becomes 10 mA/cm², where spectral radiance spectrum is measured by a spectroradiometer CS-2000 (manufactured by Konica Minolta, Inc.).

A peak wavelength of an emission spectrum, at which the luminous intensity of the resultant spectral radiance spectrum is at the maximum, is measured and defined as the main peak wavelength (unit: nm).

Film Thickness of Emitting Layer

A film thickness of the emitting layer 5 of the organic EL device 1 in the exemplary embodiment is preferably in a range from 5 nm to 50 nm, more preferably in a range from 7 nm to 50 nm, most preferably in a range from 10 nm to 50 nm. When the film thickness of the emitting layer is 5 nm or more, the formation of the emitting layer and the adjustment of the chromaticity are easy. When the film thickness of the emitting layer is 50 nm or less, an increase in the drive voltage is likely to be reducible.

Content Ratios of Compounds in Emitting Layer

In the emitting layer 5 of the organic EL device 1 of the exemplary embodiment, the content ratio of the first compound is preferably in a range from 0.01 mass % to 10 mass %, more preferably in a range from 0.01 mass % to 5 mass %, further preferably in a range from 0.01 mass % to 1 mass %.

The content ratio of the second compound preferably ranges from 10 mass % to 80 mass %, more preferably from 10 mass % to 60 mass %, further preferably from 20 mass % to 60 mass %.

The content ratio of the third compound is preferably in a range from 10 mass % to 80 mass %.

An upper limit of the total of the respective content ratios of the first, second, and third compounds in the emitting layer 5 is 100 mass %. It is not excluded that the emitting layer 5 of the exemplary embodiment further contains a material(s) other than the first, second, and third compounds.

The emitting layer 5 may include a single type of the first compound or may include two or more types of the first compound. The emitting layer 5 may include a single type of the second compound or may include two or more types of the second compound. The emitting layer 5 may include a single type of the third compound or may include two or more types of the third compound.

The organic EL device 1 according to the first exemplary embodiment emits light at a low voltage or a high efficiency or at a low voltage and a high efficiency. The organic EL device 1 according to the first exemplary embodiment is applicable to an electronic device such as a display device and a light-emitting device.

An arrangement of the organic EL device 1 will be further described below. It should be noted that the reference numerals will be occasionally omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include indium oxide-tin oxide (ITO: Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

The elements belonging to the group 1 or 2 of the periodic table, which are a material having a small work function, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal are usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of materials for the cathode include elements belonging to the group 1 or 2 of the periodic table, specifically, an alkali metal such as lithium (Li) and cesium (Cs), an alkaline earth metal such as magnesium (Mg), calcium (Ca) and strontium (Sr), an alloy containing the alkali metal and the alkaline earth metal (e.g., MgAg, AlLi), a rare earth metal such as europium (Eu) and ytterbium (Yb), and an alloy containing the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance include: an aromatic amine compound, which is a low-molecule organic compound, such that 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl(abbreviation: DPAB), 4,4'-bis(N-{4-[N'-(3-methylphenyl)-N'-phenylamino]phenyl}-N-phenylamino)biphenyl (abbreviation:

DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1); and dipyrazino[2,3-f:20,30-h]quinoxaline-2,3,6,7,10,11-hexacarbonitrile (HAT-CN).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ cm$^2$/(V·s) or more.

For the hole transporting layer, a carbazole derivative such as CBP, 9-[4-(N-carbazolyl)]phenyl-10-phenylanthracene (CzPA), and 9-phenyl-3-[4-(10-phenyl-9-anthryl)phenyl]-9H-carbazole (PCzPA) and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. It should be noted that the layer containing the substance exhibiting a high hole transportability may be not only a single layer but also a laminate of two or more layers formed of the above substance(s).

When the hole transporting layer includes two or more layers, one of the layers with a larger energy gap is preferably provided closer to the emitting layer. An example of the material with a larger energy gap is HT-2 used in later-described Examples.

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: Almq$_3$), bis(10-hydroxybenzo[h]quinolinato)beryllium (abbreviation: BeBq$_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: β-Et-TAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is preferably usable. The above-described substances mostly have an electron mobility of $10^{-6}$ cm$^2$/(V·s) or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF$_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. The composite material exhibits excellent electron injecting performance and electron transporting performance since the electron donor generates electrons in the organic compound. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A thickness of each of the organic layers in the organic EL device according to the exemplary embodiment is not limited except for the above particular description. In general, the thickness preferably ranges from several nanometers to 1 μm because excessively small film thickness is likely to cause defects (e.g. pin holes) and excessively large thickness leads to the necessity of applying high voltage and consequent reduction in efficiency.

Second Exemplary Embodiment

Electronic Device

An electronic device according to the exemplary embodiment is installed with the organic EL device according to the above exemplary embodiment. Examples of the electronic device include a display device and a light-emitting device. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above-described exemplary embodiments but includes any modification and improvement as long as such modification and improvement are compatible with the invention.

For instance, the emitting layer is not limited to a single layer, but may be provided by laminating a plurality of emitting layers. When the organic EL device has the plurality of emitting layers, it is only required that at least one of the emitting layers satisfies the conditions described in the above exemplary embodiment. For instance, in some embodiments, the rest of the emitting layers is a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

It is preferable that a blocking layer is provided adjacent to at least one of a side of the emitting layer close to the anode or a side of the emitting layer close to the cathode. The blocking layer is preferably provided in contact with the emitting layer to block holes, electrons, excitons or combinations thereof.

Specifically, in the exemplary embodiment, an electron blocking layer as the first layer is provided adjacent to the side of the emitting layer close to the anode. Since the first layer contains the compound represented by the formula (1), the first layer serving as the electron blocking layer is considered to have a deeper ionization potential Ip (larger absolute value). As a result, electrons can be efficiently blocked.

Moreover, in the exemplary embodiment, a hole blocking layer as the second layer is provided adjacent to the side of the emitting layer close to the cathode. Since the second layer contains the compound represented by the formula (2), the second layer serving as the hole blocking layer is considered to have a sharrower electron affinity level Af (smaller absolute value). As a result, holes can be efficiently blocked.

The emitting layer and the electron blocking layer are preferably bonded to each other. The emitting layer and the hole blocking layer are preferably bonded to each other.

Specific structure, shape and the like of the components in the invention may be designed in any manner as long as an object of the invention can be achieved.

Herein, numerical ranges represented by "x to y" represents a range whose lower limit is the value (x) recited before "to" and whose upper limit is the value (y) recited after "to."

Herein, the phrase "Rx and Ry are mutually bonded to form a ring" means, for instance, that Rx and Ry include a carbon atom, a nitrogen atom, an oxygen atom, a sulfur atom or a silicon atom, the atom(s) contained in Rx (a carbon atom, a nitrogen atom, an oxygen atom, a sulfur atom or a silicon atom) and the atom(s) contained in Ry (a carbon atom, a nitrogen atom, an oxygen atom, a sulfur atom or a silicon atom) are bonded via a single bond(s), a double bond(s), a triple bond, and/or a divalent linking group(s) to form a ring having 5 or more ring atoms (specifically, a heterocycle or an aromatic hydrocarbon ring). x represents a number, a character or a combination of a number and a character. y represents a number, a character or a combination of a number and a character.

The divalent linking group is not limited. Examples of the divalent linking group include —O—, —CO—, —CO$_2$—, —S—, —SO—, —SO$_2$—, —NH—, —NRa—, and a group provided by a combination of two or more of these linking group.

Specific examples of the heterocyclic ring herein include, unless otherwise described, a cyclic structure (heterocyclic ring) obtained by removing a bond from a "heteroaryl group Sub$_2$" exemplarily shown in the later-described "Description of Each Substituent in Formula." The heterocyclic ring may have a substituent.

Specific examples of the aromatic hydrocarbon ring herein include, unless otherwise described, a cyclic structure (aromatic hydrocarbon ring) obtained by removing a bond from a "aryl group Sub$_1$" exemplarily shown in the later-described "Description of Each Substituent in Formula." The aromatic hydrocarbon ring may have a substituent.

Examples of Ra include a substituted or unsubstituted alkyl group Sub$_3$ having 1 to 30 carbon atoms, a substituted or unsubstituted aryl group Sub$_1$ having 6 to 30 ring carbon atoms, and a substituted or unsubstituted heteroaryl group Sub$_2$ having 5 to 30 ring atoms, which are exemplarily shown in the later-described "Description of Each Substituent in Formula."

Rx and Ry are mutually bonded to form a ring, which means, for instance, that: an atom contained in Rx$_1$ and an atom contained in Ry$_1$ in a molecular structure represented by a formula (E1) below form a ring (cyclic structure) E represented by a formula (E2); an atom contained in Rx$_1$ and an atom contained in Ry$_1$ in a molecular structure represented by a formula (F1) below form a ring (cyclic structure) F represented by a formula (F2); an atom contained in Rx$_1$ and an atom contained in Ry$_1$ in a molecular structure represented by a formula (G1) below form a ring (cyclic structure) G represented by a formula (G2); an atom contained in Rx$_1$ and an atom contained in Ry$_1$ in a molecular structure represented by a formula (H1) below form a ring (cyclic structure) H represented by a formula (H2); and an atom contained in $Rx_1$ and an atom contained in $Ry_1$ in a molecular structure represented by a formula (11) below form a ring (cyclic structure) I represented by a formula (12).

In the formulae (E1) to (11), * each independently represent a bonding position to another atom in a molecule. The two * in the formulae (E1), (F1), (G1), (H1) and (11) correspond to two * in the formulae (E2), (F2), (G2), (H2) and (12), respectively.

[Formula 129]

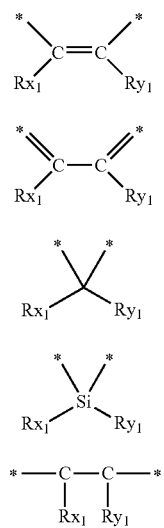

[Formula 130]

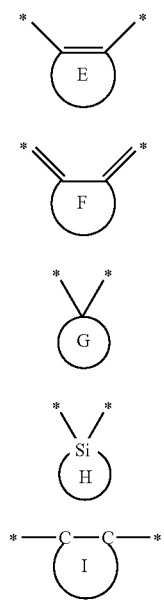

In the molecular structures represented by the formulae (E2) to (12), E to I each represent a cyclic structure (the ring having 5 or more ring atoms). In the formulae (E2) to (12), * each independently represent a bonding position to another atom in a molecule. The two * in the formula (E2) correspond to two * in the formula (E1). Similarly, two * in each of the formulae (F2) to (12) correspond one-to-one to two * in in each of the formulae (F1) to (11).

For instance, in the formula (E1), when $Rx_1$ and $Ry_1$ are mutually bonded to form the ring E in the formula (E2) and the ring E is an unsubstituted benzene ring, the molecular structure represented by the formula (E1) is a molecular structure represented by a formula (E3) below. Herein, two * in the formula (E3) each independently correspond to two * in the formula (E2) and the formula (E1).

For instance, in the formula (E1), when $Rx_1$ and $Ry_1$ are mutually bonded to form the ring E in the formula (E2) and the ring E is an unsubstituted pyrrole ring, the molecular structure represented by the formula (E1) is a molecular structure represented by a formula (E4) below. Herein, two * in the formula (E4) each independently correspond to two * in the formula (E2) and the formula (E1). In the formulae (E3) and (E4), * each independently represent a bonding position to another atom in a molecule.

[Formula 131]

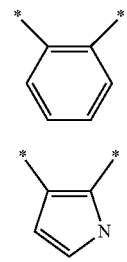

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded to each other to form the ring. When the ring is substituted by a substituent (s), carbon atom(s) contained in the substituent(s) is not counted in the ring carbon atoms. Unless specifically described, the same applies to the "ring carbon atoms" described later. For instance, a benzene ring has 6 ring carbon atoms, a naphthalene ring has 10 ring carbon atoms, a pyridinyl group has 5 ring carbon atoms, and a furanyl group has 4 ring carbon atoms. When a benzene ring and/or a naphthalene ring is substituted by a substituent (e.g., an alkyl group), the number of carbon atoms of the alkyl group is not counted in the number of the ring carbon atoms. When a fluorene ring is substituted by a substituent (e.g., a fluorene ring) (i.e., a spirofluorene ring is included), the number of carbon atoms of the fluorene ring as the substituent is not counted in the number of the ring carbon atoms of the fluorene ring.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, ring assembly). Atom(s) not forming a ring and atom(s) included in a substituent when the ring is substituted by the substituent are not counted in the number of the ring atoms. Unless specifically described, the same applies to the "ring atoms" described later. For instance, a pyridine ring has six ring atoms, a quinazoline ring has ten ring atoms, and a furan ring has five ring atoms.

A hydrogen atom(s) and/or an atom(s) of a substituent which are bonded to carbon atoms of a pyridine ring and/or quinazoline ring are not counted in the ring atoms. When a fluorene ring is substituted by a substituent (e.g., a fluorene ring) (i.e., a spirofluorene ring is included), the number of atoms of the fluorene ring as the substituent is not counted in the number of the ring atoms of the fluorene ring.

Description of Each Substituent in Formulae Herein

The aryl group (occasionally referred to as an aromatic hydrocarbon group) herein is exemplified by an aryl group $Sub_1$. The aryl group $Sub_1$ is at least one group selected from the group consisting of a phenyl group, biphenyl group, terphenyl group, naphthyl group, anthryl group, phenanthryl group, fluorenyl group, pyrenyl group, chrysenyl group, fluoranthenyl group, benz[a]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

Herein, the aryl group $Sub_1$ preferably has 6 to 30 ring carbon atoms, more preferably 6 to 20 ring carbon atoms, further preferably 6 to 14 ring carbon atoms, further more preferably 6 to 12 ring carbon atoms. Among the aryl group $Sub_1$, a phenyl group, biphenyl group, naphthyl group, phenanthryl group, terphenyl group and fluorenyl group are preferable. A carbon atom in a position 9 of each of 1-fluorenyl group, 2-fluorenyl group, 3-fluorenyl group and 4-fluorenyl group is preferably substituted by a substituted or unsubstituted alkyl group $Sub_3$ or a substituted or unsubstituted aryl group $Sub_1$ described later herein.

The heteroaryl group (occasionally referred to as a heterocyclic group, heteroaromatic cylic group or aromatic heterocyclic group) herein is exemplified by a heterocyclic group $Sub_2$. The heterocyclic group $Sub_2$ is a group containing, as a hetero atom(s), at least one atom selected from the group consisting of nitrogen, sulfur, oxygen, silicon, selenium atom and germanium atom. The heterocyclic group $Sub_2$ preferably contains, as a hetero atom(s), at least one atom selected from the group consisting of nitrogen, sulfur and oxygen.

The heterocyclic group $Sub_2$ herein are, for instance, at least one group selected from the group consisting of a pyridyl group, pyrimidinyl group, pyrazinyl group, pyridazinyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothienyl group, benzoxazolyl group, benzothiazolyl group, benzisoxazolyl group, benzisothiazolyl group, benzoxadiazolyl group, benzothiadiazolyl group, dibenzofuranyl group, dibenzothienyl group, piperidinyl group, pyrrolidinyl group, piperazinyl group, morpholyl group, phenazinyl group, phenothiazinyl group, and phenoxazinyl group.

Herein, the heterocyclic group $Sub_2$ preferably has 5 to 30 ring atoms, more preferably 5 to 20 ring atoms, further preferably 5 to 14 ring atoms. Among the above heterocyclic group $Sub_2$, a 1-dibenzofuranyl group, 2-dibenzofuranyl group, 3-dibenzofuranyl group, 4-dibenzofuranyl group, 1-dibenzothienyl group, 2-dibenzothienyl group, 3-dibenzothienyl group, 4-dibenzothienyl group, 1-carbazolyl group, 2-carbazolyl group, 3-carbazolyl group, 4-carbazolyl group, and 9-carbazolyl group are further more preferable. A nitrogen atom in position 9 of 1-carbazolyl group, 2-carbazolyl group, 3-carbazolyl group and 4-carbazolyl group is preferably substituted by the substituted or unsubstituted aryl group $Sub_1$ or the substituted or unsubstituted heterocyclic group $Sub_2$ described herein.

Herein, the heterocyclic group $Sub_2$ may be a group derived from any one of partial structures represented by formulae (XY-1) to (XY-18) below.

[Formula 132]

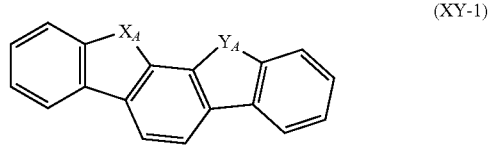
(XY-1)

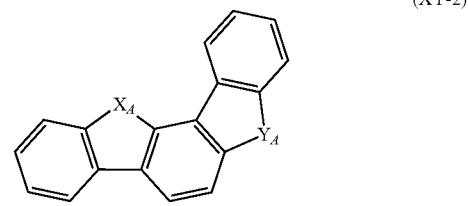
(XY-2)

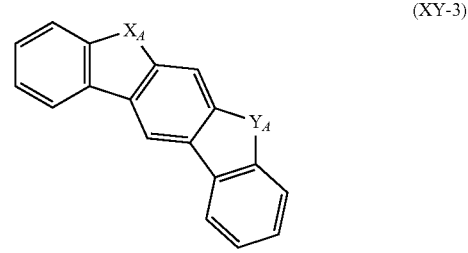
(XY-3)

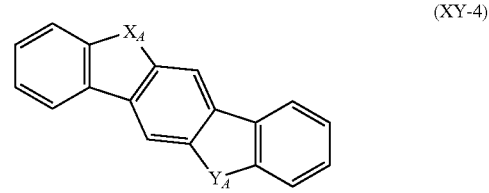
(XY-4)

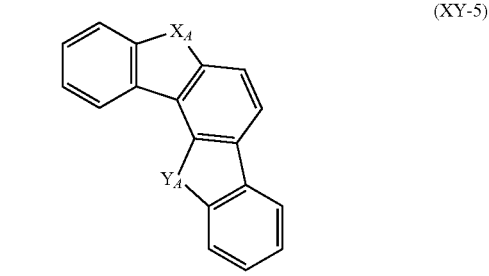
(XY-5)

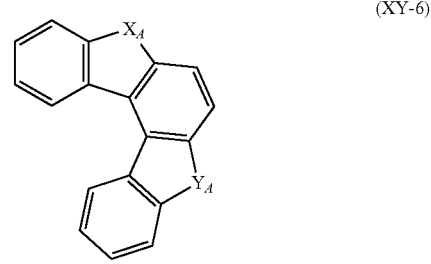
(XY-6)

[Formula 133]

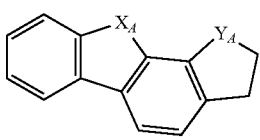
(XY-7)

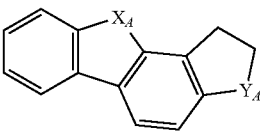
(XY-8)

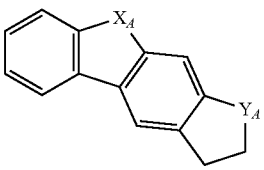
(XY-9)

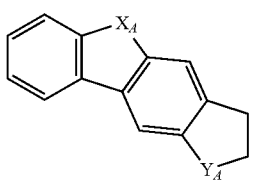
(XY-10)

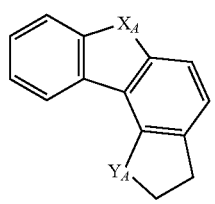
(XY-11)

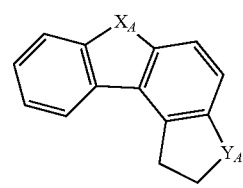
(XY-12)

[Formula 134]

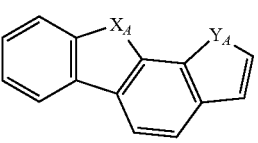
(XY-13)

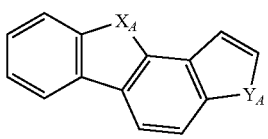
(XY-14)

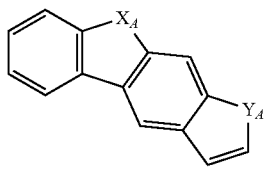
(XY-15)

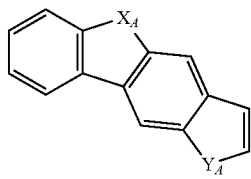
(XY-16)

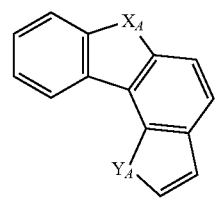
(XY-17)

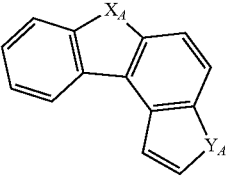
(XY-18)

In the formulae (XY-1) to (XY-18), $X_A$ and $Y_A$ each independently represent a hetero atom, and preferably represent an oxygen atom, sulfur atom, selenium atom, silicon atom or germanium atom. Each of the partial structures represented by the respective formulae (XY-1) to (XY-18) has a bond at any position to provide a heterocyclic group. The heterocyclic group may be substituted.

Herein, the heterocyclic group $Sub_2$ may be a group represented by one of formulae (XY-19) to (XY-22) below. Moreover, the position of the bond may be changed as needed.

[Formula 135]

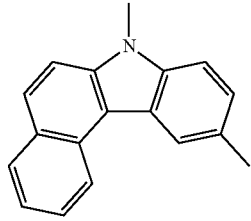
(XY-19)

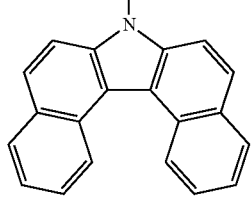
(XY-20)

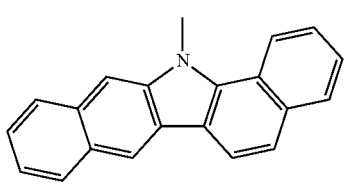
(XY-21)

(XY-22)

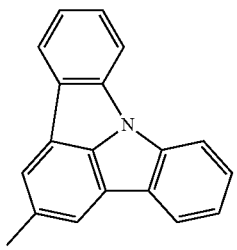

The alkyl group herein may be any one of a linear alkyl group, branched alkyl group and cyclic alkyl group.

The alkyl group herein is exemplified by an alkyl group $Sub_3$.

The linear alkyl group herein is exemplified by a linear alkyl group $Sub_{31}$.

The branched alkyl group herein is exemplified by a branched alkyl group $Sub_{32}$.

The cyclic alkyl group herein is exemplified by a cyclic alkyl group $Sub_{33}$.

For instance, the alkyl group $Sub_3$ is at least one group selected from the group consisting of the linear alkyl group $Sub_{31}$, branched alkyl group $Sub_{32}$, and cyclic alkyl group $Sub_{33}$.

The linear alkyl group $Sub_{31}$ or branched alkyl group $Sub_{32}$ is exemplified by at least one group selected from the group consisting of a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, amyl group, isoamyl group, 1-methylpentyl group, 2-methylpentyl group, 1-pentylhexyl group, 1-butylpentyl group, 1-heptyloctyl group, and 3-methylpentyl group.

Herein, the linear alkyl group $Sub_{31}$ or branched alkyl group $Sub_{32}$ preferably has 1 to 30 carbon atoms, more preferably 1 to 20 carbon atoms, further preferably 1 to 10 carbon atoms, further more preferably 1 to 6 carbon atoms. The linear alkyl group $Sub_{31}$ or branched alkyl group $Sub_{32}$ is further more preferably a methyl group, ethyl group, propyl group, isopropyl group, n-butyl group, s-butyl group, isobutyl group, t-butyl group, n-pentyl group, n-hexyl group, amyl group, isoamyl group and neopentyl group.

Herein, the cyclic alkyl group $Sub_{33}$ is exemplified by a cycloalkyl group $Sub_{331}$.

The cycloalkyl group $Sub_{331}$ herein is exemplified by at least one group selected from the group consisting of a cyclopropyl group, cyclobutyl group, cyclopentyl group, cyclohexyl group, 4-metylcyclohexyl group, adamantyl group and norbornyl group. The cycloalkyl group $Sub_{331}$ preferably has 3 to 30 ring carbon atoms, more preferably 3 to 20 ring carbon atoms, further preferably 3 to 10 ring carbon atoms, further more preferably 5 to 8 ring carbon atoms. Among the cycloalkyl group $Sub_{331}$, a cyclopentyl group and a cyclohexyl group are further more preferable.

Herein, an alkyl halide group is exemplified by an alkyl halide group $Sub_4$. The alkyl halide group $Sub_4$ is provided by substituting the alkyl group $Sub_3$ with at least one halogen atom, preferably at least one fluorine atom.

Herein, the alkyl halide group $Sub_4$ is exemplified by at least one group selected from the group consisting of a fluoromethyl group, difluoromethyl group, trifluoromethyl group, fluoroethyl group, trifluoromethylmethyl group, trifluoroethyl group, and pentafluoroethyl group.

Herein, a substituted silyl group is exemplified by a substituted silyl group $Sub_5$. The substituted silyl group $Sub_5$ is exemplified by at least one group selected from the group consisting of an alkylsilyl group $Sub_{51}$ and an arylsilyl group $Sub_{52}$.

Herein, the alkylsilyl group $Sub_{51}$ is exemplified by a trialkylsilyl group $Sub_{511}$ having the above-described alkyl group $Sub_3$.

The trialkylsilyl group $Sub_{511}$ is exemplified by at least one group selected from the group consisting of a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups $Sub_3$ in the trialkylsilyl group $Sub_{511}$ may be mutually the same or different.

Herein, the arylsilyl group $Sub_{52}$ is exemplified by at least one group selected from the group consisting of a dialkylarylsilyl group $Sub_{521}$, alkyldiarylsilyl group $Sub_{522}$ and triarylsilyl group $Sub_{523}$.

The dialkylarylsilyl group $Sub_{521}$ is exemplified by a dialkylarylsilyl group including two alkyl groups $Sub_3$ and one aryl group $Sub_1$. The dialkylarylsilyl group $Sub_{521}$ preferably has 8 to 30 carbon atoms.

The alkyldiarylsilyl group $Sub_{522}$ is exemplified by an alkyldiarylsilyl group including one alkyl group $Sub_3$ and two aryl groups $Sub_1$. The alkyldiarylsilyl group $Sub_{522}$ preferably has 13 to 30 carbon atoms.

The triarylsilyl group $Sub_{523}$ is exemplified by a triarylsilyl group including three aryl groups $Sub_1$. The triarylsilyl group $Sub_{523}$ preferably has 18 to 30 carbon atoms.

Herein, a substituted or unsubstituted alkyl sulfonyl group is exemplified by an alkyl sulfonyl group $Sub_6$. The alkyl sulfonyl group $Sub_6$ is represented by —$SO_2R_w$. $R_w$ in —$SO_2R_w$ represents a substituted or unsubstituted alkyl group $Sub_3$ described above.

Herein, an aralkyl group (occasionally referred to as an arylalkyl group) is exemplified by an aralkyl group $Sub_7$. An aryl group in the aralkyl group $Sub_7$ includes, for instance, at least one of the above-described aryl group $Sub_1$ or the above-described heteroaryl group $Sub_2$.

The aralkyl group $Sub_7$ herein is preferably a group having the aryl group $Sub_1$ and is represented by —$Z_3$—$Z_4$. $Z_3$ is exemplified by an alkylene group corresponding to the above alkyl group $Sub_3$. $Z_4$ is exemplified by the above aryl group $Sub_1$. In this aralkyl group $Sub_7$, an aryl moiety has 6 to 30 carbon atoms (preferably 6 to 20 carbon atoms, more preferably 6 to 12 carbon atoms) and an alkyl moiety has 1 to 30 carbon atoms (preferably 1 to 20 carbon atoms, more preferably 1 to 10 carbon atoms, further preferably 1 to 6 carbon atoms). The aralkyl group $Sub_7$ is exemplified by at least one group selected from the group consisting of a benzyl group, 2-phenylpropane-2-yl group, 1-phenylethyl group, 2-phenylethyl group, 1-phenylisopropyl group, 2-phenylisopropyl group, phenyl-t-butyl group, a-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

The alkoxy group herein is exemplified by an alkoxy group $Sub_3$. The alkoxy group $Sub_3$ is represented by —$OZ_1$. $Z_1$ is exemplified by the above alkyl group $Sub_3$. The alkoxy group $Sub_8$ is exemplified by at least one group selected from the group consisting of a methoxy group, ethoxy group, propoxy group, butoxy group, pentyloxy group and hexyloxy group. The alkoxy group $Sub_8$ preferably has 1 to 30 carbon atoms, more preferably 1 to 20 carbon atoms.

Herein, an alkoxy halide group is exemplified by an alkoxy halide group $Sub_9$. The alkoxy halide group $Sub_9$ is provided by substituting the alkoxy group $Sub_8$ with at least one halogen atom, preferably at least one fluorine atom.

Herein, an aryloxy group (occasionally referred to as an arylalkoxy group) is exemplified by an arylalkoxy group $Sub_{10}$. An aryl group in the arylalkoxy group $Sub_{10}$ includes at least one of the aryl group $Sub_1$ or the heteroaryl group $Sub_2$.

The arylalkoxy group $Sub_{10}$ herein is represented by $-OZ_2$. $Z_2$ is exemplified by the aryl group $Sub_1$ or the heteroaryl group $Sub_2$. The arylalkoxy group $Sub_{10}$ preferably has 6 to 30 ring carbon atoms, more preferably 6 to 20 ring carbon atoms. The arylalkoxy group $Sub_{10}$ is exemplified by a phenoxy group.

Herein, a substituted amino group is exemplified by a substituted amino group $Sub_{11}i$. The substituted amino group $Sub_{11}$ is exemplified by at least one group selected from the group consisting of an arylamino group $Sub_{111}$ and an alkylamino group $Sub_{112}$.

The arylamino group $Sub_{111}$ is represented by $-NHR_{V1}$ or $-N(R_{V1})_2$. $R_{V1}$ is exemplified by the aryl group $Sub_1$. Two $R_{V1}$ in $-N(R_{V1})_2$ are mutually the same or different.

The alkylamino group $Sub_{112}$ is represented by $-NHR_{V2}$ or $-N(R_{V2})_2$. $R_{V2}$ is exemplified by the alkyl group $Sub_3$. Two $R_{V2}$ in $-N(R_{V2})_2$ are mutually the same or different.

Herein, the alkenyl group is exemplified by an alkenyl group $Sub_{12}$. The alkenyl group $Sub_{12}$, which is linear or branched, is exemplified by at least one group selected from the group consisting of a vinyl group, propenyl group, butenyl group, oleyl group, eicosapentaenyl group, docosahexaenyl group, styryl group, 2,2-diphenylvinyl group, 1,2,2-triphenylvinyl group, and 2-phenyl-2-propenyl group.

The alkynyl group herein is exemplified by an alkynyl group $Sub_{13}$. The alkynyl group $Sub_{13}$ may be linear or branched and is at least one group selected from the group consisting of an ethynyl group, a propynyl group and a 2-phenylethynyl group.

The alkylthio group herein is exemplified by an alkylthio group $Sub_{14}$.

The alkylthio group $Sub_{14}$ is represented by $-SR_{V3}$. $R_{V3}$ is exemplified by the alkyl group $Sub_3$. The alkylthio group $Sub_{14}$ preferably has 1 to 30 carbon atoms, more preferably 1 to 20 carbon atoms.

The arylthio group herein is exemplified by an arylthio group $Sub_{15}$.

The arylthio group $Sub_{15}$ is represented by $-SR_{V4}$. $R_{V4}$ is exemplified by the aryl group $Sub_1$. The arylthio group $Sub_{15}$ preferably has 6 to 30 ring carbon atoms, more preferably 6 to 20 ring carbon atoms.

Herein, examples of the halogen atom include a fluorine atom, a chlorine atom, a bromine atom and an iodine atom, among which a fluorine atom is preferable.

A substituted phosphino group herein is exemplified by a substituted phosphino group $Sub_{16}$. The substituted phosphino group $Sub_{16}$ is exemplified by a phenyl phosphanyl group.

An arylcarbonyl group herein is exemplified by an arylcarbonyl group $Sub_{17}$. The arylcarbonyl group $Sub_{17}$ is represented by $-COY'$. $Y'$ is exemplified by the aryl group $Sub_1$. Herein, the arylcarbonyl group $Sub_{17}$ is exemplified by at least one group selected from the group consisting of a phenyl carbonyl group, diphenyl carbonyl group, naphthyl carbonyl group, and triphenyl carbonyl group.

An acyl group herein is exemplified by an acyl group $Sub_{18}$. The acyl group $Sub_{18}$ is represented by $-COR'$. $R'$ is exemplified by the alkyl group $Sub_3$. The acyl group $Sub_{18}$ herein is exemplified by at least one group selected from the group consisting of an acetyl group and a propionyl group.

A substituted phosphoryl group herein is exemplified by a substituted phosphoryl group $Sub_{19}$. The substituted phosphoryl group $Sub_{19}$ is represented by a formula (P) below.

[Formula 136]

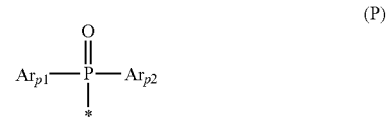

(P)

In the formula (P), $Ar_{P1}$ and $Ar_{P2}$ are any one substituent selected from the group consisting of the above alkyl group $Sub_3$ and the above aryl group $Sub_1$.

An ester group herein is exemplified by an ester group $Sub_{20}$. The ester group $Sub_{20}$ is exemplified by at least one group selected from the group consisting of an alkyl ester group and an aryl ester group.

An alkyl ester group herein is exemplified by an alkyl ester group $Sub_{201}$. The alkyl ester group $Sub_{201}$ is represented by $-C(=O)OR^E$. $R^E$ is exemplified by a substituted or unsubstituted alkyl group $Sub_3$ described above.

An aryl ester group herein is exemplified by an aryl ester group $Sub_{202}$. The aryl ester group $Sub_{202}$ is represented by $-C(=O)OR^{Ar}$. $R^{Ar}$ is exemplified by a substituted or unsubstituted aryl group $Sub_1$ described above.

A siloxanyl group herein is exemplified by a siloxanyl group $Sub_{21}$. The siloxanyl group $Sub_{21}$ is a silicon compound group through an ether bond. The siloxanyl group $Sub_{21}$ is exemplified by a trimethylsiloxanyl group.

A carbamoyl group herein is represented by $-CONH_2$.

A substituted carbamoyl group herein is exemplified by a carbamoyl group $Sub_{22}$. The carbamoyl group $Sub_{22}$ is represented by $-CONH-Ar^C$ or $-CONH-R^C$. $Ar^C$ is exemplified by at least one group selected from the group consisting of the above-described aryl group $Sub_1$ (preferably 6 to 10 ring carbon atoms) and the above-described heteroaryl group $Sub_2$ (preferably 5 to 14 ring atoms). $Ar^C$ may be a group formed by bonding the aryl group $Sub_1$ and the heteroaryl group $Sub_2$.

$R^C$ is exemplified by a substituted or unsubstituted alkyl group $Sub_3$ described above (preferably having 1 to 6 carbon atoms).

Herein, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a ring including a saturated ring, unsaturated ring, or aromatic ring.

Herein, a hydrogen atom includes isotope having different numbers of neutrons, specifically, protium, deuterium and tritium.

Hereinafter, an alkyl group $Sub_3$ means at least one group of a linear alkyl group $Sub_{31}$, a branched alkyl group $Sub_{32}$, or a cyclic alkyl group $Sub_{33}$ described in "Description of Each Substituent."

Similarly, a substituted silyl group $Sub_5$ means at least one group of an alkylsilyl group $Sub_{51}$ or an arylsilyl group $Sub_{52}$.

Similarly, a substituted amino group $Sub_{11}$ means at least one group of an arylamino group $Sub_{111}$ or an alkylamino group $Sub_{112}$.

Herein, a substituent for a "substituted or unsubstituted" group is exemplified by a substituent $R_{F1}$. The substituent $R_{F1}$ is at least one group selected from the group consisting of an aryl group $Sub_1$, heteroaryl group $Sub_2$, alkyl group $Sub_3$, alkyl halide group $Sub_4$, substituted silyl group $Sub_5$, alkylsulfonyl group $Sub_6$, aralkyl group $Sub_7$, alkoxy group $Sub_8$, alkoxy halide group $Sub_9$, arylalkoxy group $Sub_{10}$, substituted amino group $Sub_{11}$, alkenyl group $Sub_{12}$, alkynyl group $Sub_{13}$, alkylthio group $Sub_{14}$, arylthio group $Sub_{15}$, substituted phosphino group $Sub_{16}$, arylcarbonyl group $Sub_{17}$, acyl group $Sub_{18}$, substituted phosphoryl group $Sub_{19}$, ester group $Sub_{20}$, siloxanyl group $Sub_{21}$, carbamoyl group $Sub_{22}$, unsubstituted amino group, unsubstituted silyl group, halogen atom, cyano group, hydroxy group, nitro group, and carboxy group.

Herein, the substituent $R_{F1}$ for a "substituted or unsubstituted" group may be a diaryl boron group ($Ar_{B1}Ar_{B2}B$—). $Ar_{B1}$ and $Ar_{B2}$ are exemplified by the above-described aryl group $Sub_1$. $Ar_{B1}$ and $Ar_{B2}$ in $Ar_{B1}Ar_{B2}B$— are the same or different.

Specific examples and preferable examples of the substituent $R_{F1}$ are the same as those of the substituents described in "Description of Each Substituent" (e.g., an aryl group $Sub_1$, heteroaryl group $Sub_2$, alkyl group $Sub_3$, alkyl halide group $Sub_4$, substituted silyl group $Sub_5$, alkylsulfonyl group $Sub_6$, aralkyl group $Sub_7$, alkoxy group $Sub_8$, alkoxy halide group $Sub_9$, arylalkoxy group $Sub_{10}$, substituted amino group $Sub_{11}$, alkenyl group $Sub_{12}$, alkynyl group $Sub_{13}$, alkylthio group $Sub_{14}$, arylthio group $Sub_{15}$, substituted phosphino group $Sub_{16}$, arylcarbonyl group $Sub_{17}$, acyl group $Sub_{18}$, substituted phosphoryl group $Sub_{19}$, ester group $Sub_{20}$, siloxanyl group $Sub_{21}$, and carbamoyl group $Sub_{22}$).

The substituent $R_{F1}$ for a "substituted or unsubstituted" group may be further substituted by at least one group (hereinafter, also referred to as a substituent $R_{F2}$) selected from the group consisting of an aryl group $Sub_1$, heteroaryl group $Sub_2$, alkyl group $Sub_3$, alkyl halide group $Sub_4$, substituted silyl group $Sub_5$, alkylsulfonyl group $Sub_6$, aralkyl group $Sub_7$, alkoxy group $Sub_8$, alkoxy halide group $Sub_9$, arylalkoxy group $Sub_{10}$, substituted amino group $Sub_{11}$, alkenyl group $Sub_{12}$, alkynyl group $Sub_{13}$, alkylthio group $Sub_{14}$, arylthio group $Sub_{15}$, substituted phosphino group $Sub_{16}$, arylcarbonyl group $Sub_{17}$, acyl group $Sub_{18}$, substituted phosphoryl group $Sub_{19}$, ester group $Sub_{20}$, siloxanyl group $Sub_{21}$, carbamoyl group $Sub_{22}$, unsubstituted amino group, unsubstituted silyl group, halogen atom, cyano group, hydroxy group, nitro group, and carboxy group. Moreover, a plurality of substituents $R_{F2}$ may be bonded to each other to form a ring.

"Unsubstituted" for a "substituted or unsubstituted" group means that a group is not substituted by the above-described substituent $R_{F1}$ but bonded with a hydrogen atom.

Herein, "XX to YY carbon atoms" in the description of "substituted or unsubstituted ZZ group having XX to YY carbon atoms" represent carbon atoms of an unsubstituted ZZ group and do not include carbon atoms of the substituent $R_{F1}$ of the substituted ZZ group.

Herein, "XX to YY atoms" in the description of "substituted or unsubstituted ZZ group having XX to YY atoms" represent atoms of an unsubstituted ZZ group and do not include atoms of the substituent $R_{F1}$ of the substituted ZZ group.

The same description as the above applies to "substituted or unsubstituted" in compounds or partial structures thereof described herein.

Herein, when the substituents are bonded to each other to form a ring, the ring is structured to be a saturated ring, an unsaturated ring, an aromatic hydrocarbon ring or a hetero ring.

Herein, examples of the aromatic hydrocarbon group in the linking group include a divalent or multivalent group obtained by eliminating one or more atoms from the above monovalent aryl group $Sub_1$.

Herein, examples of the heterocyclic group in the linking group include a divalent or multivalent group obtained by eliminating one or more atoms from the above monovalent heteroaryl group $Sub_2$.

EXAMPLES

Example(s) of the invention will be described below. However, the invention is not limited to Example(s).

Compounds

The compounds represented by the formula (1) and used for manufacturing organic EL devices in Examples 1 to 10 are shown below.

[Formula 137]

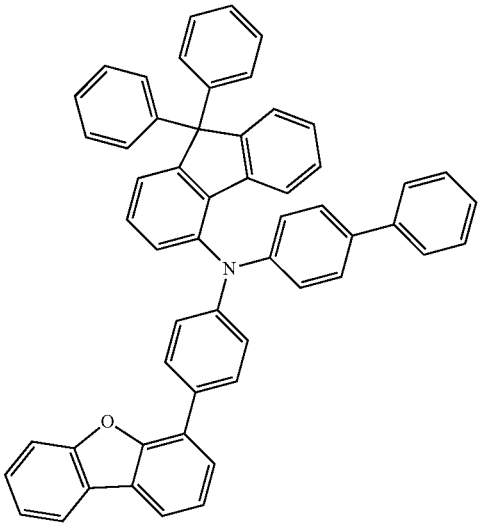

EBL-1

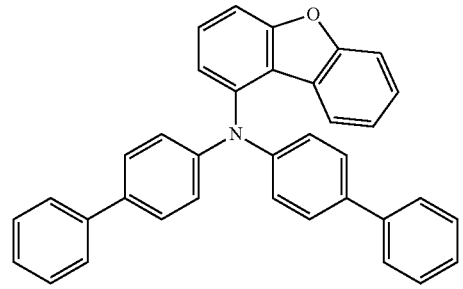

EBL-2

[Formula 138]
EBL-3
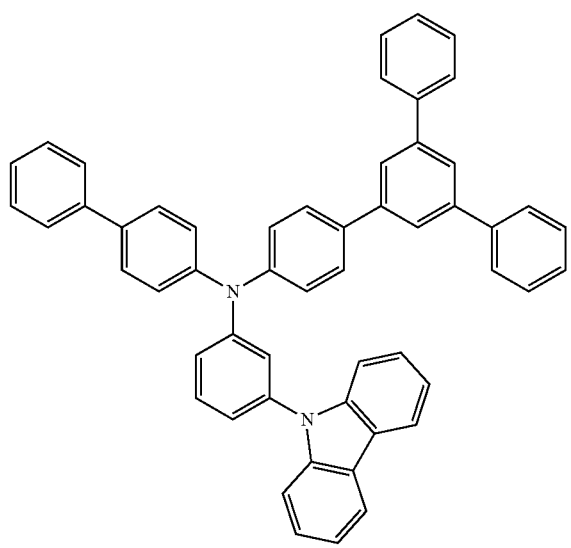
[Formula 139]
HBL-1
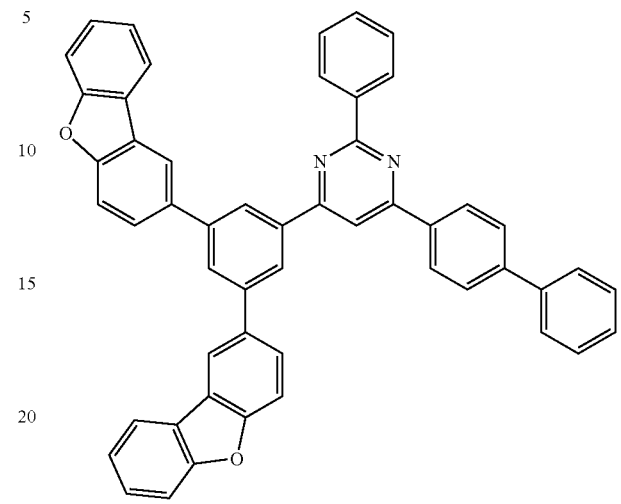
HBL-2
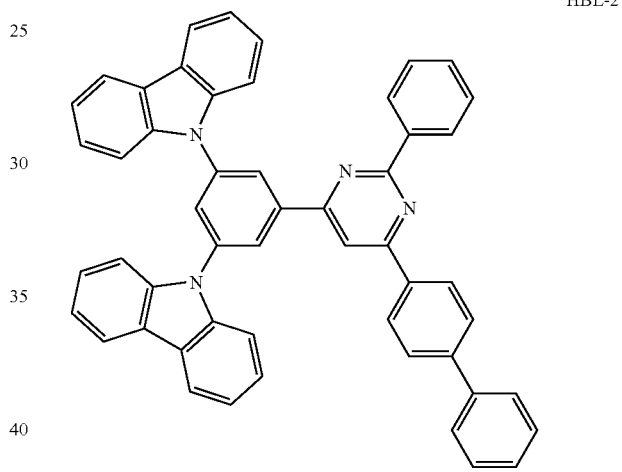
EBL-4
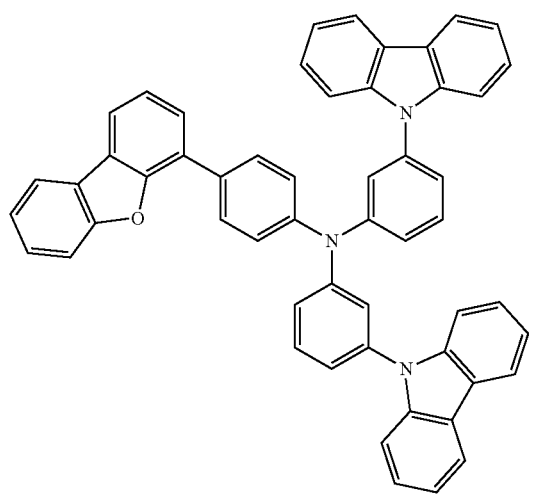
HBL-3
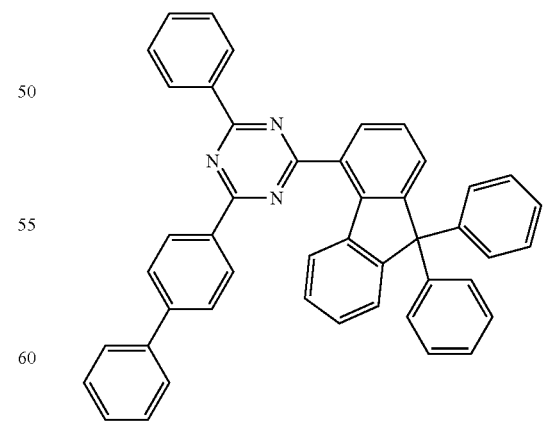
The compounds represented by the formula (2) and used for manufacturing organic EL devices in Examples 1 to 10 are shown below.
Structures of comparative compounds used for manufacturing organic EL devices in Comparatives 1 to 4 are shown below.

[Formula 140]
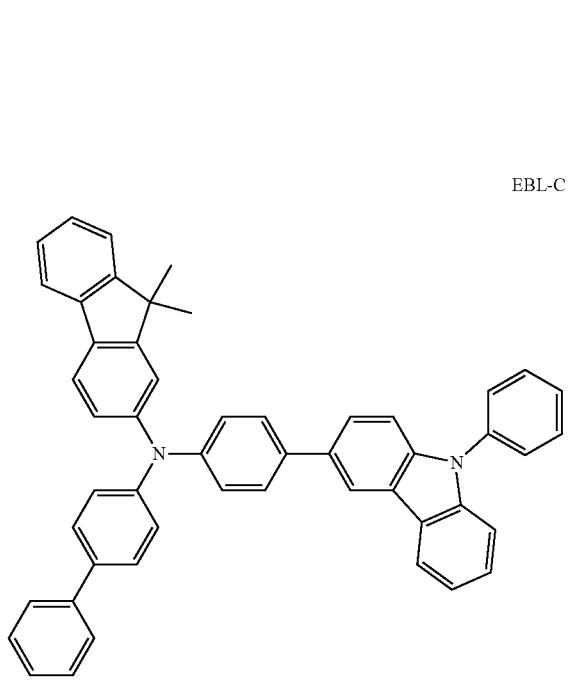
EBL-C1
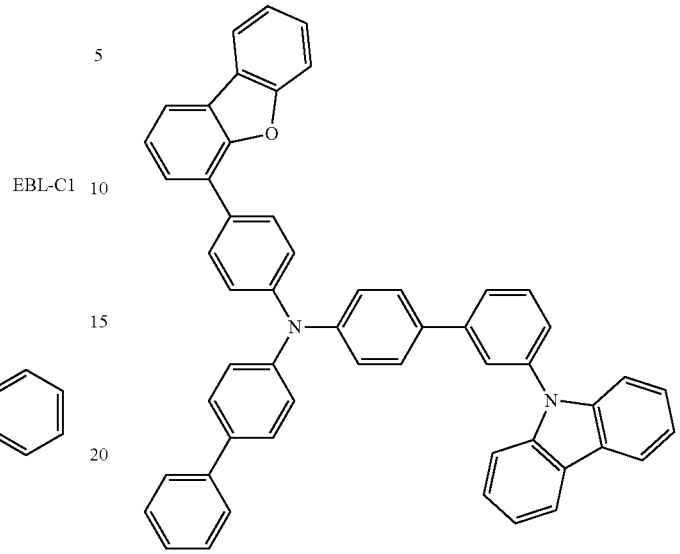
EBL-C2
Structures of other compounds used for manufacturing organic EL devices in Examples 1 to 10 and Comparatives 1 to 4 are shown below.
[Formula 141]
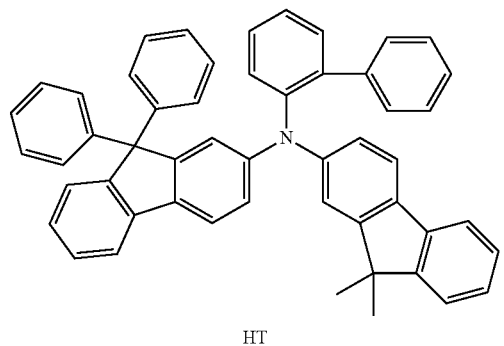
HT
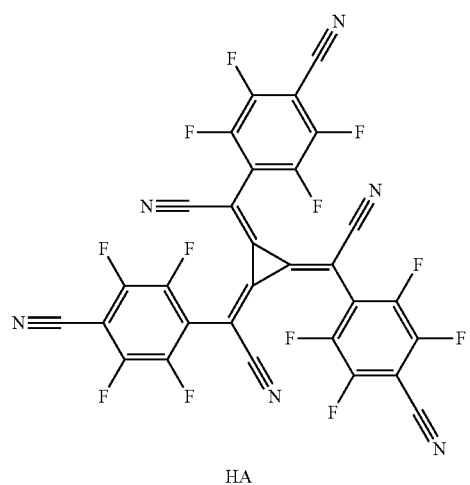
HA

[Formula 142]
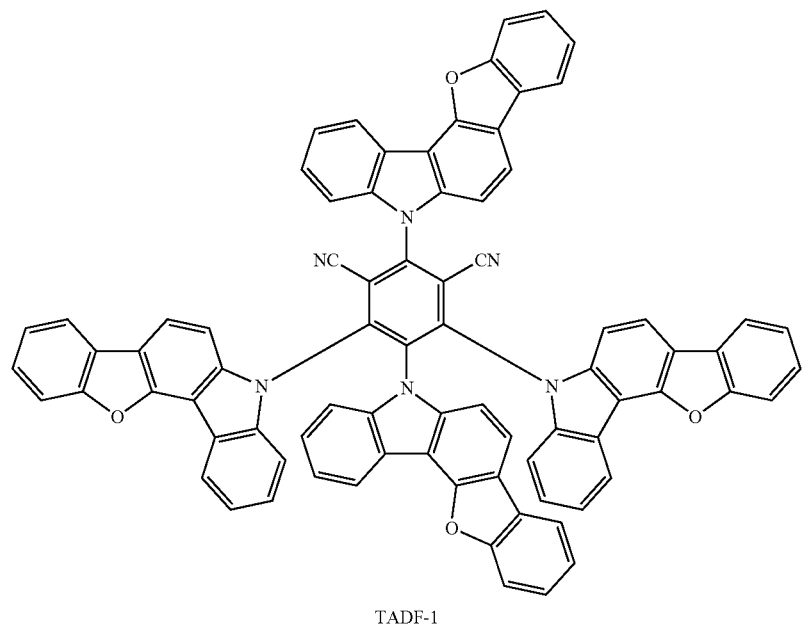
TADF-1
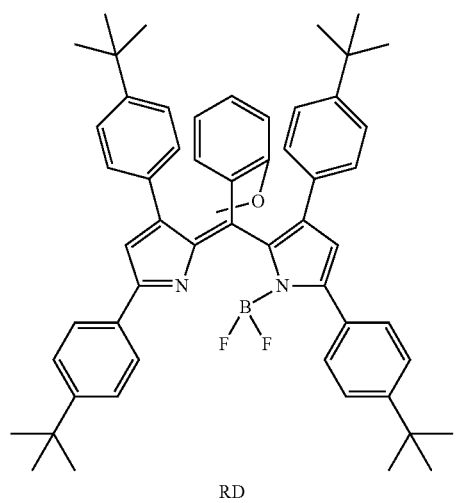
RD
[Formula 143]
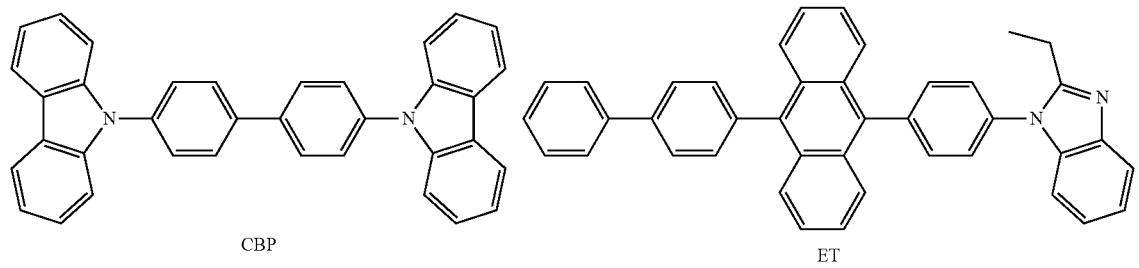
CBP
ET

[Formula 144]

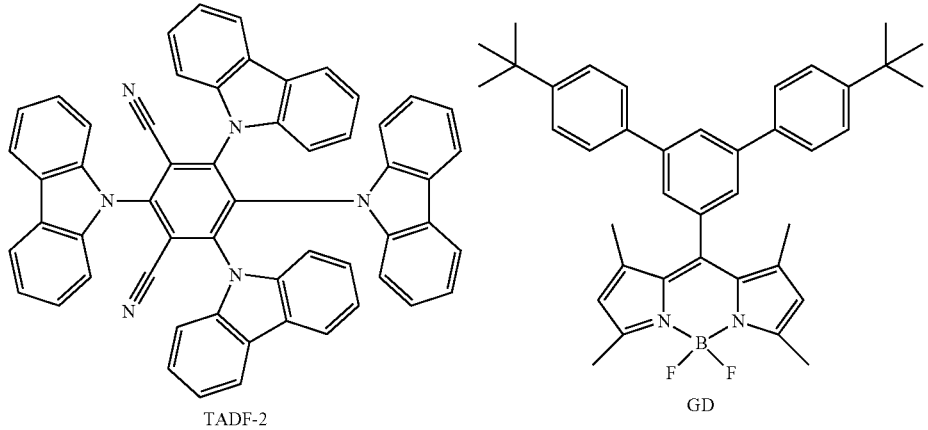

TADF-2

GD

[Formula 145]

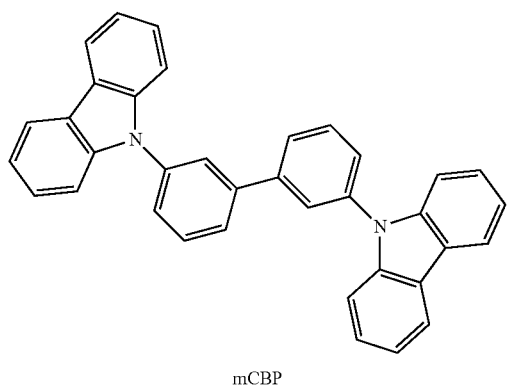

mCBP

Manufacture 1 of Organic EL Device

The organic EL devices were prepared and evaluated as follows.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

After the glass substrate having the transparent electrode line was cleaned, the glass substrate was mounted on a substrate holder of a vacuum evaporation apparatus. Firstly, a compound HT and a compound HA were co-deposited on a surface of the glass substrate where the transparent electrode line was provided in a manner to cover the transparent electrode, thereby forming a 10-nm-thick hole injecting layer. The concentrations of the compound HT and the compound HA in the hole injecting layer were 97 mass % and 3 mass %, respectively.

Next, a compound HT was vapor-deposited on a hole injecting layer to form a 200-nm-thick hole transporting layer.

Next, a compound EBL-1 was vapor-deposited on the hole transporting layer to form a 10-nm-thick electron blocking layer as the first layer.

Next, a fluorescent compound RD (the first compound), a delayed fluorescent compound TADF-1 (the second compound), and a compound CBP (the third compound) were co-deposited on the electron blocking layer to form a 25-nm-thick emitting layer. The concentrations of the compound RD, the compound TADF-1, and the compound CBP in the emitting layer were 1 mass %, 25 mass %, and 74 mass %, respectively.

Next, a compound HBL-1 was vapor-deposited on the emitting layer to form a 10-nm-thick hole blocking layer as the second layer.

Next, the compound ET was vapor-deposited on the hole blocking layer to form a 30-nm-thick electron transporting layer.

Next, lithium fluoride (LiF) was vapor-deposited on the electron transporting layer to form a 1-nm-thick electron injecting electrode (cathode).

Subsequently, metal aluminum (Al) was vapor-deposited on the electron injectable electrode to form an 80-nm-thick metal Al cathode.

A device arrangement of the organic EL device in Example 1 is schematically shown as follows.

ITO(130)/HT:HA(10,97%:3%)/HT(200)/EBL-1(10)/CBP:TADF-1:RD(25,74%:25%:1%)/HBL-1 (10)/ET(30)/LiF(1)/Al(80)

Numerals in parentheses represent a film thickness (unit: nm).

The numerals (97%:3%) represented by percentage in the same parentheses indicate a ratio (mass %) between the compound HT and the compound HA in the hole injecting layer, and the numerals (74%:25%:1%) represented by percentage in the same parentheses indicate a ratio (mass %)

between the third compound, the second compound, and the first compound in the emitting layer. Similar notations apply to the description below.

Examples 2 to 4 and Comparative 1

The organic EL devices in Examples 2 to 4 and Comparative 1 were manufactured in the same manner as in Example 1 except that compounds shown in a column of the electron blocking layer in Table 6 were used in place of the compound EBL-1 in Example 1.

Examples 5 to 8 and Comparatives 2 to 3

The organic EL devices in Examples 5 to 8 and Comparatives 2 to 3 were manufactured in the same manner as in Example 1 except that compounds shown in the column of the electron blocking layer in Table 6 were used in place of the compound EBL-1 in Example 1 and compounds shown in a column of the hole blocking layer in Table 6 were used in place of the compound HBL-1 in Example 1.
Evaluation 1 of Organic EL Devices The manufactured organic EL devices were evaluated as follows.
Measurement results are shown in Table 6.
Drive Voltage A voltage (unit: V) was measured when current was applied between the anode and the cathode such that a current density was 10 mA/cm².
External Quantum Efficiency EQE Voltage was applied on each of the organic EL devices such that a current density was 10 mA/cm², where spectral radiance spectra were measured by a spectroradiometer CS-2000 (manufactured by Konica Minolta, Inc.). The external quantum efficiency EQE (unit: %) was calculated based on the obtained spectral-radiance spectra, assuming that the spectra was provided under a Lambertian radiation.
CIE1931 Chromaticity Voltage was applied on each of the organic EL devices manufactured such that a current density was 10 mA/cm², where coordinates (x, y) of CIE1931 chromaticity were measured by a spectroradiometer CS-1000 (manufactured by Konica Minolta, Inc.).

The organic EL devices in Examples 5 to 6 exhibit a lower drive voltage and an improved external quantum efficiency EQE as compared with the organic EL device including the electron blocking layer containing the compound EBL-$C_1$ in Comparative 2.

The organic EL devices in Examples 7 to 8 exhibit a lower drive voltage and an improved external quantum efficiency EQE as compared with the organic EL device including the electron blocking layer containing the compound EBL-$C_1$ in Comparative 3.
Manufacture 2 of Organic EL Device Example 9

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick.

After the glass substrate having the transparent electrode line was cleaned, the glass substrate was mounted on a substrate holder of a vacuum evaporation apparatus. Firstly, a compound HT and a compound HA were co-deposited on a surface of the glass substrate where the transparent electrode line was provided in a manner to cover the transparent electrode, thereby forming a 10-nm-thick hole injecting layer. The concentrations of the compound HT and the compound HA in the hole injecting layer were 97 mass % and 3 mass %, respectively.

Next, a compound HT was vapor-deposited on the hole injecting layer to form a 110-nm-thick hole transporting layer.

Next, a compound EBL-1 was vapor-deposited on the hole transporting layer to form a 10-nm-thick electron blocking layer as the first layer.

Next, a fluorescent compound GD (the first compound), a delayed fluorescent compound TADF-2 (the second compound), and a compound mCBP (the third compound) were co-deposited on the electron blocking layer to form a 25-nm-thick emitting layer. The concentrations of the compound GD, the compound TADF-2, and the compound

TABLE 6

| | Electron Blocking Layer (First Layer) | | Emitting Layer | | | Hole Blocking Layer | Evaluation | | |
|---|---|---|---|---|---|---|---|---|---|
| | Compound | Ip [eV] | Third Compound | Second Compound | First Compound | (Second Layer) Compound | Drive Voltage [V] | EQE [%] | CIE (x, y) |
| Example 1 | EBL-1 | 5.78 | CBP | TADF-1 | RD | HBL-1 | 4.3 | 15.9 | (0.65, 0.35) |
| Example 2 | EBL-2 | 5.79 | CBP | TADF-1 | RD | HBL-1 | 4.0 | 15.6 | (0.65, 0.35) |
| Example 3 | EBL-3 | 5.80 | CBP | TADF-1 | RD | HBL-1 | 4.3 | 15.4 | (0.66, 0.34) |
| Example 4 | EBL-4 | 5.86 | CBP | TADF-1 | RD | HBL-1 | 4.4 | 15.4 | (0.65, 0.35) |
| Comparative 1 | EBL-C1 | 5.48 | CBP | TADF-1 | RD | HBL-1 | 4.7 | 13.8 | (0.65, 0.35) |
| Example 5 | EBL-2 | 5.79 | CBP | TADF-1 | RD | HBL-2 | 4.0 | 14.4 | (0.65, 0.35) |
| Example 6 | EBL-3 | 5.80 | CBP | TADF-1 | RD | HBL-2 | 4.1 | 14.5 | (0.65, 0.35) |
| Comparative 2 | EBL-C1 | 5.48 | CBP | TADF-1 | RD | HBL-2 | 4.5 | 12.9 | (0.65, 0.35) |
| Example 7 | EBL-2 | 5.79 | CBP | TADF-1 | RD | HBL-3 | 4.1 | 14.3 | (0.65, 0.35) |
| Example 8 | EBL-3 | 5.80 | CBP | TADF-1 | RD | HBL-3 | 4.2 | 14.9 | (0.66, 0.34) |
| Comparative 3 | EBL-C1 | 5.48 | CBP | TADF-1 | RD | HBL-3 | 4.6 | 13.1 | (0.65, 0.35) |

The organic EL devices in Examples 1 to 4 exhibit a lower drive voltage and an improved external quantum efficiency EQE as compared with the organic EL device including the electron blocking layer containing the compound EBL-$C_1$ in Comparative 1.

mCBP in the emitting layer were 1 mass %, 25 mass %, and 74 mass %, respectively.

Next, a compound HBL-1 was vapor-deposited on the emitting layer to form a 5-nm-thick hole blocking layer as the second layer.

Next, a compound ET was vapor-deposited on the hole blocking layer to form a 50-nm-thick electron transporting layer.

Next, lithium fluoride (LiF) was vapor-deposited on the electron transporting layer to form a 1-nm-thick electron injecting electrode (cathode).

Subsequently, metal aluminum (Al) was vapor-deposited on the electron injectable electrode to form an 80-nm-thick metal Al cathode.

A device arrangement of the organic EL device in Example 9 is roughly shown as follows.

ITO(130)/HT:HA(10,97%:3%)/HT(110)/EBL-1(10)/mCBP:TADF-2:GD(25,74%:25%:1%)/HBL-1(5)/ET(50)/LiF(1)/Al(80) Numerals in parentheses represent a film thickness (unit: nm).

Example 10 and Comparative 4

The organic EL devices in Example 10 and Comparative 4 were manufactured in the same manner as in Example 9 except that compounds shown in a column of the electron blocking layer in Table 7 were used in place of the compound EBL-1 in Example 9.
Evaluation 2 of Organic EL Devices The manufactured organic EL devices were evaluated in the same manner as in Example 1. Measurement results are shown in Table 7.

degassed and then sealed in a cell with a lid under an argon atmosphere to obtain an oxygen-free sample solution saturated with argon.

The fluorescence spectrum of the above sample solution was measured with a spectrofluorometer FP-8600 (manufactured by JASCO Corporation), and the fluorescence spectrum of a 9,10-diphenylanthracene ethanol solution was measured under the same conditions. Using the fluorescence area intensities of both spectra, the total fluorescence quantum yield is calculated by an equation (1) in Morris et al. J. Phys. Chem. 80 (1976) 969.

Prompt emission was observed immediately when the excited state was achieved by exciting the compound TADF-1 with a pulse beam (i.e., a beam emitted from a pulse laser) having a wavelength to be absorbed by the compound TADF-1, and Delay emission was observed not immediately when the excited state was achieved but after the excited state was achieved. The delayed fluorescence in Examples means that an amount of Delay Emission is 5% or more with respect to an amount of Prompt Emission. Specifically, provided that the amount of Prompt emission is denoted by XP and the amount of Delay emission is denoted by XD, the delayed fluorescence means that a value of XD/XP is 0.05 or more.

An amount of Prompt emission, an amount of Delay emission and a ratio between the amounts thereof can be

TABLE 7

| | Electron Blocking Layer (First Layer) | | Emitting Layer | | | Hole Blocking Layer | Evaluation | | |
|---|---|---|---|---|---|---|---|---|---|
| | Compound | Ip [eV] | Third Compound | Second Compound | First Compound | (Second Layer) Compound | Drive Voltage [V] | EQE [%] | CIE (x, y) |
| Example 9 | EBL-1 | 5.78 | mCBP | TADF-2 | GD | HBL-1 | 4.2 | 14.5 | (0.24, 0.70) |
| Example 10 | EBL-4 | 5.86 | mCBP | TADF-2 | GD | HBL-1 | 4.1 | 15.6 | (0.24, 0.70) |
| Comparative 4 | EBL-C2 | 5.74 | mCBP | TADF-2 | GD | HBL-1 | 4.5 | 11.7 | (0.25, 0.70) |

The organic EL devices in Examples 9 to 10 exhibit a lower drive voltage and an improved external quantum efficiency EQE as compared with the organic EL device including the electron blocking layer containing the compound EBL-C$_2$ in Comparative 4.
Evaluation of Compounds Values of physical properties of the compounds shown in Tables 6 and 7 were measured by the following method.
Ionization Potential Ip Ionization potential Ip of each of the compounds EBL-1 to EBL-4 and the compounds EBL-C1 to EBL-C$_2$ was measured by the following method.
Measurement results are shown in Tables 6 and 7.

The ionization potential Ip was measured under atmosphere using a photoelectron spectroscope ("AC-3" manufactured by RIKEN KEIKI Co., Ltd.). Specifically, the measurement target material was irradiated with light and the amount of electrons generated by charge separation was measured to measure the ionization potential.
Delayed Fluorescence of Compound TADF-1

Delayed fluorescence properties were checked by measuring transient photoluminescence (PL) using a device shown in FIG. 2. The compound TADF-1 was dissolved in toluene to prepare a dilute solution with an absorbance of 0.05 or less at the excitation wavelength to eliminate the contribution of self-absorption. In order to prevent quenching due to oxygen, the sample solution was frozen and obtained according to the method as described in "Nature 492, 234-238, 2012" (Reference Document 1). The amount of Prompt emission and the amount of Delay emission may be calculated using a device different from one described in Reference Document 1 or one shown in FIG. 2.

It was confirmed that the amount of Delay Emission was 5% or more with respect to the amount of Prompt Emission in the compound TADF-1.

Specifically, it was found that a value of XD/XP was 0.05 or more in the compound TADF-1.
Delayed Fluorescence of Compound TADF-2

The compound TADF-2 was checked in terms of delayed fluorescence in the same manner as above except that the compound TADF-2 was used in place of the compound TADF-1.

Specifically, it was found that a value of XD/XP was 0.05 or more in the compound TADF-2.
Singlet Energy $S_1$ Singlet energy $S_1$ of each of the compounds RD, GD, TADF-1, TADF-2, CBP and mCBP was measured according to the above-described solution method.
Measurement results are shown in Table 8.
Energy Gap $T_{77K}$ at 77K Energy gap $T_{77K}$ at 77K of each of the compounds TADF-1 and TADF-2 was measured. ΔST was checked from the measurement results of the energy gap $T_{77K}$ and the values of the singlet energy $S_1$ described above. The energy gap $T_{77K}$ at 77K of each of the compounds TADF-1 and TADF-2 was measured by the measurement method of the energy gap $T_{77K}$ described above in "Relationship between Triplet Energy and Energy Gap at 77K."

Measurement results are shown in Table 8.

Main Peak Wavelength Δ of Compound

A main peak wavelength Δ of each of the compounds RD and GD was measured by the following method.

Measurement results are shown in Table 8.

A toluene solution of a measurement target compound at a concentration of 5 μmol/L was prepared and put in a quartz cell. An emission spectrum (ordinate axis: luminous intensity, abscissa axis: wavelength) of the thus-obtained sample was measured at a normal temperature (300K). In Examples, the emission spectrum was measured using a spectrophotometer manufactured by Hitachi, Ltd. (device name: F-7000). It should be noted that the machine for measuring the emission spectrum is not limited to the machine used herein. A peak wavelength of the emission spectrum exhibiting the maximum luminous intensity was defined as a main peak wavelength λ.

TABLE 8

|  |  | $S_1$ [eV] | ΔST [eV] | λ [nm] |
|---|---|---|---|---|
| First Compound | RD | 2.02 | — | 609 |
|  | GD | 2.39 | — | 516 |
| Second Compound | TADF-1 | 2.36 | <0.01 | — |
|  | TADF-2 | 2.62 | <0.01 | — |
| Third Compound | CBP | 3.41 | — | — |
|  | mCBP | 3.56 | — | — |

Explanation of Table 8
" " represents no measurement.
"<0.01" represents ΔST of less than 0.01 eV.

The invention claimed is:

1. An organic electroluminescence device comprising:

an anode;

a cathode;

an emitting layer provided between the anode and the cathode;

a first layer provided between the anode and the emitting layer and adjacent to the emitting layer; and a second layer provided between the cathode and the emitting layer and adjacent to the emitting layer, wherein the emitting layer comprises a first compound, a second compound, and a third compound, the first layer comprises a compound represented by formula (1), the second layer comprises a compound represented by formula (2), the first compound is a fluorescent compound, the second compound is a delayed fluorescent compound, and a singlet energy $S_1(M1)$ of the first compound, a singlet energy $S_1(M2)$ of the second compound, and a singlet energy $S_1(M3)$ of the third compound satisfy a relationship of Numerical Formula 1, $$S_1(M3) > S_1(M2) > S_1(M1) \quad \text{(Numerical Formula 1)}$$

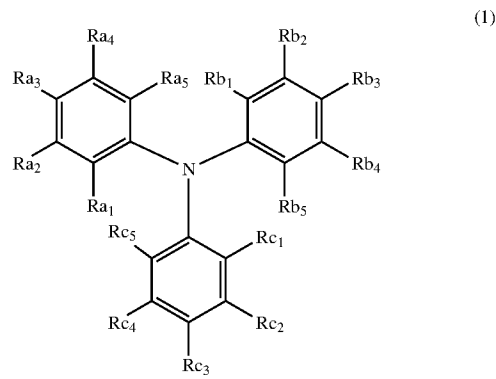

(1)

wherein $Ra_1$ to $Ra_5$, $Rb_1$ to $Rb_5$, and $Rc_3$ to $Rc_5$ are each independently a hydrogen atom or a substituent;

with the proviso that one of $Ra_1$ to $Ra_5$ is a substituent and the $Ra_1$ to $Ra_5$ not being a substituent are each hydrogen atoms and one of $Rb_1$ to $Rb_5$ is a substituent and the $Rb_1$ to $Rb_5$ not being a substituent are each hydrogen atoms, $Ra_1$ to $Ra_5$, $Rb_1$ to $Rb_5$, and $Rc_3$ to $Rc_5$ serving as the substituent are each independently a halogen atom, a cyano group, a substituted or unsubstituted aryl group having 6 to 30 ring carbon atoms, or a substituted or unsubstituted heteroaryl group having 5 to 30 ring atoms;

$Rc_1$ is a hydrogen atom or a substituent, or is bonded to $Rc_2$ to form a ring, and $Rc_1$ serving as the substituent is a substituted or unsubstituted aryl group having 6 to 12 ring carbon atoms;

$Rc_2$ is a hydrogen atom or a substituent, or a pair of $Rc_1$ and $Rc_2$ are mutually bonded to form a ring;

when a pair of $Rc_1$ and $Rc_2$ are mutually bonded to form a ring, the ring at least comprises a five-membered ring, the five-membered ring comprising at least one of a carbon atom, an oxygen atom, a sulfur atom, or a nitrogen atom;

$Rc_1$ and $Rc_2$ are not hydrogen atoms at the same time; and $Rc_2$ serving as the substituent is a substituted or unsubstituted aryl group having 6 to 30 ring carbon atoms, a substituted or unsubstituted heteroaryl group having 5 to 30 ring atoms, a substituted or unsubstituted aryloxy group having 6 to 30 ring carbon atoms, a substituted or unsubstituted arylthio group having 6 to 30 ring carbon atoms, or a substituted or unsubstituted amino group, wherein a partial structure represented by formula (1A) in formula (1) is a group represented by one of formulae (1A-1) and (1A-3) to (1A-10),

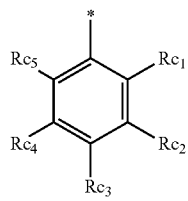

(1A)

wherein

Rc$_1$ represents the same as Rc$_1$ in the formula (1), Rc$_2$ represents the same as Rc$_2$ in the formula (1), Rc$_3$ to Rc$_5$ each independently represent the same as Rc$_3$ to Rc$_5$ in the formula (1), and * represents a bonding position to a nitrogen atom in the compound represented by the formula (1),

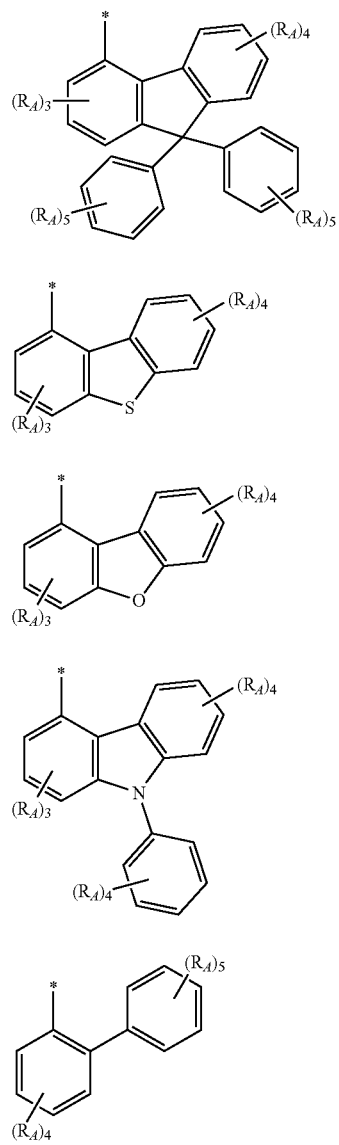

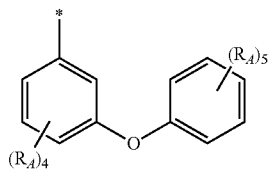

(1A-7)

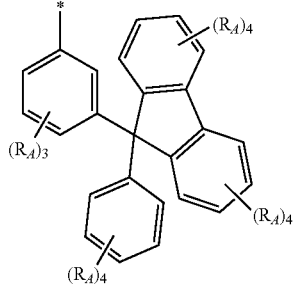

(1A-8)

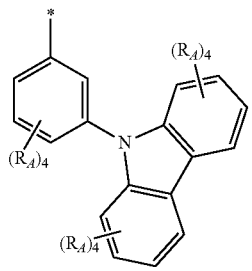

(1A-9)

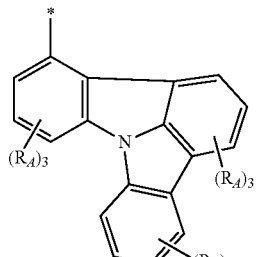

(1A-10)

where in the formulae (1A-1) and (1A-3) to (1A-10);

R$_A$ is a hydrogen atom or a substituent;

R$_A$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

when a plurality of R$_A$ are present, the plurality of R$_A$ are mutually the same or different; and * represents a bonding position to a nitrogen atom in the compound represented by the formula (1),

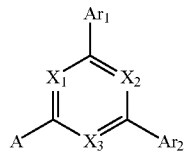

(2)

wherein $X_1$ to $X_3$ are each independently a nitrogen atom or $CR_1$, at least one of $X_1$ to $X_3$ is a nitrogen atom;

$R_1$ is a hydrogen atom or a substituent;

$R_1$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

$Ar_1$ and $Ar_2$ are each independently represented by formula (2A), or a substituted or unsubstituted aryl group having 6 to 30 ring carbon atoms, or a substituted or unsubstituted heteroaryl group having 5 to 30 ring atoms; and A is represented by formula (2A) below,

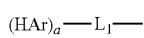

(2A)

wherein

HAr is represented by formula (2B);

a is 1, 2, 3, 4 or 5;

when a is 1, $L_1$ is a single bond or a divalent linking group;

when a is 2, 3, 4 or 5, $L_1$ is a trivalent to hexavalent linking group;

a plurality of HAr are mutually the same or different;

the linking group is a group derived from a substituted or unsubstituted aryl group having 6 to 30 ring carbon atoms, a group derived from a substituted or unsubstituted heteroaryl group having 5 to 30 ring atoms, a group derived from a group formed by mutually bonding two groups selected from the group consisting of a substituted or unsubstituted aryl group having 6 to 30 ring carbon atoms and a substituted or unsubstituted heteroaryl group having 5 to 30 ring atoms, or a group derived from a group formed by mutually bonding three groups selected from the group consisting of a substituted or unsubstituted aryl group having 6 to 30 ring carbon atoms and a substituted or unsubstituted heteroaryl group having 5 to 30 ring atoms; and the mutually bonded groups are mutually the same or different,

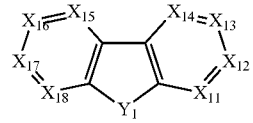

(2B)

wherein $X_{11}$ to $X_{18}$ are each independently a nitrogen atom, $CR_{13}$, or a carbon atom bonded to $L_1$;

a plurality of $R_{13}$ are mutually the same or different;

$Y_1$ is an oxygen atom, a sulfur atom, $NR_{18}$, $SiR_{11}R_{12}$, $CR_{14}R_{15}$, a nitrogen atom bonded to $L_1$, a silicon atom bonded to each of $R_{16}$ and $L_1$, or a carbon atom bonded to each of $R_{17}$ and $L_1$;

among carbon atoms in $X_{11}$ to $X_{18}$, $R_{11}$ to $R_{12}$, and $R_{14}$ to $R_{15}$ as well as a nitrogen atom, a silicon atom, and carbon atoms in $Y_1$, one atom is bonded to $L_1$;

$R_{11}$ and $R_{12}$ are the same or different; $R_{14}$ and $R_{15}$ are the same or different;

$R_{18}$ and $R_{11}$ to $R_{17}$ are each independently a hydrogen atom or a substituent, or at least one pair of a pair of adjacent ones of $R_{13}$, a pair of $R_{11}$ and $R_{12}$, or a pair of $R_{14}$ and $R_{15}$ are bonded to each other to form a ring; and $R_{18}$ and $R_{11}$ to $R_{17}$ serving as the substituent are each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms.

2. The organic electroluminescence device according to claim 1, wherein
the group represented by formula (1A) is one of formulae (1A-1), (1A-3) to (1A-5) and (1A-10).

3. The organic electroluminescence device according to claim 1, wherein
the group represented by formula (1A) is formula (1A-1) or formula (1A-4).

4. The organic electroluminescence device according to claim 1, wherein
the group represented by formula (1A) is one of formulae (1A-6) to (1A-9).

5. The organic electroluminescence device according to claim 4, wherein
the group represented by formula (1A) is formula (1A-9).

6. The organic electroluminescence device according to claim 1, wherein
the group represented by formula (1A) is formula (1A-1), (1A-4) or (1A-9).

7. The organic electroluminescence device according to claim 1, wherein
the one of $Ra_1$ to $Ra_5$ and the one of $Rb_1$ to $Rb_5$ serving as the substituent is a substituted or unsubstituted aryl group having 6 to 30 ring carbon atoms.

8. The organic electroluminescence device according to claim 1, wherein the one of $Ra_1$ to $Ra_5$ serving as the substituent is a substituted or unsubstituted aryl group having 6 to 30 ring carbon atoms, and the one of $Rb_1$ to $Rb_5$ serving as the substituent is a substituted or unsubstituted heteroaryl group having 5 to 30 ring atoms.

9. The organic electroluminescence device according to claim 1, wherein the one of $Ra_1$ to $Ra_5$ serving as the substituent is an aryl group having 6 to 30 ring carbon atoms and substituted by a heteroaryl group having 5 to 30 ring atom, and the one of $Rb_1$ to $Rb_5$ serving as the substituent is a substituted or unsubstituted heteroaryl group having 5 to 30 ring atoms.

10. The organic electroluminescence device according to claim 1, wherein the one of $Ra_1$ to $Ra_5$ serving as the substituent and the one of $Rb_1$ to $Rb_5$ serving as the substituent are each independently selected from the group consisting of a substituted or unsubstituted heteroaryl group having 5 to 30 ring atoms.

11. The organic electroluminescence device according to claim 1, wherein the one of $Ra_1$ to $Ra_5$ serving as the substituent, and the one of $Rb_1$ to $Rb_5$ serving as the substituent, are each independently selected from the group consisting of a halogen atom, a cyano group, an unsubstituted aryl group having 6 to 30 ring carbon atoms, and an unsubstituted heteroaryl group having 5 to 30 ring atoms.

12. The organic electroluminescence device according to claim 1, wherein the one of $Ra_1$ to $Ra_5$ serving as the substituent is a group of formulae (1B-1) to (1B-10) and the one of $Rb_1$ to $Rb_5$ serving as the substituent is of formulae (1B-1) to (1B-10),

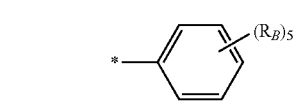
(1B-1)

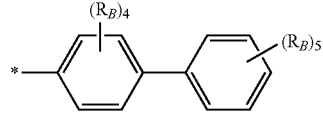
(1B-2)

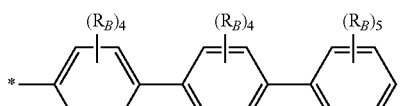
(1B-3)

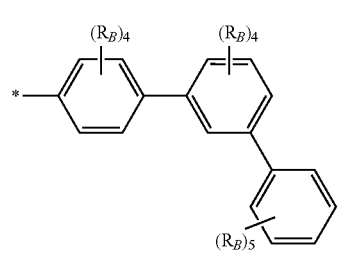
(1B-4)

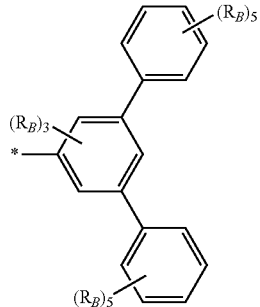
(1B-5)

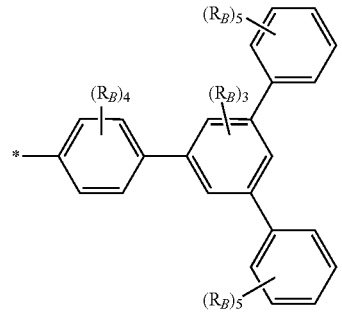
(1B-6)

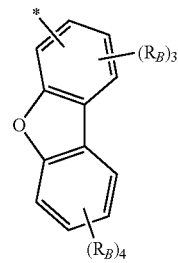
(1B-7)

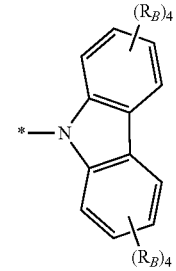
(1B-8)

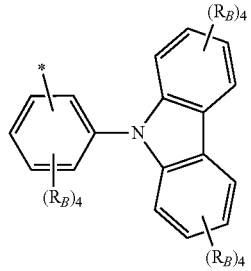
(1B-9)

-continued

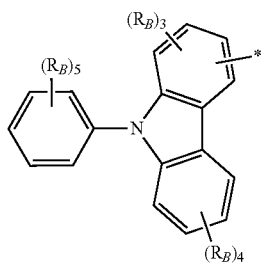
(1B-10)

wherein $R_B$ is a hydrogen atom or a substituent;

$R_B$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

when a plurality of $R_B$ are present, the plurality of $R_B$ are mutually the same or different; and * each represents a bonding position to a benzene ring bonded to $Ra_1$ to $Ra_5$ or a bonding position to a benzene ring bonded to $Rb_1$ to $Rb_5$ in the compound represented by the formula (1).

13. The organic electroluminescence device according to claim 1, wherein the compound represented by formula (1) is a compound represented by formula (1X), formula (1Y) or formula (1Z),

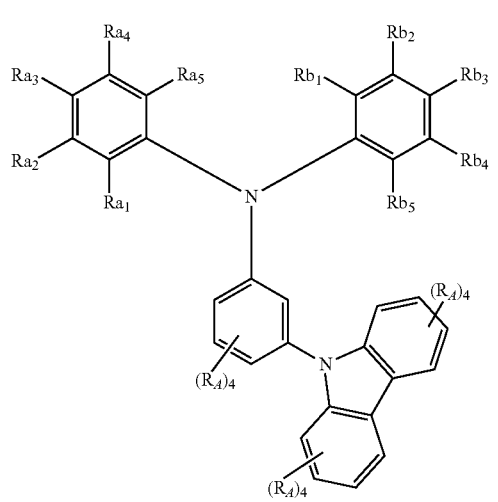
(1X)

-continued

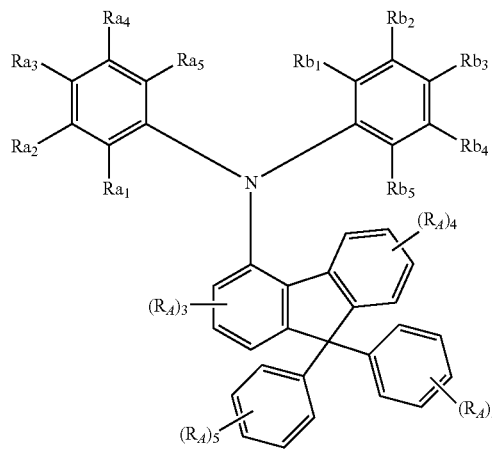
(1Y)

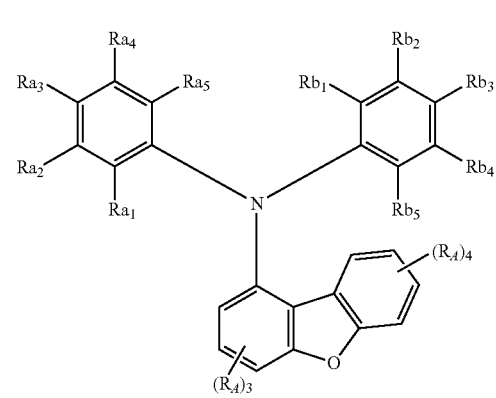
(1Z)

wherein one of $Ra_1$ to $Ra_5$ is a group represented by one of formulae (1B-1) to (1B-10);

one of $Rb_1$ to $Rb_5$ is a group represented by one of formulae (1B-1) to (1B-10);

$R_A$ is a hydrogen atom or a substituent, and $R_A$ serving as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms; and when a plurality of $R_A$ are present, the plurality of $R_A$ are the same or different,

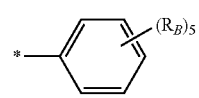
(1B-1)

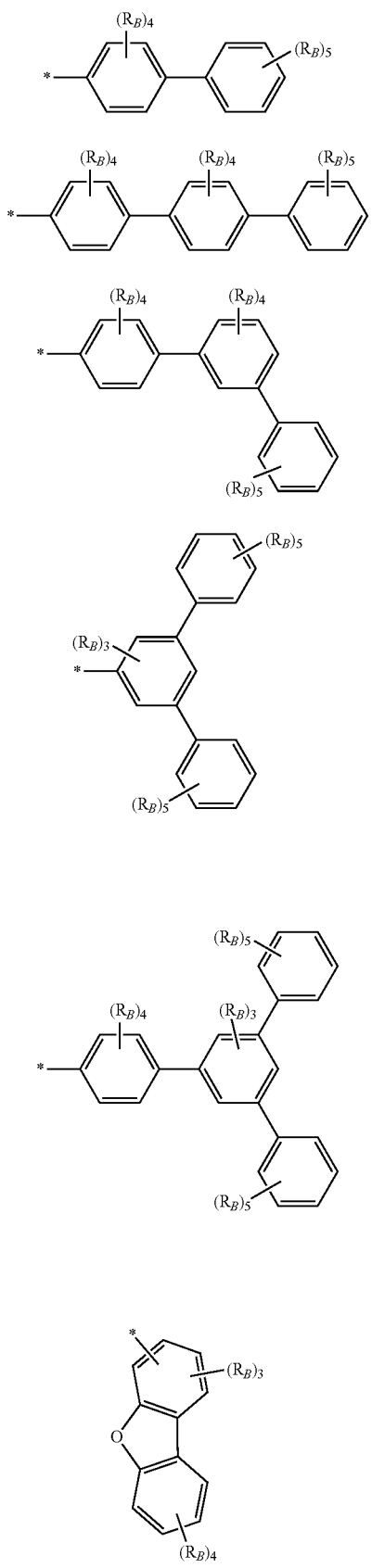

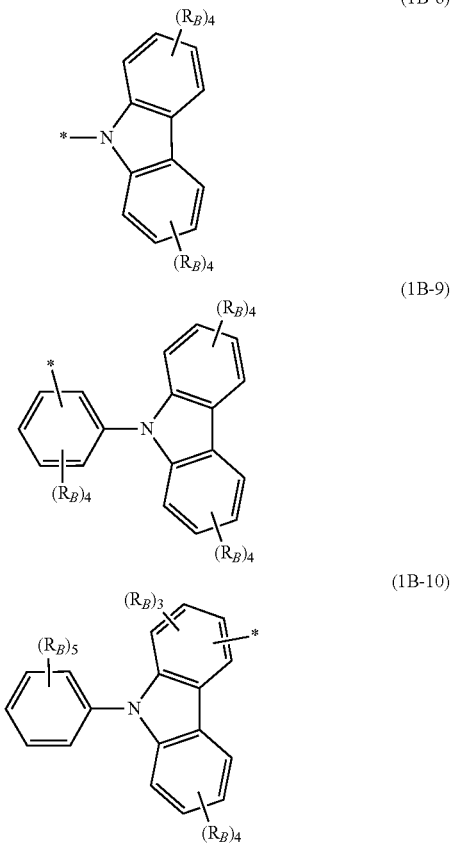

wherein
$R_B$ is a hydrogen atom or a substituent, and $R_B$ as the substituent is each independently a halogen atom, a cyano group, a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted silyl group, a substituted or unsubstituted alkoxy group having 1 to 30 carbon atoms, a substituted or unsubstituted aralkyl group having 7 to 30 carbon atoms, or a substituted or unsubstituted aryloxy group having 6 to 30 ring carbon atoms;

when a plurality of R are present, the plurality of $R_B$ are mutually the same or different; and * each represents a bonding position to a benzene ring bonded to $Ra_1$ to $Ra_5$ or a bonding position to a benzene ring bonded to $Rb_1$ to $Rb_5$ in the compound represented by the formula (1).

14. The organic electroluminescence device according to claim 13, wherein
$R_A$ is a hydrogen atom.

15. The organic electroluminescence device according to claim 1, wherein
an ionization potential Ip of the compound represented by formula (1) is 5.78 eV or more.

16. The organic electroluminescence device according to claim 1, wherein
two or three of $X_1$ to $X_3$ are nitrogen atoms.

17. The organic electroluminescence device according to claim 1, wherein
$L_1$ is a trivalent to hexavalent residue derived from a substituted or unsubstituted aryl group having 6 to 30 ring carbon atoms.

18. The organic electroluminescence device according to claim 1, wherein
a is 1 or 2, and
$L_1$ is a divalent or trivalent linking group.

19. The organic electroluminescence device according to claim 18, wherein
$L_1$ is a divalent or trivalent linking group derived from benzene, biphenyl, terphenyl, naphthalene, and phenanthrene.

20. The organic electroluminescence device according to claim 1, wherein
a is 2 and
$L_1$ is a trivalent residue derived from a substituted or unsubstituted aryl group having 6 to 30 ring carbon atoms, or a trivalent residue derived from a substituted or unsubstituted heteroaryl group having 5 to 30 ring atoms.

21. The organic electroluminescence device according to claim 1, wherein
$L_1$ is a single bond.

22. The organic electroluminescence device according to claim 1, wherein
$Y_1$ is $NR_{18}$, or a nitrogen atom bonded to $L_1$.

23. The organic electroluminescence device according to claim 1, wherein
$Y_1$ is $CR_{14}R_{15}$.

24. The organic electroluminescence device according to claim 1, wherein
$Y_1$ is an oxygen atom or a sulfur atom.

25. The organic electroluminescence device according to claim 1, wherein
$Y_1$ is an oxygen atom or a sulfur atom, and
one of $X_{11}$ to $X_{18}$ is a carbon atom bonded to $L_1$ and the rest of $X_{11}$ to $X_{18}$ are each $CR_{13}$.

26. The organic electroluminescence device according to claim 1, wherein
$X_{13}$ or $X_{16}$ is a carbon atom bonded to $L_1$.

27. The organic electroluminescence device according to claim 1, wherein
a substituent for a substituted or unsubstituted group is a substituted or unsubstituted alkyl group having 1 to 30 carbon atoms, a substituted or unsubstituted alkyl halide group having 1 to 30 carbon atoms, a substituted or unsubstituted cycloalkyl group having 3 to 30 ring carbon atoms, a substituted or unsubstituted aryl group having 6 to 30 ring carbon atoms, a substituted or unsubstituted heteroaryl group having 5 to 30 ring atoms, a substituted or unsubstituted alkoxy group having 1 to 30 carbon atoms, a substituted or unsubstituted alkoxy halide group having 1 to 30 carbon atoms, a substituted or unsubstituted alkylthio group having 1 to 30 carbon atoms, a substituted or unsubstituted aryloxy group having 6 to 30 ring carbon atoms, a substituted or unsubstituted arylthio group having 6 to 30 ring carbon atoms, a substituted or unsubstituted alkenyl group having 2 to 30 carbon atoms, a substituted or unsubstituted alkynyl group having 2 to 30 carbon atoms, a substituted or unsubstituted aralkyl group having 7 to 30 carbon atoms, a substituted or unsubstituted alkylsulfonyl group having 1 to 30 carbon atoms, a substituted or unsubstituted arylcarbonyl group having 6 to 30 ring carbon atoms, a substituted or unsubstituted acyl group having 1 to 30 carbon atoms, a halogen atom, a carboxy group, a substituted or unsubstituted amino group, a nitro group, a cyano group, a substituted or unsubstituted silyl group, a substituted phosphoryl group, a hydroxy group, a substituted phosphino group, an ester group, a siloxanyl group, or a carbamoyl group.

28. The organic electroluminescence device according to claim 1, wherein
a substituent for a substituted or unsubstituted group is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted alkyl halide group having 1 to 30 carbon atoms, and a substituted or unsubstituted cycloalkyl group having 3 to 30 ring carbon atoms.

29. The organic electroluminescence device according to claim 1, wherein
a substituent for a substituted or unsubstituted group is selected from the group consisting of a substituted or unsubstituted aryl group having 6 to 12 ring carbon atoms, a substituted or unsubstituted heteroaryl group having 5 to 12 ring atoms, a substituted or unsubstituted alkyl group having 1 to 6 carbon atoms, a substituted or unsubstituted alkyl halide group having 1 to 6 carbon atoms, and a substituted or unsubstituted cycloalkyl group having 3 to 12 ring carbon atoms.

30. The organic electroluminescence device according to claim 1, wherein
the emitting layer does not comprise a metal complex.

31. An electronic device comprising the organic electroluminescence device according to claim 1.

* * * * *